(12) United States Patent
Seo et al.

(10) Patent No.: US 9,578,759 B2
(45) Date of Patent: Feb. 21, 2017

(54) ELECTRONIC DEVICE WITH COVER

(71) Applicant: Samsung Electronics Co., Ltd., Suwon-si, Gyeonggi-do (KR)

(72) Inventors: Jaeil Seo, Suwon-si (KR); Gyeongtae Kim, Suwon-si (KR); Kyungpil Kim, Suwon-si (KR); Heecheul Moon, Seongnam-si (KR); Sangin Baek, Suwon-si (KR); Kwonho Son, Suwon-si (KR); Minsung Lee, Suwon-si (KR); Bongsuk Choi, Seoul (KR); Nayoung Chu, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/994,546

(22) Filed: Jan. 13, 2016

(65) Prior Publication Data
US 2016/0234949 A1 Aug. 11, 2016

Related U.S. Application Data

(60) Provisional application No. 62/113,108, filed on Feb. 6, 2015.

(30) Foreign Application Priority Data

May 15, 2015 (KR) .................. 10-2015-0068079

(51) Int. Cl.
*G06F 1/16* (2006.01)
*H05K 5/00* (2006.01)
(Continued)

(52) U.S. Cl.
CPC ......... *H05K 5/0017* (2013.01); *H04M 1/0202* (2013.01); *H04M 1/0266* (2013.01); *H05K 5/03* (2013.01)

(58) Field of Classification Search
CPC ......... G06F 1/16; G06F 1/1626; G06F 1/1637
See application file for complete search history.

(56) References Cited

U.S. PATENT DOCUMENTS 5,176,733 A * 1/1993 Koss .................. C03B 23/0258
65/107
8,737,045 B2 * 5/2014 Dai .................. B29C 45/14467
174/255
(Continued)

FOREIGN PATENT DOCUMENTS

EP 2 498 336 A2 9/2012
EP 2 533 502 A1 12/2012
(Continued)

OTHER PUBLICATIONS

Halleck; Samsung Will Release Galaxy S6 With Two Curved Edges, A Glass Back and Non-Removable Battery, Reports Say; http://www.ibtimes.com/samsung-will-release-galaxy-s6-two-curved-edges-glass-back-non-removable-battery-1788104; XP55271607; Jan. 20, 2015.
(Continued)

*Primary Examiner* — Anthony Q Edwards
(74) *Attorney, Agent, or Firm* — Jefferson IP Law, LLP

(57) ABSTRACT

An electronic device is provided. The electronic device includes a front glass cover forming a front face of the electronic device, a rear glass cover forming a rear face of the electronic device, a metal bezel encapsulating a space formed by the front glass cover and the rear glass cover, and a display device disposed in the space and that includes a screen region exposed through the front glass cover. At least one glass cover of the front glass cover and the rear glass cover includes a surface that includes a first edge, a second edge extending at an opposite side to the first edge, a third edge interconnecting a first end of the first edge and a first
(Continued)

end of the second edge, and a fourth edge interconnecting a second end of the first edge and a second end of the second edge.

20 Claims, 92 Drawing Sheets

(51) Int. Cl.
*H04M 1/02* (2006.01)
*H05K 5/03* (2006.01)

(56) References Cited

U.S. PATENT DOCUMENTS

| | | | |
|---|---|---|---|
| 9,047,044 B2* | 6/2015 | Raff | G06F 1/1637 |
| 2010/0315769 A1* | 12/2010 | Mathew | G06F 1/1637 |
| | | | 361/679.29 |
| 2011/0241949 A1 | 10/2011 | Nickel et al. | |
| 2011/0287812 A1* | 11/2011 | Joo | H04M 1/185 |
| | | | 455/566 |
| 2012/0178503 A1 | 7/2012 | Merz et al. | |
| 2013/0306697 A1 | 11/2013 | Lee | |
| 2014/0111927 A1* | 4/2014 | Raff | G06F 1/1637 |
| | | | 361/679.21 |
| 2014/0198436 A1* | 7/2014 | Lim | H04M 1/0266 |
| | | | 361/679.01 |
| 2014/0228080 A1 | 8/2014 | Choi et al. | |
| 2014/0233170 A1 | 8/2014 | Hobson et al. | |
| 2014/0234581 A1* | 8/2014 | Immerman | C03B 23/0357 |
| | | | 428/141 |
| 2014/0267097 A1 | 9/2014 | Lee et al. | |
| 2014/0307370 A1 | 10/2014 | Zadesky et al. | |
| 2014/0323063 A1 | 10/2014 | Xu et al. | |
| 2014/0368228 A1 | 12/2014 | Kim | |
| 2015/0070825 A1* | 3/2015 | Perko | G06F 1/1637 |
| | | | 361/679.26 |
| 2015/0140291 A1 | 5/2015 | Kim | |

FOREIGN PATENT DOCUMENTS

| | | |
|---|---|---|
| EP | 2 709 283 A1 | 3/2014 |
| KR | 10-2010-0136719 A | 12/2010 |
| KR | 10-2011-0006039 A | 1/2011 |
| KR | 10-2011-0127483 A | 11/2011 |
| KR | 10-2013-0015535 A | 2/2013 |
| KR | 10-1279793 B1 | 6/2013 |
| KR | 10-2013-0099499 A | 9/2013 |
| KR | 10-2013-0127050 A | 11/2013 |
| WO | 2015/001181 A1 | 1/2015 |

OTHER PUBLICATIONS

Maier; MWC: Samsung teased Galaxy S6 Edge an; TechStage; http://www.techstage.de/news/MWC-Samsung;teasert-Galaxy-s6-Edge-an-2535441.html; XP55271738; Feb. 3, 2015.
Prigg; Samsung's Galaxy s6 could have curved screens that cover its sides: special edition; handset is set to take on Apple's iPhone 6; http://www.dailymail.co.uk/sciencetech/article-2918936/Samsung-s-Galazxy-S6-curved-screens-cover-sides-special-edition-hand-set-set-Apple-s-iPhone-6.html; XP55271817; Jan. 21, 2015.

* cited by examiner

ELECTRONIC DEVICE WITH COVER

CROSS-REFERENCE TO RELATED APPLICATION(S)

This application claims the benefit under 35 U.S.C. §119(e) of a U.S. Provisional application filed on Feb. 6, 2015 in the U.S. Patent and Trademark Office and assigned Ser. No. 62/113,108, and under 35 U.S.C. §119(a) of a Korean patent application filed on May 15, 2015 in the Korean Intellectual Property Office and assigned Serial number 10-2015-0068079, the entire disclosure of each of which is hereby incorporated by reference.

TECHNICAL FIELD

Various embodiments relate to an electronic device that includes a cover that forms an exterior.

BACKGROUND

Currently, due to the development of the electronic communications, user devices (e.g., electronic devices such as a cellular phone, an electronic scheduler, a personal composite electronic device, and a laptop computer) have become necessities of modern life, and thus have become important means for information delivery.

The user devices are equipped with various electronic components to provide various functions. For example, the user devices are equipped with a display module and provides a graphical user interface (GUI) environment. Alternatively, the user devices are equipped with a stereo speaker module so as to allow a user to listen to music with stereo sound.

The user devices may be equipped with a camera module so as to provide a photographing function. The user devices may be equipped with a communication module so as to provide a communication function to communication with other electronic devices through a network.

In general, the user devices include a cover and the above-mentioned electronic components are protected by the cover.

The above information is presented as background information only to assist with an understanding of the present disclosure. No determination has been made, and no assertion is made, as to whether any of the above might be applicable as prior art with regard to the present disclosure.

SUMMARY

Recently, users prefer beautiful exteriors for the user devices and thus, research on various cover materials is occurring. However, due to problems in the mechanical strength of a cover and the binding force between the cover and other elements, it is difficult to select a cover material.

Aspects of the present disclosure are to address at least the above-mentioned problems and/or disadvantages and to provide at least the advantages described below. Accordingly, an aspect of the present disclosure is to provide an electronic device that includes a cover that makes the exterior of the electronic device beautiful and improves the endurance of the electronic device.

In accordance with an aspect of the present disclosure, a portable electronic device is provided. The portable electronic device includes a front glass cover forming a front face of the electronic device, a rear glass cover forming a rear face of the electronic device, a metal bezel encapsulating a space formed by the front glass cover and the rear glass cover, and a display device disposed in the space and that includes a screen region exposed through the front glass cover. At least one glass cover of the front glass cover and the rear glass cover may include a surface that comprises a first edge, a second edge extending at an opposite side to the first edge, a third edge interconnecting a first end of the first edge and a first end of the second edge, and a fourth edge interconnecting a second end of the first edge and a second end of the second edge. When viewed from a cross-section, the at least one glass cover may include a first region having a thickness that decreases at a first gradient toward the first edge, and positioned adjacent to the first edge, a second region having a thickness that decreases at the first gradient toward the second edge, and positioned adjacent to the second edge, a third region having a thickness that decreases at a second gradient, which is different from the first gradient, toward the third edge, and positioned adjacent to the third edge, and a fourth region having a thickness that decreases at the second gradient toward the fourth edge, and positioned adjacent to the fourth edge.

An electronic device, which includes a cover according to various embodiments of the present disclosure, is capable of improving aesthetic satisfaction and maintaining a correct mechanical state.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
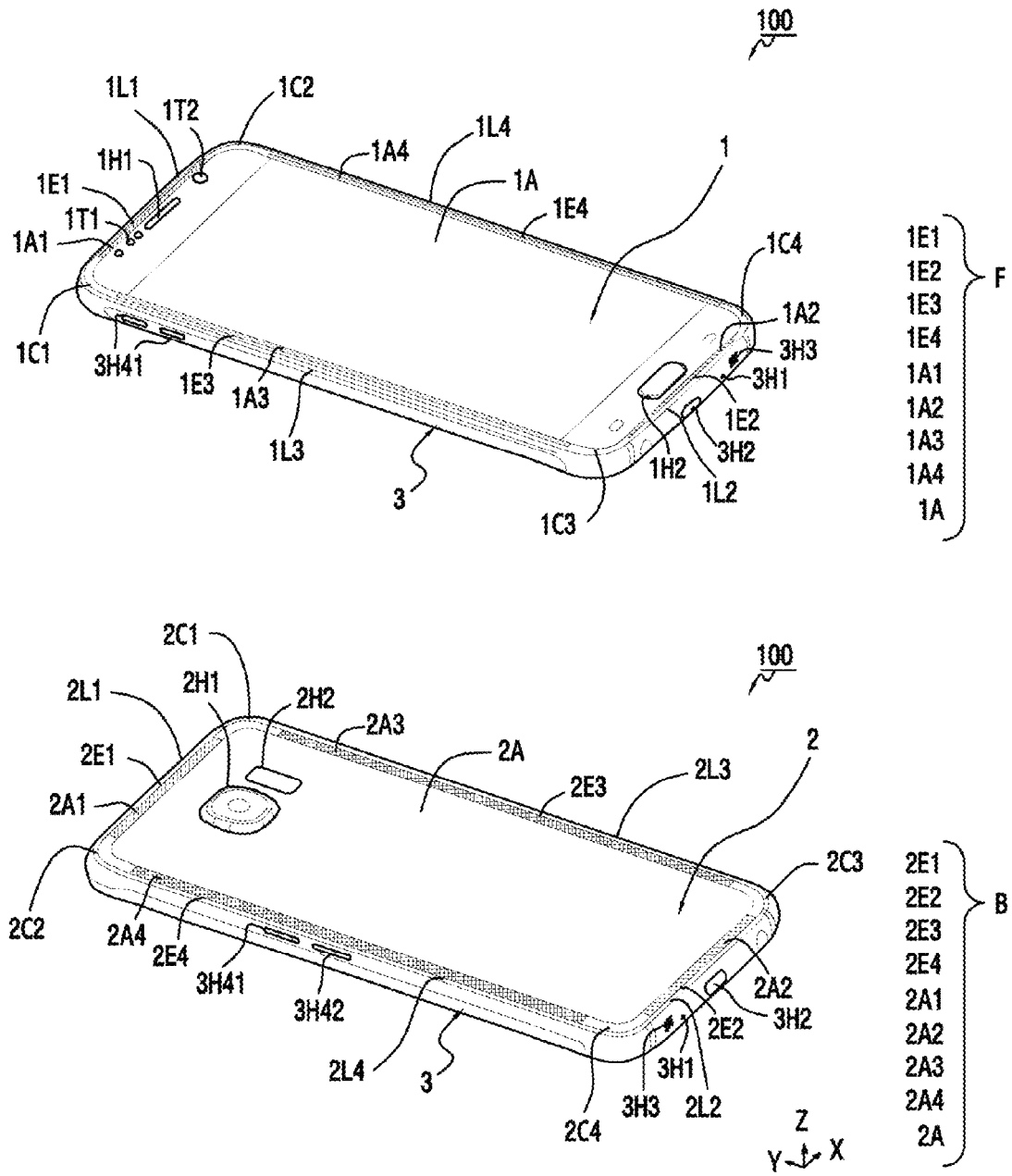
FIG. 1 illustrates perspective views of an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components.

For example, a first user device and a second user device indicate different user devices although both of them are user devices.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. embedded processor) only for performing the corresponding operations or a generic-purpose processor (e.g., central processing unit (CPU) or application processor (AP)) that can perform the corresponding operations by executing one or more software programs stored in a memory device.

Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

According to various embodiments, the electronic device may be a home appliance. The home appliance may include at least one of, for example, a television (TV), a digital video disc (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to various embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present disclosure may be a combination of one or more of the aforementioned various devices.

The electronic device according to various embodiments of the present disclosure may be a flexible device. Further, the electronic device according to an embodiment of the present disclosure is not limited to the aforementioned devices, and may include a new electronic device according to the development of technology Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

Figure 2:
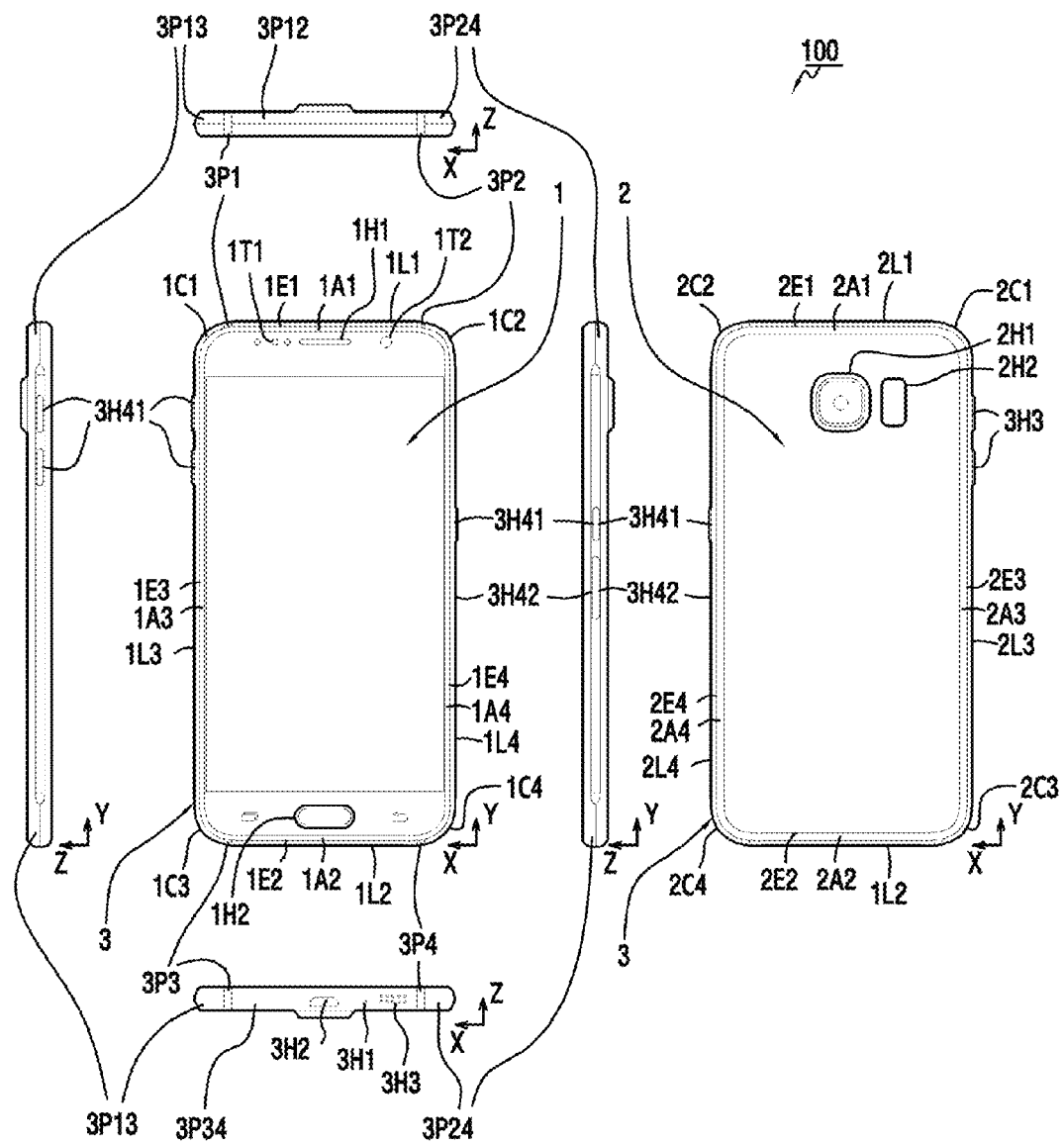
FIG. 2 illustrates perspective views of an electronic device from various directions according to an embodiment of the present disclosure.

FIG. 1 illustrates perspective views of an electronic device according to an embodiment of the present disclosure. FIG. 2 illustrates perspective views of an electronic device from various directions according to an embodiment of the present disclosure.

Referring to FIGS. 1 and 2, according to an embodiment of the present disclosure, an electronic device 100 has a substantially rectangular shape, and may include a front cover 1 that forms a front face F of the electronic device 100, and a rear cover 2 that forms a rear face B of the electronic device 100. In addition, the electronic device 100 may include a bezel 3 that surrounds a space between the front cover 1 and the rear cover 2. In addition, the electronic device 100 may include a display device that is embedded in the space formed by the front cover 1 and the rear cover 2. Here, the screen region of the display device may be exposed to the outside through the front cover 1.

According to various embodiments of the present disclosure, the front cover 1 and/or the rear cover 2 may be formed of glass.

According to various embodiments of the present disclosure, the bezel 3 may be formed of a non-metal or a metal.

According to various embodiments of the present disclosure, the front face F may include a first edge 1E1, a second edge 1E2, a third edge 1E3, and a fourth edge 1E4. The first edge 1E1 and the second edge 1E2 may be arranged opposite to each other, and the third edge 1E3 and the fourth edge 1E4 may be arranged opposite to each other. The third edge 1E3 may interconnect a first end of the first edge 1E1 and a first end of the second edge 1E2. The fourth edge 1E4 may interconnect a second end of the first edge 1E1 and a second end of the second edge 1E2.

According to various embodiments of the present disclosure, the first edge 1E1, the second edge 1E2, the third edge 1E3, or the fourth edge 1E4 may be a straight line, as illustrated, but, without being limited thereto, may be a curved line shape.

According to various embodiments of the present disclosure, the front cover 1 may include a first region 1A1 adjacent to the first edge 1E1. The first region 1A1 has a thickness that may decrease at a first gradient toward the first edge 1E1. In addition, the front cover 1 may include a second region 1A2 adjacent to the second edge 1E2. The second region 1A2 has a thickness that may decrease at a second gradient toward the second edge 1E2. The first region 1A1 and the second region 1A2 may be symmetrical to each other. In addition, the first gradient and the second gradient may be equal to or different from each other.

According to an embodiment of the present disclosure, the front cover 1 may include a third region 1A3 adjacent to the third edge 1E3. The third region 1A3 has a thickness that may decrease at a third gradient toward the third edge 1E3.

In addition, the front cover 1 may include a fourth region 1A4 adjacent to the fourth edge 1E4. The fourth region 1A4 has a thickness that may decrease at a fourth gradient toward the fourth edge 1E4. The third region 1A3 and the fourth region 1A4 may be symmetrical to each other. In addition, the third gradient and the fourth gradient may be equal to or different from each other. Further, the first gradient and/or second gradient may be equal to or different from the third gradient and/or fourth gradient. For example, the first gradient and/or the second gradient may smaller than the third gradient and/or the fourth gradient.

According to various embodiments of the present disclosure, at least one of the first region 1A1, the second region 1A2, the third region 1A3, and the fourth region 1A4 may include a curved face. Alternatively, at least one of the first region 1A1, the second region 1A2, the third region 1A3, and the fourth region 1A4 may be a flat face having a predetermined gradient. Alternatively, at least one of the first region 1A1, the second region 1A2, the third region 1A3, and the fourth region 1A4 may be a combination of flat faces that have different gradients. Alternatively, at least one of the first region 1A1, the second region 1A2, the third region 1A3, and the fourth region 1A4 may be a combination of a flat face and a curved face.

According to an embodiment of the present disclosure, the front face F may include a central region 1A surrounded by the first region 1A1, the second region 1A2, the third region 1A3, and the fourth region 1A4.

According to various embodiments of the present disclosure, the central region 1A may have a tetragonal (rectangular) shape as illustrated, but is not limited thereto. In addition, the central region 1A may include a flat face and/or a curved face.

According to an embodiment of the present disclosure, the screen region of the display device may overlap with the central region 1A with the front face F, and may not overlap with the first region 1A1, the second region 1A2, the third region 1A3, and the fourth region 1A4.

According to an embodiment of the present disclosure, the bezel 3 may include a first corner portion 1C1 adjacent to a location where the first edge 1E1 and the third edge 1E3 are connected to each other. The bezel 3 may include a second corner portion 1C2 adjacent to a location where the first edge 1E1 and the fourth edge 1E4 are connected to each other.

In addition, the bezel 3 may include a first connecting portion 1L1 that interconnects the first corner portion 1C1 and the second corner portion 1C2. The first corner portion 1C1 and/or the second corner portion 1C2 may relatively protrude in a direction from the rear face B toward the front face F of the electronic device 100 in relation to the first connecting portion 1L1. For example, when viewed in a cross-section, at least a portion of the first corner portion 1C1 and/or the second corner portion 1C2 may be thicker than the first connecting portion 1L1 in the direction from the rear face B toward the front face F of the electronic device 100.

According to an embodiment of the present disclosure, the bezel 3 may include a third corner portion 1C3 adjacent to a location where the second edge 1E2 and the third edge 1E3 are connected to each other. The bezel 3 may include a fourth corner portion 1C4 adjacent to a location where the second edge 1E2 and the fourth edge 1E4 are connected to each other. In addition, the bezel 3 may include a second connecting portion 1L2 that interconnects the third corner portion 1C3 and the fourth corner portion 1C4. The third corner portion 1C3 and/or the fourth corner portion 1C4 may relatively protrude in the direction from the rear face B toward the front face F in relation to the second connecting portion 1L2. For example, when viewed in a cross section, at least a portion of the third corner portion 1C3 and/or the fourth corner portion 1C4 may be thicker than the second connecting portion 1L2 in the direction from the rear face B toward the front face F of the electronic device 100.

According to an embodiment of the present disclosure, the bezel 3 may include a third connecting portion 1L3 that interconnects the first corner portion 1C1 and the third corner portion 1C3. The first corner portion 1C1 and/or the third corner portion 1C3 may relatively protrude in the direction from the rear face B toward the front face F in relation to the third connecting portion 1L3. For example, when viewed in a cross section, at least a portion of the first corner portion 1C1 and/or the third corner portion 1C3 may be thicker than the third connecting portion 1L3 in the direction from the rear face B toward front face F of the electronic device 100.

According to an embodiment of the present disclosure, the bezel 3 may include a fourth connecting portion 1L4 that interconnects the second corner portion 1C2 and the fourth corner portion 1C4. The second corner portion 1C2 and/or the fourth corner portion 1C4 may relatively protrude in the direction from the rear face B toward the front face F in relation to the fourth connecting portion 1L4. For example, when viewed in a cross section, the second corner portion 1C2 and/or the fourth corner portion 1C4 may be thicker than the fourth connecting portion 1L4 in the direction from the rear face B toward the front face F of the electronic device 100.

According to various embodiments of the present disclosure, the corner portions 1C1, 1C2, 1C3, and 1C4 may be smoothly connected to the connecting portions 1L1, 1L2, 1L3, and 1L4.

According to an embodiment of the present disclosure, the rear face B may include a first edge 2E1, a second edge 2E2, a third edge 2E3, and a fourth edge 2E4. The first edge 2E1 and the second edge 2E2 may be arranged opposite to each other, and the third edge 2E3 and the fourth edge 2E4 may be arranged opposite to each other. The third edge 2E3 may interconnect a first end of the first edge 2E1 and a first end of the second edge 2E2. The fourth edge 2E4 may interconnect a second end of the first edge 2E1 and a second end of the second edge 2E2.

According to various embodiments of the present disclosure, the first edge 2E1, the second edge 2E2, the third edge 2E3, and the fourth edge 2E4 may have a straight shape as illustrated, but, without being limited thereto, may be a curved line shape.

According to various embodiments of the present disclosure, the rear cover 2 may include a first region 2A1 adjacent to the first edge 2E1. The first region 2A1 has a thickness that may decrease at a first gradient toward the first edge 2E1. In addition, the rear cover 2 may include a second region 2A2 adjacent to the second edge 2E2. The second region 2A2 has a thickness that may decrease at a second gradient toward the second edge 2E2. The first region 2A1 and the second region 2A2 may be symmetrical to each other. In addition, the first gradient and the second gradient may be equal to or different from each other.

According to an embodiment of the present disclosure, the rear cover 2 may include a third region 2A3 adjacent to the third edge 2E3. The third region 2A3 has a thickness that may decrease at a third gradient toward the third edge 2E3. In addition, the rear cover 2 may include a fourth region 2A4 adjacent to fourth edge 2E4. The fourth region 2A4 has a thickness that may decrease at a fourth gradient toward the fourth edge 2E4. The third region 2A3 and the fourth region 2A4 may be symmetrical to each other. The third region 2A3 and/or the fourth region 2A4 may have a tetragonal shape as illustrated, but is not limited thereto. In addition, the third gradient and the fourth gradient may be equal to or different from each other. In addition, the first gradient and/or the second gradient may be equal to or different from the third gradient and/or the fourth gradient. For example, the first gradient and/or the second gradient may be smaller than the third gradient/or the fourth gradient.

According to various embodiments of the present disclosure, at least one of the first region 2A1, the second region 2A2, the third region 2A3, and the fourth region 2A4 may include a curved face. Alternatively, at least one of the first region 2A1, the second region 2A2, the third region 2A3, and the fourth region 2A4 may be a flat face having a predetermined gradient. Alternatively, at least one of the first region 2A1, the second region 2A2, the third region 2A3, and the fourth region 2A4 may be a combination of flat faces that have different gradients. Alternatively, at least one of the first region 2A1, the second region 2A2, the third region 2A3, and the fourth region 2A4 may be a combination of a flat face and a curved face.

According to an embodiment of the present disclosure, the rear face B may include a central region 2A surrounded by the first region 2A1, the second region 2A2, the third region 2A3, and the fourth region 2A4.

According to various embodiments of the present disclosure, the central region 2A may have a tetragonal (rectangular) shape as illustrated, but is not limited thereto. In addition, the central region 2A may include a flat face and/or a curved face.

According to an embodiment of the present disclosure, the screen region of the display device may overlap with the central region 2A of the rear face B, and may not overlap with the first region 2A1, the second region 2A2, the third region 2A3, and the fourth region 2A4.

According to an embodiment of the present disclosure, the bezel 3 may include a first corner portion 2C1 adjacent to a location where the first edge 2E1 and the third edge 2E3 are connected to each other. The bezel 3 may include a second corner portion 2C2 adjacent to a location where the first edge 2E1 and the fourth edge 2E4 are connected to each other. In addition, the bezel 3 may include a first connecting portion 2L1 that interconnects the first corner portion 2C1 and the second corner portion 2C2. The first corner portion 2C1 and/or the second corner portion 2C2 may relatively protrude in a direction from the front face F toward the rear face B in relation to the first connecting portion 2L1. For example, when viewed in a cross section, at least a portion of the first corner portion 2C1 and/or the second corner portion 2C2 may be thicker than the first connecting portion 2L1 in the direction from the front face F to the rear face B of the electronic device 100.

According to an embodiment of the present disclosure, the bezel 3 may include a third corner portion 2C3 adjacent to a location where the second edge 2E2 and the third edge 2E3 are connected to each other. The bezel 3 may include a fourth corner portion 2C4 adjacent to a location where the second edge 2E2 and the fourth edge 2E4. In addition, the bezel 3 may include a second connecting portion 2L2 that interconnects the third corner portion 2C3 and the fourth corner portion 2C4. The third corner portion 2C3 and/or the fourth corner portion 2C4 may relatively protrude in the direction from the front face F toward the rear face B in relation to the second connecting portion 2L2. For example, when viewed in a cross section, at least a portion of the third corner portion 2C3 and/or the fourth corner portion 2C4 may be thicker than the second connecting portion 2L2 in the direction from the front face F toward the rear face B of the electronic device 100.

According to an embodiment of the present disclosure, the bezel 3 may include a third connecting portion 2L3 that interconnects the first corner portion 2C1 and the third corner portion 2C3. The first corner portion 2C1 and/or the third corner portion 2C3 may relatively protrude in the direction from the front face F toward the rear face B in relation to the third connecting portion 2L3. For example, when viewed in a cross section, at least a portion of the first corner portion 2C1 and/or the third corner portion 2C3 may be thicker than the third connecting portion 2L3 in the direction from the front face F toward the rear face B of the electronic device 100.

According to an embodiment of the present disclosure, the bezel 3 may include a fourth connecting portion 2L4 that interconnects the second corner portion 2C2 and the fourth corner portion 2C4. The second corner portion 2C2 and/or the fourth corner portion 2C4 may relatively protrude in the direction from the front face F toward the rear face B in relation to the fourth connecting portion 2L4. For example, when viewed in a cross section, the second corner portion 2C2 and/or the fourth corner portion 2C4 may be thicker than the fourth connecting portion 2L4 in the direction from the front face F toward the rear face B of the electronic device 100.

According to various embodiments of the present disclosure, the corner portions 2C1, 2C2, 2C3, and 2C4 may be smoothly connected to the connecting portions 2L1, 2L2, 2L3, and 2L4.

According to various embodiments of the present disclosure, the front cover 1 may include a through-hole 1H1 in order to aid a speaker or a receiver that is equipped in the electronic device 100. Sounds from the speaker or the receiver may be released to the outside through the through-hole 1H1.

According to various embodiments of the present disclosure, the front cover 1 may include one or more transparent regions 1T1 and 1T2 to aid optical related components that are equipped in the electronic device 100 (e.g., an illuminance sensor, an image sensor, or a proximity sensor). External light may be introduced into the optical related components through the transparent regions 1T1 and 1T2. In addition, the light from the optical related components may be projected to the outside through the transparent regions 1T1 and 1T2.

According to various embodiments of the present disclosure, the front cover 1 may include a through-hole 1H2 to aid a button that is equipped in the electronic device 100. The button may be exposed to the outside through the through-hole 1H2.

According to various embodiments of the present disclosure, the rear cover 2 may include a through-hole 2H1 to aid a camera that is equipped in the electronic device 100. The camera may be exposed to the outside through the through-hole 2H 1. In addition, the rear cover 2 may include a through-hole or a transparent region 2H2 for a flash that is equipped in the electronic device 100. The light from the flash may be released to the outside through the through-hole or the transparent region 2H2.

According to various embodiments of the present disclosure, the bezel 3 may include a through-hole 3H1 to aid a microphone that is equipped in the electronic device 100. External sounds may be introduced into the microphone through the through-hole 3H1.

According to various embodiments of the present disclosure, the bezel 3 may include a through-hole 3H2 to aid a connector that is equipped in the electronic device 100 (e.g., a universal serial bus (USB) socket, a charge jack, a communication jack, or an ear jack). An external device is connected to the connector of the electronic device 100 through the through-hole 3H2.

According to various embodiments of the present disclosure, the bezel 3 may include a through-hole 3H3 to aid a speaker that is equipped in the electronic device 100. The sound from the speaker may be released to the outside through the through-hole 3H3.

According to various embodiments of the present disclosure, the bezel 3 may include at least one through hole 3H41 to support one or more buttons that are equipped in the electronic device 100. The one or more buttons may be exposed to the outside through the at least one through through-hole 3H41.

According to various embodiments of the present disclosure, the bezel 3 may include a through-hole 3H42 to aid a card socket (e.g., a memory card socket or a subscriber identity module (SIM) card socket) that is equipped in the electronic device 100. A cover, which closes the through-hole 3H42, may be opened, and a card may be inserted into or removed from the card socket through the through-hole 3H42.

According to various embodiments of the present disclosure, the bezel 3 may include a plurality of cut-off portions 3P1, 3P2, 3P3, and 3P4. The bezel 3 may include a plurality of segmented sections 3P12, 3P13, 3P24, and 3P34 that are separated from a plurality of cut-off portions 3P1, 3P2, 3P3, and 3P4. When the bezel 3 is formed of a metal, a structure configured by the plurality of segmented sections 3P12, 3P13, 3P24, and 3P34 may suppress the degradation of the performance of an antenna that is equipped in the electronic device 100.

According to various embodiments of the present disclosure, at least one of the plurality of segmented sections 3P12, 3P13, 3P24, and 3P34 may be used as an antenna radiator that radiates radio waves by being directly supplied with a current.

According to various embodiments of the present disclosure, at least one of the plurality of segmented sections 3P12, 3P13, 3P24, and 3P34 may be used as an antenna radiator that radiates radio waves by being indirectly supplied with a current (e.g., by being electromagnetically supplied with a current from a power feeding unit).

According to various embodiments of the present disclosure, the front face F may be a three-dimensional face that includes a flat central region 1A and inclined regions 1A1, 1A2, 1A3, 1A4 that surround the central region 1A, in the direction from the rear face B toward the front face F of the electronic device 100 when viewed from a cross section. Alternatively, the front face F may be a three-dimensional face that includes a flat central region 2A and inclined regions 2A1, 2A2, 2A3, 2A4 that surround the central region 2A, in the direction from the rear face B toward the front face F of the electronic device 100 when viewed from a cross section. In particular, such a three-dimensional face may be defined herein as a 2.5-dimensional face.

Figure 3:
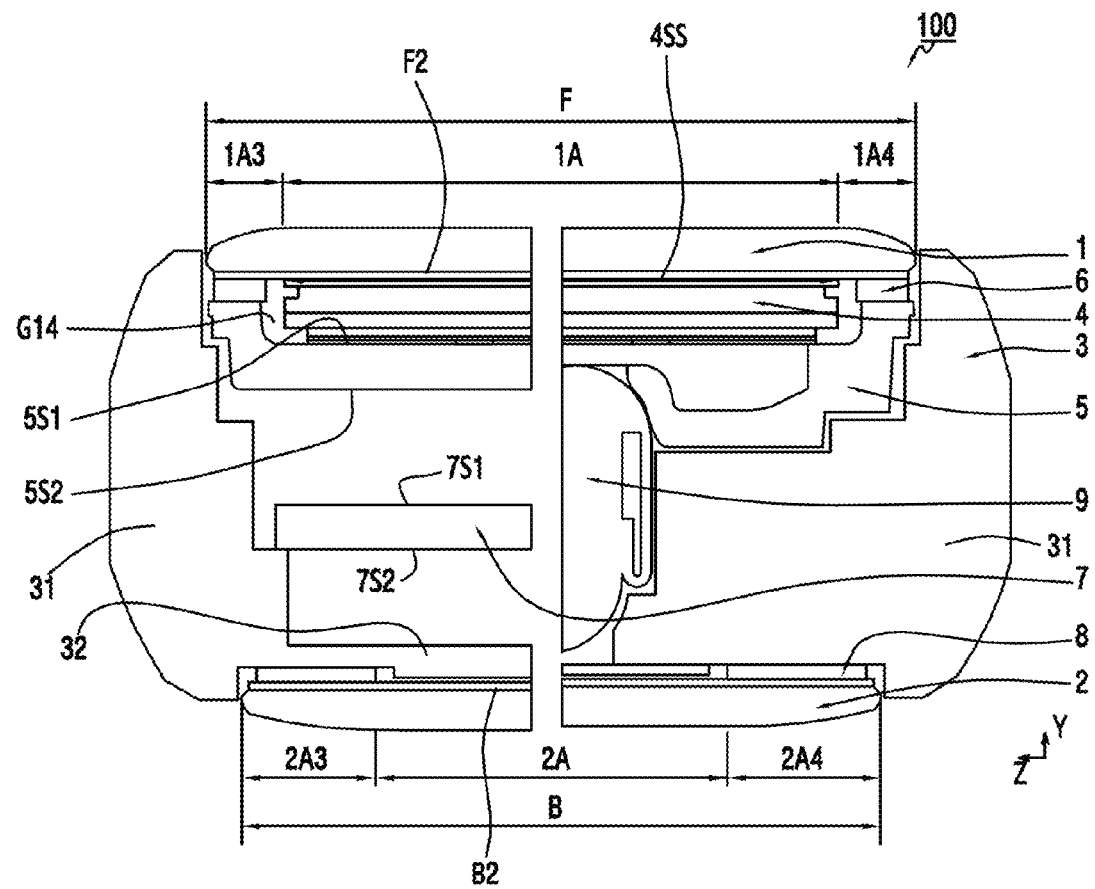
FIG. 3 illustrates a cross-sectional view of an electronic device according to an embodiment of the present disclosure.
Figure 4:
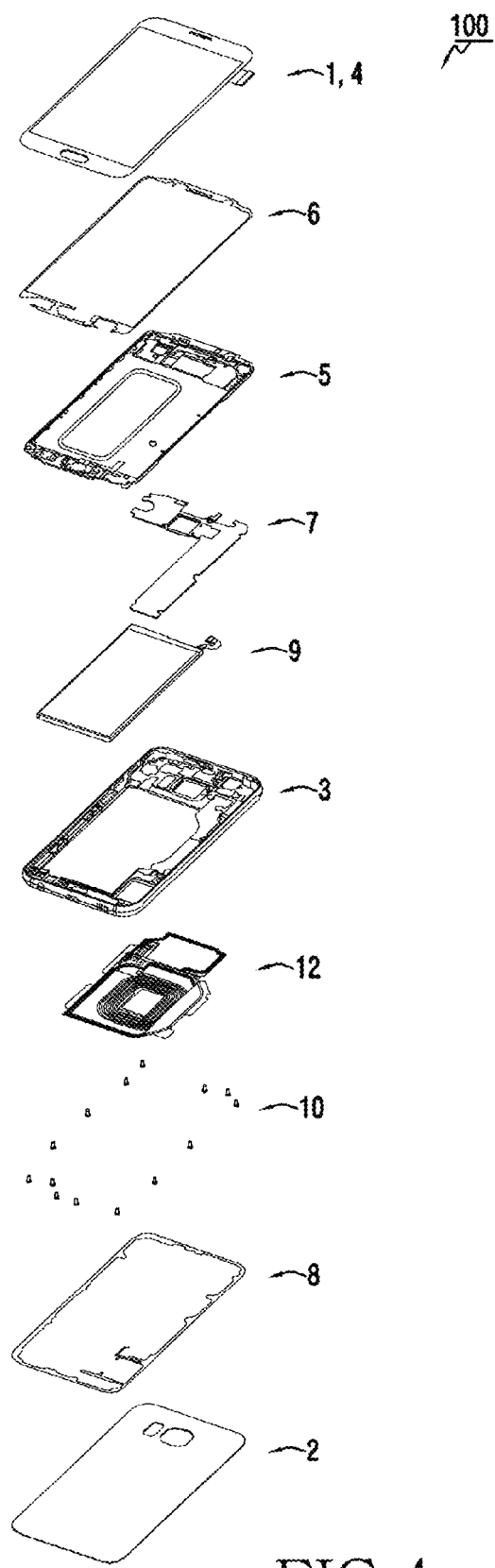
FIGS. 4 and 5 illustrate an electronic device from different directions according to various embodiments of the present disclosure.
Figure 5:
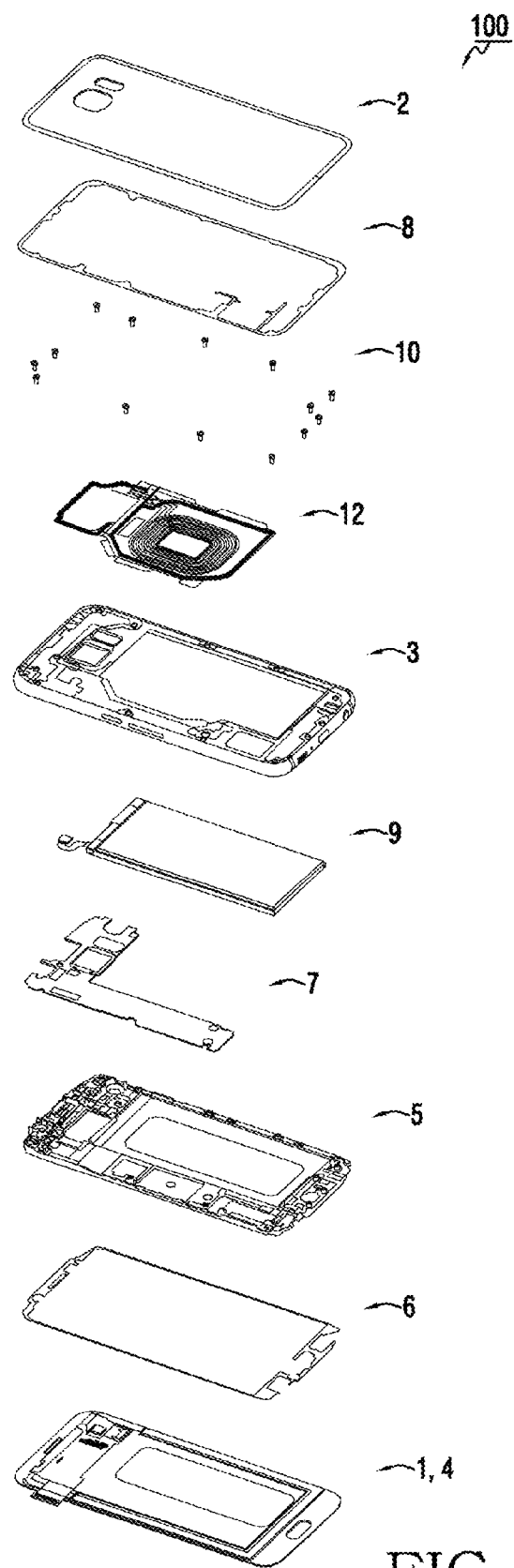
Figure 6A:
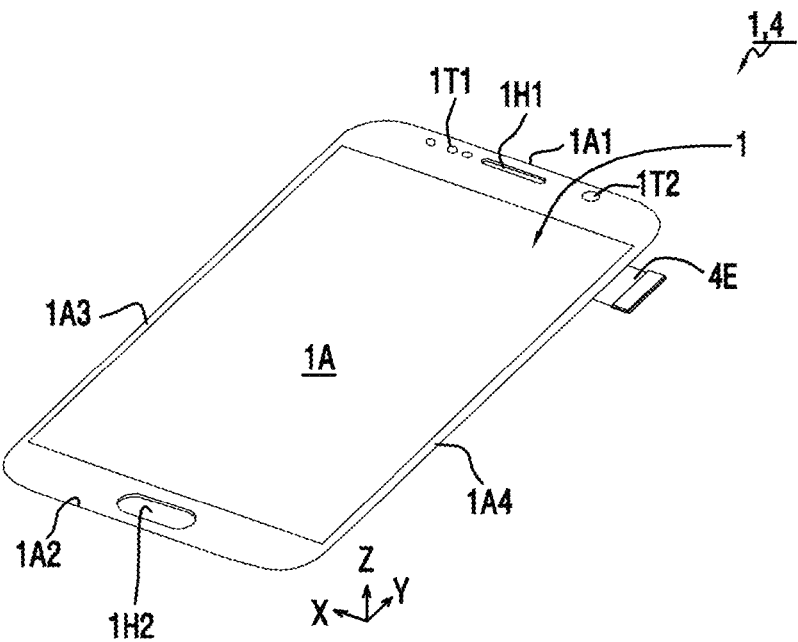
FIG. 6A illustrates a front cover and a display device according to an embodiment of the present disclosure.
Figure 6A:
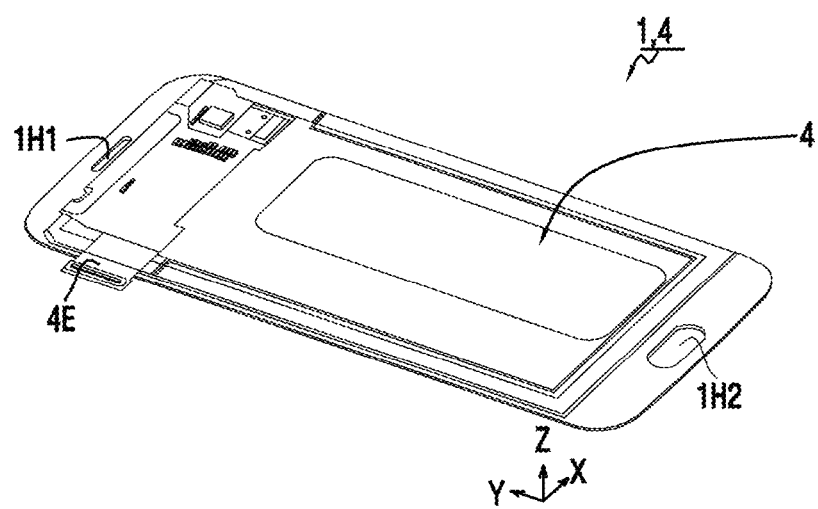
Figure 6B:
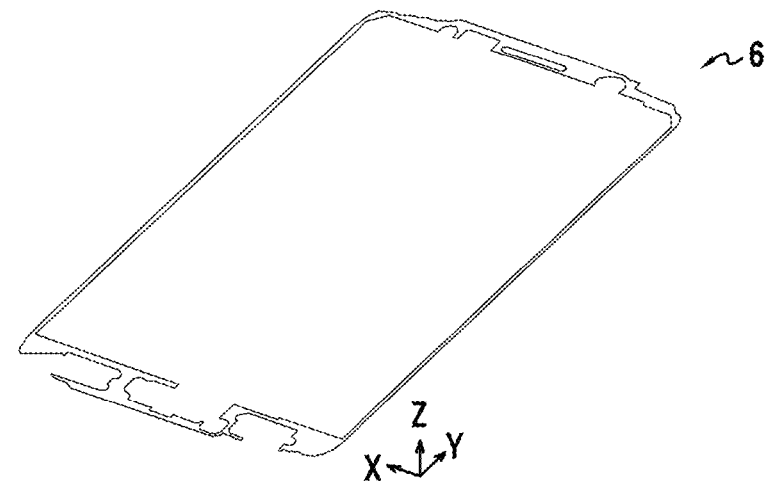
FIG. 6B illustrates an adhesive member according to an embodiment of the present disclosure.
Figure 6B:
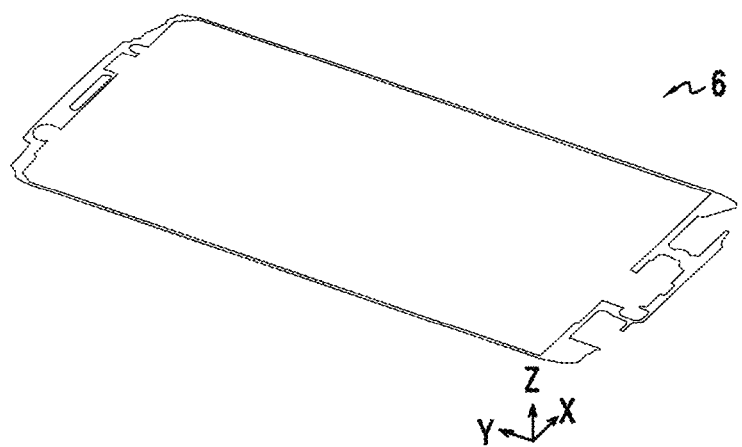
Figure 6C:
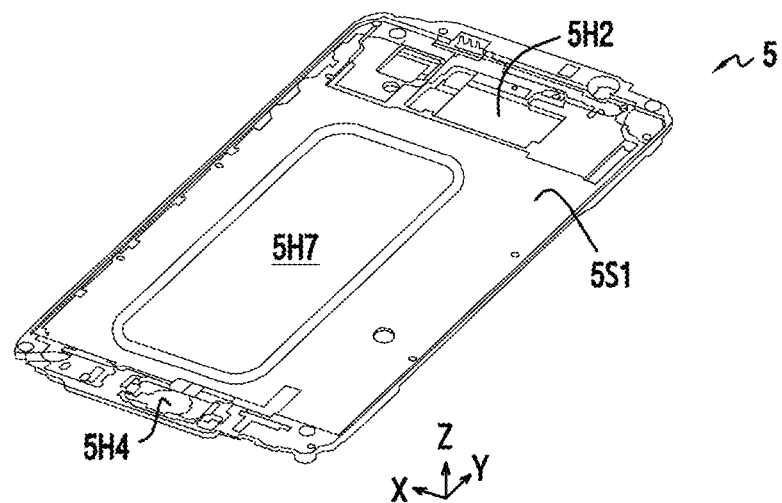
FIG. 6C illustrates a bracket according to an embodiment of the present disclosure.
Figure 6C:
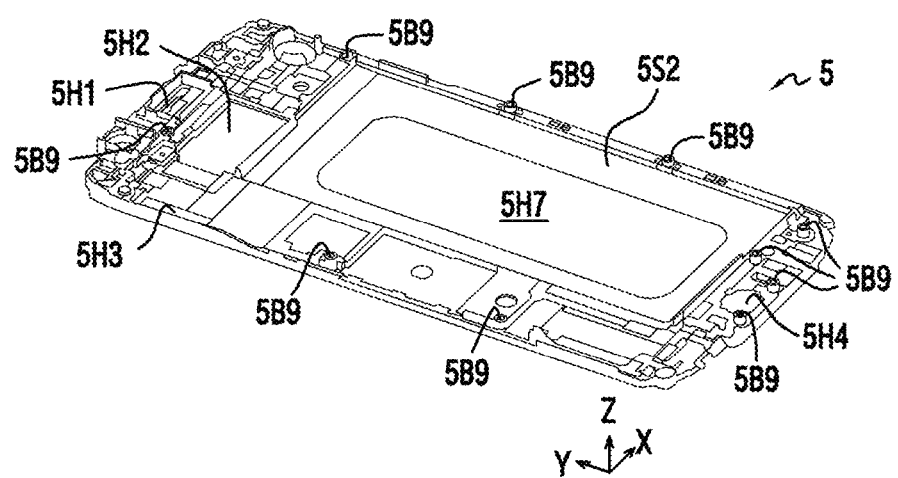
Figure 6D:
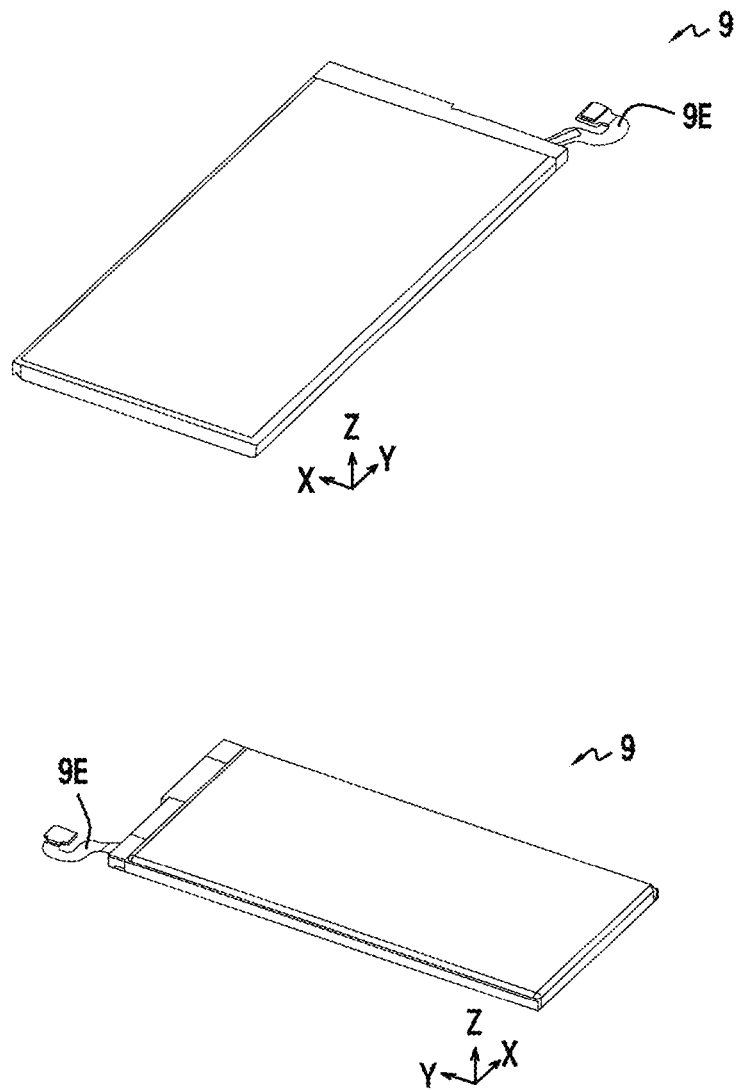
FIG. 6D illustrates a battery according to an embodiment of the present disclosure.
Figure 6E:
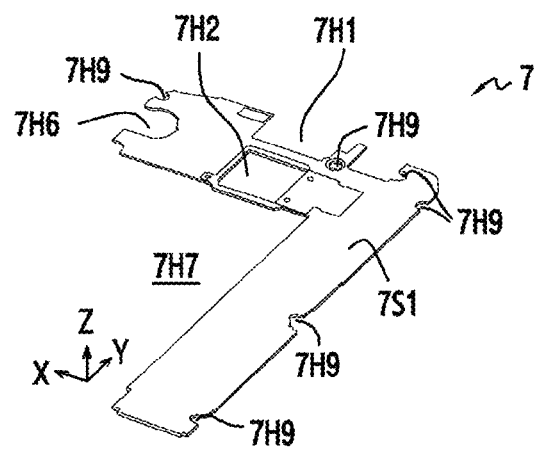
FIG. 6E illustrates a circuit board according to an embodiment of the present disclosure.
Figure 6E:
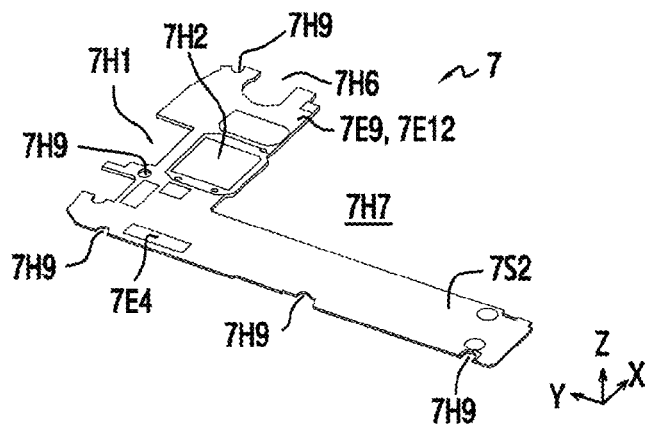
Figure 6E:
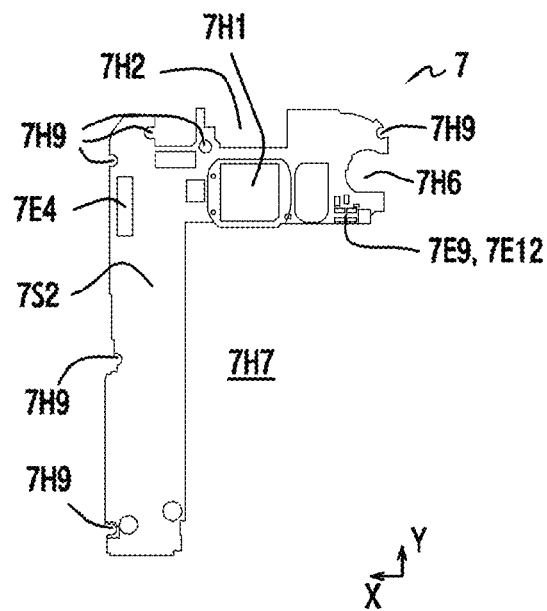
Figure 6F:
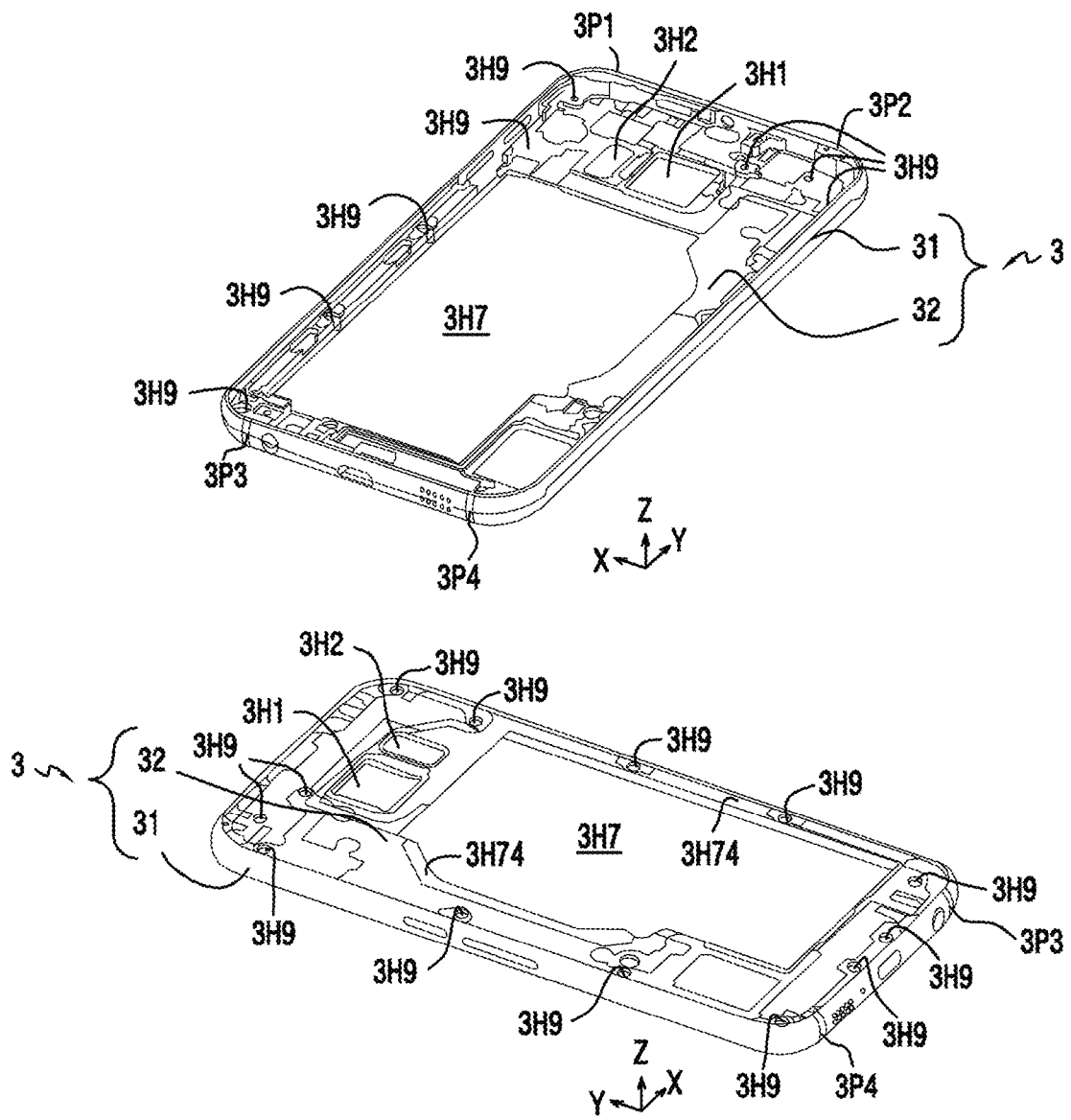
FIG. 6F illustrates a bezel according to an embodiment of the present disclosure.
Figure 6G:
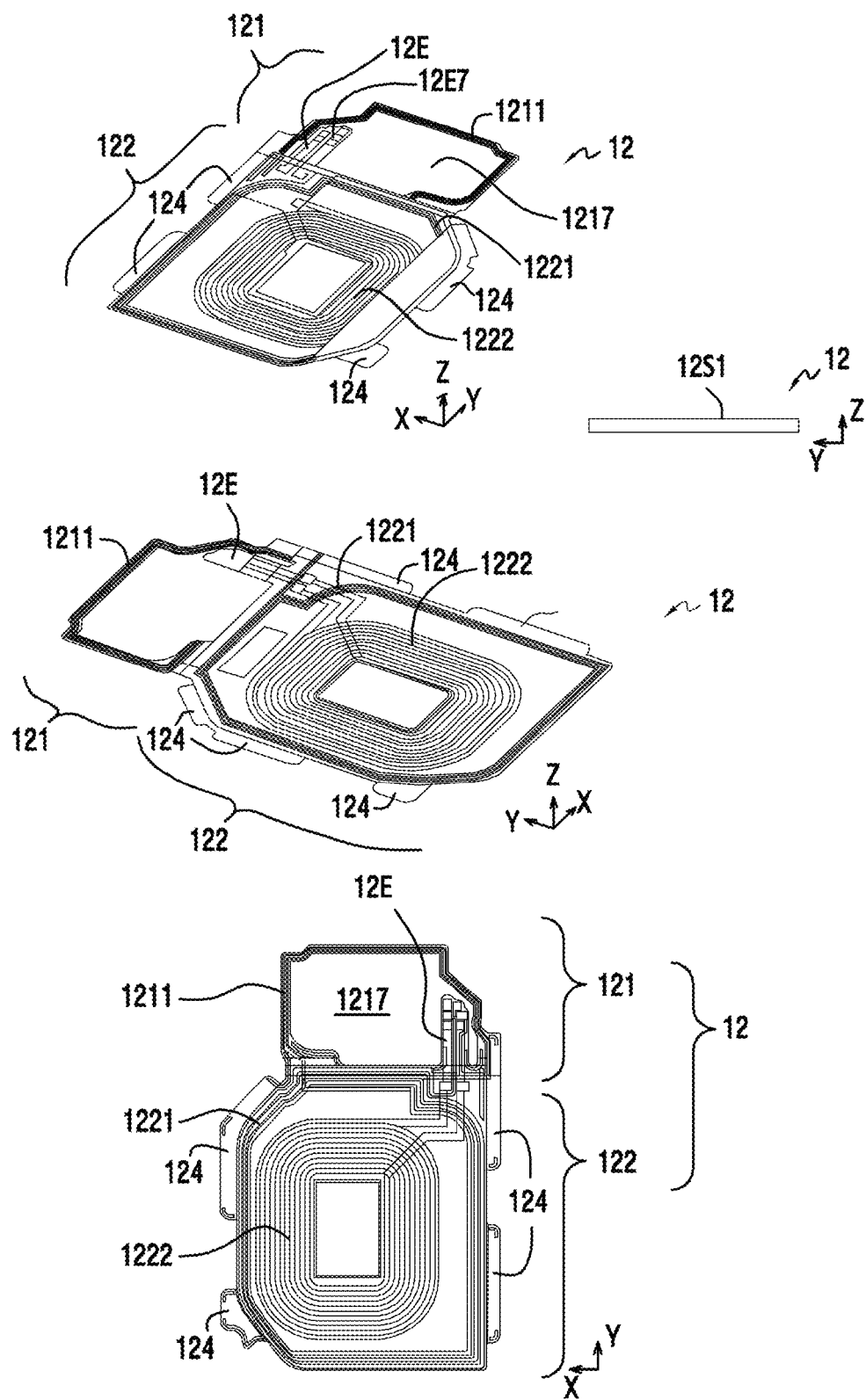
FIG. 6G illustrates an antenna device according to an embodiment of the present disclosure.
Figure 6H:
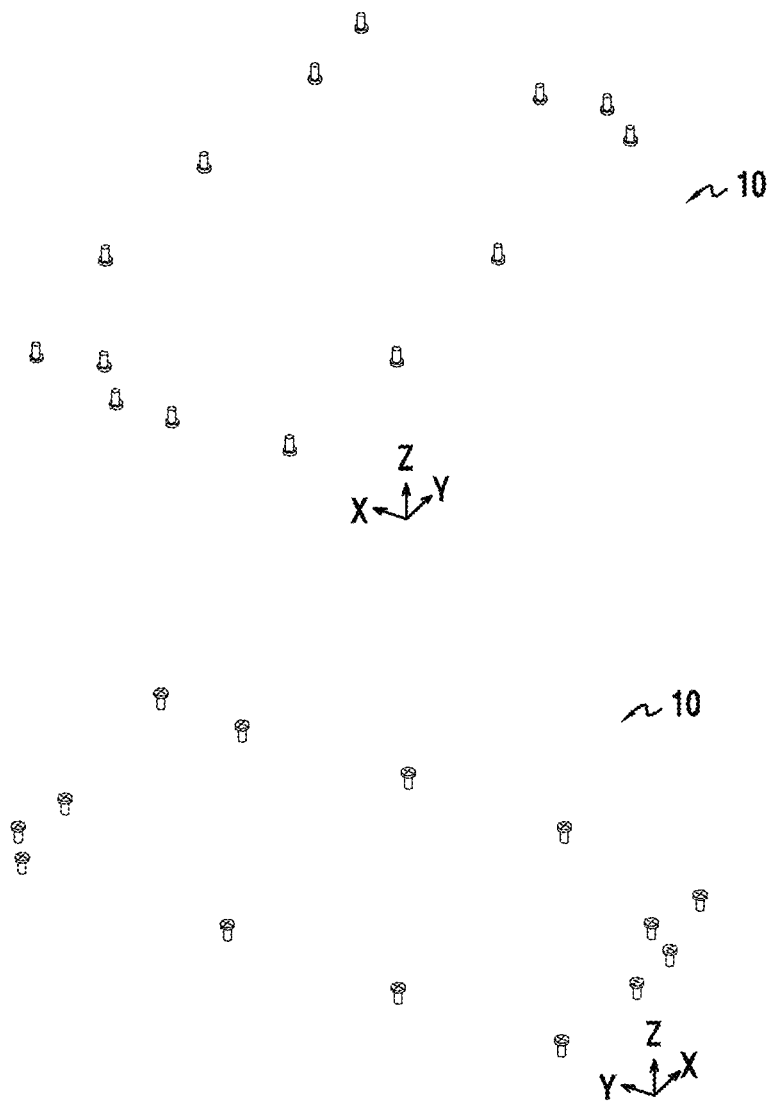
FIG. 6H illustrates bolts according to an embodiment of the present disclosure.
Figure 6I:
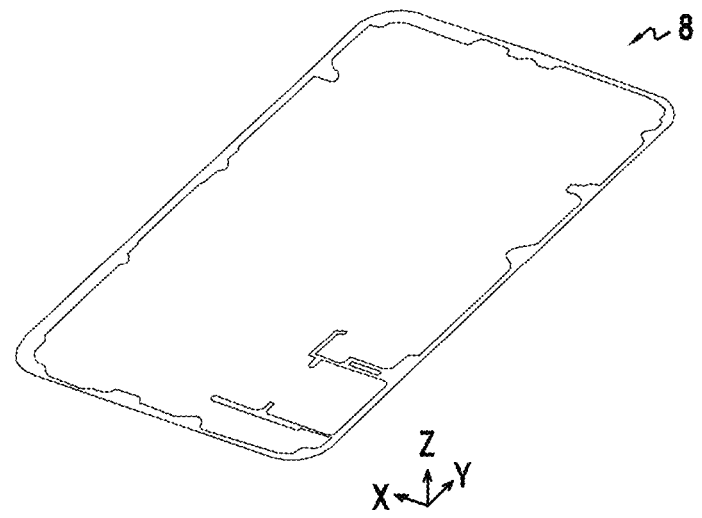
FIG. 6I illustrates an adhesive member according to an embodiment of the present disclosure.
Figure 6I:
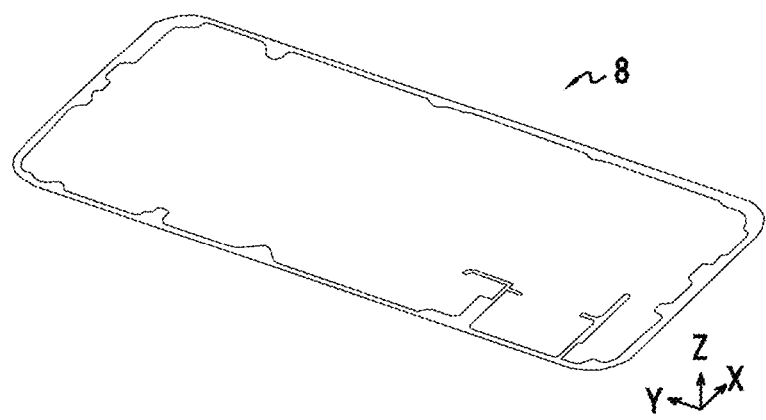
Figure 6J:
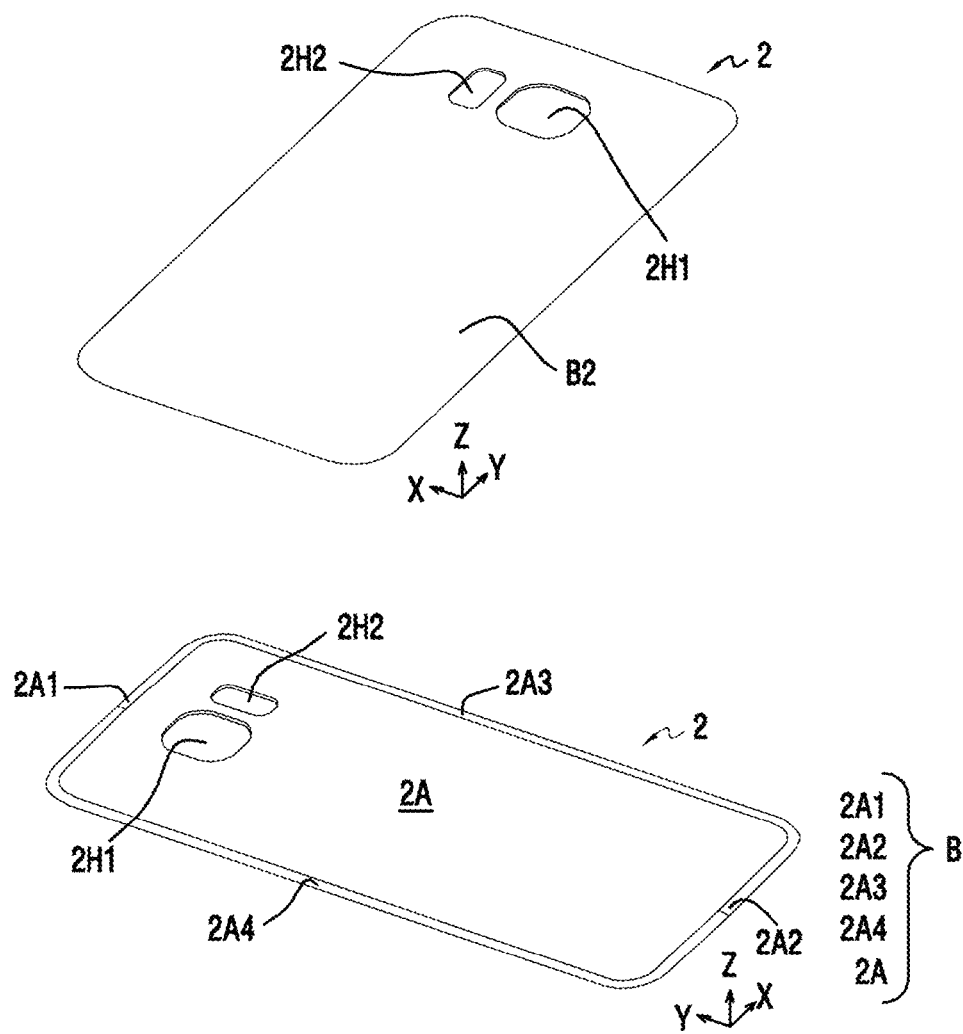
FIG. 6J illustrates a rear cover according to an embodiment of the present disclosure.

FIG. 3 illustrates a cross-sectional view of an electronic device 100 according to an embodiment of the present disclosure. FIGS. 4 and 5 illustrate an electronic device from different directions according to various embodiments of the present disclosure. FIG. 6A illustrates a front cover and a display device according to an embodiment of the present disclosure. FIG. 6B illustrates an adhesive member according to an embodiment of the present disclosure. FIG. 6C illustrates a bracket according to an embodiment of the present disclosure. FIG. 6D illustrates a battery according to an embodiment of the present disclosure. FIG. 6E illustrates a circuit board according to an embodiment of the present disclosure. FIG. 6F illustrates a bezel according to an embodiment of the present disclosure. FIG. 6G illustrates an antenna device according to an embodiment of the present disclosure. FIG. 6H illustrates bolts according to an embodiment of the present disclosure. FIG. 6I illustrates an adhesive member according to an embodiment of the present disclosure. FIG. 6J illustrates a rear cover according to an embodiment of the present disclosure.

Referring to FIGS. 3, 4, 5, and 6A, the front cover 1 has a substantially plate-like shape, and may be disposed on the display device 4. The front cover 1 may be transparent and may be resistant to impact.

According to an embodiment of the present disclosure, the front face F of the front cover 1 may include a first region 1A1, a second region 1A2, a third region 1A3, and a fourth region 1A4, and a central region 1A surrounded by the regions 1A1, 1A2, 1A3, and 1A4. Here, the central region 1A may be a substantially flat face. In addition, the first region 1A1, the second region 1A2, the third region 1A3, and the fourth region 1A4 may be inclined faces, and may be, for example, curved faces. In addition, the first region 1A1, second region 1A2, the third region 1A3, and the fourth region 1A4, and the central region 1A may be smoothly connected to each other.

According to an embodiment of the present disclosure, the front cover 1 may include an internal face F2 that is arranged within the electronic device 100, and positioned opposite to the front face F (i.e., the external face exposed to the outside). The internal face F2 may be a substantially flat face, but is not limited thereto.

According to an embodiment of the present disclosure, the display device 4 may be arranged within the space G14 formed by the front cover 1 and the bracket 5.

According to various embodiments of the present disclosure, the display device 4 may have a shape that corresponds to the internal face F2 of the front cover 1. Here, the display device 4 may be flexible, and may be arranged in a state in which it is deformed into a shape that corresponds to the internal face F2 of the front cover 1. For example, in the case where the internal face F2 of the front cover 1 is a curved face, the display device 4 may be arranged in a correspondingly curved shape.

According to an embodiment of the present disclosure, the display device 4 may include an extension 4E (e.g., a flexible printed circuit board (FPCB)) that is provided with a connector to be electrically connected to a circuit board 7.

According to an embodiment of the present disclosure, the display device 4 may include a liquid crystal display (LCD), an organic light-emitting diode (OLED) (in particular, an active matrix-OLED (AM-OLED)), or the like.

According to an embodiment of the present disclosure, the screen region 4SS of the display device 4 may overlap with the central region 1A of the front cover 1, and may not overlap with the first region 1A1, the second region 1A2, the third region 1A3, and the fourth region 1A4.

According to various embodiments of the present disclosure, the display device 4 may further include a touch panel. Alternatively, the display device 4 may further include a digitizer panel. A contact input or a non-contact input in relation to the touch panel or the digitizer panel may be aided through the central region 1A of the front cover 1.

According to various embodiments of the present disclosure, the display device 4 may be a display-integrated touch screen that receives a contact input or a non-contact input. For example, the display device 4 may be an AM-OLED-integrated touch screen (on-cell touch screen panel (TSP) AMOLED (OCTA)).

According to various embodiments of the present disclosure, the front cover 1 and the display device 4 may be provided to a manufacturing process of the electronic device 100 as one single set in the state where the front cover 1 and the display device 4 are coupled to each other.

According to various embodiments of the present disclosure, the front cover 1 includes one or more through-holes 1H1 and 1H2 and one or more transparent regions 1T1 and 1T2 as described above with reference to FIGS. 1 and 2.

Referring to FIGS. 3, 4, 5, and 6B, according to an embodiment of the present disclosure, the front cover 1 may be coupled to the bracket 5. For example, an adhesive member 6 may be arranged between one face F2 of the front cover 1 and the bracket 5. Here, the adhesive member 6 may overlap with the first region 1A1, the second region 1A2, the third region 1A3, and the fourth region 1A4 of the front cover 1, and may not overlap with the central region 1A of the front cover 1. The adhesive member 6 may have an approximately annular shape.

According to an embodiment of the present disclosure, the adhesive member 6 may be a double-sided tape (e.g., a polyethylene terephthalate (PET) double-sided tape), a liquid type adhesive, or the like.

According to various embodiments of the present disclosure, the adhesive member 6 may be exposed to the outside through the front cover 1, and may have a color. For example, the adhesive member 6 may have a color similar to that of the bezel 3. Alternatively, the adhesive member 6 may exhibit a metallic texture.

According to various embodiments of the present disclosure, at least a portion of the adhesive member 6 is formed of a conductive material, and may be used as a conducting line that electrically connects elements of the electronic device 100.

According to various embodiments of the present disclosure, at least a portion of the adhesive member 6 may be formed of an insulating material, and may insulate two elements of the electronic device 100 from each other.

According to various embodiments of the present disclosure, the adhesive member 6 may have an impact-resistant or vibration-resistant property. Accordingly, the adhesive member 6 may relieve an impact applied to the electronic device in order to prevent damage to the front cover 1.

Referring to FIGS. 3, 4, 5, and 6C, according to an embodiment of the present disclosure, the bracket 5 may be arranged between the display device 4 and the circuit board 7. The bracket 5 may provide a first face 5S1 and a second face 5S2, which are positioned opposite to each other, as electronic component mounting portions. The bracket 5 is a structure that is arranged adjacent to the display device 4 and the circuit board 7, and the first face 5S1 of the bracket 5 may be provided as a display device 4 mounting portion, and the second surface 5S2 of the bracket 5 may be provided as a circuit board 7 mounting portion.

According to various embodiments of the present disclosure, the first and second faces 5S 1 and 5S2 of the bracket 5 may have a recessed shape so as to allow the display device 4, the circuit board 7, or any other device (e.g., a speaker, a receiver, or vibrator) therein, and the display device 4, the circuit board 7, and any other device may be mounted without a gap by being fitted to the bracket 5.

According to various embodiments of the present disclosure, the bracket 5 may include a plurality of through-holes 5H1, 5H2, 5H3, and 5H4, and at least one electronic component is inserted into and arranged in each of the plurality of through-holes 5H1, 5H2, 5H3, and 5H4. One or more of the plurality of through-holes 5H1, 5H2, 5H3, and 5H4 may be arranged to correspond to the through-holes 1H1 and 1H2. Alternatively, at least one of the plurality of through-holes 5H1, 5H2, 5H3, and 5H4 (e.g., the through-hole 5H3) may be a portion in which the extension 4E may be arranged to electrically interconnect the display device 4 and the circuit board 7.

According to various embodiments of the present disclosure, an elastic body (e.g., sponge or rubber) (not illustrated) may be additionally arranged between the bracket 5 and the display device 4. The elastic body may take the form of a layer, a sheet, or a film (e.g., a single-sided tape or a double-sided tape). In addition, the elastic body may serve to enhance the binding force between the bracket 5 and the display 4 in the set, and to protect the display device 4.

According to various embodiments of the present disclosure, the bracket 5 may impart rigidity to the electronic device 100. In addition, the bracket 5 may shield radio waves or block electric noise, or may be used as a heat radiation plate that prevents electronic components from being heated.

According to various embodiments of the present disclosure, the bracket 5 may be formed of a metal, such as magnesium Mg, aluminum Al, or stainless steel STS. Alternatively, the bracket 5 may be formed of a non-metal. For example, the bracket 5 may be formed of a high rigid plastic that contains glass fibers. Alternatively, the bracket 5 may include both the metal and non-metal (plastic). In addition, the bracket 5 may be coated with a material that shields radio waves.

According to various embodiments of the present disclosure, the bracket 5 may additionally provide an available space. The available space may be used for mounting a component. Alternatively, the available space may be used as a space to cope with a deformation of a component. For example, when swelling of a battery 9 occurs, the increased volume of the battery 9 may occupy the available space, thereby preventing the deformation of the battery 9 from adversely affecting any other portion. Such an available space may be formed by a recess or a perforated portion 5H7.

According to various embodiments of the present disclosure, the bracket 5 may further include an additional member, such as a metal or a composite material. Such an additional member may improve the rigidity of the bracket 5. Such an additional member may be installed within the above-mentioned available space.

According to various embodiments of the present disclosure, the bracket 5 may further include an auxiliary device to improve a thermal characteristic, an antenna characteristic, or the like.

Referring to FIGS. 3, 4, 5, and 6E, according to an embodiment of the present disclosure, the circuit board 7 may configure electric circuits that interconnect a plurality of electronic components that are mounted on a first face 7S1 and/or a second face 7S2 thereof. The circuit board 7 may set an execution environment for the electronic device 100, may maintain information for the execution environment, and may support data input/output and data exchange of the devices within the electronic device 100. The circuit board 7 may be arranged in a state of being coupled to the bracket 5. The circuit board 7 may include a main board, a mother board, a printed circuit board (PCB), or a printed board assembly (PBA).

According to an embodiment of the present disclosure, the first face 7S1 of the circuit board 7 may face the second face 5S2 of the bracket 5, and the second face 5S2 of the bracket 5 may provide a space that may receive electronic components (not illustrated) mounted on the first face 7S1 of the circuit board 7. A space may be provided between the second face 7S2 of the circuit board 7 and the bezel 3, and the electronic components mounted on the second surface 7S2 of the circuit board 7 may be received in the space.

According to various embodiments of the present disclosure, the circuit board 7 may include an empty space 7H7 that does not overlap with the battery 9 that is arranged between the bracket 5 and the bezel 3. The circuit board 7 may have a substantially "L" shape formed by two intersecting rectangular shapes.

According to various embodiments of the present disclosure, the circuit board 7 may include one or more through-holes 7H1, 7H2, and 7H6, and one or more electronic components (e.g., a camera, a speaker, or a receiver) may be inserted into and arranged in the through-holes 7H1, 7H2, and 7H6.

According to various embodiments of the present disclosure, the circuit board 7 may include a connector 7E4 that is arranged on the second face 7S2. The connector 7E4 may be electrically connected to the connector of the extension 4E of the display device 4.

According to various embodiments of the present disclosure, the circuit board 7 may include a plurality of contacts 7E9 arranged on the second face 7S2, and the contacts 7E9 may be electrically connected to the extension 9E of the battery 9.

According to various embodiments of the present disclosure, the circuit board 7 may include a plurality of contacts 7E12 arranged on the second face 7S2, and the contacts 7E12 may be electrically connected to an extension 12E7 of the antenna device 12.

According to various embodiments of the present disclosure, there may be a plurality of electronic components that are not installed on the circuit board 7 (e.g., an antenna device, a sound device, a power supply device, or a sensor device). The plurality of electronic components may be installed on the bracket 5 or the bezel 3. Alternatively, the plurality of electronic components may be installed in a space between the bracket 5 and the bezel 3.

Referring to FIGS. 3, 4, 5, and 6F, according to an embodiment of the present disclosure, the bezel 3 may be formed in a container shape that is opened substantially in a direction from the rear face B toward the front face F, and may be connected to the bracket 5 to form an entire frame of the electronic device 100. The electronic components (e.g., the display device 4 and the circuit board 7) may exist within the electronic device 100 by being mounted on the frame structure formed by the bezel 3 and the bracket 5. The bezel 3 may include a first part 31 that forms an external face (e.g., a side face) of the electronic device 100, and a second part 32 that extends from the first part 31 and is arranged between the bracket 5 and the rear cover 2. The first part 31 may have a shape that is mated with the bracket 5 so that the bracket 5 may be mounted on the bezel 3 without a gap. The second part 32 may have a shape that covers the first face 5S2 of the bracket 5, and the inner face thereof may be smooth as illustrated, but may have various concave-convex shapes without being limited thereto. For example, the inner face of the second part 32 may include at least one rib that extends to the bracket 5, and the rib may serve to support the bracket 5. In addition, the inner face of the second part 32 may include at least one rib that extends to the circuit board 7, and the rib may serve to support the circuit board 7.

According to various embodiments of the present disclosure, the second part 32 of the bezel 3 may include one or more through-holes 3H1 and 3H2, and one or more electronic components (e.g., a card socket, a camera, or a flash), which are mounted on the second face 7S2 of the circuit board 7, may be inserted into the through-holes 3H1 and 3H2. The one or more through-holes 3H1 and 3H2 may be arranged to correspond to the through-holes 2H1 and 2H2 of the rear cover 2.

According to various embodiments of the present disclosure, the bezel 3 may additionally provide an available space. The available space may be used for mounting a component. Alternatively, the available space may be used as a space to cope with a deformation of a component. For example, when swelling of the battery 9 occurs, the increased volume of the battery 9 may occupy the available space, thereby preventing the deformation of the battery 9 from adversely affecting any other portion. The available space may include a recess or a perforated portion 3H7.

According to various embodiments of the present disclosure, as described above with reference to FIGS. 1 and 2, the bezel 3 may include a plurality of cut-off portions 3P1, 3P2, 3P3, and 3P4 in order to prevent the degradation of antenna performance.

According to various embodiments of the present disclosure, the bezel 3 may include a conductive material, and may be configured to be electrically conducted with the ground face of the circuit board 7. For example, the inner face of the second part 32 of the bezel 3 may be coated with a conductive material. The electric conduction between the conductive material of the bezel 3 and the ground face of the circuit board 7 may be caused by bringing the rib of the second part 32 to be in contact with the ground face of the circuit board 7. Here, the rib of the second part 32 may include a conductive rubber gasket to cause the rib to be in elastic contact with the ground face of the circuit board 5. Alternatively, an elastic means (e.g., a metal spring terminal) may be arranged between the rib of the second part 32 and the ground face of the circuit board 5, and the conductive elastic means may electrically interconnect the conductive material coated on the second part 32 and the ground face of the circuit board 5. The conductive material of the second part 32 may be used as an additional ground return path for the circuit board 5.

According to various embodiments of the present disclosure, the bezel 3 may further include an additional member, such as a metal or a composite material. The additional member may improve the rigidity of the bezel 3. The additional member may be installed in the above-mentioned available space.

According to various embodiments of the present disclosure, the bezel 3 may further include an auxiliary device for improving a thermal characteristic, an antenna characteristic, or the like.

Referring to FIGS. 4, 5, 6C, 6E, 6F, and 6H, according to various embodiments of the present disclosure, the bezel 3, the circuit board 7, and the bracket 5 may be connected with each other. For example, the bezel 3 may include a plurality of bolt holes 3H9 for bolting. The circuit board 7 may include a plurality of bolt holes 7H9 for bolting. In addition, the bracket 5 may include a plurality of bosses 5B9 for bolting. A plurality of bolts 10 may be inserted through the plurality of bolt holes 3H9 of the bezel 3 and then through the plurality of bolt holes 7H9 of the circuit board 7 to be fixed to the plurality of bosses 5B9 of the bracket 5. As a result, the bezel 3, the circuit board 7, and the bracket 5 may be connected with each other.

Referring to FIGS. 3, 4, 5, and 6J, according to an embodiment of the present disclosure, the rear cover 2 may have a substantially plate-like shape that is capable of being coupled to the second part 32 of the bezel 3, and may form the rear face B of the electronic device 100. For example, the second part 32 of the bezel 3 may have a recess shape that allows the rear cover 2 to be seated therein, and the rear cover 2 may be mounted without a gap by being fitted to the second part 32 of the bezel 3.

According to an embodiment of the present disclosure, the rear face B of the rear cover 2 may include a first region 2A1, a second region 2A2, a third region 2A3, and a fourth region 2A4, and a central region 2A that is surrounded by the regions 2A1, 2A2, 2A3, and 2A4. Here, the central region 2A may be a substantially flat face. In addition, the first region 2A1, the second region 2A2, the third region 2A3, and the fourth region 2A4 may be inclined faces and may be, for example, curved faces. The first region 2A1, the second region 2A2, the third region 2A3, and the fourth region 2A4, and the central region 2A may be smoothly connected to each other.

According to an embodiment of the present disclosure, the rear cover 2 may include an internal face B2 that is arranged within the electronic device 100, and positioned opposite to the rear face B (i.e., the external face exposed to the outside). The internal face B2 may be substantially flat, but is not limited thereto. For example, the internal face B2 may have a shape that corresponds to that of the second part 32 of the bezel 3.

According to various embodiments of the present disclosure, the central region 2A of the rear cover 2 may have a shape that completely overlaps with that of the central region 1A of the front cover 1 or a shape that is different from that of the central region 1A of the front cover 1.

According to various embodiments of the present disclosure, the rear cover 2 may include a transparent layer. The transparent layer may be molded with a plastic material, such as impact-resistant acryl, or a glass material. For example, the transparent layer may be molded with a tempered glass.

According to various embodiments of the present disclosure, the rear cover 2 may have a color. For example, the above-mentioned transparent layer may be colored to express various colors. Alternatively, the rear cover 2 may further include a color layer that contains a dye, a pigment, a coloring matter, a fluorescent material, or a phosphorescent material that develops a predetermined color.

According to various embodiments of the present disclosure, the rear cover 2 may further include a plastic film. The plastic film may be formed of a material that is thermally stable and excellent in mechanical strength. For example, the plastic film may be a PET film, a polycarbonate (PC) film, a polyethylene (PE) film, or a polypropylene (PP) film.

According to various embodiments of the present disclosure, the rear cover 2 may further include a pattern layer. The pattern layer may include various patterns (e.g., a flat face pattern or an input pattern) that are formed by being attached additionally or printed. For example, the pattern layer may be formed through ultraviolet (UV) molding. Such a pattern layer may be formed to a metallic texture when external light is irradiated thereto. For example, the patterns of the pattern layer may express a hairline. In particular, the pattern layer may be arranged inside the rear cover 2, and due to the thickness of the transparent layer, the patterns of the pattern layer may look three-dimensional through the transparent layer.

According to various embodiments of the present disclosure, the rear cover 2 may further include a metal layer. The metal layer may be formed through vapor deposition (e.g., physical vapor deposition (PVD) or chemical vapor deposition (CVD)) or coating of a metal (e.g., Sn, Al, Si, Ti, TiC, TiN, TiCB, or $Al_2O_3$). The metal layer may be irradiated by external light so as to express a metallic texture. In addition, the metal layer is arranged inside the rear cover 2, and due to the thickness of the transparent layer, the metal layer may look three-dimensional through the transparent layer.

According to various embodiments of the present disclosure, the rear cover 2 may further include a light shielding layer. The light shielding layer may contain a black component that absorbs light without reflecting the light. The light shielding layer may be a layer that is printed with a black color. Alternatively, the light shielding layer may be an adhesive that contains a black component.

According to various embodiments of the present disclosure, the front cover 1 may be obtained by adding at least one of the color layer, the plastic film, the pattern layer, the metal layer, and the light shielding layer to the transparent layer. For example, the regions 1A1 and 1A2 of the front cover 1 may express a metallic texture, which may be expressed when the metal layer is applied thereto.

According to various embodiments of the present disclosure, the electronic device 100 may additionally provide an electronic component that uses the rear cover 2. For example, a display may be added, and a display image may appear to the outside through the rear cover 2. Alternatively, a touch panel may be added, and the rear face B of the rear cover 2 may be applied as a face for a touch input or a hovering input.

Referring to FIGS. 3, 4, 5, and 6I, according to an embodiment of the present disclosure, the adhesive member 8 may be arranged between the internal face B2 of the rear cover 2 and the bezel 3. Here, the adhesive member 8 may overlap with the first region 2A1, the second region 2A2, the third region 2A3, and the fourth region 2A4 of the rear cover 2, but may not overlap with the central region 2A of the rear cover 2. The adhesive member 8 may have an approximately annular shape.

According to various embodiments of the present disclosure, the adhesive member 8 may be a double-sided tape (e.g., a PET double-sided tape), or a liquid type adhesive.

According to various embodiments of the present disclosure, the adhesive member 8 may have an impact-resistant property or a vibration-resistant property. The adhesive member 8 may relieve an impact applied to the electronic device, thereby preventing damage to the rear cover 2.

Referring to FIGS. 3, 4, 5, and 6G, according to an embodiment of the present disclosure, the antenna device 12 may be arranged between the rear cover 2 and the bezel 3. For example, the antenna device 12 may take the form of film (e.g., FPCB), and may be bonded to one face of the bezel 3. In particular, at least a portion of the peripheral edge of the antenna device 12 may be installed on the periphery of the perforated portion 3H7 of the bezel 3, and the antenna device 12 may block at least a portion of the perforated portion 3H7 of the bezel 3. Here, the antenna device 12 may be arranged adjacent to the rear cover 2. One end 12E of the antenna device 12 may include a plurality of contacts, and may be electrically connected to the plurality of contacts 7E12 of the circuit board 7.

According to various embodiments of the present disclosure, the antenna device 12 may include an extension 124 that extends at least a portion of the periphery thereof. At least one extension 124 may be coupled to a recess or a seating portion 3H74 that is formed in at least a portion of the periphery of the perforated portion 3H7 of the bezel 3.

According to various embodiments of the present disclosure, the antenna device 12 may include a plurality of antennas. For example, the antenna device 12 may include two regions 121 and 122 for installing antennas. A first antenna 1211 may be installed in a first region 121. In addition, a second antenna 1221 and a third antenna 1222 may be installed in a second region 122. Here, the first antenna 1211, the second antenna 1221, and the third antenna 1222 may be arranged in parallel to each other so that the interference therebetween may be reduced.

According to various embodiments of the present disclosure, the first region 121 may be an annular portion that includes the perforated portion 1217, and antenna radiators of the first antenna 1211, which radiate radio waves, may be arranged annularly. In addition, the antenna radiators of the second antenna 1221, which radiate radio waves, may be arranged annularly, and the radiators of the third antenna 1222, which radiate radio waves, may be arranged inside the second antenna 1221.

According to various embodiments of the present disclosure, the first antenna 1211, the second antenna 1221, and the third antenna 1222 may be installed on the same face 12S1 of the antenna device 12.

According to various embodiments of the present disclosure, the antenna device 12 may include an extension 12E that extends to the inside of the perforated portion 1217, and the extension 12E may include a plurality of contacts 12E7 that are electrically connected to the first antenna 1211, the second antenna 1221, and the third antenna 1222. Here, the plurality of contacts 12E7 may be electrically connected to the circuit board 7.

According to various embodiments of the present disclosure, the first antenna 1211, the second antenna 1221, and the third antenna 1222 may be used for different functions, respectively. For example, the first antenna 1211 may be used for near field communication (NFC). The second antenna 1221 may be used for magnetic security transmission (MST). In addition, the third antenna 1222 may be used for a wireless charge module.

FIGS. 3, 4, 5, 6C, 6D, and 6F, according to an embodiment of the present disclosure, the battery 9 supplies power to the electronic device 100, and may have a substantially plate-like shape to be arranged between the bracket 5 and the bezel 3. That is, the battery 9 may be arranged between the perforated portion 5H7 of the bracket 5 and the perforated portion 3H7 of the bezel 3. A first face of the battery 9 may face the display device 4 through the perforated portion 5H7 of the bracket 5, and a second face of the battery 9 may face the antenna device 12 through the perforated portion 3H7 of the bezel 3. As described above, the perforated portion 5H7 of the bracket 5 and the perforated portion 3H7 of the bezel 3 may serve to prevent deformation and damage to the peripheral portion due to the swelling of the battery 9.

According to various embodiments of the present disclosure, a first end 9E of the battery 9 may include a contact, and the contact may be electrically connected to the contact 7E9 of the circuit board 7.

Figure 7:
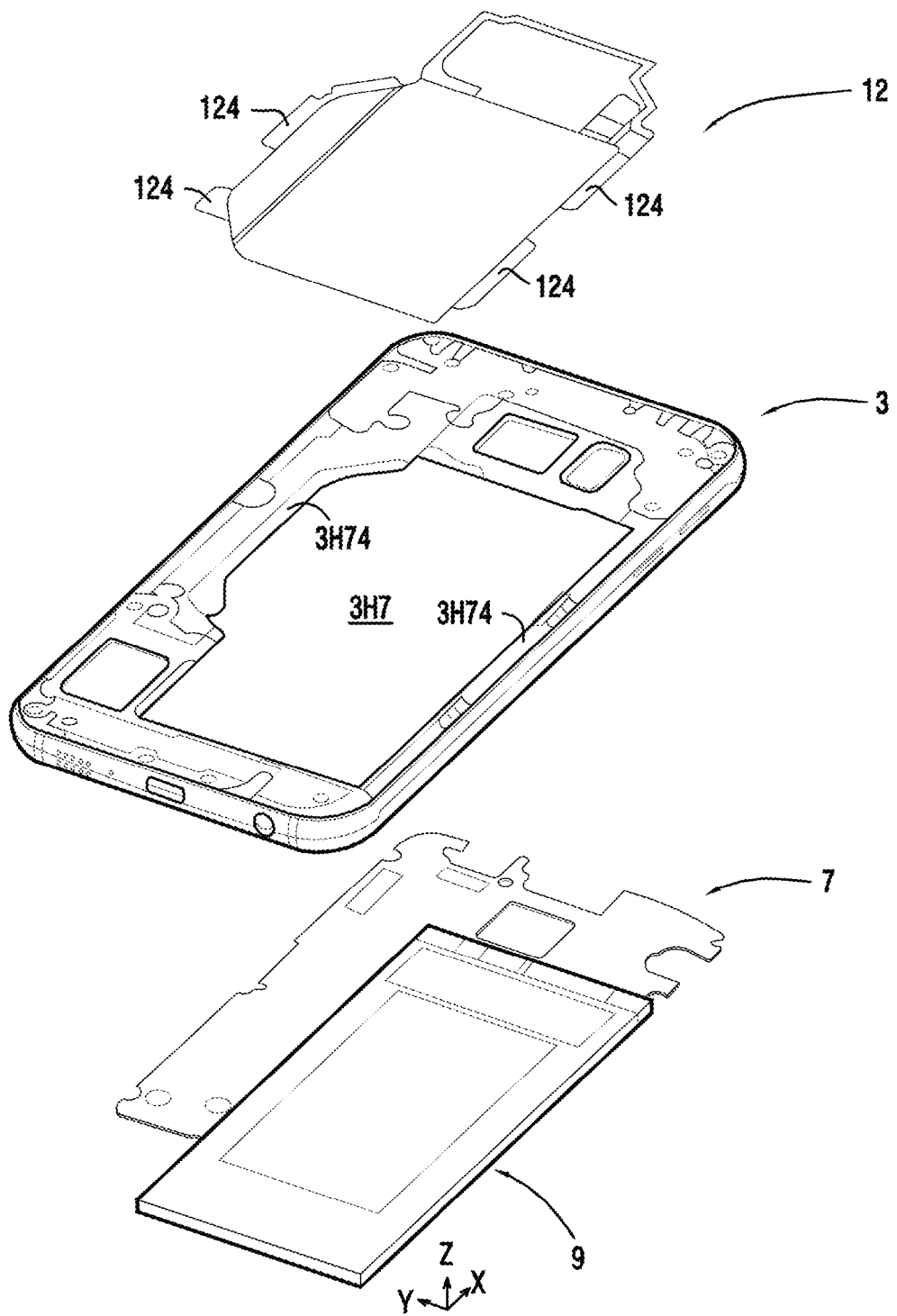
FIGS. 7 and 8 illustrate coupling among an antenna device, a bezel, a battery, and a circuit board according to an embodiment of the present disclosure.
Figure 8:
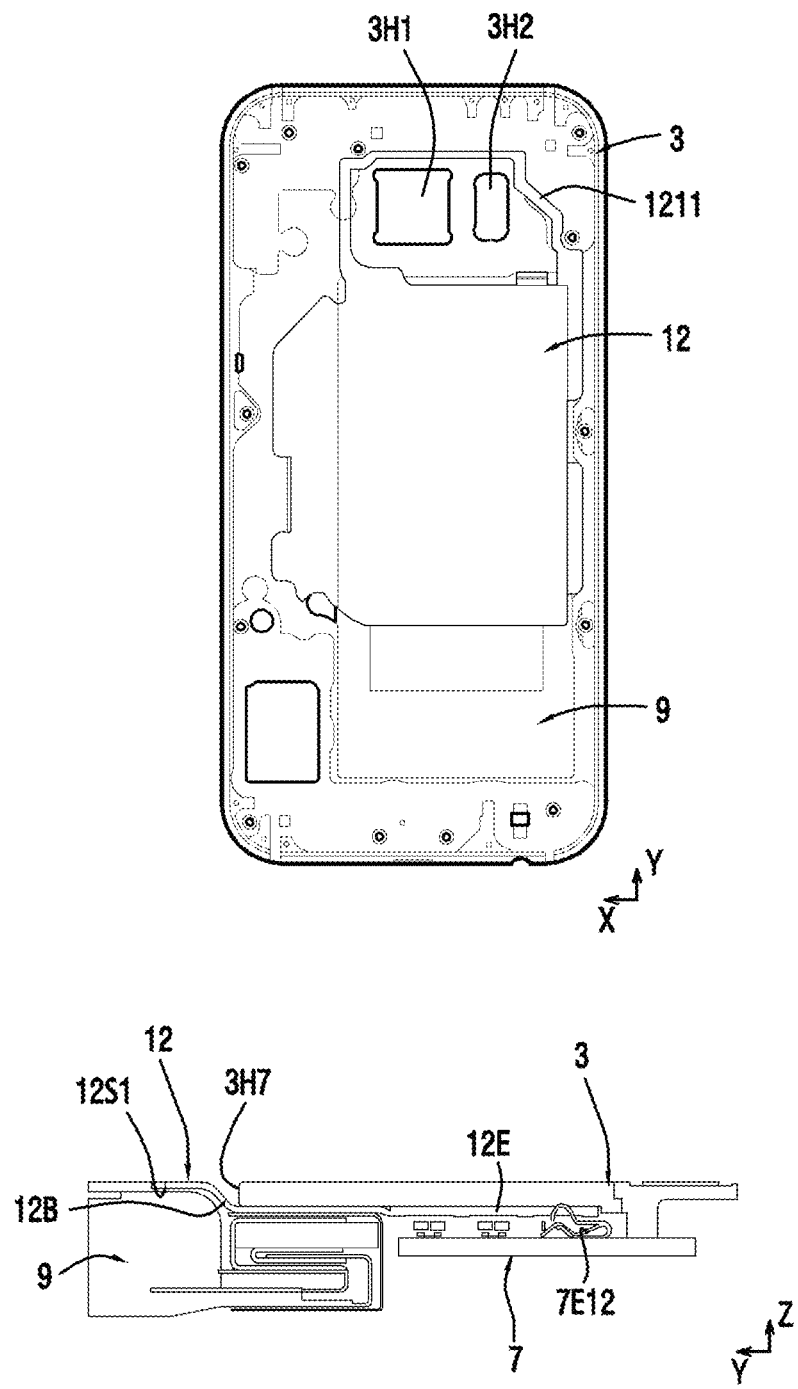

FIGS. 7 and 8 illustrate coupling among an antenna device, a bezel, a battery, and a circuit board according to an embodiment of the present disclosure.

Referring to FIGS. 7 and 8, extensions 124 of the antenna device 12 are coupled to recesses or seating portions 3H74 formed in the periphery of the perforated portion 3H7 of the bezel 3, and the antenna device 12 may cover at least a portion of the perforated portion 3H7 of the bezel 3. In addition, the battery 9 may be fitted to the perforated portion 3H7 of the bezel 3 in a form of being enclosed by the film type antenna device 12. Here, since the antenna device 12 is flexible, a portion 12B of the antenna device 12 may be in a bent state. In addition, a plurality of antennas of the antenna device 12 (the antennas 1211, 1221, and 1222 in FIG. 6G) may be installed on the first surface 12S1 of the antenna device 12, which faces the battery 9. The above-mentioned installation structure, in which the battery 9 is fitted to the perforated portion 3H7 of the bezel 3, may provide an effect of reducing the thickness of the electronic device 100. In addition, when the electronic device 100 drops to be impacted, the impact to the battery 9 is blocked by the antenna device 12 so that the impact cannot be transferred to the rear cover 2 and damage to the rear cover 2 can be prevented.

According to various embodiments of the present disclosure, the first antenna 1211 may be arranged to avoid the through-holes 3H1 and 3H2 of the bezel 3, which are provided for a camera and a flash. Here, the through-holes 3H1 and 3H2 of the bezel 3 may overlap with the perforated portion 1217 of the antenna device 12.

According to various embodiments of the present disclosure, the extension 12E of the antenna device 12 may be arranged between the bezel 3 and the circuit board 7 through the perforated portion 3H7 of the bezel 3, and may be in electrical contact with the contact 7E12 of the circuit board 7.

According to various embodiments of the present disclosure, the contact 7E12 of the circuit board 7 may include a fixing portion (not illustrated) that is coupled to the circuit board 7 and a free end (not illustrated) that extends from the fixing portion. The free end may elastically sag under the support of the fixing portion. In addition, the extension 12E of the antenna device 12 may include a contact (the contact 12E7 in FIG. 6G). In the case where the extension 12E of the antenna device 12 is arranged between the bezel 3 and the circuit board 7 though the perforated portion 3H7 of the bezel 3, the contact 12E7 of the extension 12E of the antenna device 12 may come in contact with the free end of the contact 7E12 of the circuit board 7. That is, the contact 12E7 of the extension 12E of the antenna device 12 may be arranged between the bezel 3 and the contact 7E12 of the circuit board 7. The free end of the contact 7E12 of the circuit board 7 may sag toward the circuit board 7 while elastically compressing the contact 12E7 of the extension 12E of the antenna device 12. Here, the free end of the contact 7E12 of the circuit board 7 may not directly compress one face of the bezel 3 that faces the circuit board 7, i.e. the face of the bezel 3, on which the extension 12E of the antenna device 12 is arranged, due to the extension 12E of the antenna device 12.

Figure 9:
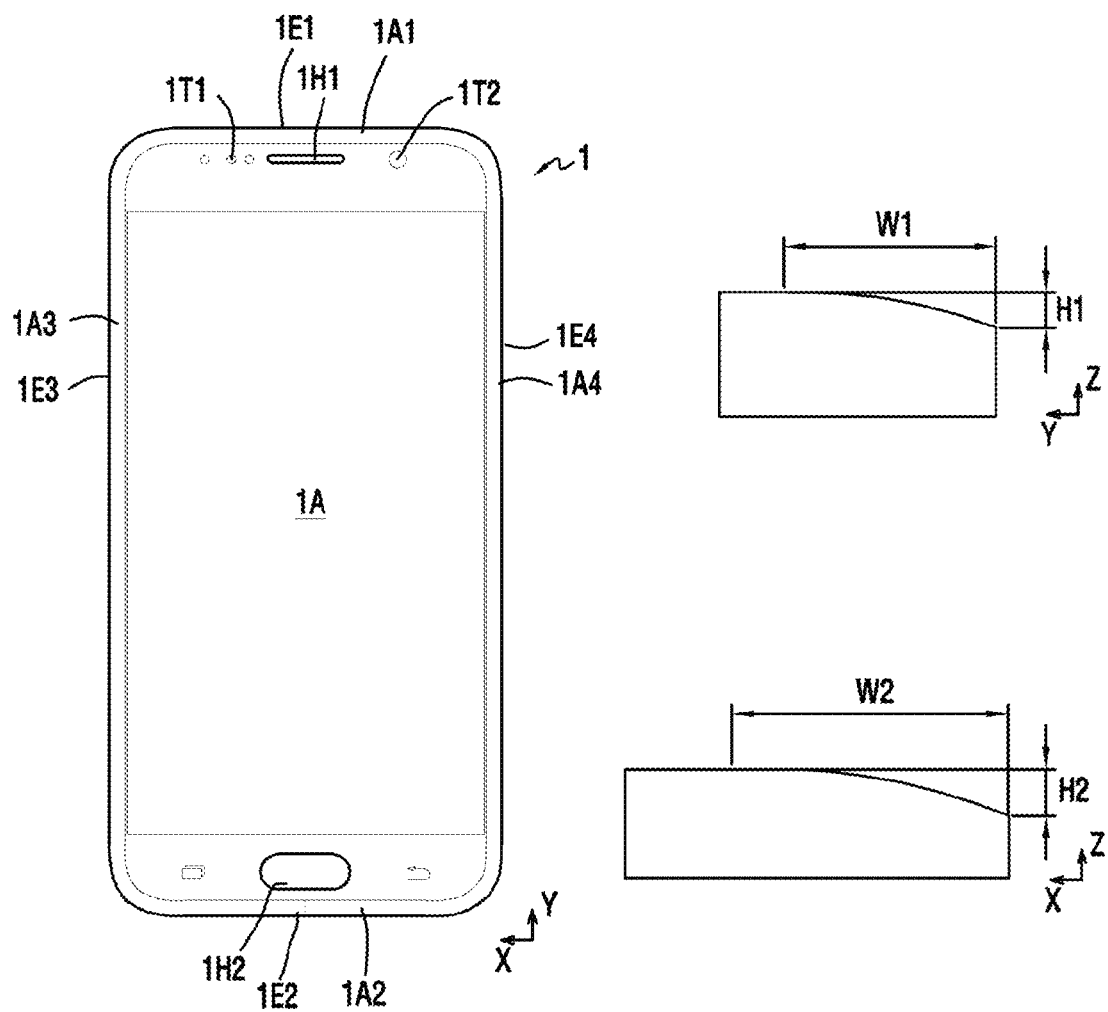
FIG. 9 illustrates a front cover according to various embodiments of the present disclosure.

FIG. 9 illustrates a front cover according to various embodiments of the present disclosure.

Referring to FIG. 9, the front cover 1 may have a substantially rectangular shape. The front cover 1 may include four edges 1E1, 1E2, 1E3, and 1E4, each of which has a linear shape. In addition, the front cover 1 may include a first region 1A1 that has a thickness that decreases toward the first edge 1E1 and is positioned adjacent to the first edge 1E1. The front cover 1 may include a second region 1A2 that has a thickness that decreases toward the second edge 1E2 and is positioned adjacent to the second edge 1E2. The front cover 1 may include a third region 1A3 that has a thickness that decreases toward the third edge 1E3 and is positioned adjacent to the third edge 1E3. In addition, the front cover 1 may include a fourth region 1A4 that has a thickness that decreases toward the fourth edge 1E4 and is positioned adjacent the fourth edge 1E4. In addition, the front cover 1 includes a central region 1A that is surrounded by the first region 1A1, the second region 1A2, the third region 1A3, and the fourth region 1A4.

According to various embodiments of the present disclosure, the central region 1A may be formed to overlap with the screen region of a display device (the display device 4 in FIG. 3), and may be transparent such that an image from the display device 4 is visible from the outside. In addition, the front cover 1 may be opaque in the region other than the central region 1A.

According to an embodiment of the present disclosure, the front cover 1 may include one or more through-holes 1H1 and 1H2. Here, the through-holes 1H1 and 1H2 may not be formed in at least one of the first region 1A1, the second region 1A2, the third region 1A3, and the fourth region 1A4.

According to an embodiment of the present disclosure, the front cover 1 may include one or more transparent regions 1T1 and 1T2. Here, the transparent regions 1T1 and 1T2 may not be formed in at least one of the first region 1A1, the second region 1A2, the third region 1A3, and the fourth region 1A4.

According to various embodiments of the present disclosure, the first region 1A1, the second region 1A2, the third region 1A3, and the fourth region 1A4 may be curved faces. The curved faces refer to portions, of which the curvature is not 0, and the shapes of the curved faces may be diversified depending on a position where the curvature is not 0. For example, as the position at which the curvature is not 0, is located more outwardly, the area that may form central region 1A (the region surrounded by the regions 1A1, 1A2, 1A3, and 1A4) may increase, and the width of the peripheral edge in which the curved faces may be formed on the front cover 1, may relatively decrease. Meanwhile, as the position at which the curvature is not zero (0), is located more inwardly, the area in which the central region 1A may be formed may decrease, and the width of the peripheral edge in which the curved faces may be formed on the front cover 1, may relatively increase. Here, the width of the peripheral edge may refer to a horizontal distance from a position at which the curvature is not 0 to a position at which the curved face is terminated (hereinafter, referred to as a "horizontal width of a curved face" or a "curvature width").

According to various embodiments of the present disclosure, the shape of the curved faces may be diversified depending on a vertical distance between a position at which the curved faces start and a position at which the curved faces are ended (hereinafter, referred to as a "vertical width of a curved face" or a "curvature depth").

According to various embodiments of the present disclosure, even in a condition where the horizontal width of the curved faces and the vertical width of the curved faces are equal to each other, the shape of the curved faces may be diversified. For example, when the curvatures of respective positions of a curved face are set to be different from each other, various shapes of curved faces, such as a curved face having a generally gently sloping shape, and a curved face having a gently sloping and then sharply sloping shape, may be formed.

According to an embodiment of the present disclosure, the horizontal width W1 of the curved face of the first region 1A1 or the second region 1A2 may be relatively smaller than the horizontal width W2 of the curved face of the third region 1A3 or the fourth region 1A4.

According to an embodiment of the present disclosure, the vertical width H1 of the curved face of the first region 1A1 or the second region 1A2 may be relatively smaller than the vertical width H2 of the curved face of the third region 1A3 or the fourth region 1A4.

Figure 10:
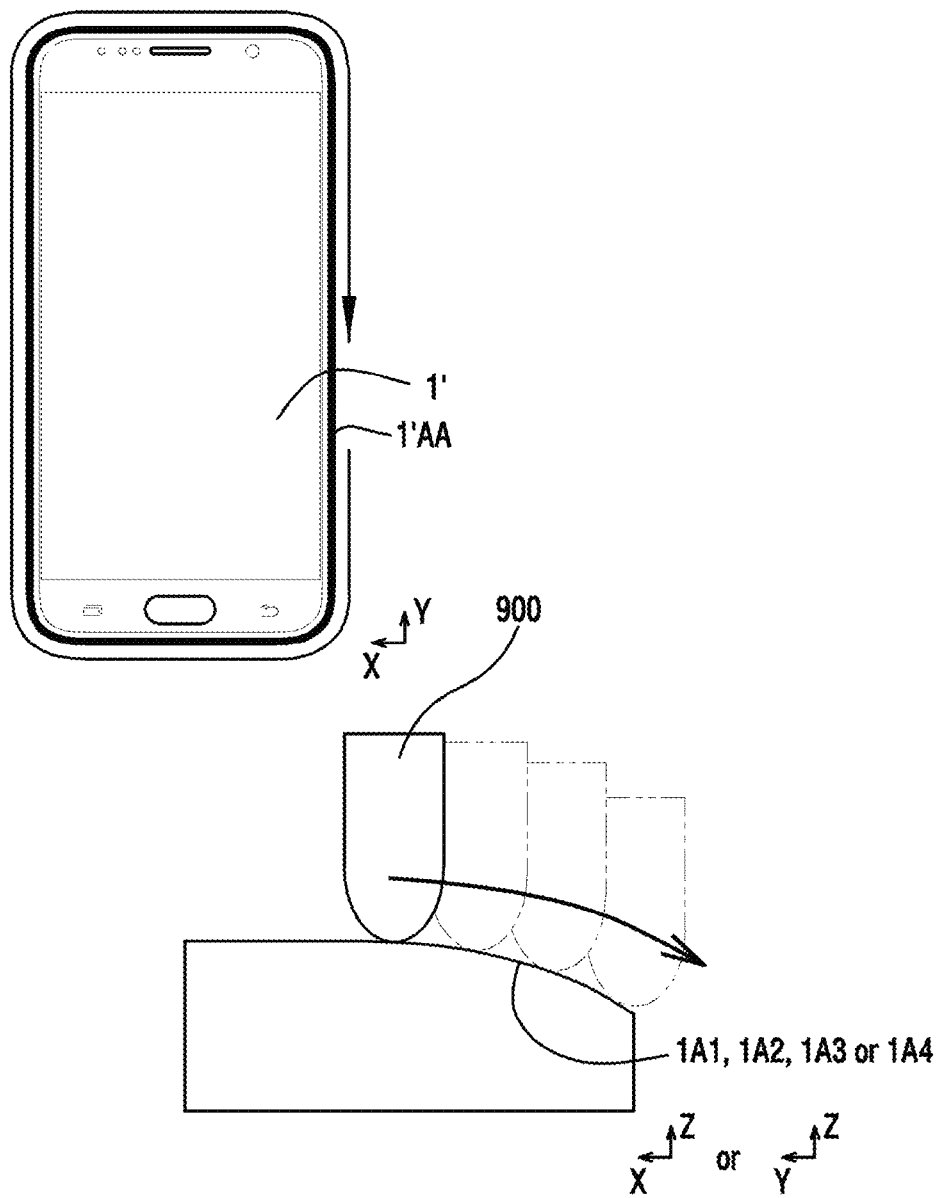
FIG. 10 is a view illustrating a forming process of a curved face according to various embodiments of the present disclosure.

FIG. 10 is a view illustrating a process of forming a curved face according to various embodiments of the present disclosure.

Referring to FIG. 10, regions 1A1, 1A2, 1A3, and 1A4 including the above-mentioned curved faces may be formed by cutting the peripheral edge region 1'AA of a plate 1'. For the cutting, a ball end mill 900 may be used.

Figure 11:
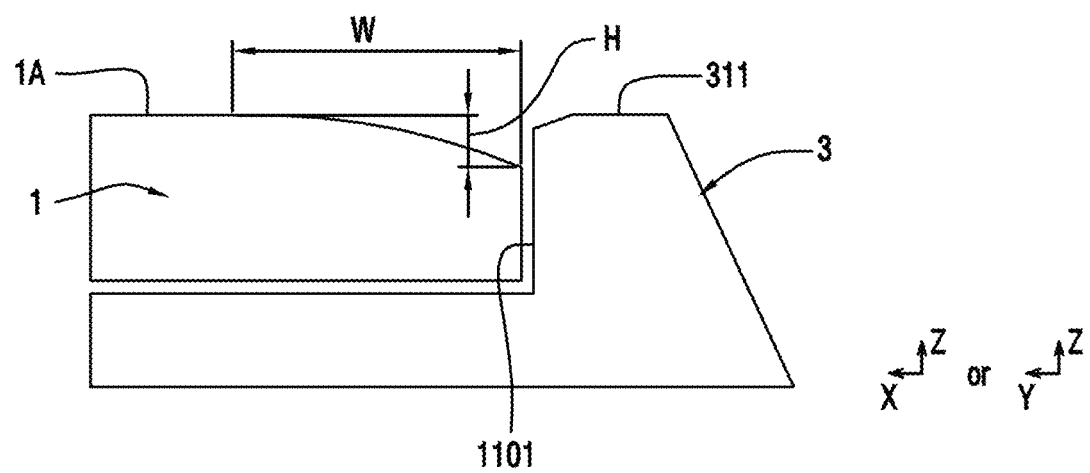
FIG. 11 is a cross-sectional view illustrating coupling between a front cover and a bezel according to an embodiment of the present disclosure.

FIG. 11 is a cross-sectional view illustrating coupling between a bezel and a front cover according to an embodiment of the present disclosure.

Referring to FIG. 11, the bezel 3 has a recessed shape 1101 to which the front cover 1 (or the rear cover 2) may be installed, and the front cover 1 may be mounted without a gap by being fitted to the bezel 3. In addition, the bezel 3 may include a face 311 that is parallel to the central region 1A of the front cover 1. The parallel face 311 may be arranged outside the edges 1E1, 1E2, 1E3, and 1E4 of the front cover 1.

According to an embodiment of the present disclosure, the central region 1A of the front cover 1 may not relatively protrude in relation to the parallel face 311 of the bezel 3. For example, the central region 1A of the front cover 1 may be located at a lower position vertically (Z-axis direction) than the parallel face 311 of the bezel 3. In particular, a curved face having a smaller horizontal width W and/or vertical width H than those of other locations may be formed. This will be described below with reference to FIG. 12.

Figure 12:
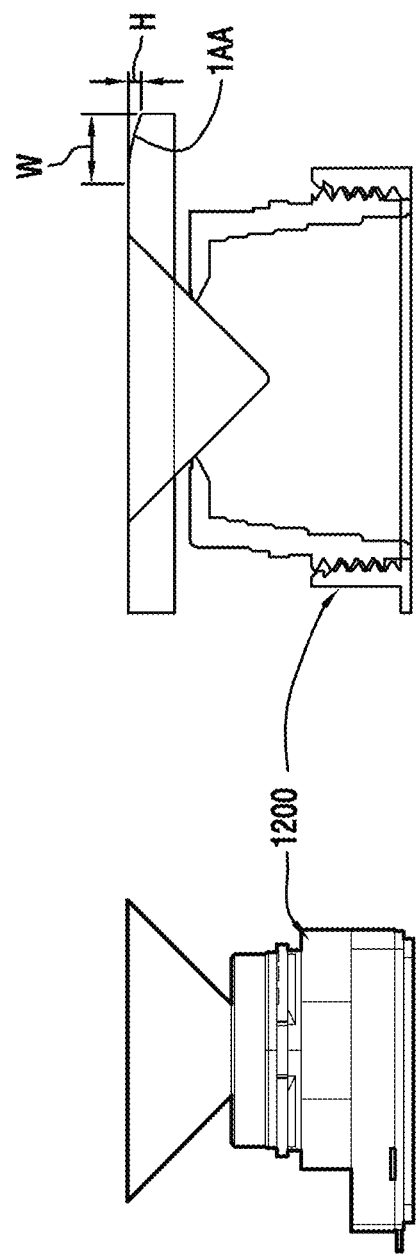
FIG. 12 is a view illustrating an optical component and a front cover according to various embodiments of the present disclosure.

FIG. 12 is a view illustrating an optical component and a front cover according to various embodiments of the present disclosure.

Referring to FIG. 12, at least one optical related component equipped within the electronic device 100 may use light introduced through the transparent region 1T1 or 1T2 of the front cover 1 (see FIG. 1). Here, in the case where at least a portion of a curved face 1AA (e.g., a region 1A1, 1A2, 1A3, or 1A4) is included on the transparent region 1T1 or 1T2, the light from the outside may refract by the curved face 1AA to be introduced into the optical related component so that a correct input may not be introduced into the optical related component. In order to prevent this, it may be desired to arrange the transparent region 1T1 or 1T2 in a portion, of which the thickness is constant. That is, it may be desired for one face on the transparent region 1T1 or 1T2 to have a curvature of zero (0).

According to an embodiment of the present disclosure, as described above with reference to FIG. 11, the problem may be solved by reducing the horizontal width W and/or the vertical width H of the curved face to be smaller than those of the other locations. As a result, the transparent region 1T1 or 1T2 may be spaced apart from the curved face. In addition, even if the transparent region 1T1 or 1T2 and the curved face 1AA are spaced apart from each other, it is possible to prevent the light refracted by the curved face 1AA from being introduced into the optical related component.

According to various embodiments of the present disclosure, a camera module 1200 equipped within the electronic device 100 may use the light that is introduced through the front cover 1. The camera module 1200 may have an inherent angle of view. Here, the curved face 1AA of the front cover 1 may be designed not to interfere with the angle of view of the camera module 1200. As described above with reference to FIG. 11, the camera module 1200 may obtain a non-distorted image by reducing the horizontal width W and/or the vertical width H of the curved face to be smaller than those of the other locations such that the angle of view of the camera module 1200 uses the portion having a constant thickness in the front cover 1 (e.g., the central region 1A).

Figure 13:
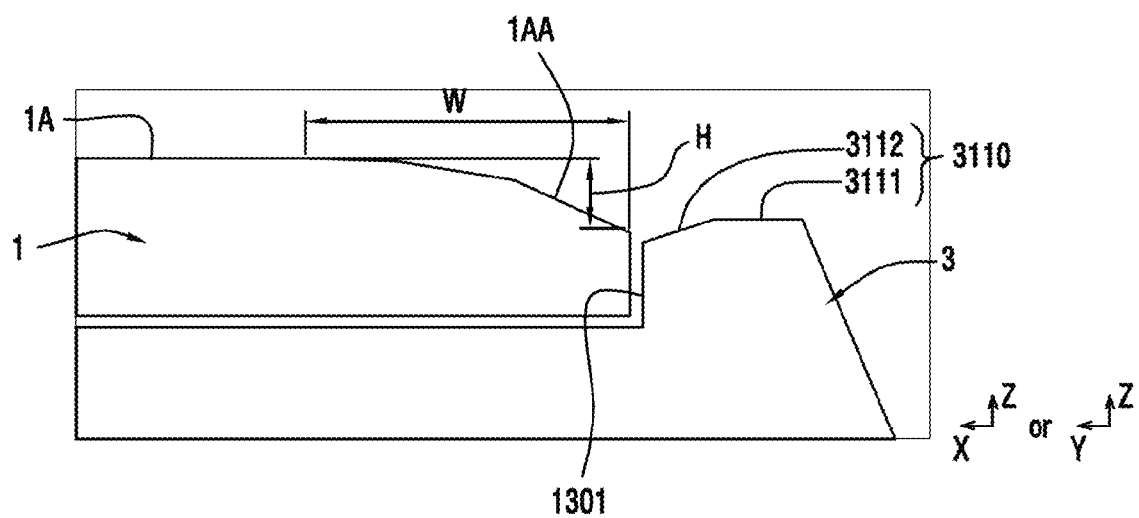
FIG. 13 is a cross-sectional view illustrating coupling between a front cover and a bezel according to various embodiments of the present disclosure.

FIG. 13 is a cross-sectional view illustrating coupling between the front cover and the bezel according to various embodiments of the present disclosure.

Referring to FIG. 13, the bezel 3 may have a recessed shape 1301 to which the front cover 1 (or the rear cover 2) may be installed, and the front cover 1 may be mounted without a gap by being fitted to the bezel 3. The, the bezel 3 may include a face 3110 that is arranged outside the front face F of the front cover 1.

According to an embodiment of the present disclosure, a curved face 1AA may be formed such that the front face F of the front cover 1 and the face 3110 of the bezel 3 are generally smoothly connected to each other. In particular, the curved face 1AA may have the horizontal width W and/or the vertical width H that are larger than those of the other locations. Here, the central region 1A of the front cove 1 may be located at a position that is vertically higher than a portion 3111 and a portion 3112 of the face 3110 of the bezel 3 (the face parallel to the central region 1A of the front cover 1). Accordingly, upon being gripped by a hand, a connection between the front cover 1 and the bezel 3 does not feel unnatural so that satisfaction in gripping can be improved.

Figure 14:
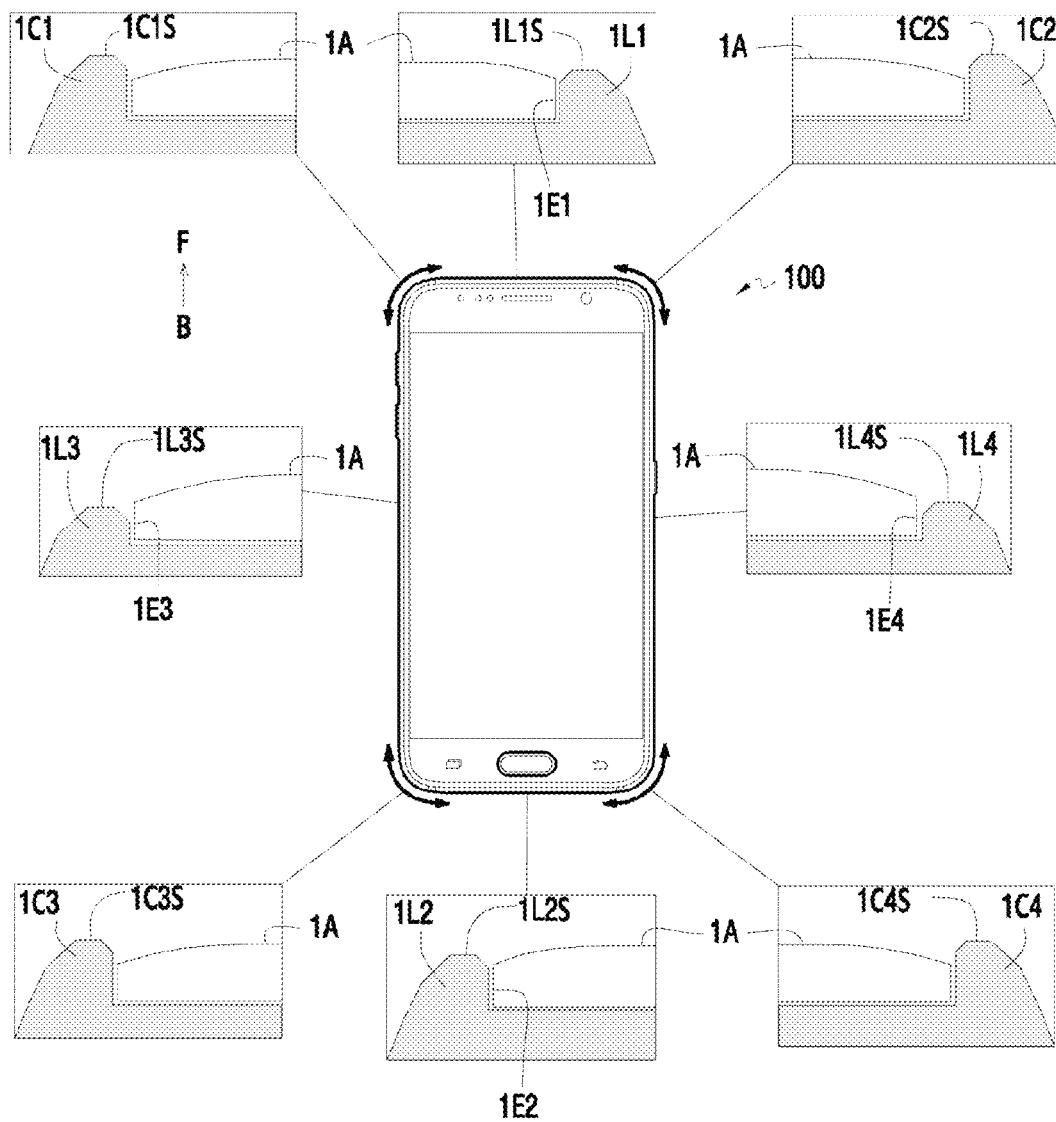
FIG. 14 is a cross-sectional view illustrating coupling between a front cover and a bezel according to various embodiments of the present disclosure.
Figure 15A:
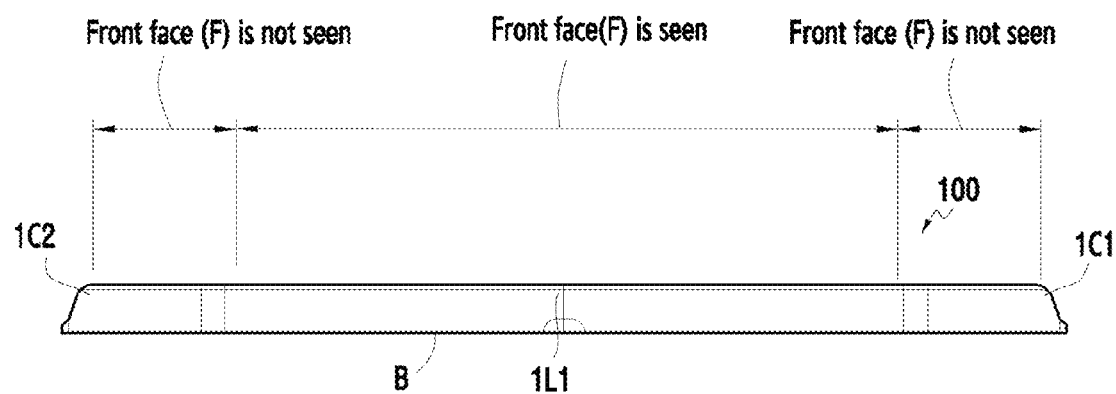
FIG. 15A illustrates a top view of the electronic device according to various embodiment of the present disclosure.
Figure 15B:
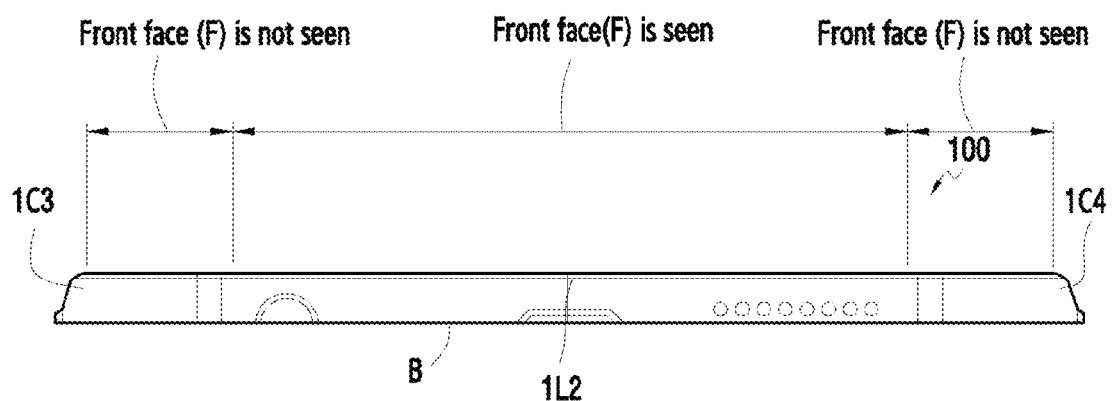
FIG. 15B illustrates a bottom view of the electronic device according to various embodiment of the present disclosure.

FIG. 14 is a cross-sectional view illustrating coupling between a front cover and a bezel according to various embodiments of the present disclosure. FIG. 15A illustrates a top view of the electronic device according to various embodiment of the present disclosure. FIG. 15B illustrates a bottom view of the electronic device according to various embodiment of the present disclosure.

Referring to FIGS. 14 to 15B, the bezel 3 may include a first corner portion 1C1 adjacent to a location where a first edge 1E1 and a third edge 1E3 are connected to each other. In addition, the bezel 3 may include a second corner portion 1C2 adjacent to a location where the first edge 1E1 and a fourth edge 1E4 are connected to each other. In addition, the bezel 3 may include a first connecting portion 1L1 between the first corner portion 1C1 and the second corner portion 1C2. Here, when viewed from the cross section, the first corner portion 1C1 and the second corner portion 1C2 may protrude more than the front cover 1 in the direction from the rear face B toward the front face F of the electronic device 100. In addition, when viewed from the cross section, the first connecting portion 1L1 may not protrude more than the front cover 1 in the direction from the rear face B toward the front face F of the electronic device 100.

According to an embodiment of the present disclosure, the bezel 3 may include a third corner portion 1C3 adjacent to a location where the second edge 1E2 and the third edge 1E3 are connected to each other. In addition, the bezel 3 may include a fourth corner portion 1C4 adjacent to a location where the second edge 1E2 and the fourth edge 1E4 are connected to each other. In addition, the bezel 3 may include a second connecting portion 1L2 between the third corner portion 1C3 and the fourth corner portion 1C4. Here, when viewed from the cross section, the third corner portion 1C3 and the fourth corner portion 1C4 may protrude more than the front cover 1 in the direction from the rear face B toward the front face F of the electronic device 100. In addition, when viewed from the cross section, the second connecting portion 1L2 may not protrude more than the front cover 1 in the direction from the rear face B toward the front face F of the electronic device 100.

According to an embodiment of the present disclosure, the bezel 3 may include a third connecting portion 1L3 between the first corner portion 1C1 and the third corner portion 1C3. In addition, the bezel 3 may include a fourth connecting portion 1L4 between the second corner portion 1C2 and the fourth corner portion 1C4. Here, when viewed from the cross section, the third connecting portion 1L3 and the fourth connecting portion 1L4 may not protrude more than the front cover 1 in the direction from the rear face B toward the front face F of the electronic device 100.

According to an embodiment of the present disclosure, the first corner portion 1C1 of the bezel 3 may include a first corner face 1C1S forming a face that is parallel with the central region 1A of the front face F. In addition, the second corner portion 1C2 of the bezel 3 may include a second corner face 1C2S forming a face that is parallel with the central region 1A of the front face F. Here, when viewed from the cross section, the first corner face 1C1S and the second corner face 1C2S may protrude more than the central region 1A of the front face F in the direction from the rear face B toward the front face F of the electronic device 100.

According to an embodiment of the present disclosure, the third corner portion 1C3 of the bezel 3 may include a third corner face 1C3S forming a face that is parallel with the front face F. In addition, the fourth corner portion 1C4 of the bezel 3 may include a fourth corner face 1C4S forming a face that is parallel with the front face F. Here, when viewed from the cross section, the third corner face 1C3S and the fourth corner face 1C4S may protrude more than the central region 1A of the front face F in the direction from the rear face B toward the front face F of the electronic device 100.

According to various embodiments of the present disclosure, the first corner portion 1C1, the second corner portion 1C2, the third corner portion 1C3, and the fourth corner portion 1C4 of the bezel 3 are formed to protrude relatively more than the front face F, and may block the transmission of impact to the front cover 1 when the electronic device 100 is dropped to be impacted.

According to an embodiment of the present disclosure, the first connecting portion 1L1 of the bezel 3 may include a first connecting face 1L1S forming a face that is parallel with the front face F. Here, when viewed from the cross section, the first connecting face 1L1S may not protrude more than central region 1A of the front face F in the direction from the rear face B toward the front face F of the electronic device 100.

According to an embodiment of the present disclosure, the second connecting portion 1L2 of the bezel 3 may include a second connecting face 1L2S forming a face that is parallel with the front face F. Here, when viewed from the cross section, the second connecting face 1L2S may not protrude more than central region 1A of the front face F in the direction from the rear face B toward the front face F of the electronic device 100.

According to an embodiment of the present disclosure, the third connecting portion 1L3 of the bezel 3 may include a third connecting face 1L3S forming a face that is parallel with the front face F. Here, when viewed from the cross section, the third connecting face 1L3S may not protrude more than central region 1A of the front face F in the direction from the rear face B toward the front face F of the electronic device 100.

According to an embodiment of the present disclosure, the fourth connecting portion 1L4 of the bezel 3 may include a fourth connecting face 1L4S forming a face that is parallel with the front face F. Here, when viewed from the cross section, the four connecting face 1L4S may not protrude more than central region 1A of the front face F in the direction from the rear face B toward the front face F of the electronic device 100.

According to various embodiments of the present disclosure, with the above-described configuration, when the electronic device 100 is viewed from the top side or the bottom side, the central portion of the front face F may be seen, but both side portions of the front face F may not be seen due to the corner portions 1C1, 1C2, 1C3, and 1C4 of the bezel 3.

According to various embodiments of the present disclosure, the first connecting portion 1L1, the second connecting portion 1L2, the third connecting portion 1L3, and the fourth connecting portion 1L4 of the bezel 3 are formed not to protrude more than the front face F, and may make the electronic device 100 feel slim. In addition, the first to fourth connecting portions may cause a connection between the bezel 3 and the front cover 1 not to feel unnatural when gripping the electronic device 100 by a hand so that satisfaction in gripping can be improved.

Figure 16:
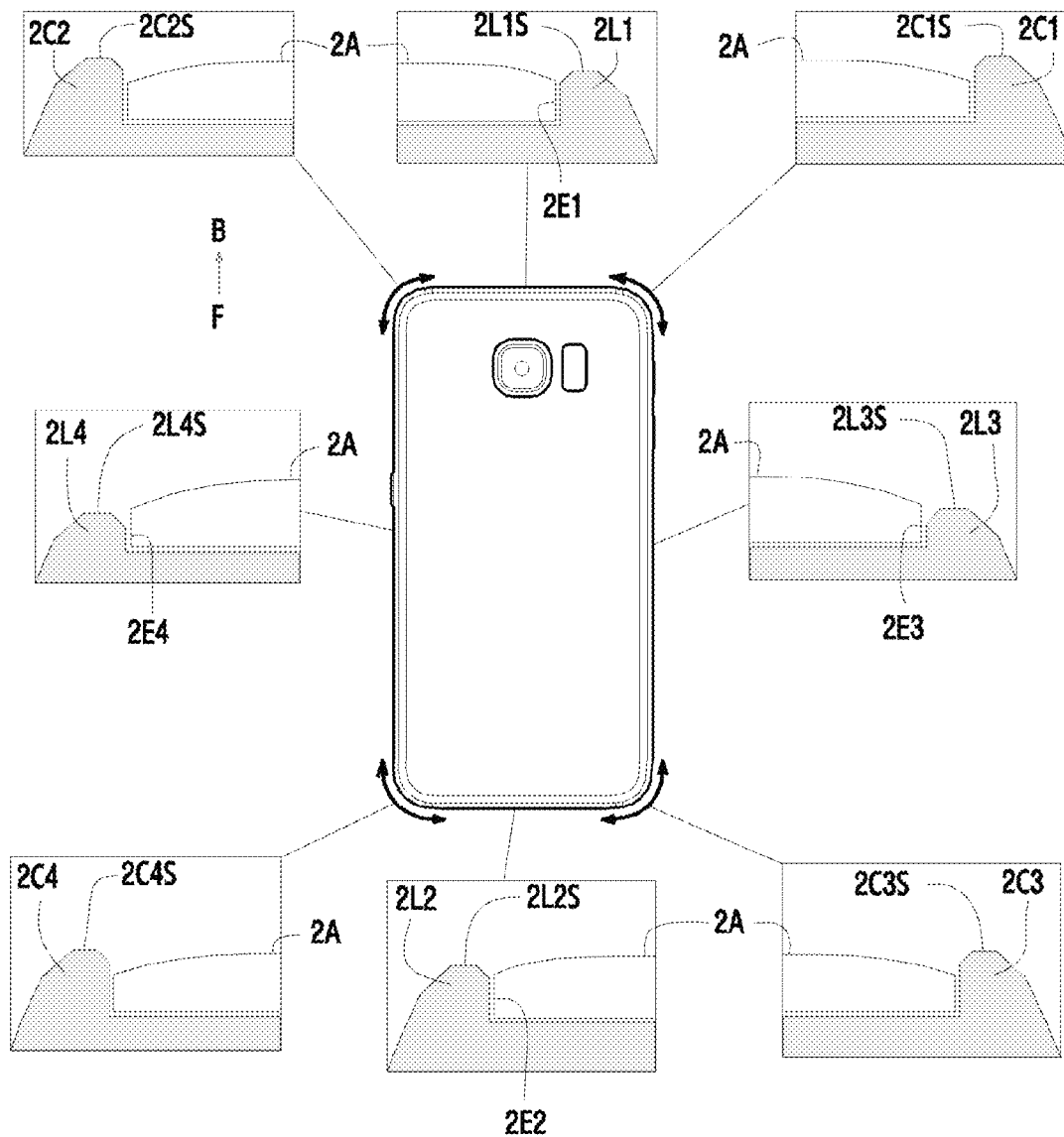
FIG. 16 is a cross-sectional view illustrating coupling between a rear cover and a bezel according to various embodiments of the present disclosure.
Figure 17A:
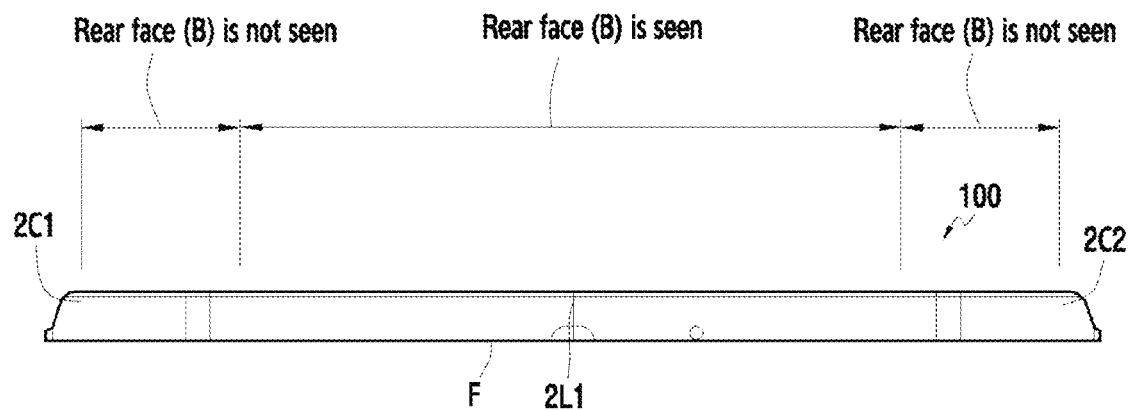
FIG. 17A illustrates a top view of the electronic device according to various embodiment of the present disclosure.
Figure 17B:
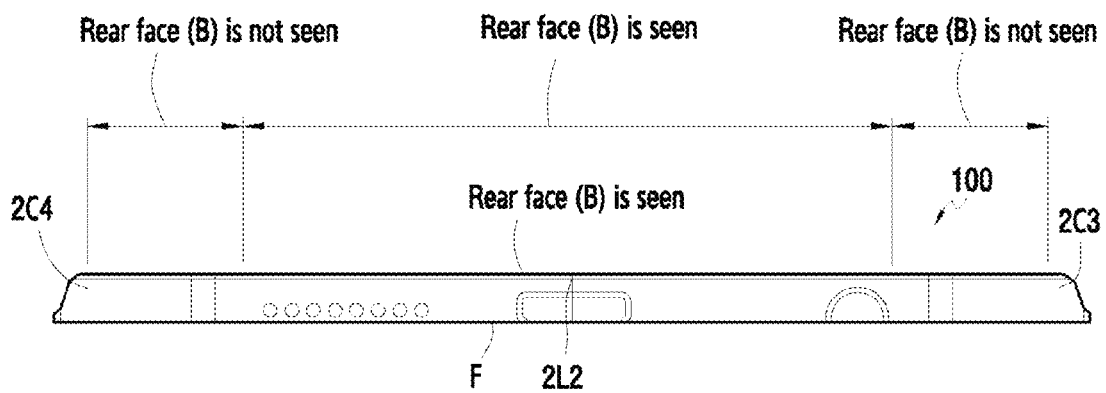
FIG. 17B illustrates a bottom view of the electronic device according to various embodiment of the present disclosure.

FIG. 16 is a cross-sectional view illustrating coupling between a rear cover and a bezel according to various embodiments of the present disclosure. FIG. 17A illustrates a top view of the electronic device according to various embodiment of the present disclosure. FIG. 17B illustrates a bottom view of the electronic device according to various embodiment of the present disclosure.

Referring to FIGS. 16 to 17B, the bezel 3 may include a first corner portion 2C1 adjacent to a location where a first edge 2E1 and a third edge 2E3 are connected to each other. In addition, the bezel 3 may include a second corner portion 2C2 adjacent to a location where the first edge 2E1 and a fourth edge 2E4 are connected to each other. In addition, the bezel 3 may include a first connecting portion 2L1 between the first corner portion 2C1 and the second corner portion 2C2. Here, when viewed from the cross section, the first corner portion 2C1 and the second corner portion 2C2 may protrude more than the rear cover 2 in the direction from front face F toward the rear face B of the electronic device 100. In addition, when viewed from the cross section, the first connecting portion 2L1 may not protrude more than the rear cover 2 in the direction from front face F toward the rear face B of the electronic device 100.

According to an embodiment of the present disclosure, the bezel 3 may include a third corner portion 2C3 adjacent to a location where the second edge 2E2 and the third edge 2E3 are connected to each other. In addition, the bezel 3 may include a fourth corner portion 2C4 adjacent to a location where the second edge 2E2 and the fourth edge 2E4 are connected to each other. In addition, the bezel 3 may include a second connecting portion 2L2 between the third corner portion 2C3 and the fourth corner portion 2C4. Here, when viewed from the cross section, the third corner portion 2C3 and the fourth corner portion 2C4 may protrude more than the rear cover 2 in the direction from the front face F toward the rear face B of the electronic device 100. In addition, when viewed from the cross section, the second connecting portion 2L2 may not protrude more than the rear cover 2 in the direction from front face F toward the rear face B of the electronic device 100.

According to an embodiment of the present disclosure, the bezel 3 may include a third connecting portion 2L3 between the first corner portion 2C1 and the third corner portion 2C3. In addition, the bezel 3 may include a fourth connecting portion 2L4 between the second corner portion 2C2 and the fourth corner portion 2C4. Here, when viewed from the cross section, the third connecting portion 2L3 and the fourth connecting portion 2L4 may not protrude more than the rear cover 2 in the direction from front face F toward the rear face B of the electronic device 100.

According to an embodiment of the present disclosure, the first corner portion 2C1 of the bezel 3 may include a first corner face 2C1S forming a face that is parallel with the central region 2A of the rear face B. In addition, the second corner portion 2C2 of the bezel 3 may include a second corner face 2C2S forming a face that is parallel with the central region 2A of the rear face B. Here, when viewed from the cross section, the first corner face 2C1S and the second corner face 2C2S may protrude more than central region 2A of the rear face B in the direction from the front face F toward the rear face B of the electronic device 100.

According to an embodiment of the present disclosure, the third corner portion 2C3 of the bezel 3 may include a third corner face 2C3S forming a face that is parallel with the rear face B. In addition, the fourth corner portion 2C4 of the bezel 3 may include a fourth corner face 2C4S forming a face that is parallel with the rear face B. Here, when viewed from the cross section, the third corner face 2C3S and the fourth corner face 2C4S may protrude more than central region 2A of the rear face B in the direction from the front face F toward the rear face B of the electronic device 100.

According to various embodiments of the present disclosure, the first corner portion 2C1, the second corner portion 2C2, the third corner portion 2C3, and the fourth corner portion 2C4 of the bezel 3 are formed to protrude relatively more than the rear face B, and may block the transmission of impact to the rear cover 2 when the electronic device 100 is dropped to be impacted.

According to an embodiment of the present disclosure, the first connecting portion 2L1 of the bezel 3 may include a first connecting face 2L1S forming a face that is parallel with the rear face B. Here, when viewed from the cross section, the first connecting face 2L1S may not protrude more than central region 2A of the rear face B in the direction from the front face F toward the rear face B of the electronic device 100.

According to an embodiment of the present disclosure, the second connecting portion 2L2 of the bezel 3 may include a second connecting face 2L2S forming a face that is parallel with the rear face B. Here, when viewed from the cross section, the second connecting face 2L2S may not protrude more than central region 2A of the rear face B in the direction from the front face F toward the front face B of the electronic device 100.

According to an embodiment of the present disclosure, the third connecting portion 2L3 of the bezel 3 may include a third connecting face 2L3S forming a face that is parallel with the rear face B. Here, when viewed from the cross section, the third connecting face 2L3S may not protrude more than central region 2A of the rear face B in the direction from the front face F toward the rear face B of the electronic device 100.

According to an embodiment of the present disclosure, the fourth connecting portion 2L4 of the bezel 3 may include a fourth connecting face 2L4S forming a face that is parallel with the rear face B. Here, when viewed from the cross section, the fourth connecting face 2L4S may not protrude more than central region 2A of the rear face B in the direction from the front face F toward the front face H of the electronic device 100.

According to various embodiments of the present disclosure, with the above-described configuration, when the electronic device 100 is viewed from the top side or the bottom side, the central portion of the rear face B may be seen, but both side portions of the rear face B may not be seen due to the corner portions 2C1, 2C2, 2C3, and 2C4 of the bezel 3.

According to various embodiments of the present disclosure, the first connecting portion 2L1, the second connecting portion 2L2, the third connecting portion 2L3, and the fourth connecting portion 2L4 of the bezel 3 are formed not to protrude more than the rear face B, and may make the electronic device 100 feel slim. In addition, the first to fourth connecting portions may not cause a connection between the bezel 3 and the rear cover 1 not to feel unnatural when gripping the electronic device 100 by a hand so that satisfaction in gripping can be improved.

Figure 18:
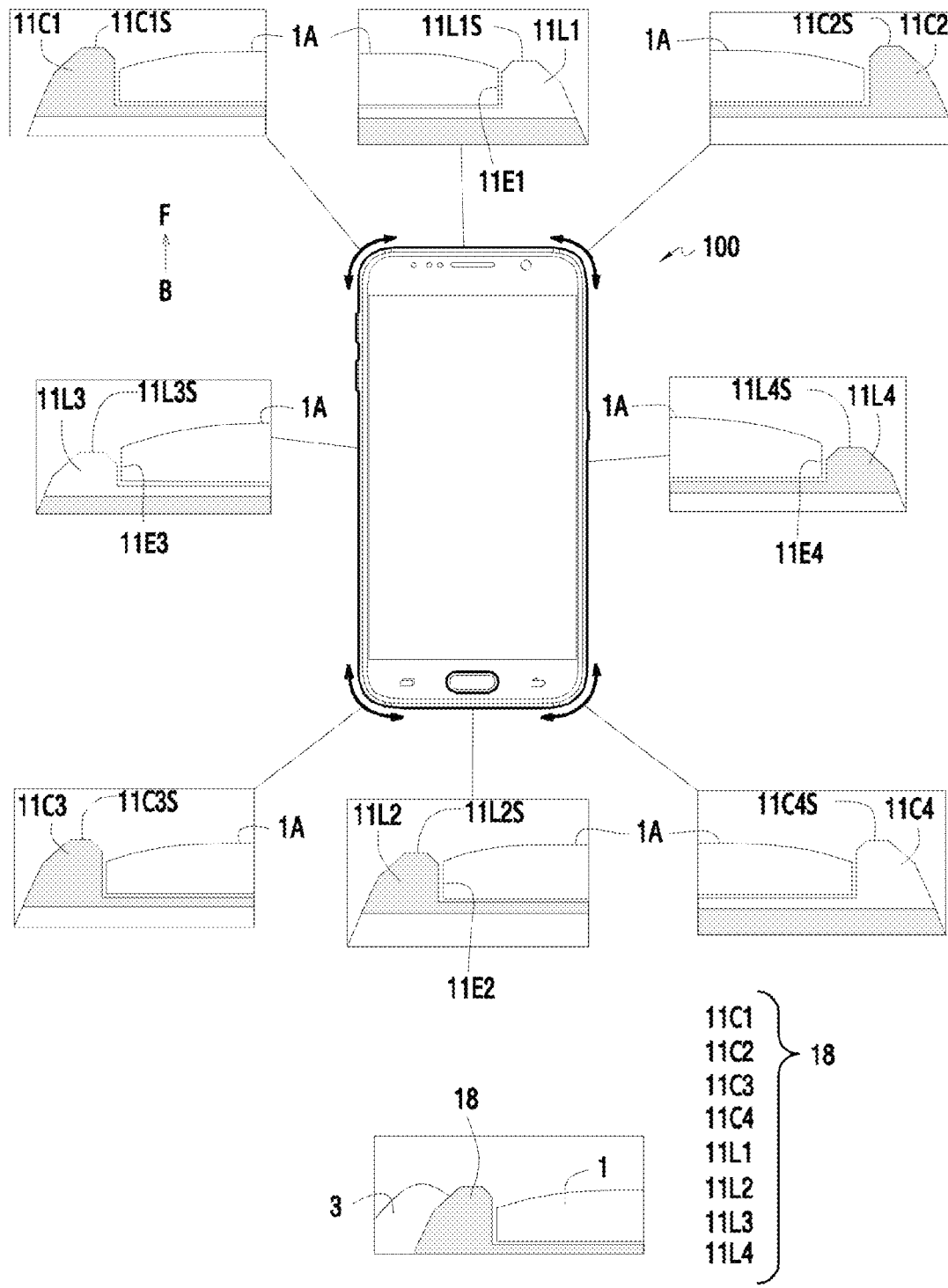
FIG. 18 is a cross-sectional view illustrating coupling between a front sub-bezel and a front cover according to various embodiments of the present disclosure.

FIG. 18 is a cross-section illustrating coupling between a front cover and a front sub-bezel according to various embodiments of the present disclosure.

Referring to FIG. 18, the electronic device 100 may further include a front sub-bezel 18 that provides an annular portion that surrounds the front cover 1. The front sub-bezel 18 may be arranged between the bezel 3 and the front cover 1, and may be added so as to provide an aesthetic sense.

According to an embodiment of the present disclosure, the front sub-bezel 18 may include a first corner portion 11C1 adjacent to a location where the first edge 11E1 and the third edge 11E3 are connected to each other. In addition, the front sub-bezel 18 may include a second corner portion 11C2 adjacent to a location where the first edge 11E1 and the fourth edge 11E4 are connected to each other. In addition, the front sub-bezel 18 may include a first connecting portion 11L1 between the first corner portion 11C1 and the second corner portion 11C2. Here, when viewed from the cross section, the first corner portion 11C1 and the second corner portion 11C2 may protrude more than the front cover 1 in the direction from the rear face B toward the front face F of the electronic device 100. In addition, when viewed from the cross section, the first connecting portion 11L1 may not protrude more than the front cover 1 in the direction from the rear face B toward the front face F of the electronic device 100.

According to an embodiment of the present disclosure, the front sub-bezel 18 may include a third corner portion 11C3 adjacent to a location where the second edge 11E2 and the third edge 11E3 are connected to each other. In addition, the front sub-bezel 18 may include a fourth corner portion 11C4 adjacent to a location where the second edge 11E2 and the fourth edge 11E4 are connected to each other. In addition, the front sub-bezel 18 may include a second connecting portion 11L2 between the third corner portion 11C3 and the fourth corner portion 11C4. Here, when viewed from the cross section, the third corner portion 11C3 and the fourth corner portion 11C4 may protrude more than the front cover 1 in the direction from the rear face B toward the front face F of the electronic device 100. In addition, when viewed from the cross section, the second connecting portion 11L2 may not protrude more than the front cover 1 in the direction from the rear face B toward the front face F of the electronic device 100.

According to an embodiment of the present disclosure, the front sub-bezel 18 may include a third connecting portion 11L3 between the first corner portion 11C1 and the third corner portion 11C3. In addition, the front sub-bezel 18 may include a fourth connecting portion 11L4 between the second corner portion 11C2 and the fourth corner portion 11C4. Here, the third connecting portion 11L3 and the fourth connecting portion 11L4 may not protrude more than the front cover 1 in the direction from the rear face B toward the front face F of the electronic device 100.

According to an embodiment of the present disclosure, the first corner portion 11C1 of the front sub-bezel 18 may include a first corner face 11C1S forming a face that is parallel with the central region 1A of the front face F. In addition, the second corner portion 11C2 of the front sub-bezel 18 may include a second corner face 11C2S forming a face that is parallel with the central region 1A of the front face F. Here, when viewed from the cross section, the first corner face 11C1S and the second corner face 11C2S may protrude more than the central region 1A of the front face F in the direction from the rear face B toward the front face F of the electronic device 100.

According to an embodiment of the present disclosure, the third corner portion 11C3 of the front sub-bezel 18 may include a third corner face 11C3S forming a face that is parallel with the front face F. In addition, the fourth corner portion 11C4 of the front sub-bezel 18 may include a fourth corner face 11C4S forming a face that is parallel with the front face F. Here, when viewed from the cross section, the third corner face 11C3S and the fourth corner face 11C4S may protrude more than the central region 1A of the front face F in the direction from the rear face B toward the front face F of the electronic device 100.

According to various embodiments of the present disclosure, the first corner portion 11C1, the second corner portion 11C2, the third corner portion 11C3, and the fourth corner portion 11C4 of the front sub-bezel 18 are formed to protrude relatively more than the front face F, and may prevent the transmission of impact to the front cover 1 when the electronic device 100 is dropped to be impacted.

According to an embodiment of the present disclosure, the first connecting portion 11L1 of the front sub-bezel 18 may include a first connecting face 11L1S forming a face that is parallel with the front face F. Here, when viewed from the cross section, the first connecting face 11L1S may not protrude more than the central region 1A of the front face F in the direction from the rear face B toward the front face F of the electronic device 100.

According to an embodiment of the present disclosure, the second connecting portion 11L2 of the front sub-bezel 18 may include a second connecting face 11L2S forming a face that is parallel with the front face F. Here, when viewed from the cross section, the second connecting face 11L2S may not protrude more than the central region 1A of the front face F in the direction from the rear face B toward the front face F of the electronic device 100.

According to an embodiment of the present disclosure, the third connecting portion 11L3 of the front sub-bezel 18 may include a third connecting face 11L3S forming a face that is parallel with the front face F. Here, when viewed from the cross section, the third connecting face 11L3S may not protrude more than the central region 1A of the front face F in the direction from the rear face B toward the front face F of the electronic device 100.

According to an embodiment of the present disclosure, the fourth connecting portion 11L4 of the front sub-bezel 18 may include a fourth connecting face 11L4S forming a face that is parallel with the front face F. Here, when viewed from the cross section, the fourth connecting face 11L4S may not protrude more than the central region 1A of the front face F in the direction from the rear face B toward the front face F of the electronic device 100.

According to various embodiments of the present disclosure, the first connecting portion 11L1, the second connecting portion 11L2, the third connecting portion 11L3, and the fourth connecting portion 11L4 of the front sub-bezel 18 are formed not to protrude more than the front face F, and may make the electronic device 100 feel slim. In addition, the first to fourth connecting portions may cause a connection between the front sub-bezel 18 and the front cover 1 not to feel unnatural when gripping the electronic device 100 by a hand so that satisfaction in gripping can be improved.

Figure 19:
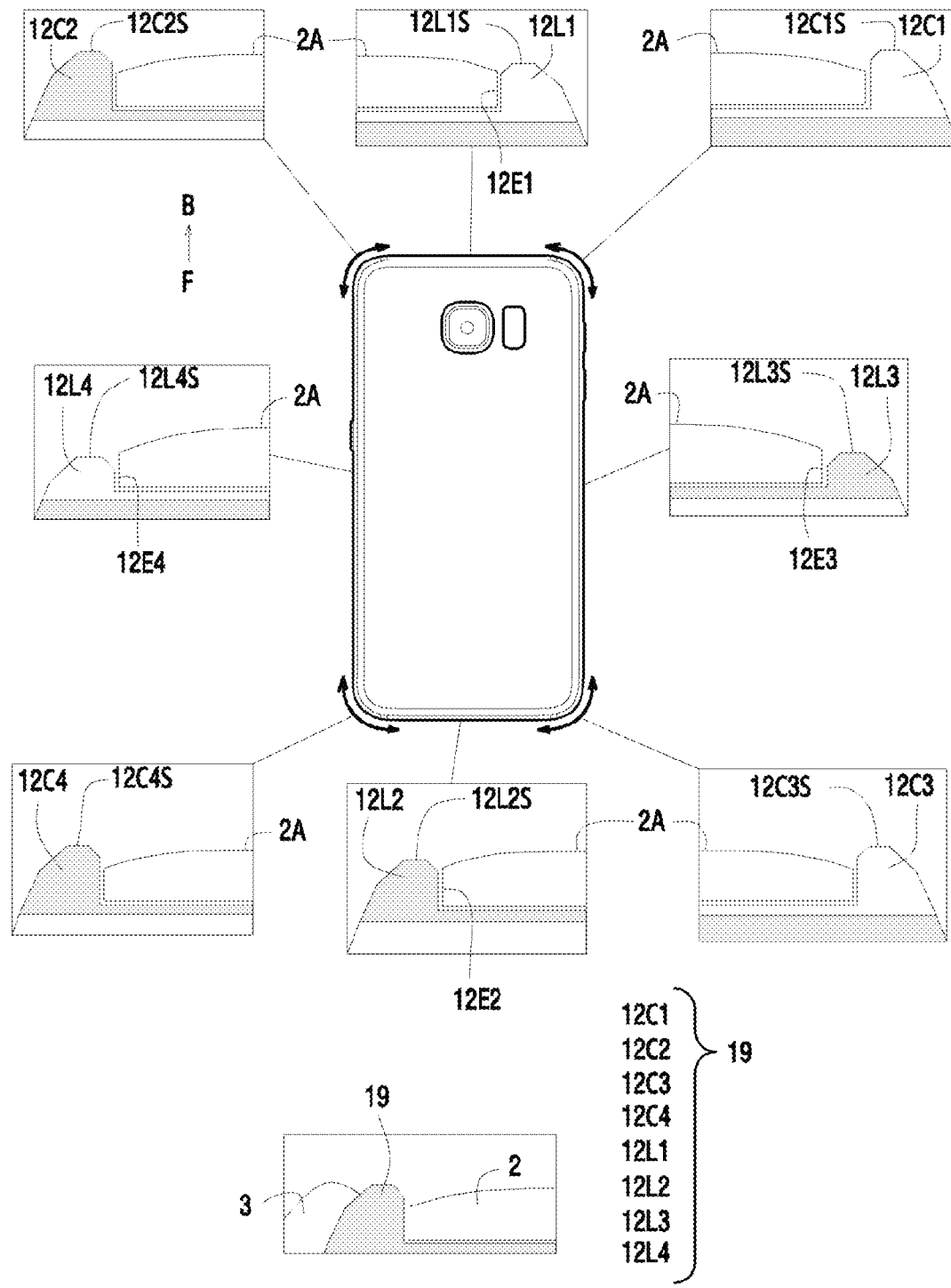
FIG. 19 is a cross-sectional view illustrating coupling between a rear cover and a rear sub-bezel according to various embodiments of the present disclosure.

FIG. 19 is a cross-sectional view illustrating coupling between a rear cover and a rear sub-bezel according to various embodiments of the present disclosure.

Referring to FIG. 19, the electronic device 100 may further include a rear sub-bezel 19 that provides an annular portion that surrounds the rear cover 2. The rear sub-bezel 19 may be arranged between the bezel 3 and the rear cover 2, and may be added so as to provide an aesthetic sense.

According to an embodiment of the present disclosure, the rear sub-bezel 19 may include a first corner portion 12C1 adjacent to a location where the first edge 12E1 and the third edge 12E3 are connected to each other. In addition, the rear sub-bezel 19 may include a second corner portion 12C2 adjacent to a location where the first edge 12E1 and the fourth edge 12E4 are connected to each other. In addition, the rear sub-bezel 19 may include a first connecting portion 12L1 between the first corner portion 12C1 and the second corner portion 12C2. Here, when viewed from the cross section, the first corner portion 12C1 and the second corner portion 12C2 may protrude more than the rear cover 2 in the direction from the front face F toward the rear face B of the electronic device 100. In addition, when viewed from the cross section, the first connecting portion 12L1 may not protrude more than the rear cover 2 in the direction from the front face F toward the rear face B of the electronic device 100.

According to an embodiment of the present disclosure, the rear sub-bezel 19 may include a third corner portion 12C3 adjacent to a location where the second edge 12E2 and the third edge 12E3 are connected to each other. In addition, the rear sub-bezel 19 may include a fourth corner portion 12C4 adjacent to a location where the second edge 12E2 and the fourth edge 12E4 are connected to each other. In addition, the rear sub-bezel 19 may include a second connecting portion 12L2 between the third corner portion 12C3 and the fourth corner portion 12C4. Here, when viewed from the cross section, the third corner portion 12C3 and the fourth corner portion 12C4 may protrude more than the rear cover 2 in the direction from the front face F toward the rear face B of the electronic device 100. In addition, when viewed from the cross section, the second connecting portion 12L2 may not protrude more than the rear cover 2 in the direction from the front face F toward the rear face B of the electronic device 100.

According to an embodiment of the present disclosure, the rear sub-bezel 19 may include a third connecting portion 12L3 between the first corner portion 12C1 and the third corner portion 12C3. In addition, the rear sub-bezel 19 may include a fourth connecting portion 12L4 between the second corner portion 12C2 and the fourth corner portion 12C4. Here, the third connecting portion 12L3 and the fourth connecting portion 12L4 may not protrude more than the rear cover 2 in the direction from the front face F toward the rear face B of the electronic device 100.

According to an embodiment of the present disclosure, the first corner portion 12C1 of the rear sub-bezel 19 may include a first corner face 12C1S forming a face that is parallel with the central region 2A of the rear face B. In addition, the second corner portion 12C2 of the rear sub-bezel 19 may include a second corner face 12C2S forming a face that is parallel with the central region 2A of the rear face B. Here, when viewed from the cross section, the first corner face 12C1S and the second corner face 12C2S may protrude more than the central region 2A of the rear face B in the direction from the front face F toward the rear face B of the electronic device 100.

According to an embodiment of the present disclosure, the third corner portion 12C3 of the rear sub-bezel 19 may include a third corner face 12C3S forming a face that is parallel with the rear face B. In addition, the fourth corner portion 12C4 of the rear sub-bezel 19 may include a fourth corner face 12C4S forming a face that is parallel with the rear face B. Here, when viewed from the cross section, the third corner face 12C3S and the fourth corner face 12C4S may protrude more than the central region 2A of the rear face B in the direction from the front face F toward the rear face B of the electronic device 100.

According to various embodiments of the present disclosure, the first corner portion 12C1, the second corner portion 12C2, the third corner portion 12C3, and the fourth corner portion 12C4 of the rear sub-bezel 19 are formed to protrude relatively more than the rear face B, and may prevent the transmission of impact to the rear cover 2 when the electronic device 100 is dropped to be impacted.

According to an embodiment of the present disclosure, the first connecting portion 12L1 of the rear sub-bezel 19 may include a first connecting face 12L1S forming a face that is parallel with the rear face B. Here, when viewed from the cross section, the first connecting face 12L1S may not protrude more than the central region 2A of the rear face B in the direction from the front face F toward the rear face B of the electronic device 100.

According to an embodiment of the present disclosure, the second connecting portion 12L2 of the rear sub-bezel 19 may include a second connecting face 12L2S forming a face that is parallel with the rear face B. Here, when viewed from the cross section, the second connecting face 12L2S may not protrude more than the central region 2A of the rear face B in the direction from the front face F toward the rear face B of the electronic device 100.

According to an embodiment of the present disclosure, the third connecting portion 12L3 of the rear sub-bezel 19 may include a third connecting face 12L3S forming a face that is parallel with the rear face B. Here, when viewed from the cross section, the third connecting face 12L3S may not protrude more than the central region 2A of the rear face B in the direction from the front face F toward the rear face B of the electronic device 100.

According to an embodiment of the present disclosure, the fourth connecting portion 12L4 of the rear sub-bezel 19 may include a fourth connecting face 12L4S forming a face that is parallel with the rear face B. Here, when viewed from the cross section, the fourth connecting face 12L4S may not protrude more than the central region 2A of the rear face B in the direction from the front face F toward the rear face B of the electronic device 100.

According to various embodiments of the present disclosure, the first connecting portion 12L1, the second connecting portion 12L2, the third connecting portion 12L3, and the fourth connecting portion 12L4 of the rear sub-bezel 19 are formed not to protrude more than the front face F, and may make the electronic device 100 feel slim. In addition, the first to fourth connecting portions may cause a connection between the rear sub-bezel 19 and the rear cover 2 not to feel unnatural when gripping the electronic device 100 by a hand so that satisfaction in gripping can be improved.

Figure 20:
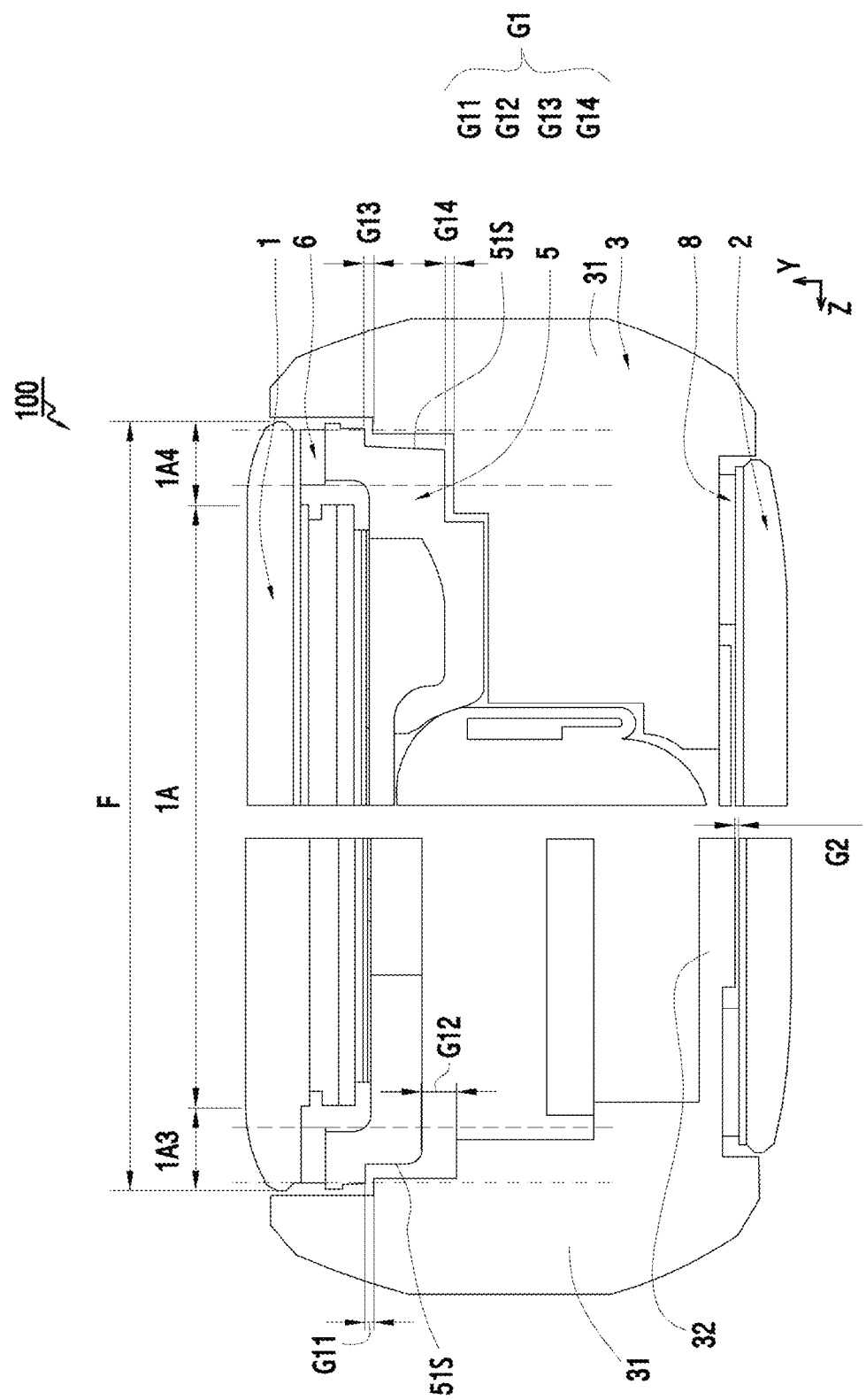
FIG. 20 illustrates a cross-sectional view of an electronic device according to various embodiments of the present disclosure.

FIG. 20 is a cross-sectional view illustrating an electronic device according to various embodiments of the present disclosure.

Referring to FIG. 20, a front cover 1 may be coupled to a bracket 5. According to an embodiment of the present disclosure, an adhesive member 6 (e.g., a double-sided tape) may be arranged between the front cover 1 and the bracket 5. In particular, the adhesive member 6 may overlap with the curved faces 1A1, 1A2, 1A3, and 1A4 of the front face F of the front cover 1.

According to an embodiment of the present disclosure, a bezel 3 may include a first part 31 that forms the external face of the electronic device 100. In addition, the bracket 5 may include a coupling portion 51S that is capable of being coupled to the first part 31 of the bezel 3.

According to an embodiment of the present disclosure, at least a portion of the coupling portion 51S of the bracket 5 may be arranged not to be in close contact with the first part 31 of the bezel 3. In particular, empty spaces (gaps) G1 may be arranged in at least a portion between the coupling portion 51S of the bracket 5 and the first part 31 of the bezel 3. Such empty spaces G1 may include one or more horizontal spaces and/or vertical spaces, and as illustrated, a plurality of vertical spaces G11, G12, G13, and G14 may overlap with each other. In particular, the empty spaces G1 may be configured to overlap with a portion in which the adhesive member 6 is arranged. In addition, the empty spaces G1 may overlap with the curved faces (e.g., first regions 1A1, 1A2, 1A3, and 1A4) of the front cover 1.

According to an embodiment of the present disclosure, when the electronic device 100 is impacted (e.g., dropped), the impact transmitted to the front cover 1 through the bezel 3 may be relieved by the empty spaces G1 so that damage to the front cover 1 can be prevented. Assuming a case in which the bezel 3 and the bracket 5 are in close contact with each other without the empty spaces G1, when the front cover 1 is directly impacted, the rigid bezel 3 or bracket 5 reflects the impact to the front cover 1 rather than absorbing the impact, the front cover 1 may be damaged. On the contrary, when the empty spaces G1 are formed, when the front cover 1 of the electronic device 100 is directly impacted, the empty spaces G1 may dampen the impact to a certain degree, and damage to the front cover 1 can be prevented.

According to various embodiments of the present disclosure, as described above with reference to FIG. 14, the connecting portions 1L1, 1L2, 1L3, and 1L4 of the bezel 3 may be formed to protrude less than the central region 1A of the front cover 1 in the direction from the rear face B toward the front face F of the electronic device 100. With such an arrangement, the front cover 1 is highly probable to be directly impacted when the electronic device 100 is dropped to be impacted, and the empty spaces G1 may be required in order to prevent this.

According to various embodiments of the present disclosure, a configuration similar to the above-described empty spaces G1 may be applied in order to prevent damage to the rear cover 2. For example, an adhesive member 8 may be arranged between the rear cover 2 and the bezel 3, and empty spaces G2 for relieving impact may be applied to one or more coupling portions except for the coupling portion in which the adhesive member 8 is used. The empty spaces G2 for relieving impact may be formed between the second part 32 of the bezel 3 and the rear cover 2.

According to various embodiments of the present disclosure, as described above with reference to FIG. 16, the connecting portions 2L1, 2L2, 2L3, and 2L4 of the bezel 3 may be formed to protrude less than the central region 2A of the rear cover 2 in the direction from the front face F toward the rear face B of the electronic device 100. With such an arrangement, the rear cover 2 is highly probable to be directly impacted when the electronic device 100 is dropped to be impacted, and the empty spaces G2 may be required in order to prevent this.

Figure 21:
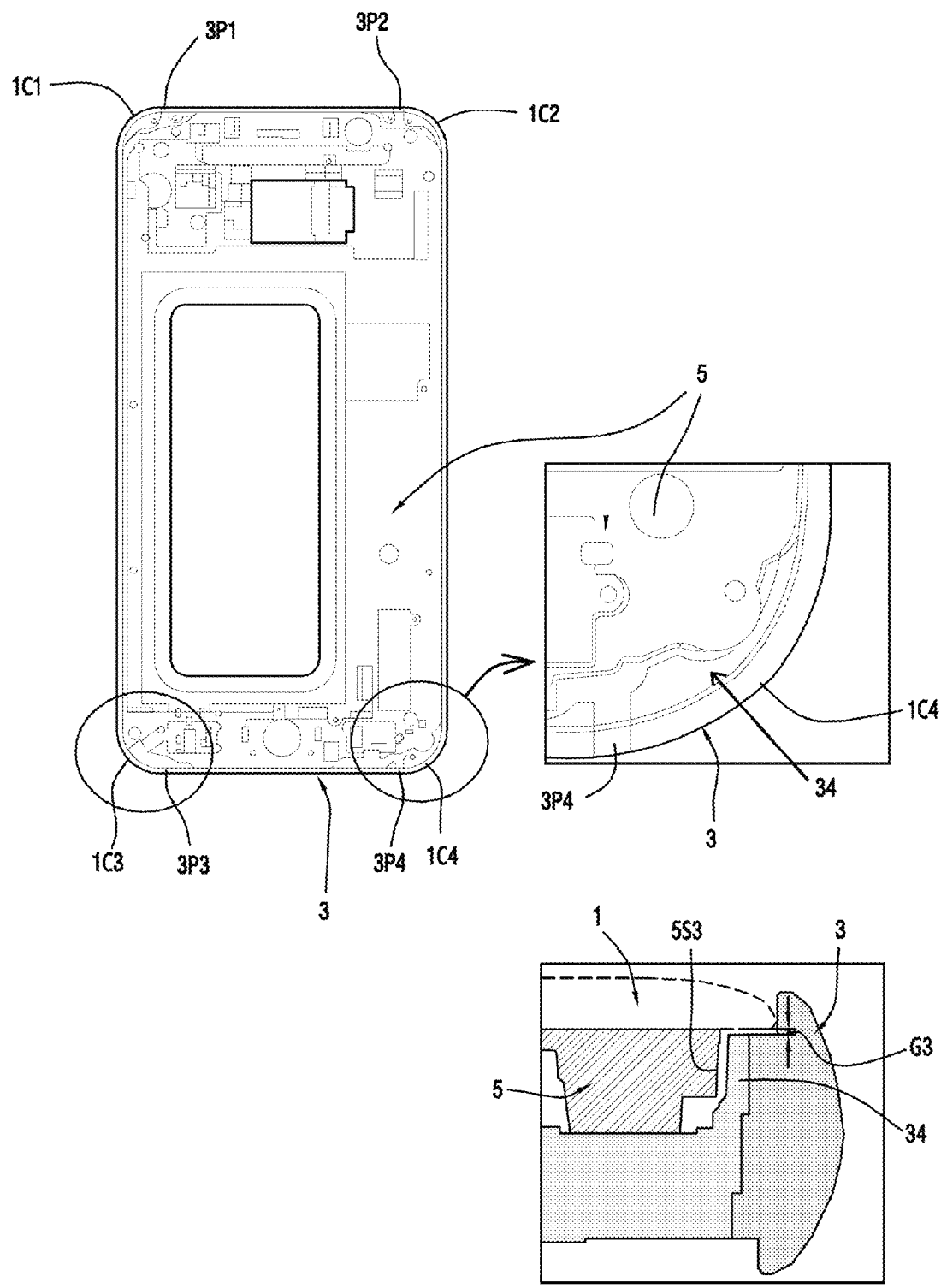
FIG. 21 illustrates a bezel of an electronic device according to various embodiments of the present disclosure.

FIG. 21 illustrates a bezel of an electronic device according to various embodiments of the present disclosure.

Referring to FIG. 21, with a configuration that couples the front cover 1 to the bracket 5 using an adhesive member 6, the bezel 3, to which the front cover 1 is not directly coupled, may be secondarily impacted due to a momentary deformation when external impact is applied. In order to solve this problem, one or more portions (or structural material) that directly support the front cover 1 may be removed from the bezel 3. However, since it is impossible to remove the structural material from the portions that are vulnerable to impact by dropping (for example, the cut-off portions 3P1, 3P2, 3P3, and 3P4 and/or the curved corner portions 1C1, 1C2, 1C3, and 1C4), it may not be desirable to remove corresponding buildup portions 34. Since such buildup portions 34 are arranged adjacent to the bracket 5 and extend toward the front cover 1 side, the buildup portions 34 may impact the front cover 1. Accordingly, in order to address the problem, according to an embodiment of the present disclosure, the buildup portions 34 of the bezel 3 are formed to not be in contact with the front cover 1 that is coupled to the bracket 5, and a gap G3 required for relieving impact may be formed between the buildup portions 34 and the front cover 1.

Figure 22:
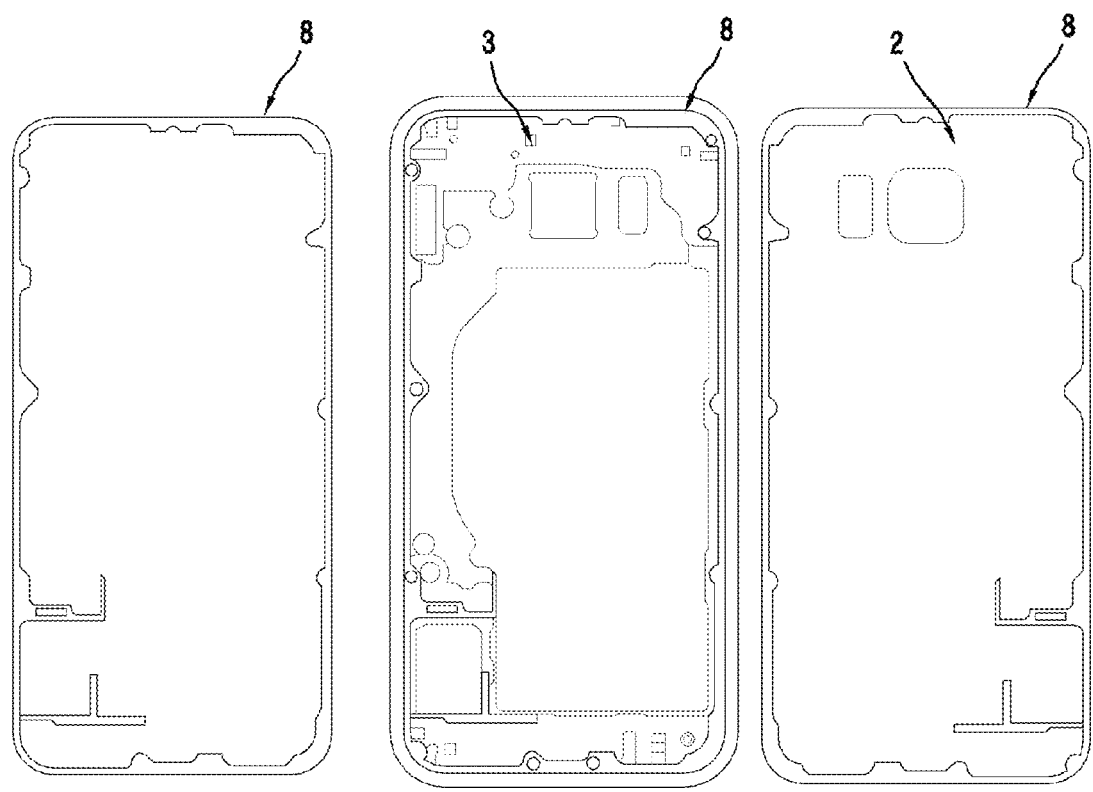
FIG. 22 illustrates coupling between a rear cover and a bezel according to various embodiments of the present disclosure.

FIG. 22 illustrates coupling between a rear cover and a bezel according to various embodiments of the present disclosure.

Referring to FIG. 22, the rear cover 2 may be coupled to the second part 32 of the bezel 3 using an adhesive member 8. According to an embodiment of the present disclosure, the adhesive member 8 may have an annular shape that is coupled along the outer periphery of the rear cover 2. Alternatively, the adhesive member 8 may be coupled to the bezel 3 first. The annular adhesive member 8 may prevent damage to the rear cover 2 due to the impact applied when the electronic device 100 is dropped. For example, the above-described structure may secure a gap between the rear cover 2 and the bezel 3, and may suppress the transmission of impact and deformation between the rear cover 2 and the bezel 3 due to the adhesion, thereby preventing damage to the rear cover 2.

The adhesive member 6, which is used when the front cover 1 is coupled to the bracket 5, is also prepared in the annular shape so that damage to the front cover 1 can be prevented.

Figure 23:
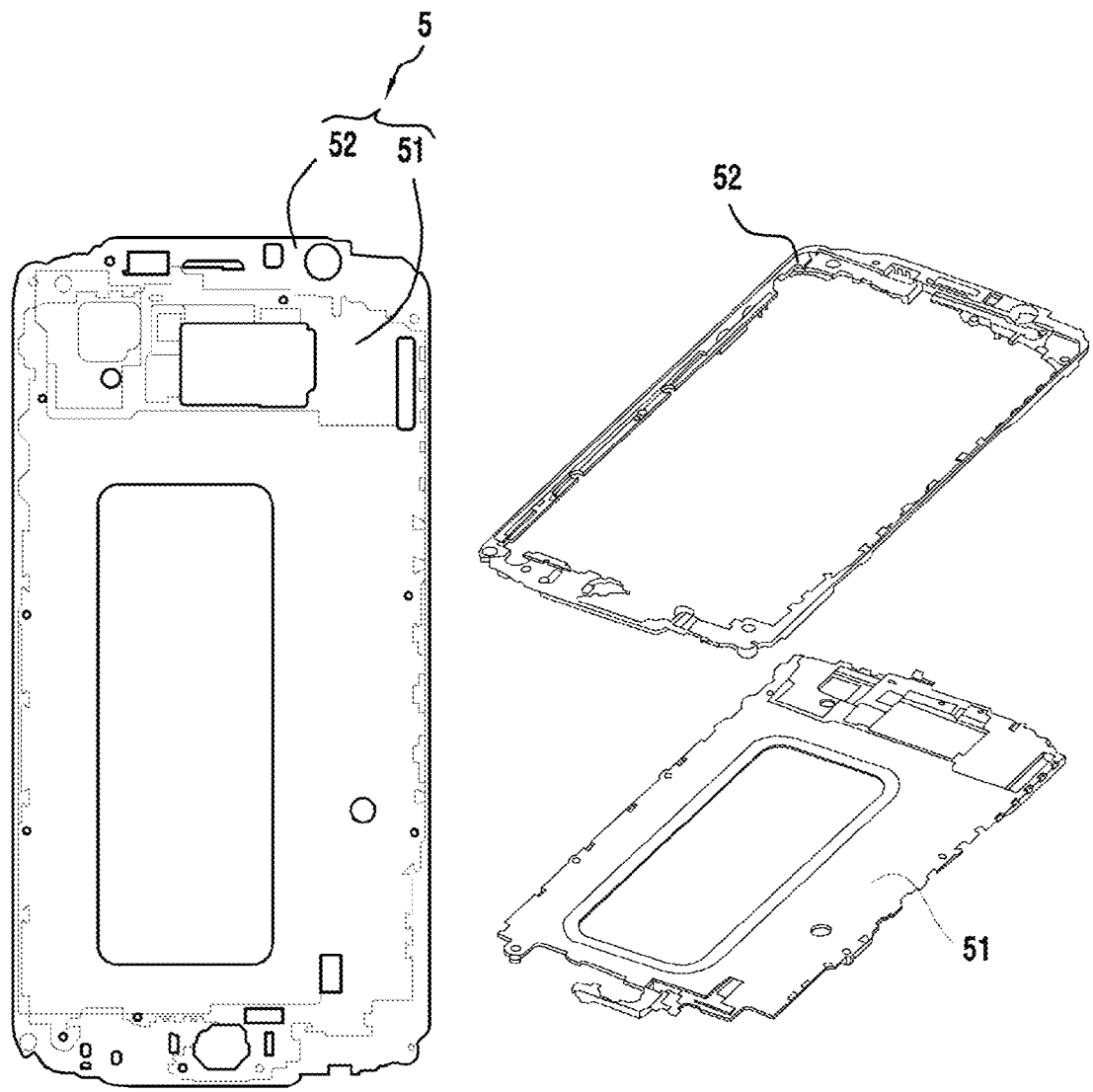
FIG. 23 illustrates a bracket according to various embodiments of the present disclosure.
Figure 24:
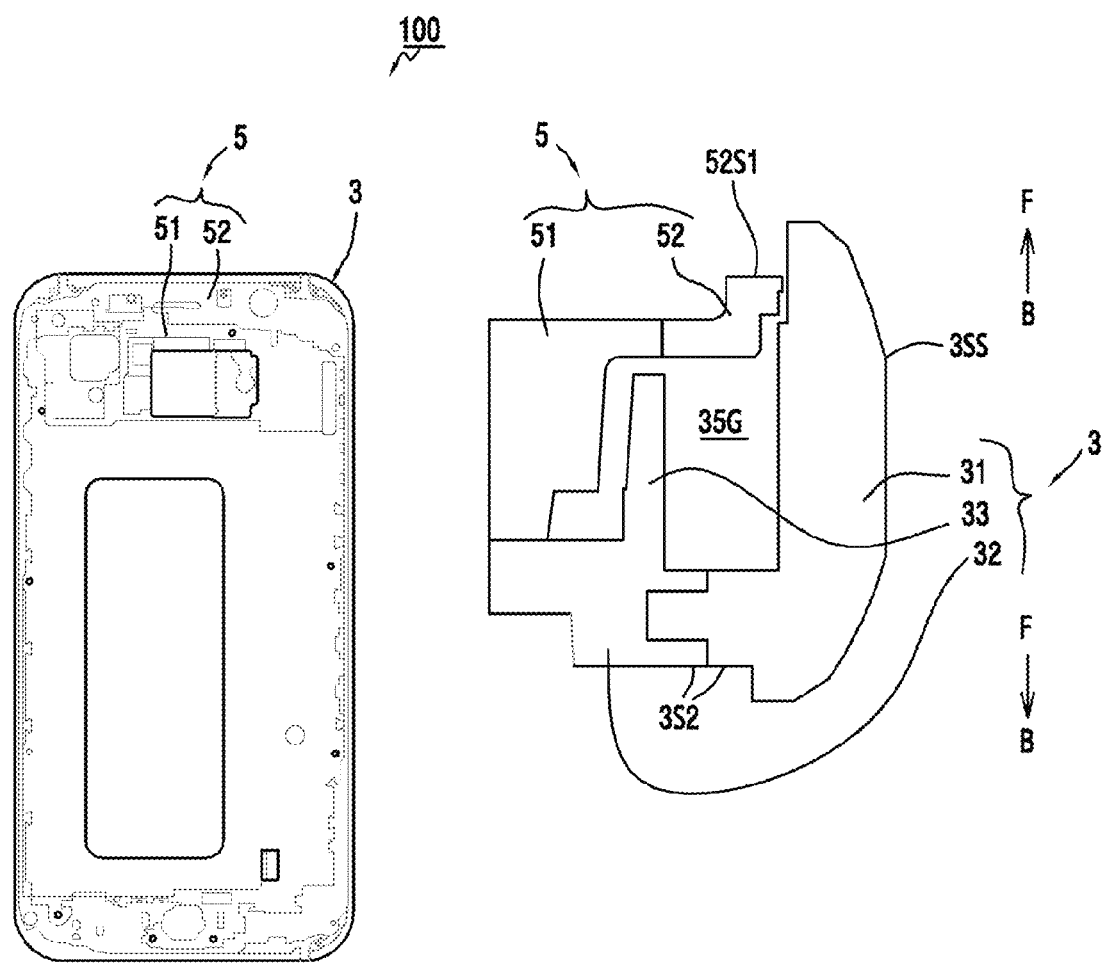
FIG. 24 illustrates coupling between a bracket and a bezel according to various embodiments of the present disclosure.

FIG. 23 illustrates a bracket according to various embodiments of the present disclosure. FIG. 24 illustrates coupling between a bracket and a bezel according to various embodiments of the present disclosure.

Referring to FIGS. 23 and 24, the bracket 5 may include a first part 51 and an annular second part 52 that encloses the first part 51. According to an embodiment of the present disclosure, the first part 51 and the second part 52 of the bracket 5 may be formed of different materials. In particular, the first part 51 may be formed of a metal material, and the second part 52 may be formed of a non-metal material.

According to an embodiment of the present disclosure, the second part 52 may be formed on the first part 51 through insert-molding after the first part 51 is molded.

According to an embodiment of the present disclosure, the second part 52 may include a flat face 52S1 to be close to the first part 31 of the bezel 3, and the front cover 1 (see FIG. 3) may be coupled to the flat face 52S1 with an adhesive member 6 (see FIG. 3) being interposed therebetween. The specific arrangement shape was described above with reference to FIG. 14.

According to an embodiment of the present disclosure, the bezel 3 may include a second part 32, and a first part 31 that encloses the second part 32. The first part 31 may form the external face 3SS (side face) of the electronic device 100. The external face 3SS may be a generally curved face. In addition, the first part 31 may have a shape that is relatively extended in the direction from the rear face B toward the front face F of the electronic device 100 and in the direction from the front face F toward the rear face B.

According to an embodiment of the present disclosure, the first part 31 and the second part 32 of the bezel 3 may be formed of different materials. In particular, the first part 31 may be formed of a metal material, and the second part 32 may be formed of a non-metal material.

According to an embodiment of the present disclosure, the second part 32 may be formed on the first part 31 through insert-molding after the first part 31 is molded.

According to an embodiment of the present disclosure, a face 3S2, that is formed as the first part 31 and the second part 32 are coupled to each other, and a rear cover 2 (see FIG. 3) may be coupled to the face 3S2 with an adhesive member 8 (see FIG. 3) being interposed therebetween. The specific arrangement shape was described above with reference to FIG. 16.

According to an embodiment of the present disclosure, the bezel 3 may include a rib 33 that extends from the second part 32. The rib 33 may extend in a direction from the rear face B toward the front face F of the electronic device 100. The rib 33 may be arranged in a space 35G that is formed by the bezel 3 and the bracket 5, and may come close to the bracket 5.

According to an embodiment of the present disclosure, the second part 52 of the bracket 5 may come close to or abut the first part 31 of the bezel 3. Here, since the first part 31 of the bezel 3 is formed of a metal material but the second part 52 of the bracket 5 is formed of a non-metal material, an electrical current cannot flow therebetween.

According to an embodiment of the present disclosure, the first part 51 of the bracket 5 extends in a direction from the front face F toward the rear face B, and may abut the second part 32 of the bezel 3. Here, since the first part 51 of the bracket 5 is formed of a metal material but the second part 32 of the bezel 3 is formed of a non-metal material, an electrical current cannot flow therebetween.

According to an embodiment of the present disclosure, since an electrical current cannot flow between the bezel 3 and the bracket 5 as described above, electric shock through the first part 31 of the bezel 3, which is exposed to the outside, can be prevented.

According to various embodiments of the present disclosure, a portable electronic device may include a front glass cover that forms a front face of the electronic device, a rear glass cover that forms a rear face of the electronic device, a metal bezel that surrounds a space formed by the front glass cover and the rear glass cover, and a display device that is embedded in the space and that includes a screen region exposed through the front glass cover. At least one glass cover of the front glass cover and the rear glass cover may include a surface that includes a first edge, a second edge extending at an opposite side to the first edge, a third edge interconnecting a first end of the first edge and a first end of the second edge, and a fourth edge interconnecting a second end of the first edge and a second end of the second edge. When viewed from a cross-section, the at least one glass cover may include a first region having a thickness that decreases at a first gradient toward the first edge, and positioned adjacent to the first edge, a second region having a thickness that decreases at the first gradient toward the second edge, and positioned adjacent to the second edge, a third region having a thickness that decreases at a second gradient, which is different from the first gradient, toward the third edge, and positioned adjacent to the third edge, and a fourth region having a thickness that decreases at the second gradient toward the fourth edge, and positioned adjacent to the fourth edge.

According to various embodiments of the present disclosure, at least one of the first to fourth regions may include a curved face.

According to various embodiments of the present disclosure, at least one glass cover may include an external face exposed to an outside and an internal face facing to an inside of the electronic device, and the internal face may be a substantially flat face.

According to various embodiments of the present disclosure, the first region and the second region may be symmetrical to each other, and the third region and the fourth region may be symmetrical to each other.

According to various embodiments of the present disclosure, the screen region may have a rectangular shape having a first short side adjacent to the first edge, a second short side adjacent to the second edge, a first long side adjacent to the third edge, and a second long side adjacent to the fourth edge.

According to various embodiments of the present disclosure, the second gradient may be smaller than the first gradient.

According to various embodiments of the present disclosure, the at least one glass cover may be the rear glass cover. In addition, the metal bezel may include a first corner portion adjacent to a location where the first edge and the third edge are connected to each other, a second corner portion adjacent to a location where the first edge and the fourth edge are connected to each other, and a first connecting portion between the first corner portion and the second corner portion. Further, in a direction from the front face to the rear face of the electronic device when viewed from the cross-section, the first corner portion and the second corner portion may have a first thickness, and the first connecting portion may have a second thickness that is smaller than the first thickness.

According to various embodiments of the present disclosure, the metal bezel may include a third corner portion adjacent to a location where the second edge and the third edge are connected to each other, a fourth corner portion adjacent to a location where the second edge and the fourth edge are connected to each other, and a second connecting portion between the third corner portion and the fourth corner portion. In addition, in the direction from the front face to the rear face of the electronic device when viewed from the cross section, the third corner portion and the fourth corner portion may have the first thickness, and the second connecting portion may have the second thickness.

According to various embodiments of the present disclosure, the metal bezel may include a third connecting portion between the first corner portion and the third corner portion, and a fourth connecting portion between the second corner portion and the fourth corner portion. In addition, in the direction from the front face to the rear face of the electronic device when viewed from the cross-section, the third connecting portion and the fourth connecting portion may have a third thickness that is smaller than the first thickness.

According to various embodiments of the present disclosure, the rear glass cover may include a central region that is surrounded by the first to fourth regions, and the first corner portion may include a first corner face that forms a surface parallel to the rear face. In addition, the second corner portion may include a second corner face that forms a surface parallel to the rear face, and the first connecting portion may include first connecting face that forms a surface parallel to the rear face. Further, the first corner face and the second corner face may protrude more than the central region in the direction from the front face to the rear face of the electronic device when viewed from the cross-section.

According to various embodiments of the present disclosure, the first connecting face may protrude less than the central region in the direction from the front face to the rear face of the electronic device when viewed from the cross-section.

According to various embodiments of the present disclosure, the third connecting portion may include a third connecting face that forms a surface parallel to the rear face. The third connecting face may protrude less than the central region and the third region in the direction from the front face to the rear face of the electronic device when viewed from the cross-section.

According to various embodiments of the present disclosure, the at least one glass cover may be the front glass cover, and the first region and the second region may not overlap with the screen region.

According to various embodiments of the present disclosure, the at least one glass cover may be the front glass cover. In addition, the metal bezel may include a first corner portion adjacent to a location where the first edge and the third edge are connected to each other, a second corner portion adjacent to a location where the first edge and the fourth edge are connected to each other, and a first connecting portion between the first corner portion and the second corner portion. Further, in a direction from the rear face to the front face of the electronic device when viewed from the cross-section, the first corner portion and the second corner portion have a first thickness, and the first connecting portion has a second thickness that is smaller than the first thickness.

According to various embodiments of the present disclosure, the metal bezel may include a third corner portion adjacent to a location where the second edge and the third edge are connected to each other, a fourth corner portion adjacent to a location where the second edge and the fourth edge, and a second connecting portion between the first corner portion and the second corner portion. In addition, in a direction from the rear face to the front face of the electronic device when viewed from the cross section, the third corner portion and the fourth corner portion may have the first thickness, and the second connecting portion may have the second thickness.

According to various embodiments of the present disclosure, the metal bezel may include a third connecting portion between the first corner portion and the third corner portion, and a fourth connecting portion between the second corner portion and the fourth corner portion. In addition, in the direction from the rear face to the front face of the electronic device when viewed from the cross section, the third connecting portion and the fourth connecting portion may have a third thickness that is smaller than the first thickness.

According to various embodiments of the present disclosure, the front glass cover may include a central region surrounded by the first to fourth regions, and the first corner portion may include a first corner face that forms a surface parallel to the front face. In addition, the second corner portion may include a second corner face that forms a surface parallel to the front face, and the first connecting portion may include a first connecting face that forms a surface parallel to the front face. Further, the first corner face and the second corner face may protrude more than the central region in the direction from the rear face to the front face of the electronic device when viewed from the cross section.

According to various embodiments of the present disclosure, the first connecting face may protrude less than the central region, in the direction from the rear face to the front face of the electronic device when viewed from the cross section.

According to various embodiments of the present disclosure, the third connecting portion may include a third connecting face that forms a surface parallel to the front face. In addition, the third connecting face may protrude less than the central region in the direction from the rear face to the front face of the electronic device when viewed from the cross section.

According to various embodiments of the present disclosure, the portable electronic device may further include a camera embedded in the space formed by the front glass cover and the rear glass cover, in which the camera may receive external light introduced through the front glass cover. In addition, the first to fourth regions may not be included in a range of an angle of view of the camera.

According to an embodiment of the present disclosure, the electronic device 100 may include one or more key buttons that are exposed to the outside. For example, the key buttons may include a key button for a volume up/down function, a key button for a power on/off function, a key button for a wakeup/sleep function, or the like.

A method of assembling a key button to a set or a structure according to the related art may include a method of assembling the key button at the outside of the set and a method of assembling the key button at the inside of the set. Here, the set refers to a frame on which the key button is installed and may include the above-mentioned bezel 3, the above-mentioned bracket 5, or the like.

According to an embodiment of the present disclosure, the method of assembling the key button at the outside of the set refers to a method in which an FPCB is attached to the set (e.g., the bezel 3 or the bracket 5), and then the key button is fitted to the set from the outside. Such a method may have an advantage in that it is possible to assemble the key button and the FPCB to a single set, the performance of the key button (e.g., a click feeling or a life span) may be tested prior to assembling the electronic device 100. However, there may be a problem in that since the key button is fitted from the outside of the set, the exterior of the set may be damaged (e.g., scratched). In addition, when the key button is fitted from the outside, there may be a problem in that it is difficult for the key button to be maintained in the coupled state.

According to an embodiment of the present disclosure, in the method of assembling the key button at the inside of the set, the key button may be assembled to one structure (e.g., the bezel 3), the FPCB may be assembled to the other structure (e.g., the bracket 5), and then two structures 3 and 5 may be coupled to each other. That is, the key button and the FPCB may be coupled to different structures. In such a case, the performance test of the key button may be conducted in the state where the two structures are coupled to each other. Meanwhile, when the key button is damaged or is defective, it is cumbersome since the two structures should be separated again.

According to an embodiment of the present disclosure, a key button assembly may be provided in order to solve the above-described problems. According to an embodiment, a key button assembly enables the performance test of the key button even if the structures are not coupled to each other while using the method of assembling the key button at the inside of the set or the structure.

Figure 25A:
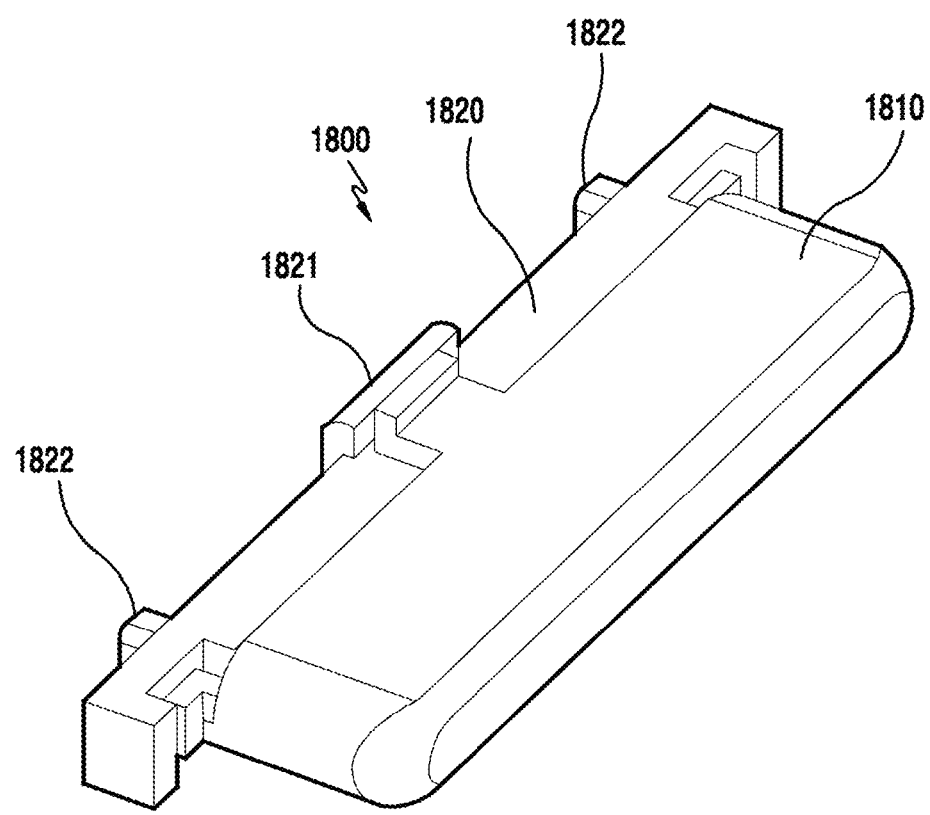
FIGS. 25A and 25B are views illustrating a configuration of a key button according to various embodiments of the present disclosure.
Figure 25B:
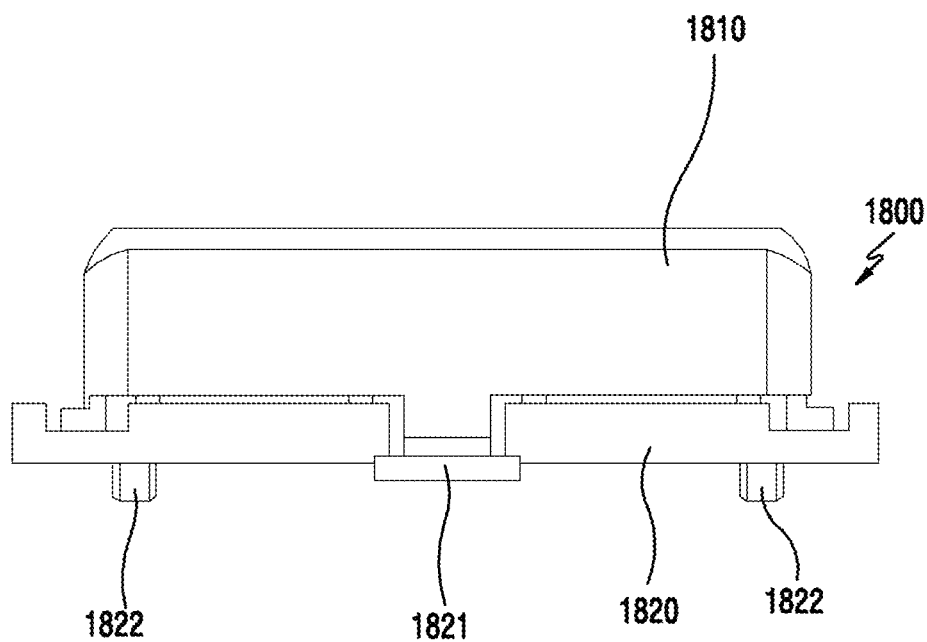

FIGS. 25A and 25B are views illustrating a configuration of a key button according to various embodiments of the present disclosure.

Referring to FIGS. 25A and 25B, the key button 1800 may include a key top 1810 and a key base 1820 that is coupled to the key top 1810.

According to an embodiment of the present disclosure, the key top 1810 may be movably arranged to be exposed to an external face (e.g., a side face) of the electronic device 100.

According to an embodiment of the present disclosure, the key top 1810 may be molded using various materials. For example, the key top 1810 may be formed of a metal material or a non-metal material (e.g., a synthetic resin).

According to an embodiment of the present disclosure, the key base 1820 may be fixed to one side of the key top 1810. Here, the key base 1820 has a width larger than that of the key top 1810, and may serve as a locking member that prevents the key button 1800 from being released to the outside through a through-hole of the set.

According to an embodiment of the present disclosure, the key base 1820 may include a pressing portion 1821 that is arranged at the opposite side to the face where the key top 1810 is installed. The pressing portion 1821 may serve to press a push switch (e.g., a dome switch), and may have a shape that protrudes from the surrounding portion in order to intensively press the push switch.

According to an embodiment of the present disclosure, the key base 1820 may include a pair of support pieces 1822 that are arranged at the opposite side to the face where the key top 1810 is installed. The pressing portion 1821 may be arranged between the support pieces 1822. The pair of support pieces 1822 may prevent the key button 1800, which is installed in the set, from being excessively inserted into the inside of the electronic device 100. In addition, the pressing portion 1821 may smoothly press the push switch under the support of the pair of support pieces 1822.

According to an embodiment of the present disclosure, the key base 1820 may have elasticity. For example, the key base 1820 may be formed of rubber, silicon, urethane, or the like.

According to an embodiment of the present disclosure, the key top 1810 and the key base 1820 may be formed of different materials. For example, the key top 1810 may be formed of a metal material, and the key base 1820 may be formed of a non-metal material. Here, after a metal key top 1810 is formed, a non-metal key base 1820 may be formed on the key top 1810 using insert-molding.

According to an embodiment of the present disclosure, the key top 1810 and the key base 1820 may be integrally formed using a single material.

Figure 26:
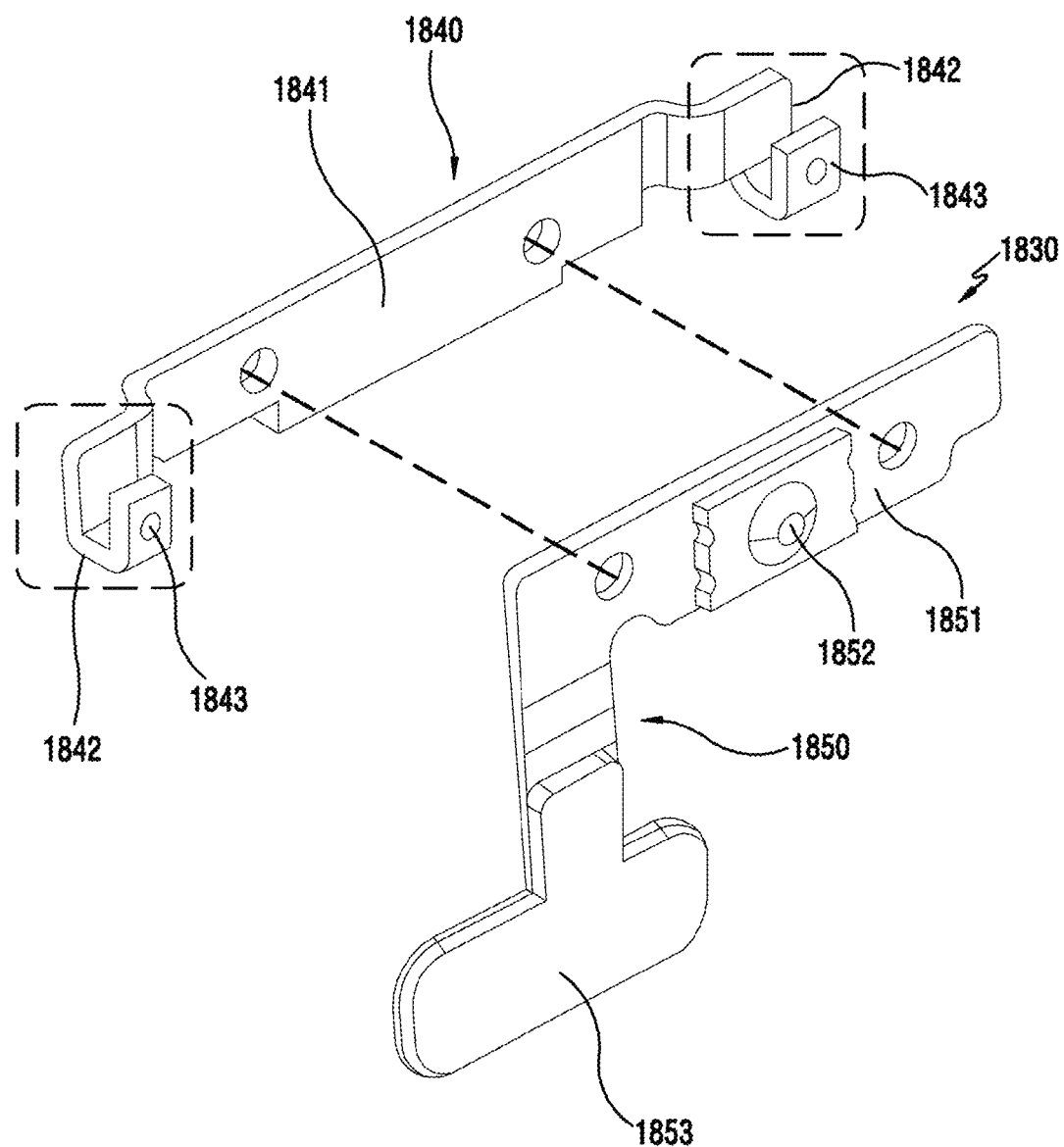
FIG. 26 is an exploded perspective view of a flexible printed circuit board (FPCB) assembly according various embodiments of the present disclosure.

FIG. 26 is an exploded perspective view of an FPCB assembly according to various embodiments of the present disclosure.

Referring to FIG. 26, an FPCB assembly 1830 may include a support plate 1840 and an FPCB 1850 that is supported by the support plate 1840.

According to an embodiment of the present disclosure, the FPCB 1850 may include a circuit body 1851 that is attached to the support plate 1840, and a contact 1853 that is drawn out from the circuit body 1851 and is electrically connected to a circuit board 7 (see FIG. 6E) of the electronic device 100.

According to an embodiment of the present disclosure, a dome switch 1852 may be arranged on the circuit body 1851. The dome switch 1852 may be pressed by the pressing portion 1821 of the above-described key base 1810.

According to an embodiment of the present disclosure, the support plate 1840 may include a plate body 1841 that supports the circuit body 1851 of the FPCB 1850, and elastic pieces 1842 that are bent at both ends of the plate body 1841. The elastic piece 1842 may include a shape that may have elasticity. For example, the elastic pieces 1842 may be formed in various shapes, such as a "U" shape, a circular shape, an oval shape, and an "S" shape.

According to an embodiment of the present disclosure, the elastic pieces 1842 are seated in elastic piece installation recesses 2011 (see FIG. 27A) of the bezel 3, which will be described below with reference to FIG. 27A, and the elastic pieces 1842 are fitted to the elastic piece installation recesses 2011, respectively, which may prevent the support plate 1840 from being released from the bezel 3. In addition, each of the elastic pieces 1842 may further include at least one fixing protrusion 1843 that protrudes from one face. The fixing protrusions 1843 may be fitted to recesses or openings that are formed in the elastic piece installation recesses 2011, respectively. This may improve the coupling force between the elastic pieces 1842 and the elastic piece installation recesses 2011.

According to an embodiment of the present disclosure, the plate body 1841 of the support plate 1840 and the circuit body 1851 of the FPCB 1850 may be coupled to each other with an adhesive member (e.g., a double-sided tape or an adhesive) being interposed therebetween.

FIGS. 27A to 27E are views illustrating a process of installing a key button and an FPCB assembly, according to various embodiments of the present disclosure.

Figure 27A:
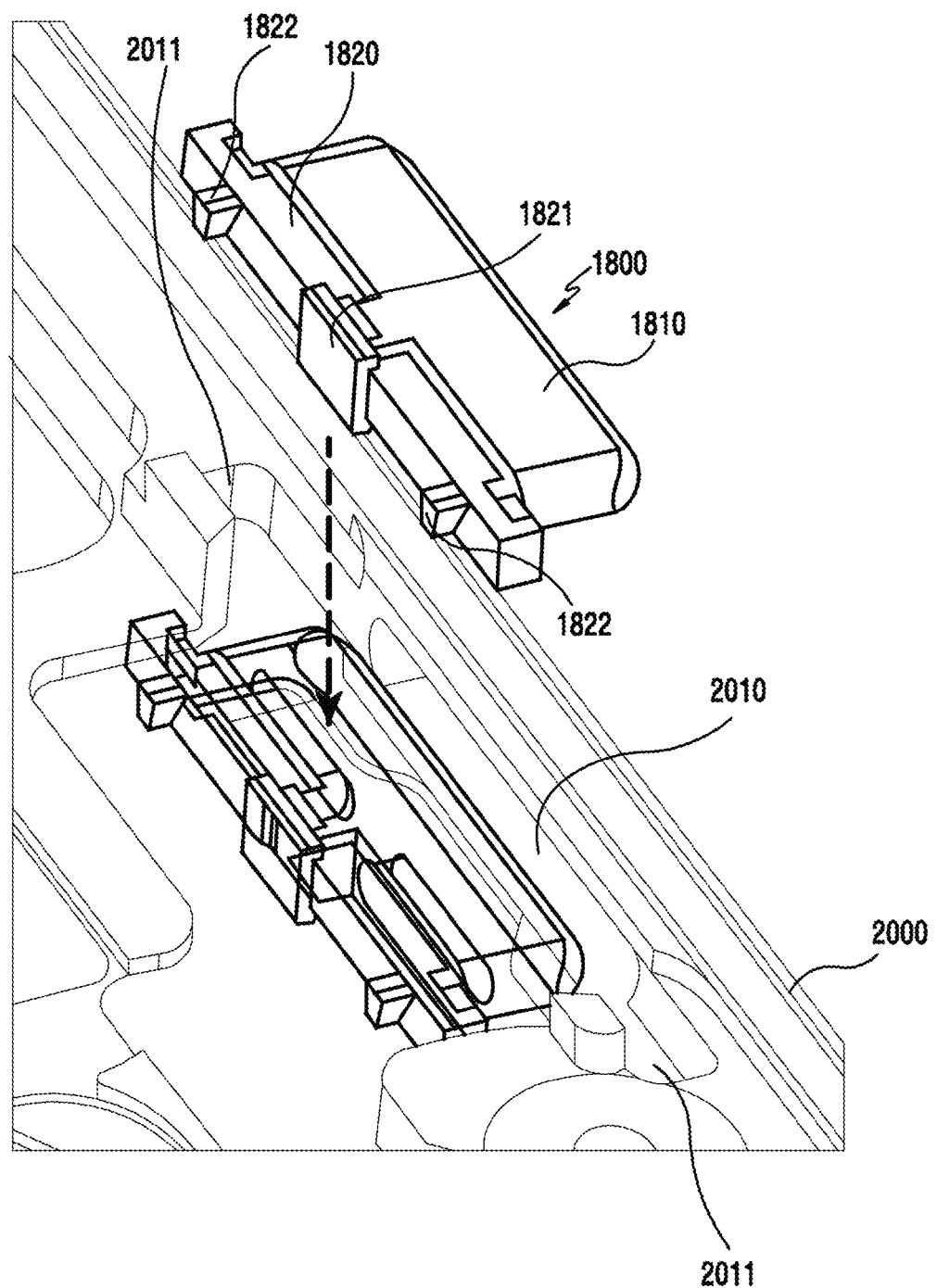
FIGS. 27A to 27E are views illustrating a process of installing a key button and an FPCB assembly according to various embodiments of the present disclosure.
Figure 27B:
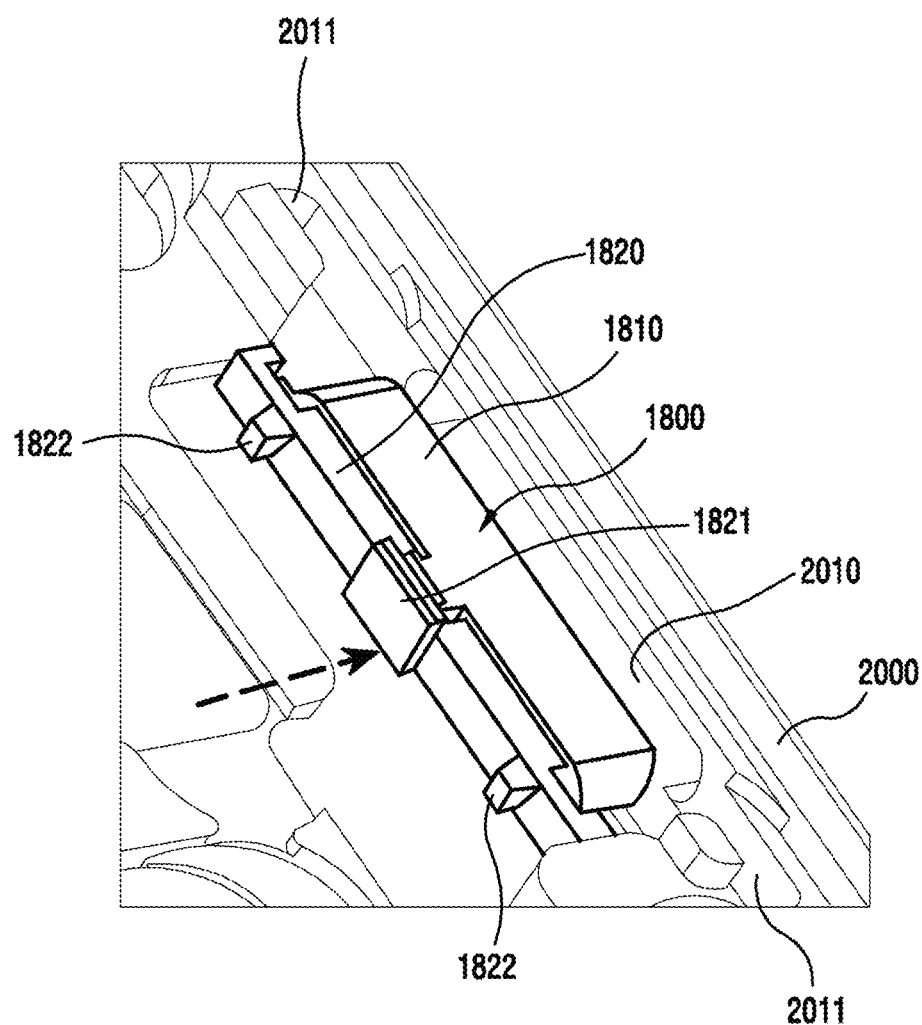

Referring to FIGS. 27A and 27B, a housing 2000 (e.g., a bezel 3) of the electronic device 100 may include a key top penetration hole 2010. According to an embodiment of the present disclosure, the key top penetration hole 2010 may be formed in a width that enables penetration of the key top 1810 of the key button 1800. In addition, the key top penetration hole 2010 may be formed in a width that allows only the key top 1810 to penetrate the key top penetration hole 2010, and but prevents the key base 1820, which is coupled to the key top 1810, from penetrating the key base 1820.

According to an embodiment of the present disclosure, the key button 1800 may be moved down in a direction indicated by the arrow from the top side of the housing 2000 as illustrated in FIG. 27A and then may be moved forward toward the key top penetration hole 2010 as illustrated in FIG. 27B. With this operation, the key base 1820 may restrain the key button 1800 from being fully released from the key top penetration hole 2010 of the housing 2000, and at the same time, the key top 1810 may be arranged to be partially exposed to the outside of the housing 2000 through the key top penetration hole 2010.

Figure 27C:
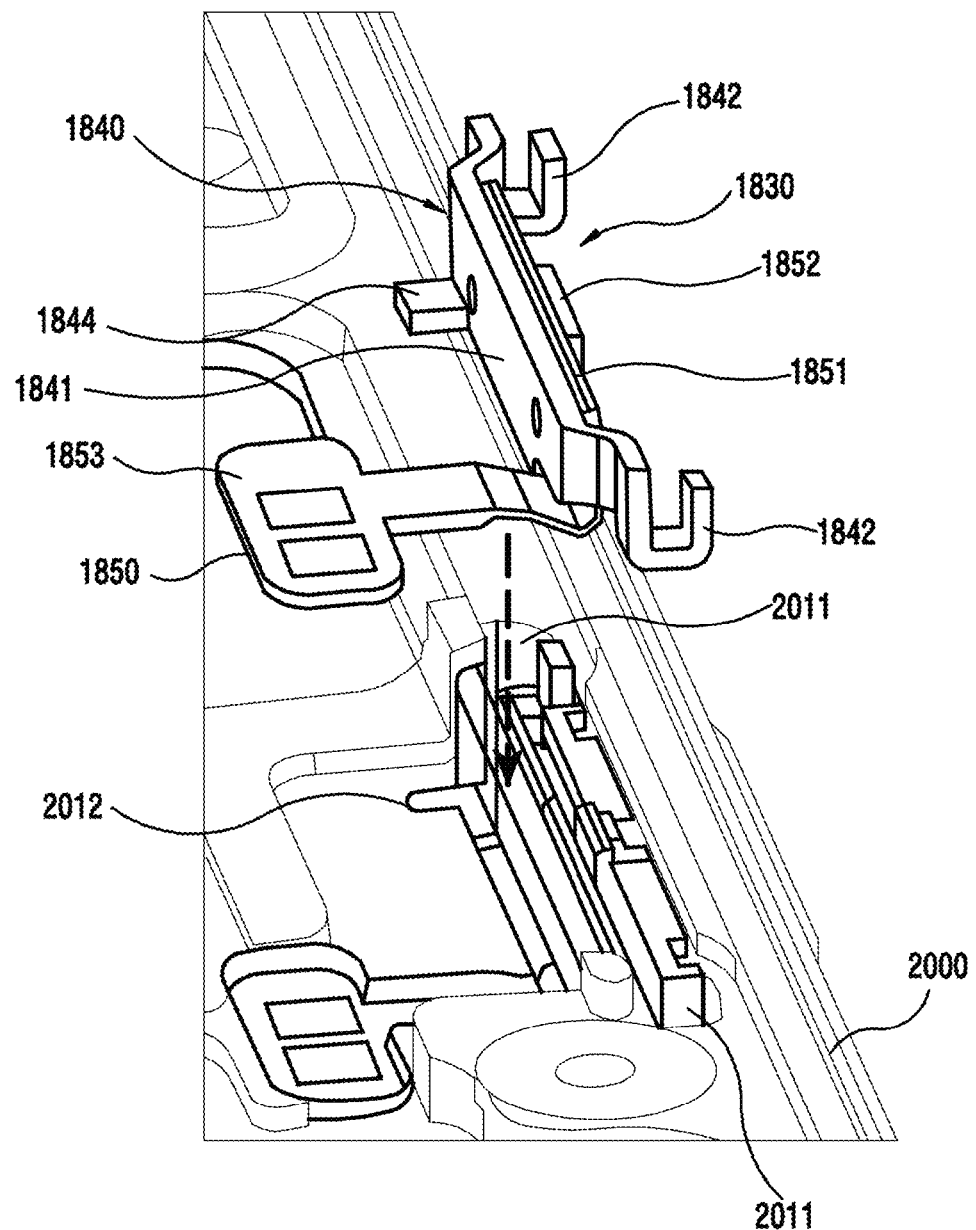

Referring to FIG. 27C, the FPCB assembly 1830 may be mounted in the direction indicated by the arrow from the rear side while maintaining the state in which the key top 1810 of the key button 1800 is partially penetrated through the key top penetration hole 2010 of the key top 1810. In such a case, the elastic pieces 1842, which are formed on the opposite ends of the support plate 1840 of the FPCB assembly 1830, may be tightly seated in the elastic piece installation recesses 2011, which are formed in the housing 2000. This is resulted from the fact that the elastic pieces 1842 are seated in the elastic piece installation recesses 2011 while retaining an outwardly biased elastic force. In addition, the elastic piece installation recesses 2011 may be formed with openings (not illustrated), respectively, so as to support fixation of the support plate 1840 to the housing 2000 by causing the fixing protrusions 1843, which are formed on the elastic pieces 1842 to protrude, to be seated in the openings, respectively.

According to an embodiment of the present disclosure, the support plate 1840 may include a fixing piece 1844 that is formed on the plate body 1841 to be orthogonal to the plate body 1841. When the support plate 1840 is fixed to the housing 2000, the above-described fixing piece 1844 is seated in a fixing piece installation recess 2012 that is formed on the inner face of the housing 2000 so that the support plate 1840, which is mounted on the housing 2000, can be prevented from moving from side to side.

Figure 27D:
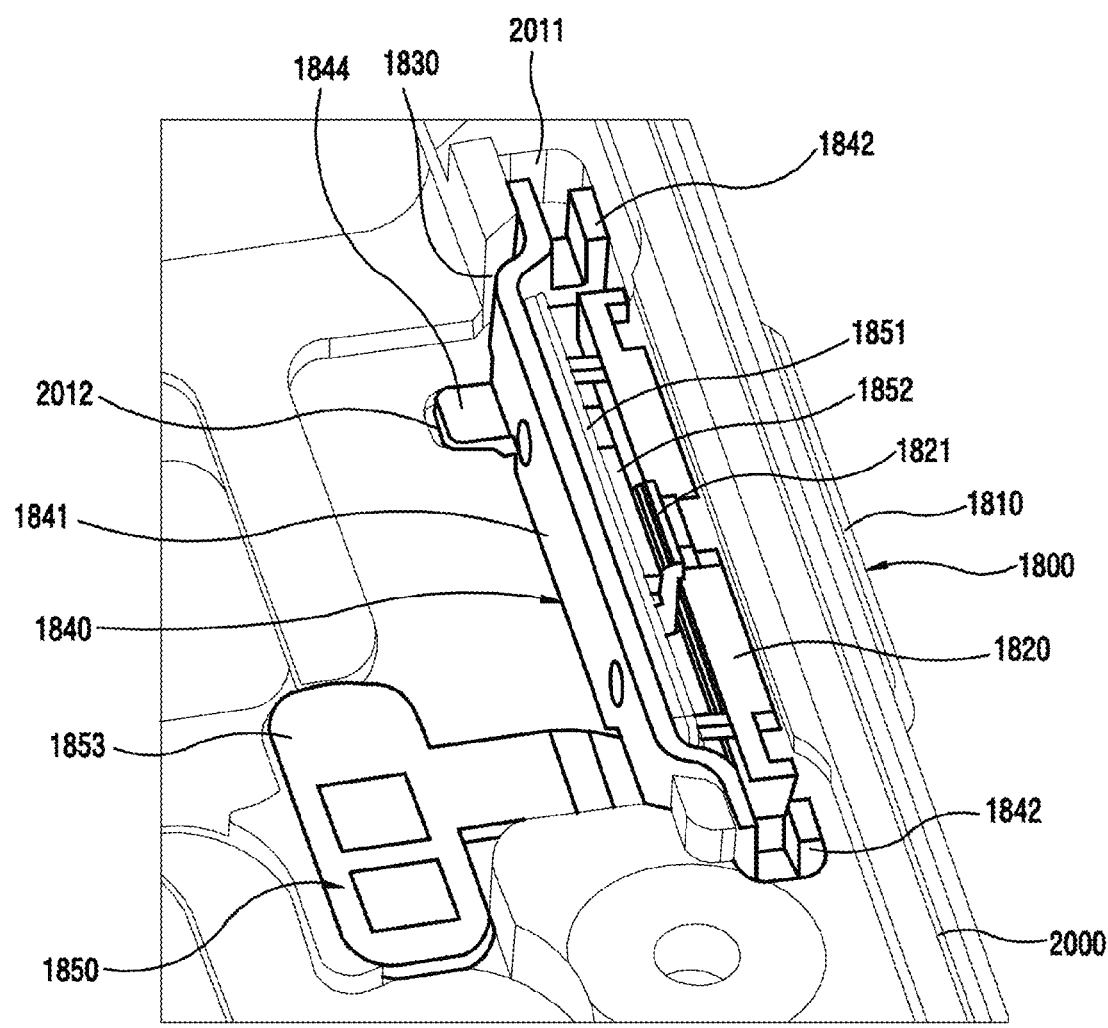
Figure 27E:
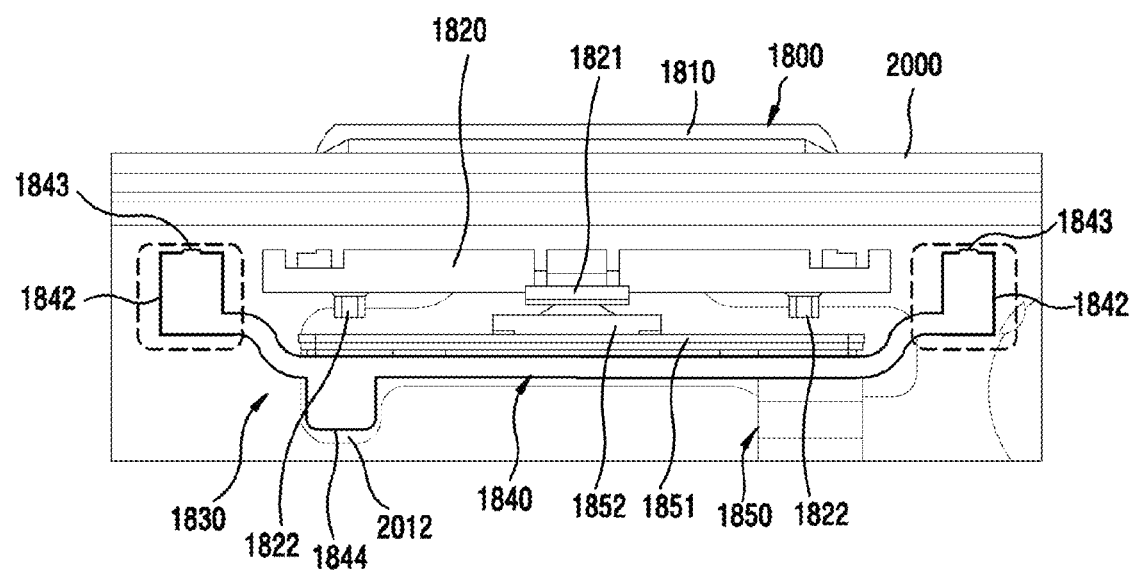
Figure 28A:
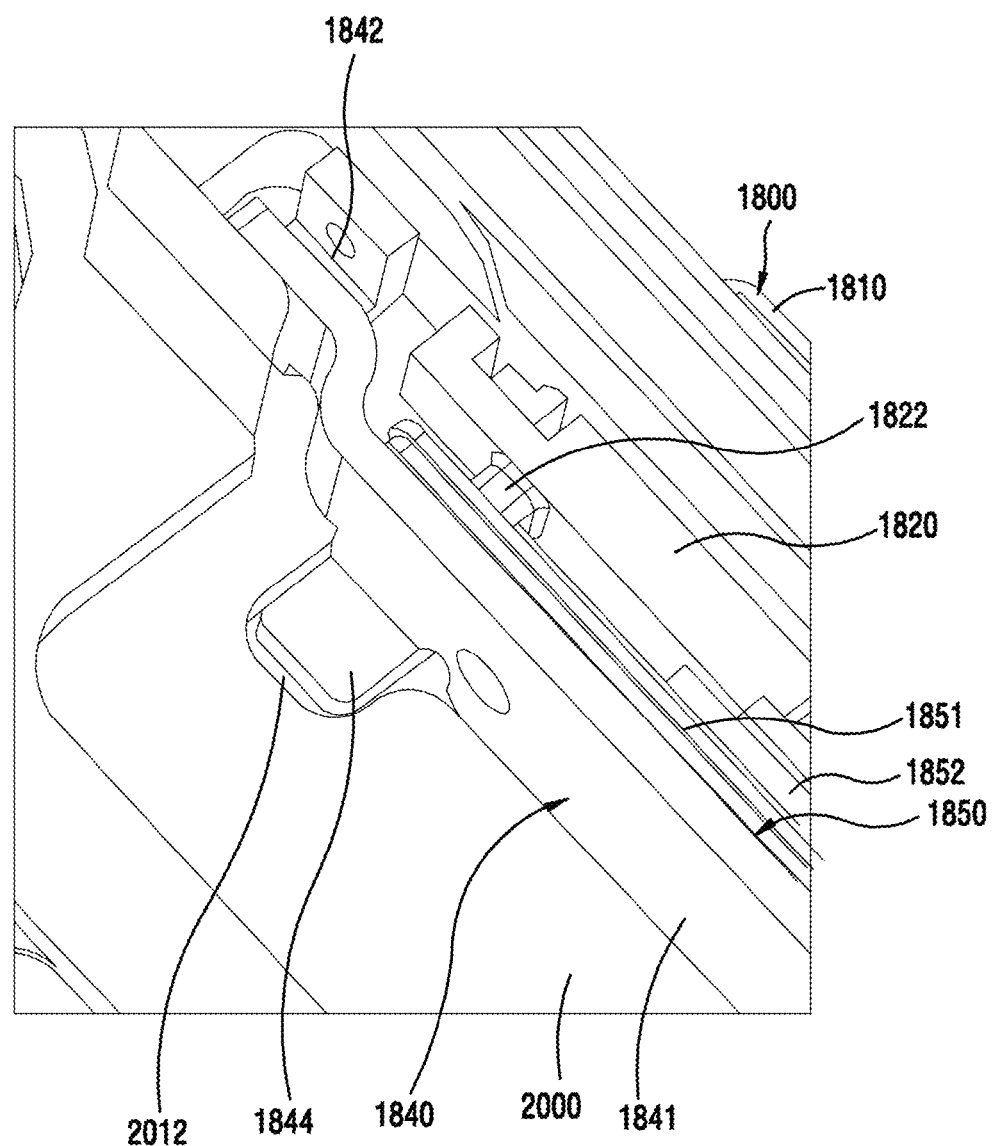
FIGS. 28A to 28D are views illustrating an FPCB assembly installed in an electronic device according to various embodiments of the present disclosure.
Figure 28B:
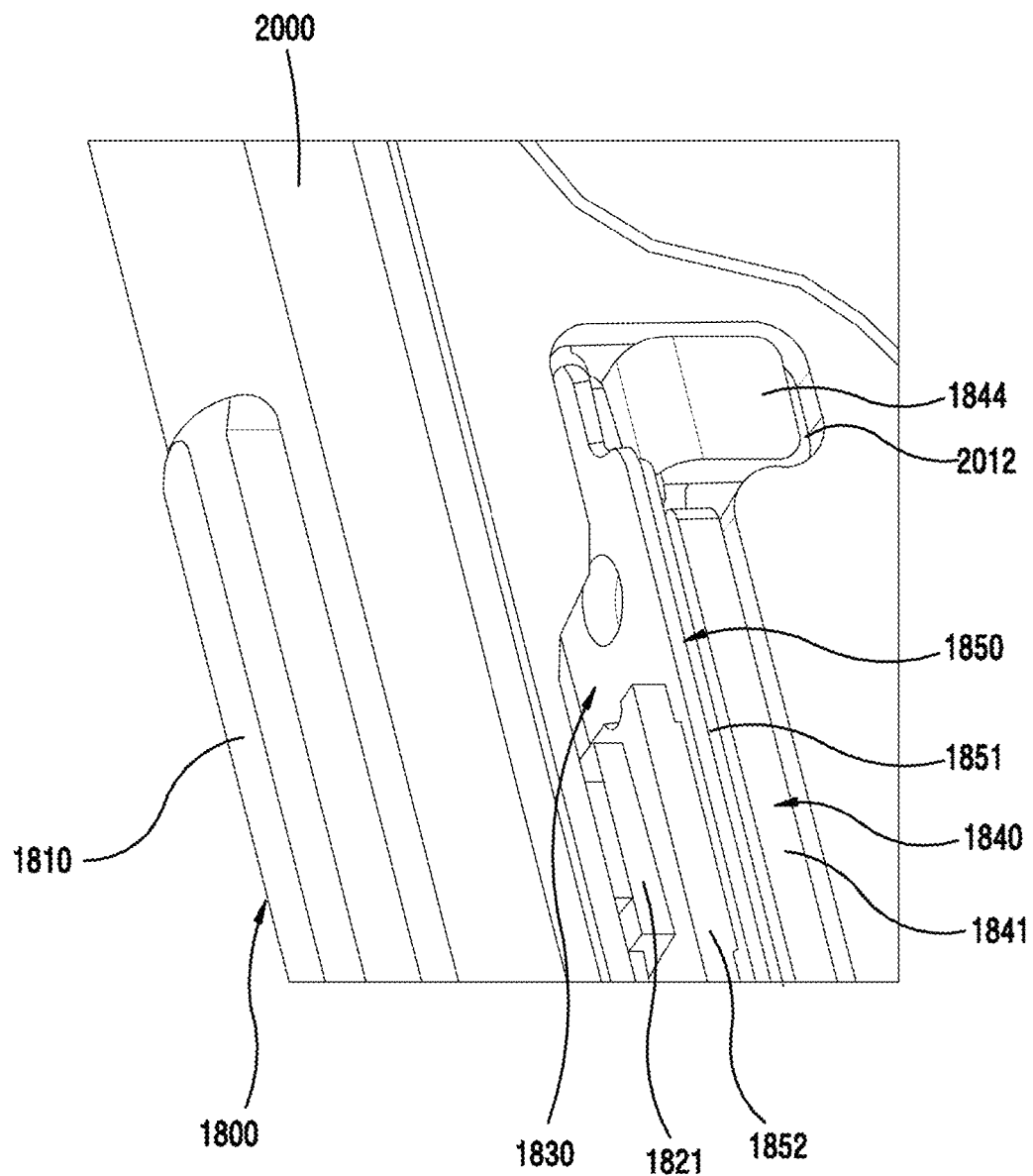
Figure 28C:
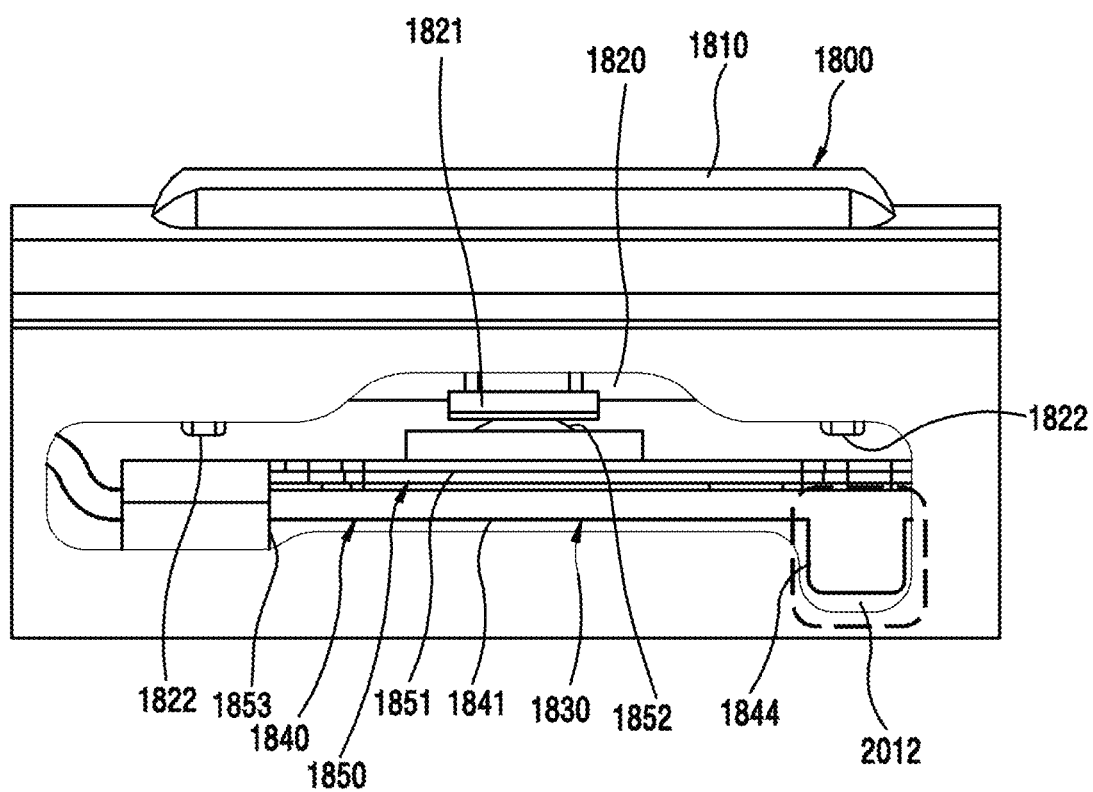
Figure 28D:
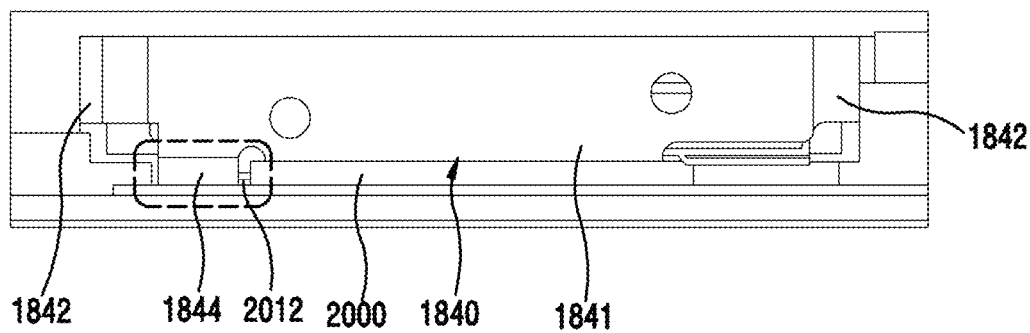

Referring to FIGS. 27D and 27E, the key button 1800 mounted in the housing 2000 may be maintained in the state where the key top 1810 is partially exposed to the outside of the housing 2000, and may support the key button 1800 by the support plate 1840 of the FPCB assembly 1830 at the rear side thereof.

According to an embodiment of the present disclosure, the pressing portion 1821 formed on the key base 1820 of the key button 1800 may be maintained in the state where it is in contact with the dome switch 1852 of the circuit body 1851 that is supported by the plate body 1841 of the FPCB assembly 1830. In such a case, since the elastic pieces 1842 formed on the opposite ends of the support plate 1840 are fixed to the elastic piece installation recesses 2011 formed in the housing 2000, the support plate 1840 is not retreated even if the key button 1800 is pressed, and only the dome switch 1852 arranged on the circuit body 1851 of the FPCB 1850 may be pressed as being processed by the pressing portion 1821 of the key base 1820.

According to an embodiment of the present disclosure, since the pressing operation of the key top 1810 is implemented only by the support of the support plate 1840 of the FPCB assembly 1830 without any other separate structure (e.g., the bracket 5) in the state where the key button 1800 is assembled in the inside of the housing 2000, the performance test of the key button 1800 can be easily implemented.

FIGS. 28A to 28D are views illustrating an FPCB assembly installed in an electronic device according to various embodiments of the present disclosure.

Referring to FIGS. 28A to 28D, while the support plate 1840 of the FPCB assembly 1830 can be rigidly fixed by the elastic pieces 1842 at the opposite ends thereof, the support plate 1840 can move from side to side. Accordingly, the fixing piece 1844 may be formed by being bent in a direction orthogonal to the plate body 1841 of the support plate 1840, and when the support plate 1840 is fixed to the housing 2000, the fixing piece 1844 may also be seated in the fixing piece installation recess 2012 formed in the housing 2000.

According to an embodiment of the present disclosure, the fixing piece installation recess 2012 may be formed in the manner of opening the bottom face of the housing 2000, and, in the case where the fixing piece 1844 is applied to the fixing piece installation recess 2012, the fixing piece 1844 may be seated in the manner where the face of the fixing piece 1844 and the bottom face of the housing 2000 coincide with each other. In addition, the fixing piece 1844 is formed in a rectangular shape, but is not limited thereto. When the fixing piece 1844 is formed in an angled polygonal shape, the support plate 1840 may be prevented from moving from side to side. In addition, although one fixing piece 1844 is formed on the plate body 1841 of the support plate 1840, a plurality of fixing pieces may be formed when the plate body 1841 and the corresponding space of the housing 2000 are available.

Figure 29:
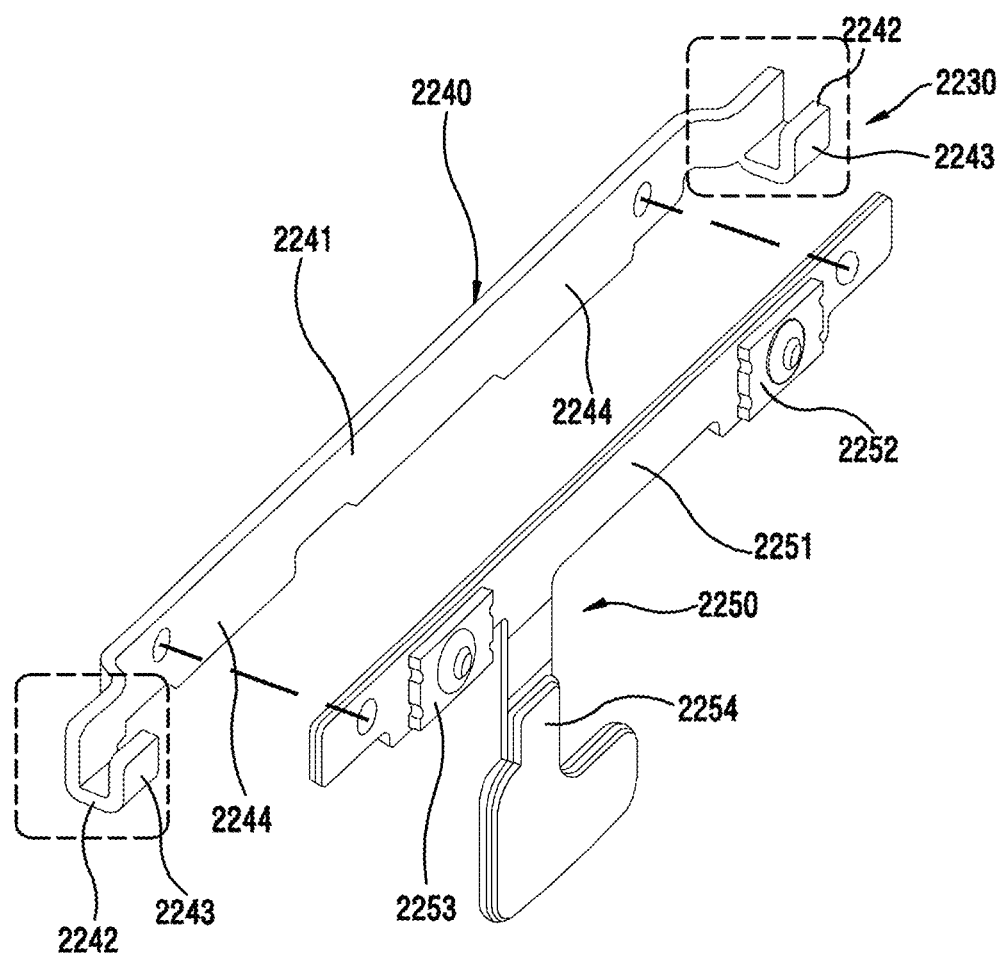
FIG. 29 is an exploded perspective view of an FPCB assembly according to various embodiments of the present disclosure.

FIG. 29 is an exploded perspective view of an FPCB assembly according to various embodiments of the present disclosure.

Referring to FIG. 29, one FPCB assembly 2230 is illustrated and includes two dome switches 2252 and 2253 that support two individually applied key buttons 1800 simultaneously. Accordingly, since the configuration of the two individually applied key buttons is the same as the configuration described above with reference to FIGS. 25A and 25B, the detailed description thereof will be omitted.

Referring to FIG. 29, the FPCB assembly 2230 may include a support plate 2240 and an FPCB 2250 that is supported by the support plate 2240.

According to an embodiment of the present disclosure, the FPCB 2250 may include a circuit body 2251 attached to the support plate 2240 and a contact 2254 drawn out from the circuit body 2251 and connected to a PCB of the electronic device. In addition, a pair of dome switches 2252 and 2253 may be arranged on the circuit body 2251 at a predetermined interval. In addition, the pair of dome switches 2252 and 2253 may be arranged at the positions that correspond to the pressing portions that are formed on the key base of each of the individual key buttons, and may be physically operated by being pressed by the pressing portions so as to perform an electric switching function.

According to an embodiment of the present disclosure, the support plate 2240 may include a plate body 2241 that supports the circuit body 2251 of the FPCB 2250, and elastic pieces 2242 bent in a predetermined shape at the opposite ends of the plate body 2241. In addition, the elastic pieces 2242 have a "U" shape, and may have outwardly biased elasticity. Accordingly, referring to FIGS. 29 and 30A, when the elastic pieces 2242 are seated in the elastic piece installation recesses 2314 of a housing 2300, the support plate 2240 may be prevented in advance from being released from the housing 2300. In addition, each of the elastic pieces 2242 may include at least one fixing protrusion 2243 that protrudes from the outer face thereof, and is fixed in the manner in which the fixing protrusion 2243 is seated in the opening formed in each of the elastic piece installation recesses 2314, thereby supporting the fixation of the support plate 2240. In addition, elastic pieces 2242 may be formed by bending in various shapes that may exert elasticity, such as a "U" shape, a circular shape, an oval shape, and an "S" shape. In addition, the plate body 2241 of the support plate 2240 and the circuit body 2251 of the FPCB 2250 may be attached to each other by bonding or using a double-sided tape.

FIGS. 30A to 30E are views illustrating a process of installing the key buttons and the FPCB assembly, according to various embodiments of the present disclosure.

Figure 30A:
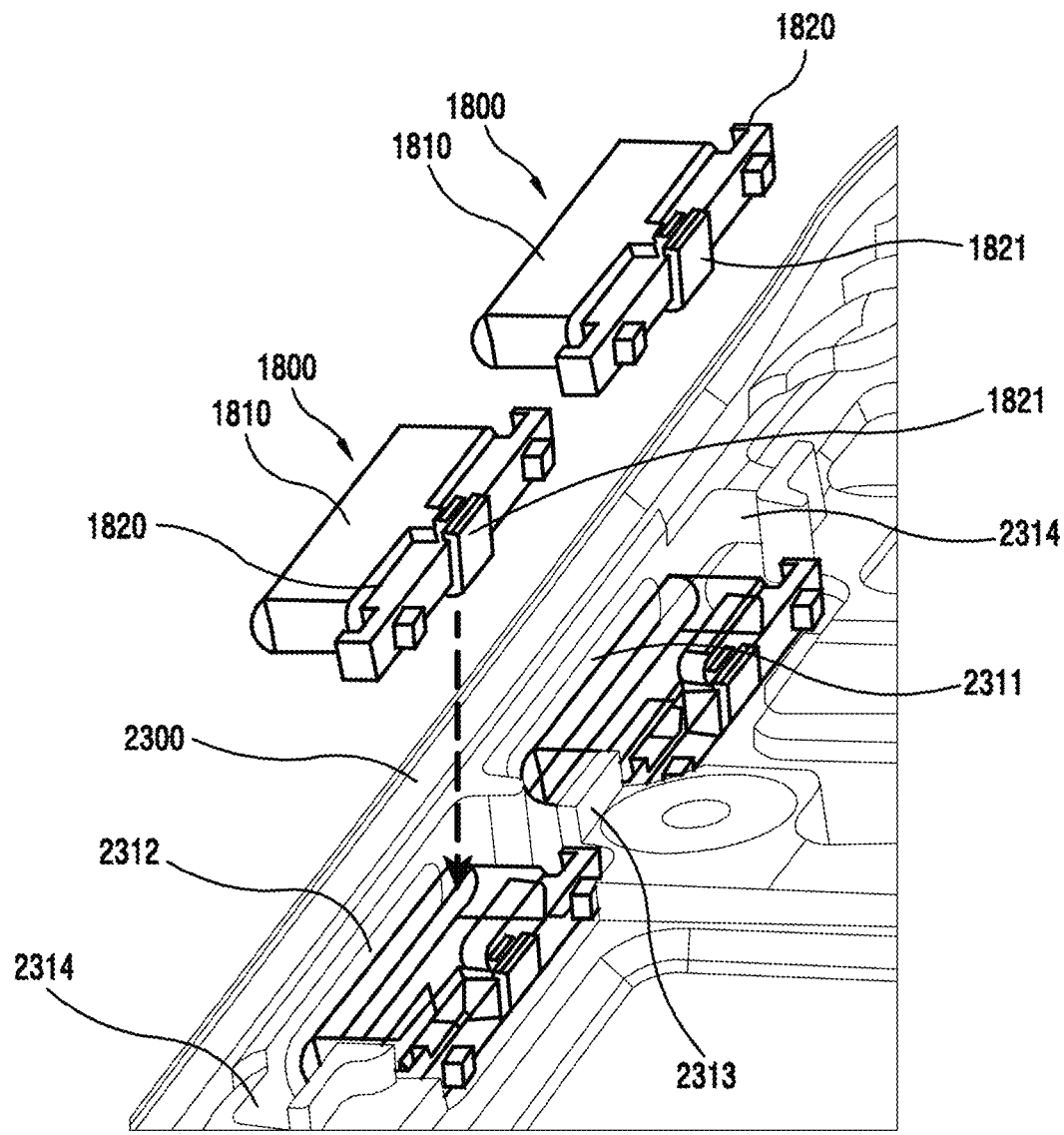
FIGS. 30A to 30E are views illustrating a process of installing a key button and an FPCB assembly, according to various embodiments of the present disclosure.
Figure 30B:
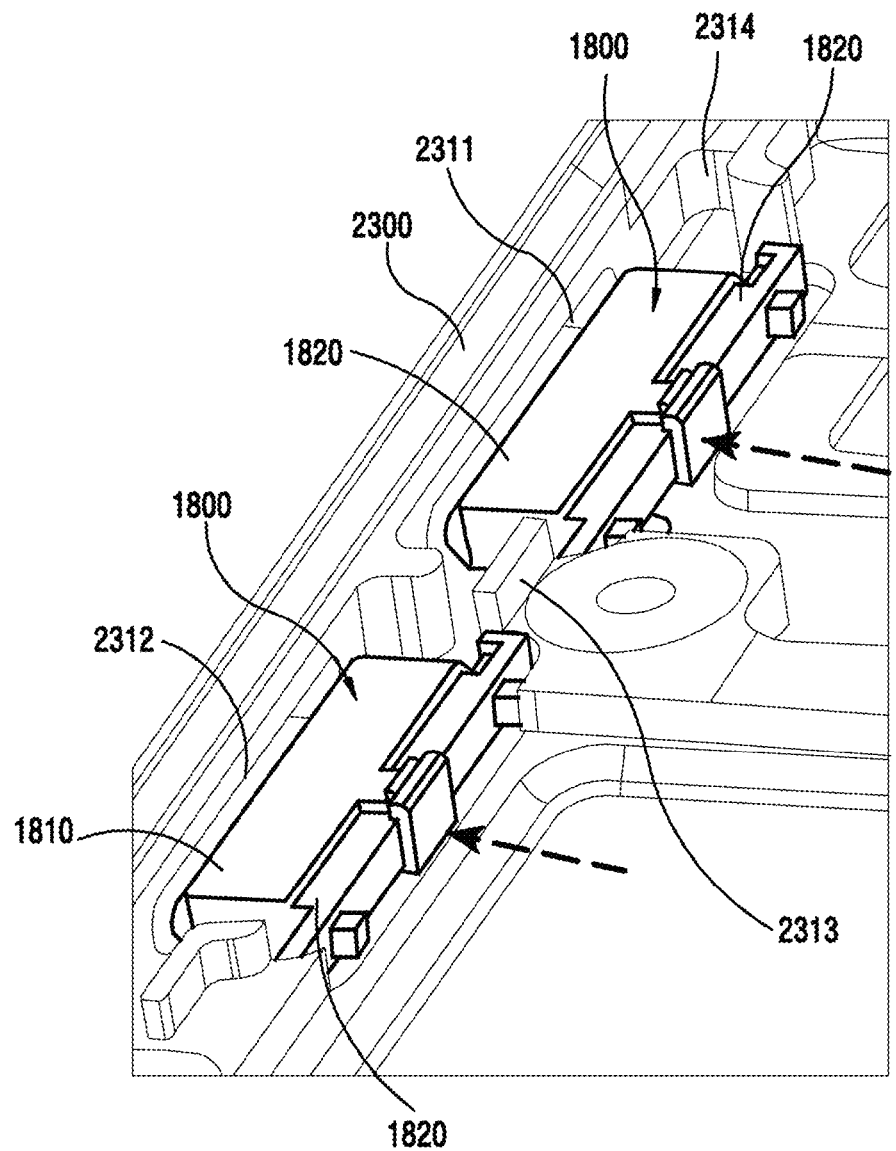

Referring to FIGS. 30A and 30B, a pair of key top penetration holes 2311 and 2312 may be formed in a housing 2300 of the electronic device (e.g., the bezel 3) at a predetermined interval. In addition, the pair of key top penetration holes 2311 and 2312 may be formed in a size that allows the key top 1810 of each of the key buttons 1800 to penetrate therethrough. In addition, the key top penetration holes 2311 and 2312 may have a size that allows the key tops 1810 to penetrate therethrough, and prevent the key bases 1820 fixed to the key tops 1810 from penetrating therethrough.

According to an embodiment of the present disclosure, the key buttons 1800 may be moved down from the top side of the housing 2300 in the direction indicated by an arrow, as illustrated in FIG. 30A, and may be moved forward toward the key top penetration holes 2311 and 2312 as illustrated in FIG. 27B. By this operation, the key base 1820 may restrain each key button 1800 from being fully released from each of the key top penetration holes 2311 and 2312 of the housing 2300. At the same time, the key tops 1810 are arranged to be partially exposed to the outside of the housing 2300 through the key top penetration holes 2311 and 2312.

Figure 30C:
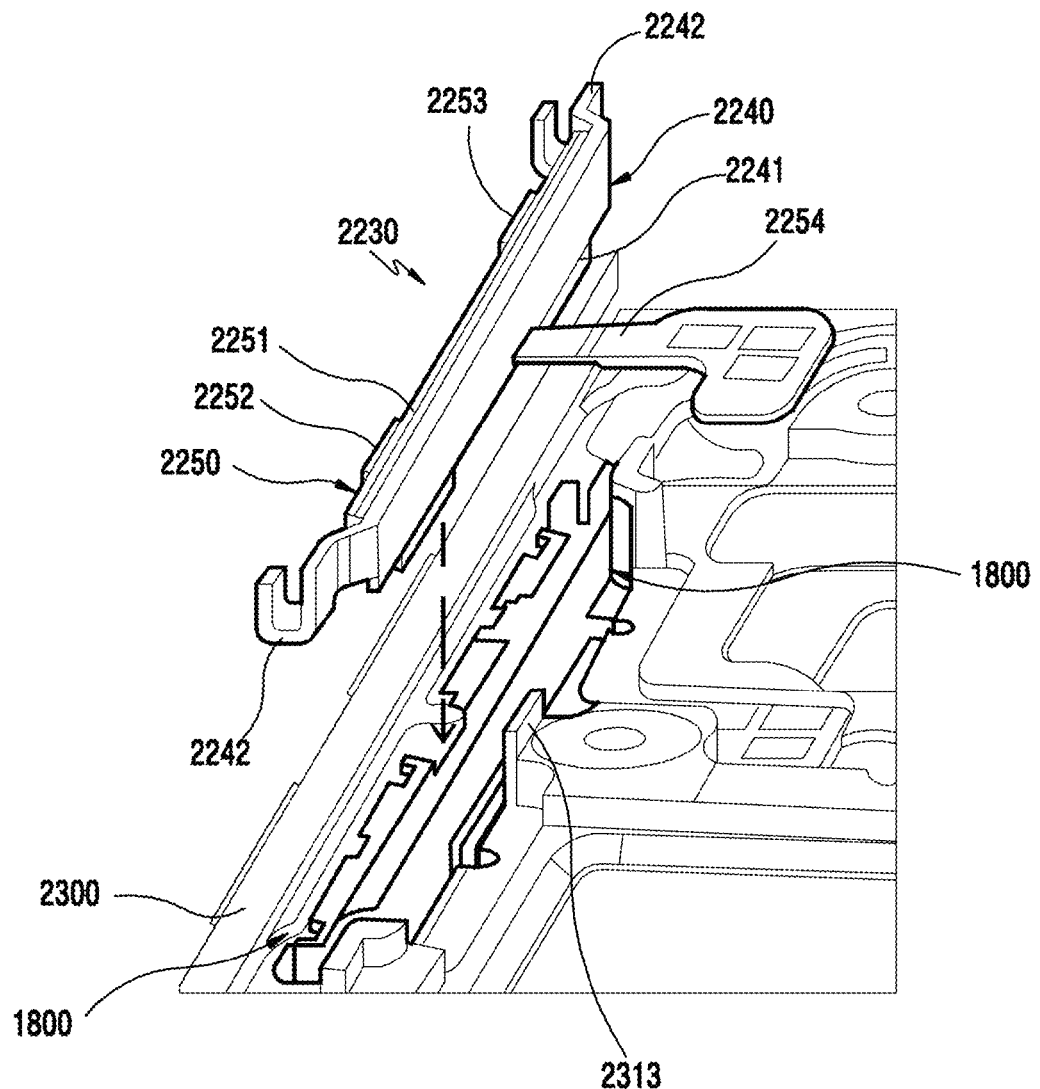

Referring to FIG. 30C, the FPCB assembly 2230 may be mounted in a direction indicated by an arrow from the rear side while maintaining the state where the key tops 1820 of the pair of key buttons 1800 partially penetrate through the key top penetration holes 2311 and 2312, respectively. In such a case, the elastic pieces 2242 formed at the opposite ends of the support plate 2240 of the FPCB assembly 2230 may be tightly seated in the elastic piece installation recesses 2314 formed in the housing 2300. This is resulted from the fact that the elastic pieces 2242 are seated in the elastic piece installation recesses 2314 while retaining the outwardly biased elasticity. In addition, each of the elastic piece installation recesses 2314 may be formed with an opening (not illustrated), and may support the fixation of the support plate 2240 to the housing 2300 in the manner in which fixing protrusions 2243 formed on the elastic pieces 2242 to protrude are seated in the openings. In addition, a plate support piece 2313 is formed on the inner face of the housing 2300 to protrude such that the rear side of the plate body 2241 of the mounted support plate 2240 can be supported. In addition, when the key buttons 1800 press the relatively long support plate 2240, the plate support piece 2313 may prevent the support plate 2240 itself from being elastically retreated rearward. In addition, the plate support piece 2313 is arranged preferably between the pair of key top penetration holes 2311 and 2312, and when a forming space is available, a plurality of plate support pieces may be formed.

Figure 30D:
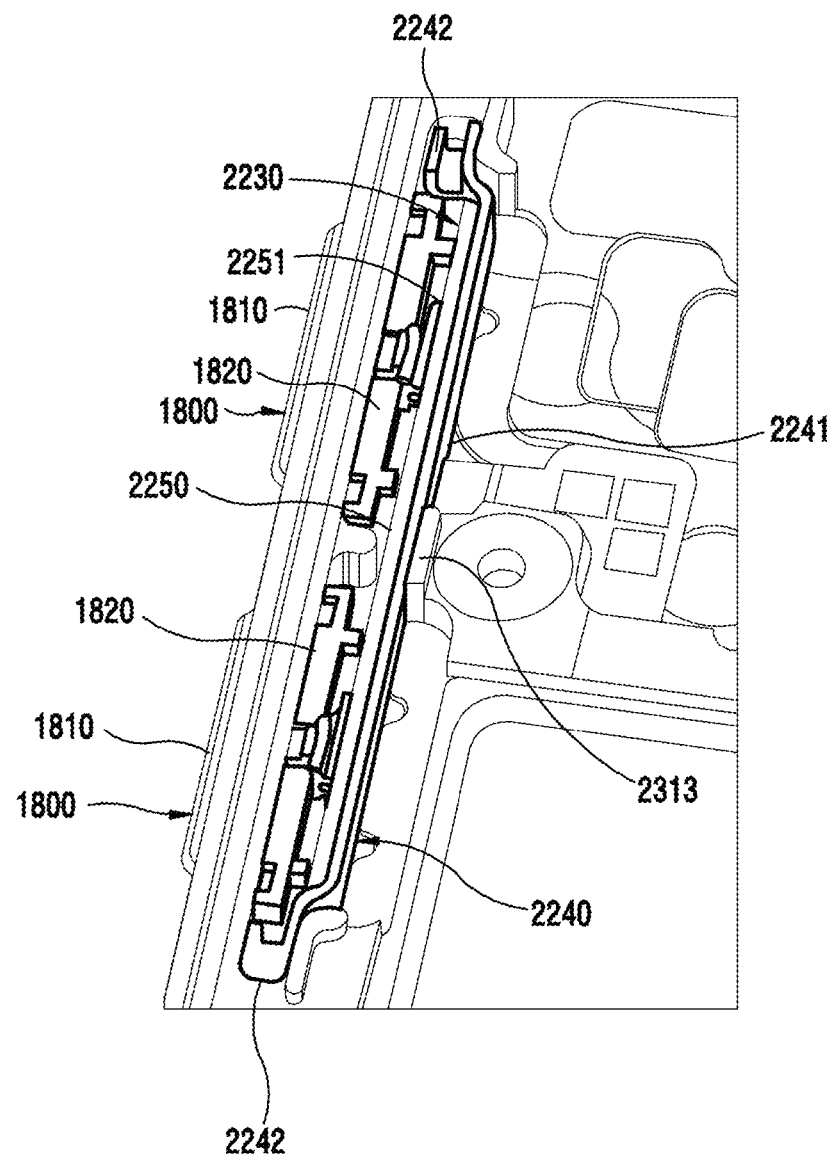
Figure 30E:
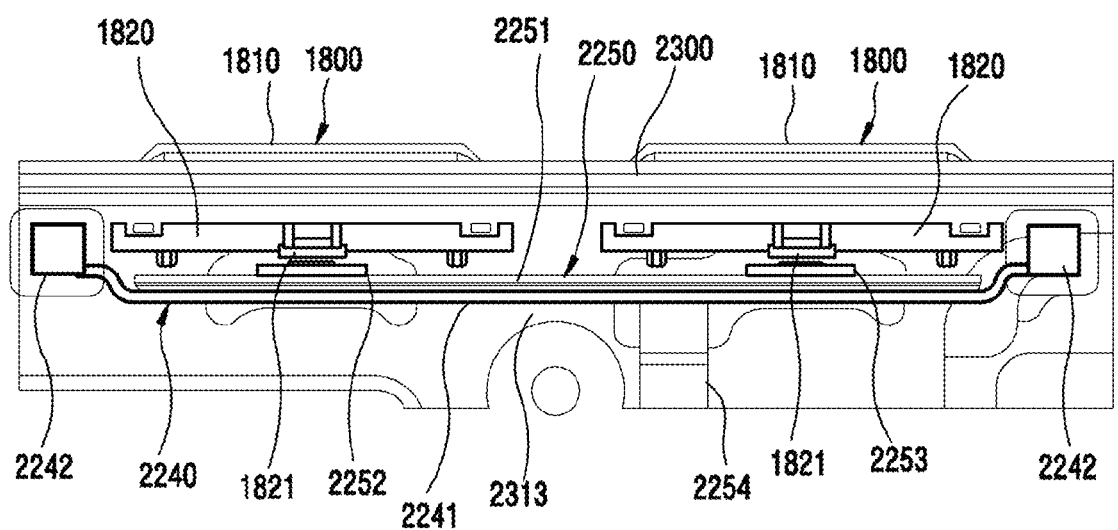
Figure 31A:
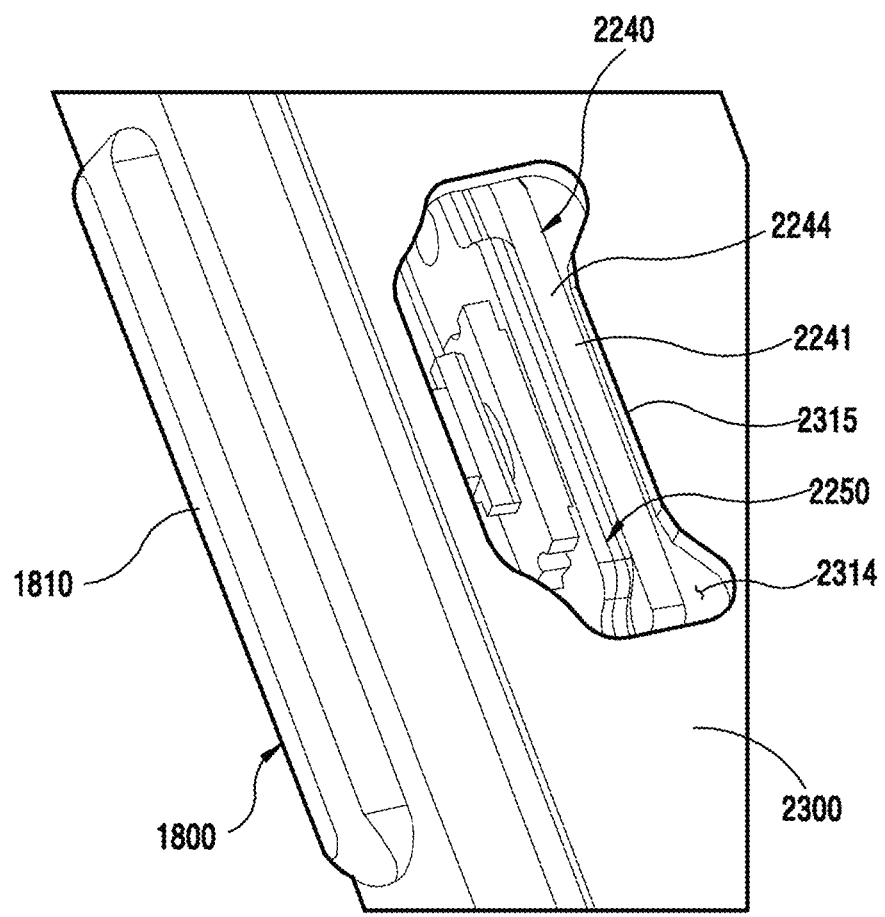
FIGS. 31A to 31D are views illustrating an FPCB assembly installed in an electronic device according to various embodiments of the present disclosure.
Figure 31B:
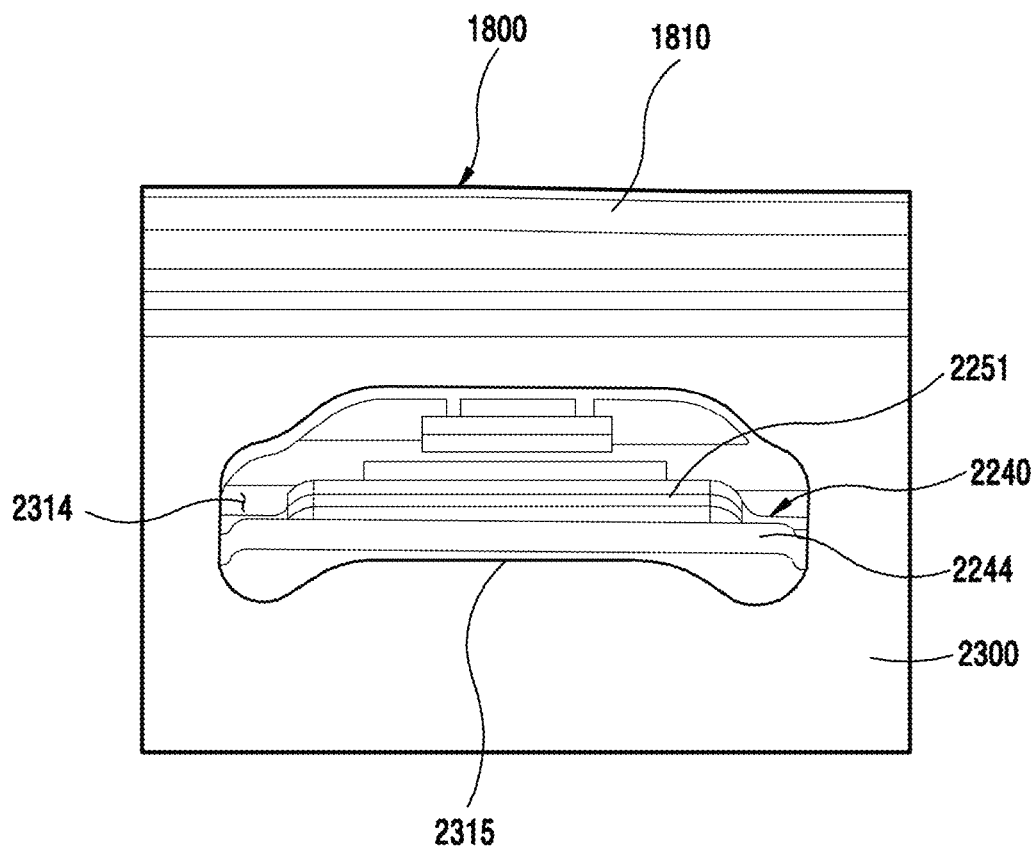
Figure 31C:
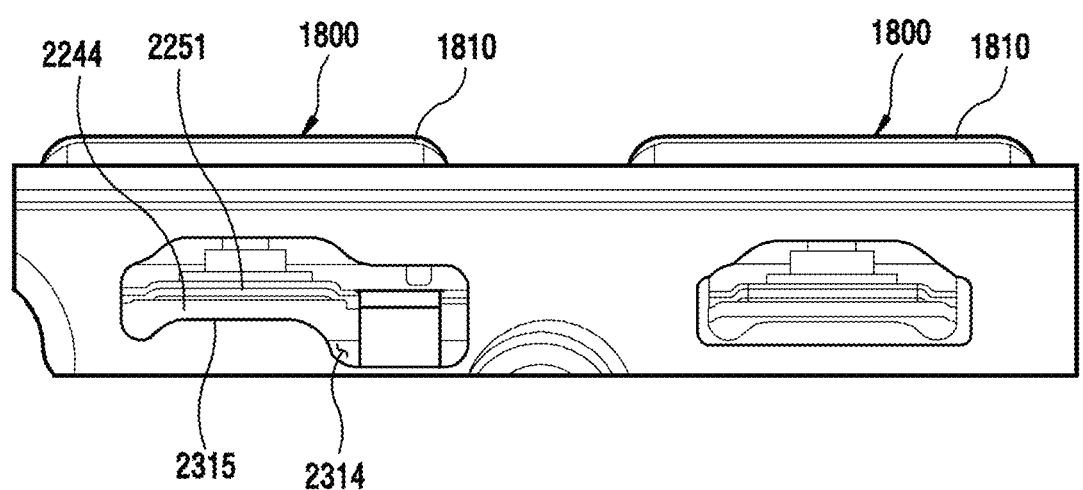
Figure 31D:
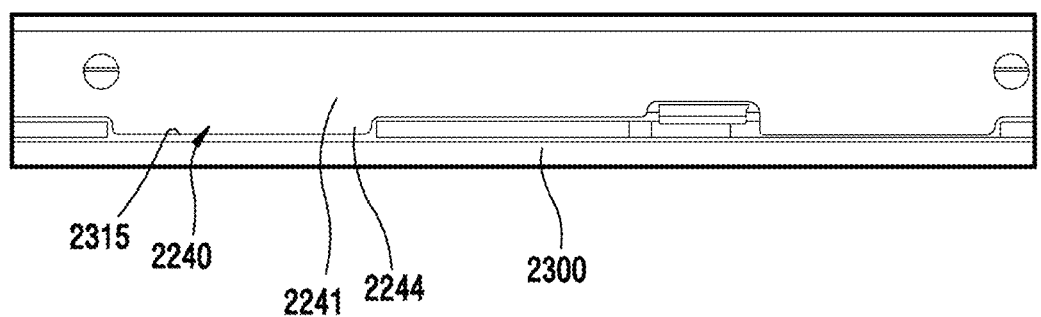

Referring to FIGS. 30D and 30E, the pair of key buttons 1800 mounted in the housing 2300 may be maintained in the state where each of the key tops 1810 is partially exposed to the outside of the housing 2300, and the key buttons 1800 may be supported at the rear side thereof by the support plate 2240 of the FPCB assembly 2230. In addition, the pressing portions 1821 formed on the key bases 1820 of the key buttons 1800 may be maintained in the state where they are in contact with the dome switches 2252 and 2253 of the circuit body 2251 that is supported by the plate body 2240 of the FPCB assembly 2230. In such a case, since the elastic pieces 2242 formed at the opposite ends of the elastic piece support plate 2240 are fixed to the elastic piece installation recesses 2314 formed in the housing 2300, the support plate 2240 is not retreated even if the key buttons 1800 are pressed, and only the dome switches 2252 and 2253 arranged on the circuit body 2251 of the FPCB 2250 may be pressed to be physically switchable by pressing the pressing portions 1821 of the key bases 1820.

According to an embodiment of the present disclosure, since the pressing operation of the key tops 1810 is implemented only by the support of the support plate 2240 of the FPCB assembly 2230 in the state where the key buttons 1800 are assembled in the inside of the housing 2300 without any separate mechanical element (e.g., the bracket 5), the performance test of the key buttons 1800 can be easily implemented.

FIGS. 31A to 31D are views illustrating an FPCB assembly installed in an electronic device according to various embodiments of the present disclosure. Descriptions for the constituent elements that are the same as those described above will be omitted.

Referring to FIGS. 31A to 31D, while the support plate 2240 of the FPCB assembly 2230 can be rigidly fixed by the elastic pieces 2242 formed at the opposite ends thereof, the support plate 2240 can be retreated rearward by the pressing operation of the key buttons 1800 since two key buttons 1800 are accommodated. Accordingly, elongated protruding stages 2244 may be formed at a predetermined interval on the plate body 2241 of the support plate 2240, and may be inserted into protruding stage insertion recesses 2314 formed on the bottom face of the housing 2300. In such a case, the protruding stages 2244 of the support plate 2240 may be supported by contact stages 2315 that are flanges of the protruding stage insertion recesses 2314 formed to be perforated. In addition, the protruding stages 2244 of the support plate 2240 may be arranged to be supported in the protruding stage insertion recesses 2314 in the manner where the protruding stages 2244 do not at least partially protrude from the protruding stage insertion recesses 2314 after the protruding stages 2244 are inserted into the protruding stage insertion recesses 2314 of the housing 2300.

Figure 32A:
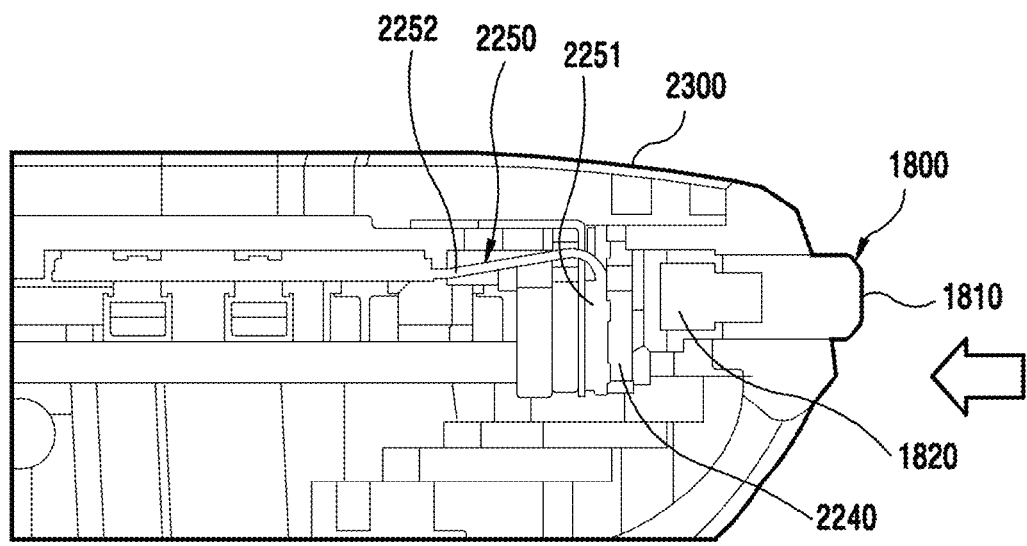
FIGS. 32A to 32C are views illustrating a key button and an FPCB assembly installed in an electronic device according to various embodiments of the present disclosure.
Figure 32B:
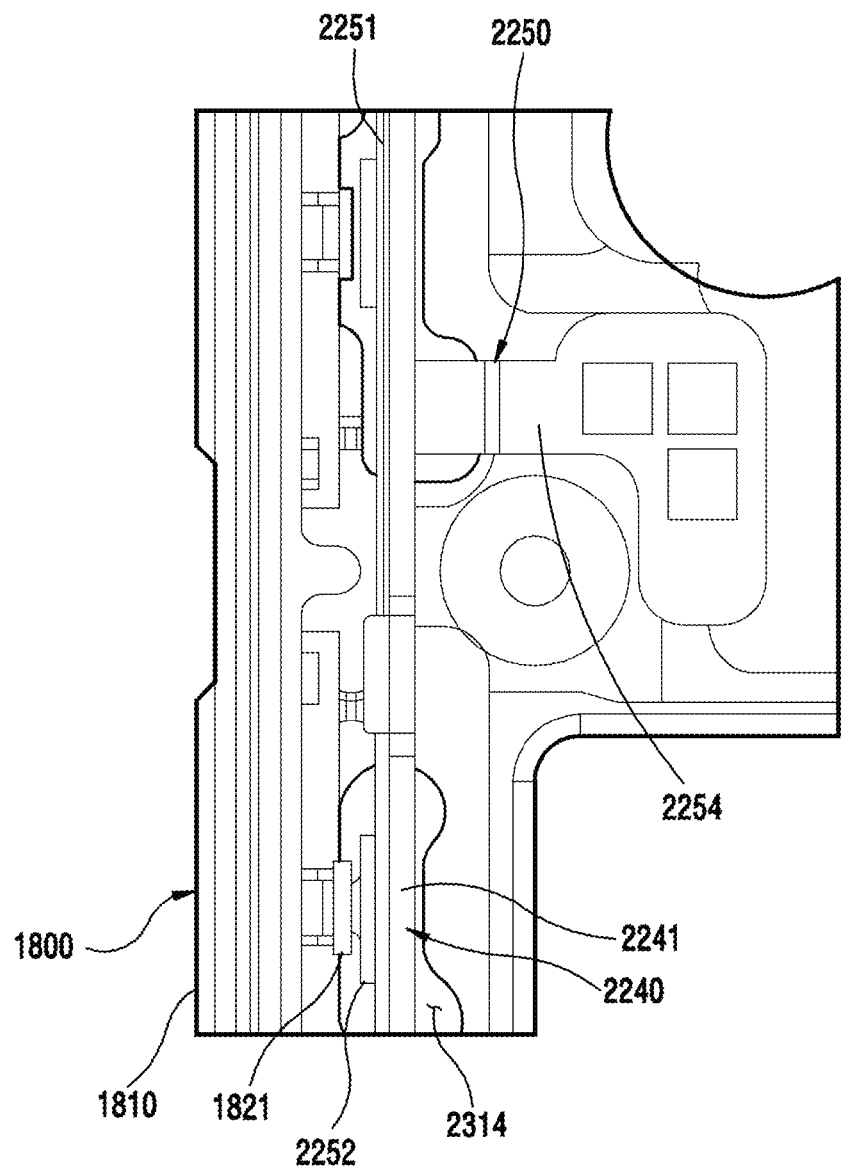
Figure 32C:
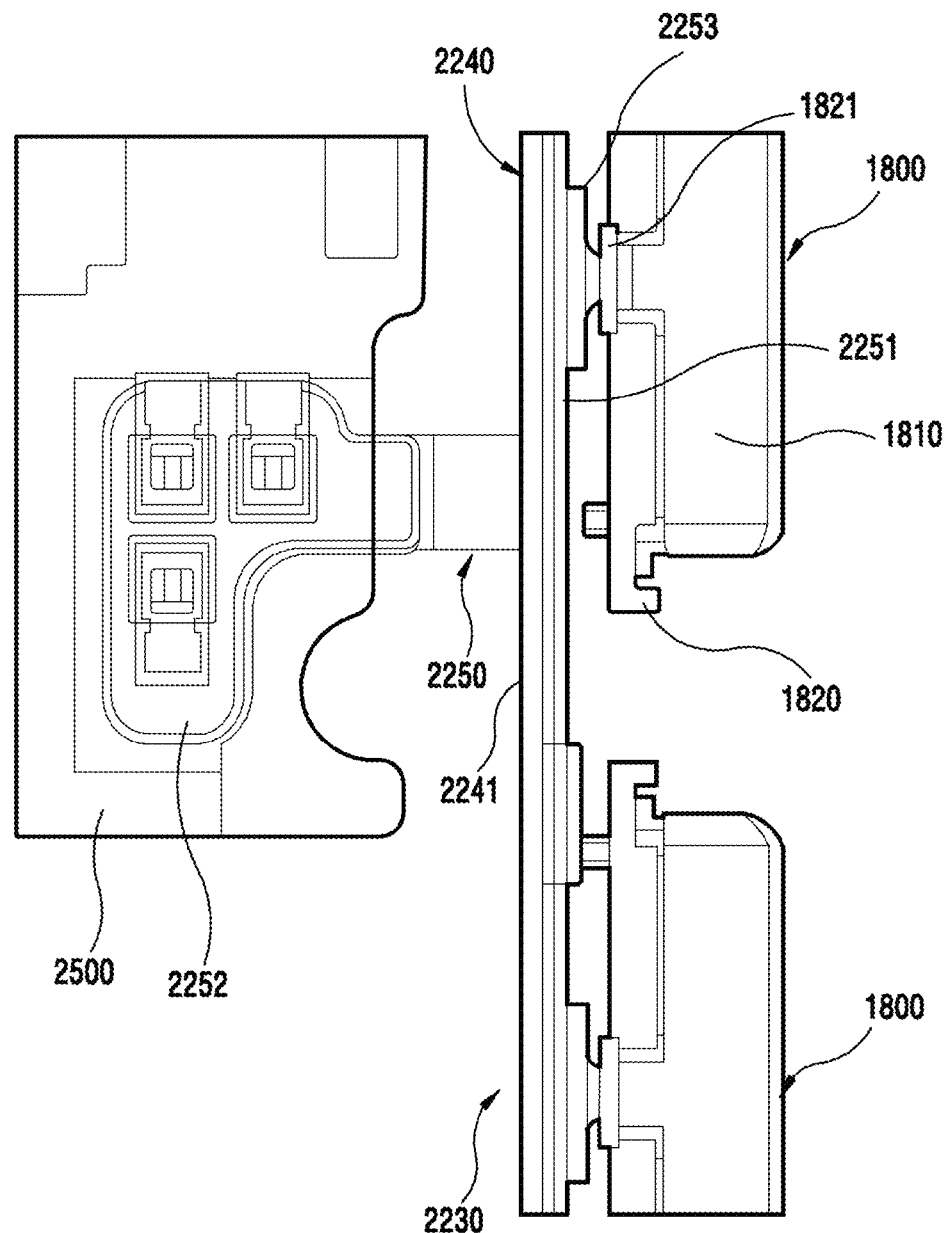

FIGS. 32A to 32C are views illustrating a key button and an FPCB assembly installed in an electronic device according to various embodiments of the present disclosure.

Referring to FIGS. 32A to 32C, the key buttons 1800 may be installed in the housing 2300 of the electronic device 100 to partially protrude. According to an embodiment of the present disclosure, the support plate 2240 of the FPCB assembly 2230 may be arranged to support the key buttons 1800 at the rear side in the state where the key tops 1810 of the key buttons 1800 are exposed to the outside of the housing 2300. In this state, the pressing portions 1821 formed on the key bases 1820 of the key buttons 1800 are maintained in the state where the key buttons 1800 are in contact with the dome switches 2252 arranged on the FPCB 2250 of the FPCB assembly 2230, and the contact 2254 of the FPCB 2250 may be maintained in the state where the contact 2254 is electrically connected to the circuit board 2500 of the electronic device 100 by bypassing to the rear side of the support plate 2240.

According to an embodiment of the present disclosure, since the key buttons 1800 and the FPCB assembly 2230 may be arranged in the housing 2300 that is a single product, and may assemble the key buttons 1800 from the inside to the outside of the housing 2300 without coupling a separate structure (e.g., the bracket 5), there is an effect advantageous in the performance test of the key buttons 1800.

Figure 33A:
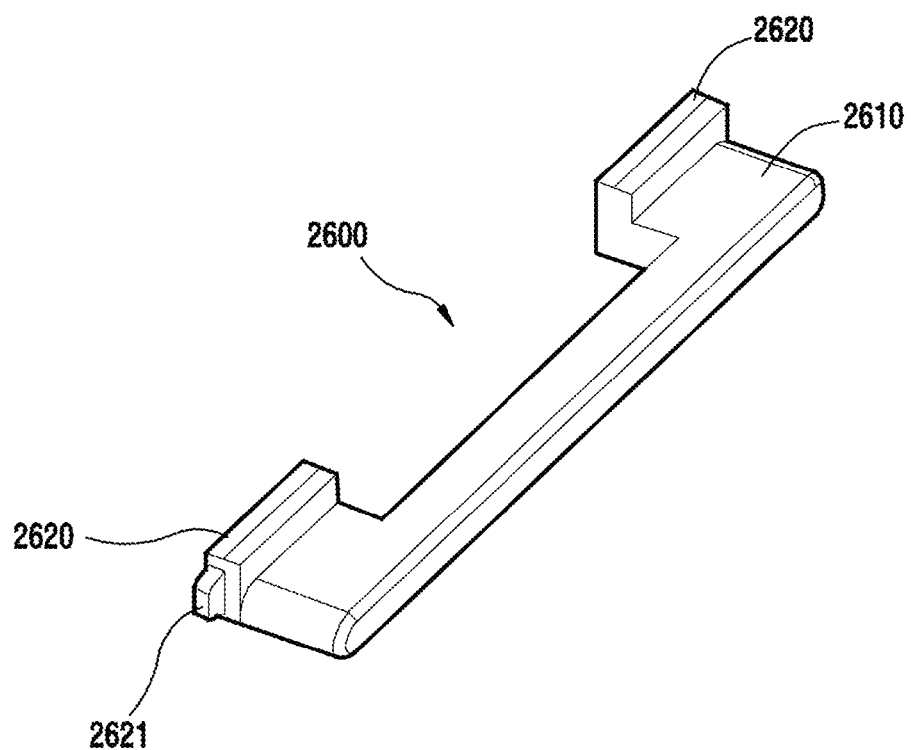
FIGS. 33A and 33B are views illustrating a configuration of a key button according to various embodiments of the present disclosure.
Figure 33B:
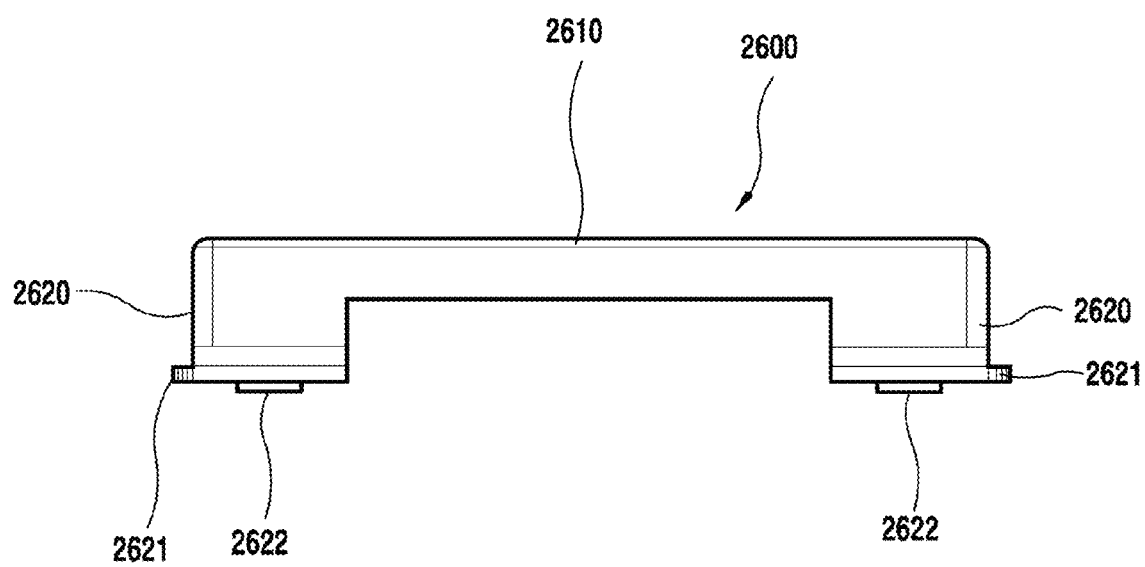

FIGS. 33A and 33B are views illustrating a configuration of a key button according to various embodiments of the present disclosure.

Figure 34A:
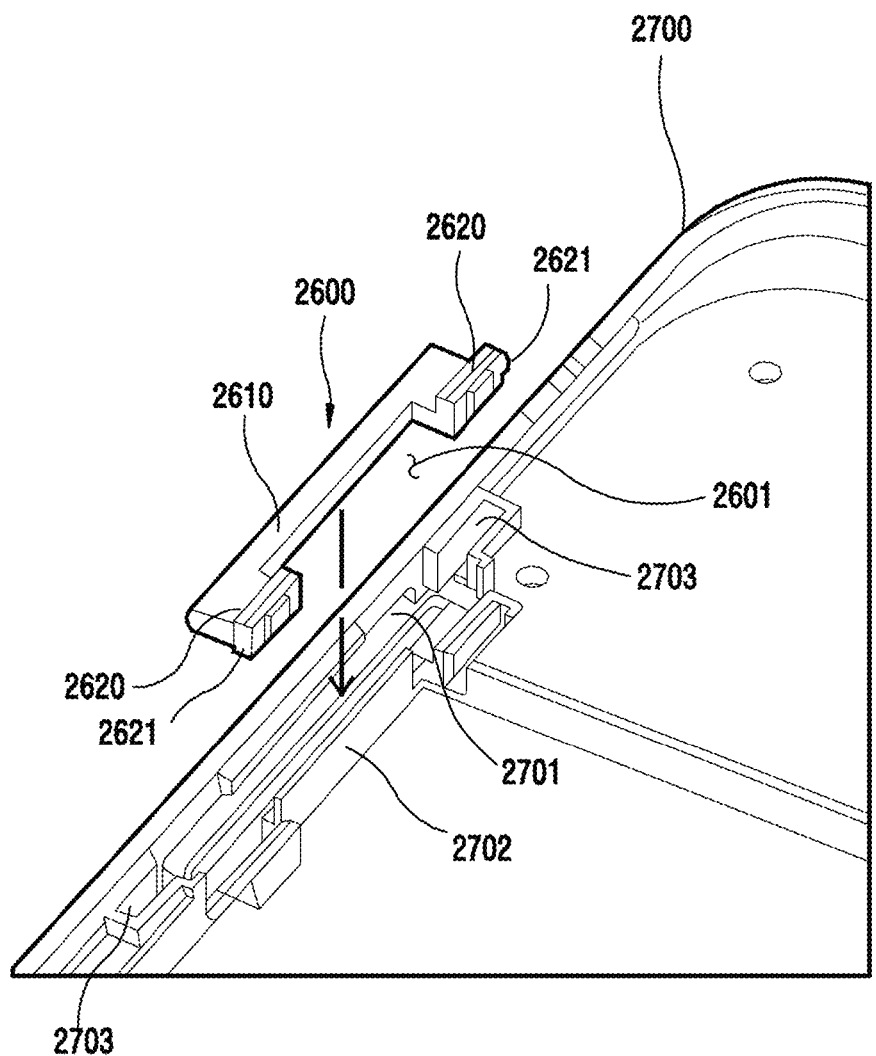
FIGS. 34A to 34D are views illustrating a process of installing a key button and an FPCB assembly, according to various embodiments of the present disclosure.

Referring to FIGS. 33A and 33B, a key button 2600 may have a configuration in which key bases 2620 are arranged at the opposite ends of a key top 2610 having a predetermined length, respectively. According to an embodiment of the present disclosure, each of the key bases 2620 are arranged to correspond to an FPCB assembly 2230 that includes an FPCB 2250 on which a pair of dome switches 2252 and 2253 as in the configuration of FIG. 29, and a pressing portion 2262 formed on each of the key bases 2620 may be configured to press one of the dome switches 2252 and 2253 of the FPCB assembly 2230. According to an embodiment of the present disclosure, each of the key bases 2620 may be formed to extend from a key flange 2621 to the outside. Referring to FIGS. 33C and 34A, the key flanges 2621 may serve to catch and restrain the key bases 2620 when the key top 2610 penetrates through key top penetration hole 2701 formed in a housing 2700.

FIGS. 34A to 34D are views illustrating a process of installing the key button and the FPCB assembly, according to various embodiments of the present disclosure, in the housing of the electronic device.

Figure 34B:
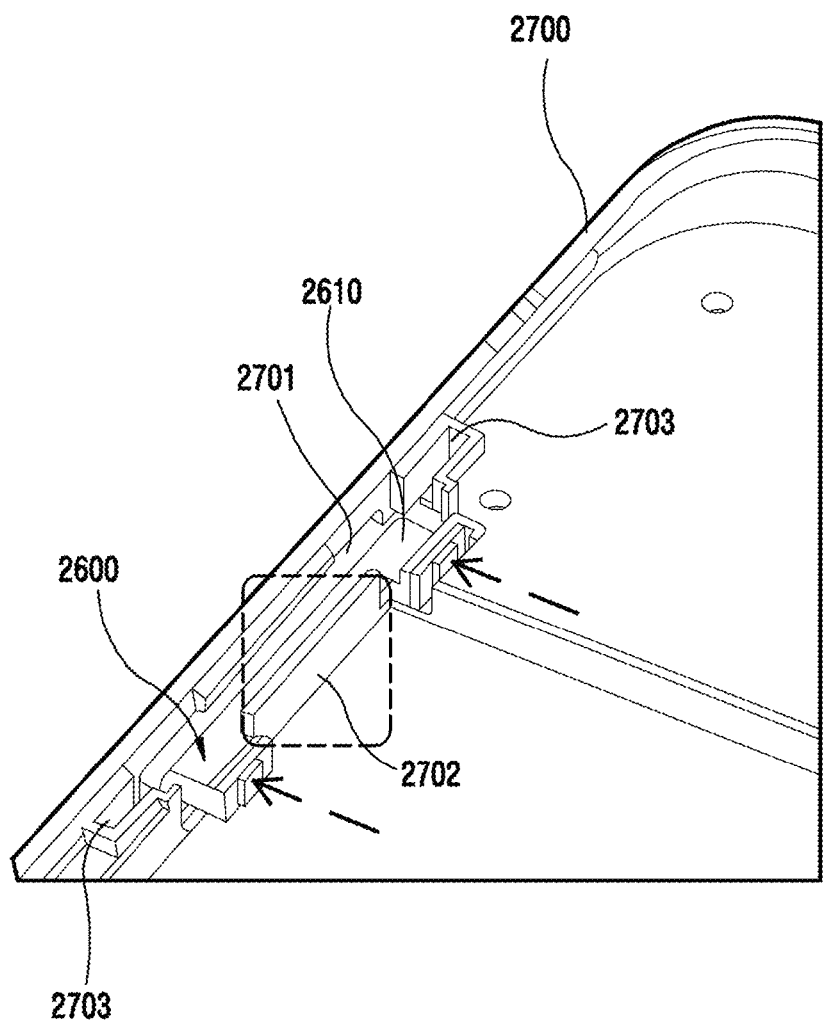

Referring to FIGS. 34A and 34B, a housing 2700 of the electronic device 100 (e.g., the bezel 3) may be formed with a key top penetration hole 2701. According to an embodiment of the present disclosure, the key top penetration hole 2701 may be formed in a size that allows the key top 2610 of the key button 2600 to penetrate therethrough. In addition, the key top penetration hole 2701 may be formed in a size that allows only the key top 2610 to penetrate therethrough, and prevents the key flanges 2621 formed on the key bases 2620 from penetrating therethrough.

According to an embodiment of the present disclosure, the key button 2600 may be moved down from the top side of the housing 2700 in a direction indicated by an arrow as illustrated in FIG. 34A, and then may be moved forward toward the key top penetration hole 2701 as illustrated in FIG. 34B. By this operation, the key flanges 2621 may restrain the key button 2600 from being fully released from the key top penetration hole 2701 of the housing 2700. At the same time, the key top 2610 may be arranged to be partially exposed to the outside of the housing 2700 through the key top penetration hole 2701. According to an embodiment of the present disclosure, the key button 2600 may have an opening portion 2601 that is formed in a "U" shape in the central portion, and a key button accommodation piece 2702 may be formed in the housing 2700 to protrude upward. Accordingly, when the key button 2600 is penetrated though the key top penetration hole 2701 of the housing 2700, the key button accommodation piece 2703 is accommodated in the opening portion 2601 so that each assembly of the key button 2600 can be guided.

Figure 34C:
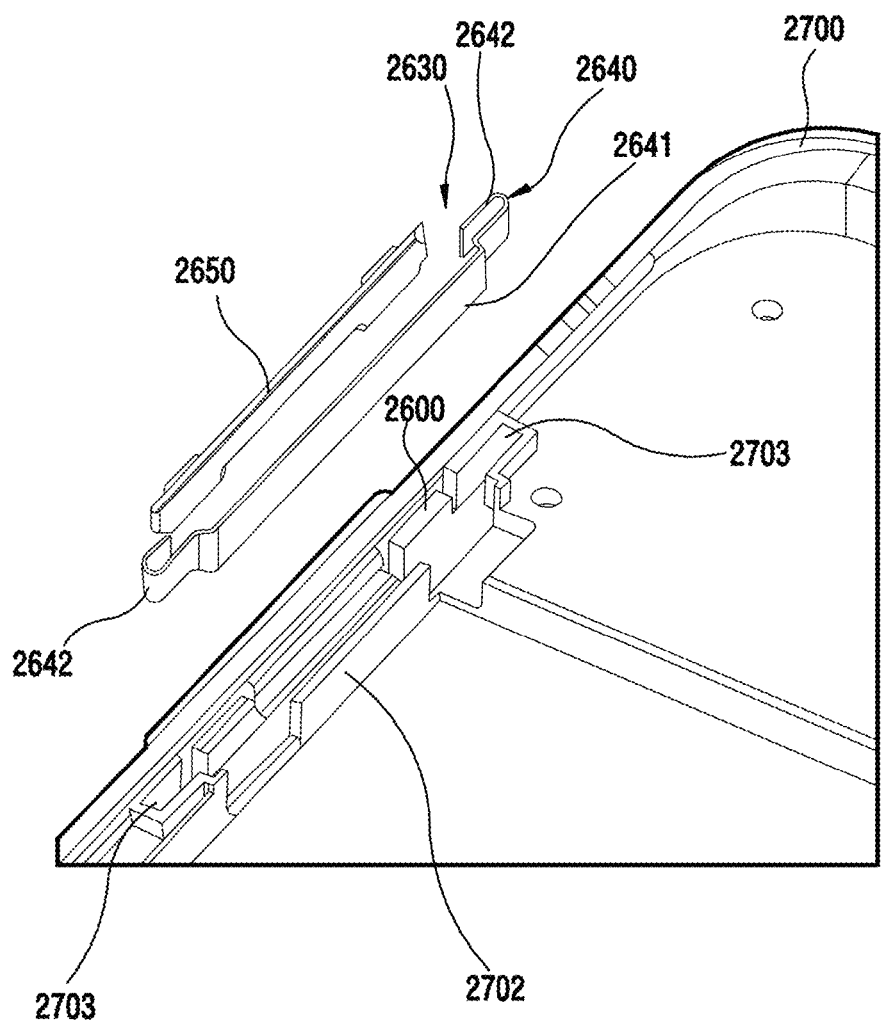
Figure 34D:
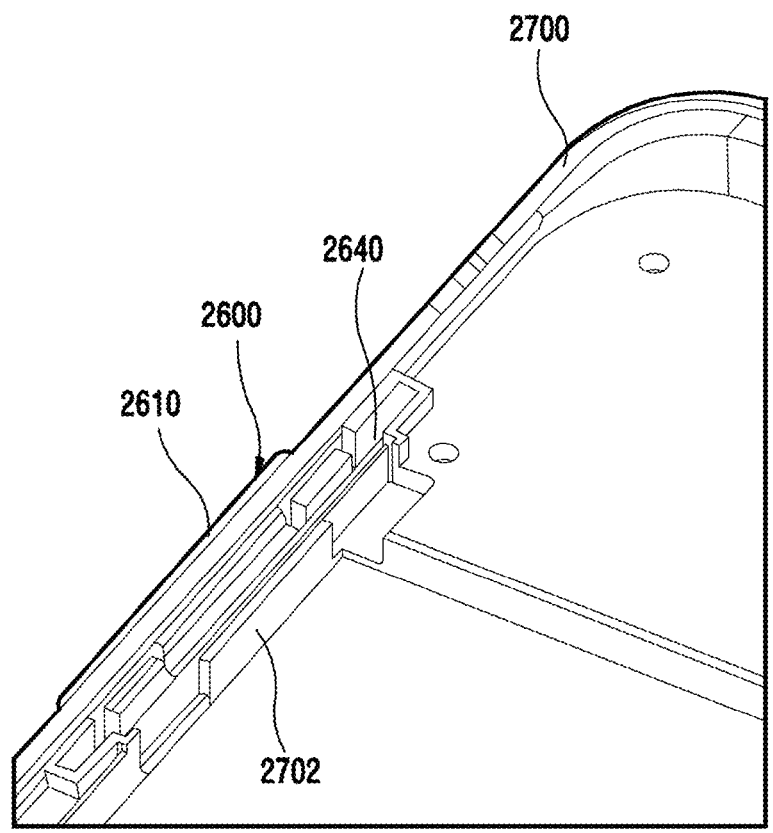

Referring to FIGS. 34C and 34D, the FPCB assembly 2630 may be mounted in a direction indicated by an arrow at the rear side while maintaining the state in which the key top 2610 of the key button 2600 is partially penetrated through the key top penetration hole 2701 of the housing 2700. In such a case, the elastic pieces 2642 formed at the opposite ends of the plate body 2641 of the support plate 2640 of the FPCB assembly 2630 may be tightly seated in the elastic piece installation recesses 2703 formed in the housing 2700. This is resulted from the fact that the elastic pieces 2642 are seated in the elastic piece installation recesses 2703 while retaining outwardly biased elasticity.

According to an embodiment of the present disclosure, since the pressing operation of the key top 2610 is implemented only by the support of the support plate 2640 of the FPCB assembly 2630 without any other separate mechanical product (e.g., the bracket 5) in the state where the key button 2600 is assembled in the inside of the housing 2700, the performance test of the key button 2600 can be easily implemented.

According to various embodiments of the present disclosure, the electronic device 100 may include a home key button on the front face (F in FIG. 1). According to an embodiment, the home key button facilitates an efficient operation of the electronic device using fingerprint recognition by mounting a fingerprint recognition sensor on the outer surface of the home key button, in addition to a wakeup function and a return-to-home screen function of the electronic device.

In general, when the fingerprint recognition sensor is provided in the home key button, the fingerprint recognition sensor may be mounted on an FPCB that passes through the home key button, and the FPCB may have a configuration that is electrically connected with a PCB of the electronic device along the lower side of the home key button. In such a case, because the FPCB is off-centered to one side of the home key button to bypass to the lower side of the home key button, there was a problem in that when a portion of the home key button, through which the FPCB passes, is pressed, the click feeling becomes weighty, and when a portion of the home key button, through which the FPCB does not pass, is pressed, the click feeling becomes lighter.

An embodiment of the present disclosure may provide a home key button for addressing the above-described problems. According to an embodiment, the various embodiments of the present disclosure may always provide a constant click feeling even when any portion of the home key button is pressed.

According to various embodiments, it is possible to provide a portable electronic device that includes a front glass cover that forms a front face of the electronic device, a rear cover that forms a rear face of the electronic device, a bezel that surrounds a space formed by the front cover and the rear cover, and includes a first portion that includes an opening, a display device that is embedded in the space, and includes a screen area that is exposed through the front cover, and a plate that includes a planar surface that is parallel with the front cover within the space, and includes a first protrusion and a second protrusion that are disposed close to the opening and are spaced apart from each other.

The first protrusion and the second protrusion are disposed to provide a passage that leads to the opening.

The electronic device further includes: a key that has a size and a shape that enable the key to pass through the passage and the opening, and is inserted into the passage and the opening to be movable in a first direction; a first member (elongated member) that is attached to or integrally formed with a surface of the key opposite to the surface of the key, which is exposed to the outside of the electronic device, so as to prevent the key from being pulled out to the outside; and a second member including, within the space, a central portion that extends in a second direction perpendicular to the first direction, a first elastic end portion that extends from one end of the central portion and is disposed between the first portion and the first protrusion, and a second elastic end portion that extends from the other end of the central portion, and is disposed between the first portion and the second protrusion.

A portable electronic device may be provided in which the first member is inserted between the key and the central portion.

According to various embodiments, the first protrusion and the second protrusion may not be in contact with the first portion.

According to various embodiments, at least one of the first end portion and the second end portion may have a U-shape.

According to various embodiments, the electronic device may further include an electric component that is inserted into a gap between the first member and the central portion and senses the movement of the key, and at least one wire that extends from the component.

According to various embodiments, the plate may be integrally formed with the bezel.

According to various embodiments, the rear cover and the side surface portion may be integrally formed with each other.

According to various embodiments, the rear cover and the side surface portion may include the same material.

According to various embodiments, the material may be a metal.

According to various embodiments, it is possible to provide a portable electronic device that includes: a front glass cover that forms a front face of the electronic device; a rear cover that forms a rear face of the electronic device; a bezel that surrounds a space formed by the front cover and the rear cover, and includes a first portion that includes a first opening and a second opening; a display device that is embedded in the space, and includes a screen area that is exposed through the front cover; and a plate that includes a planar surface that is parallel with the front cover within the space, and includes a first protrusion, a second protrusion, and a third protrusion, the first, second and third protrusion disposed close to the first and second openings and are spaced apart from each other. The second protrusion includes a plate interposed between the first protrusion and the third protrusion.

The first protrusion and the second protrusion are disposed to provide a first passage that leads to the first opening without being in contact with the first portion.

The second protrusion and the third protrusion are disposed to provide a second passage that leads to the second opening without being in contact with the first portion.

The electronic device further includes: a first key that has a size and a shape that enable the first key to pass through the first passage and the first opening, and is inserted into the first passage and the first opening to be movable in a first direction; a second key that has a size and a shape which enable the second key to pass through the second passage and the second opening, and is inserted into the second passage and the second opening to be movable in the first direction; a first key member (elongated member) that is attached to or integrally formed with a surface of the first key opposite to the surface of the first key, which is exposed to the outside of the electronic device, so as to prevent the first key from being pulled out to the outside; a second key member (elongated member) that is attached to or integrally formed with a surface of the second key opposite to the surface of the second key, which is exposed to the outside of the electronic device, so as to prevent the second key from being pulled out to the outside; and a second member that includes, within the space, a central portion that extends in a second direction perpendicular to the first direction, a first elastic end portion that extends from one end of the central portion and is disposed between the first portion and the first protrusion, and a second elastic end portion that extends from the other end of the central portion, and is disposed between the first portion and the third protrusion.

A portable electronic device may be provided in which the first key member is inserted into a gap between the first key and the central portion, and the second key member is inserted into a gap between the second key and the central portion.

According to various embodiments, it is possible to provide a method of manufacturing an electronic device that includes A) an operation of providing a bezel that surrounds an inner mounting space of the electronic device and a plate that is connected with the bezel, in which the bezel includes a first portion that includes an opening formed through a portion of the bezel, the plate that includes a planar surface that is parallel with the front cover within the space, and includes a first protrusion and a second protrusion that are disposed close to the opening and are spaced apart from each other, the first protrusion and the second protrusion being configured to form a passage that leads to the opening without being in contact with the first portion, B) an operation of inserting a key through the passage and the opening such that at least a part of the key is exposed to the outside of the electronic device, C) an operation of preventing the key from being pulled out to the outside by using a first member (elongated member) that is attached to or integrally formed with a surface of the key opposite to the surface of the key, which is exposed to the outside of the electronic device, and includes one end portion that extends in a first direction parallel to the longitudinal direction of the first portion, and the other end portion that extends in the first direction and is formed at the opposite side to the one end portion so as to prevent the key from being pulled out to the outside, and D) an operation of inserting a second member including, within the space, a central portion that extends in the first direction, a first end portion that extends in the first direction and is disposed between the first portion and the first protrusion, and a second end portion that extends in the first direction and is disposed between the first portion and the second protrusion.

According to various embodiments, the method may further include an operation of providing a rear cover that forms the rear face of the electronic device.

According to various embodiments, the method may further include an operation of providing a front glass cover that forms the front face of the electronic device.

According to various embodiments of the present disclosure, the electronic device may include a home key button on the front face (F in FIG. 1). According to an embodiment, the home key button facilitates an efficient operation of the electronic device using fingerprint recognition by mounting a fingerprint recognition sensor on the outer surface of the home key button, in addition to a wakeup function and a return-to-home screen function of the electronic device.

In general, when the fingerprint recognition sensor is provided in the home key button, the fingerprint recognition sensor may be mounted on an FPCB that passes through the home key button, and the FPCB may have a configuration that is electrically connected with a PCB of the electronic device along the lower side of the home key button. In such a case, because the FPCB is off-centered to one side of the home key button to bypass to the lower side of the home key button, there is a problem in that when a portion of the home key button, through which the FPCB passes, is pressed, the click feeling becomes weighty, and when a portion of the home key button, through which the FPCB does not pass, is pressed, the click feeling becomes lighter.

An embodiment of the present disclosure may provide a home key button for addressing the above-described problems. According to an embodiment, the various embodiments of the present disclosure may always provide a constant click feeling even when any portion of the home key button is pressed.

FIGS. 35A to 35D are views illustrating a configuration of a home key button of an electronic device according to various embodiments of the present disclosure.

Figure 35A:
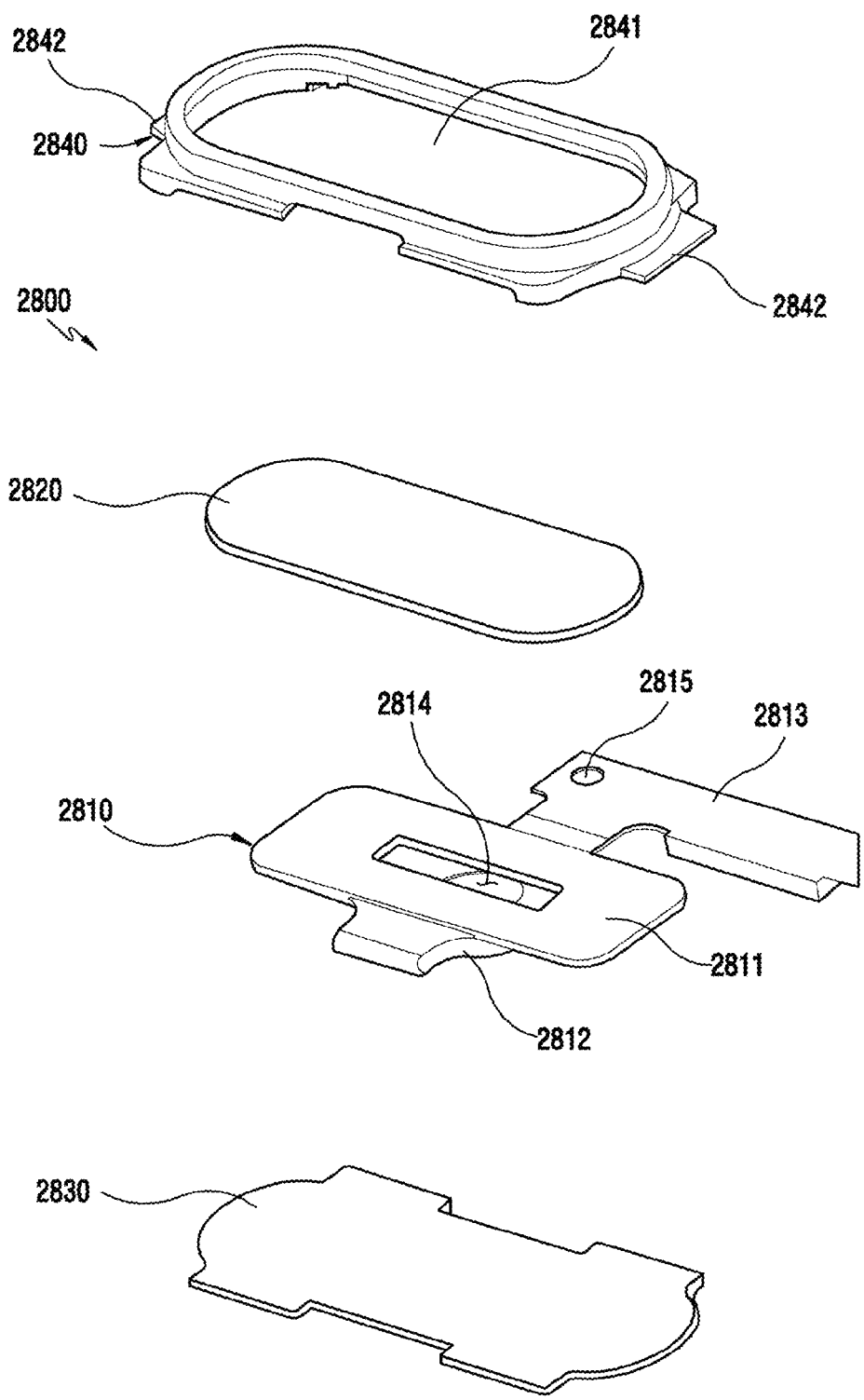
FIGS. 35A to 35D are views illustrating a configuration of a home key button of an electronic device according to various embodiments of the present disclosure.
Figure 36A:
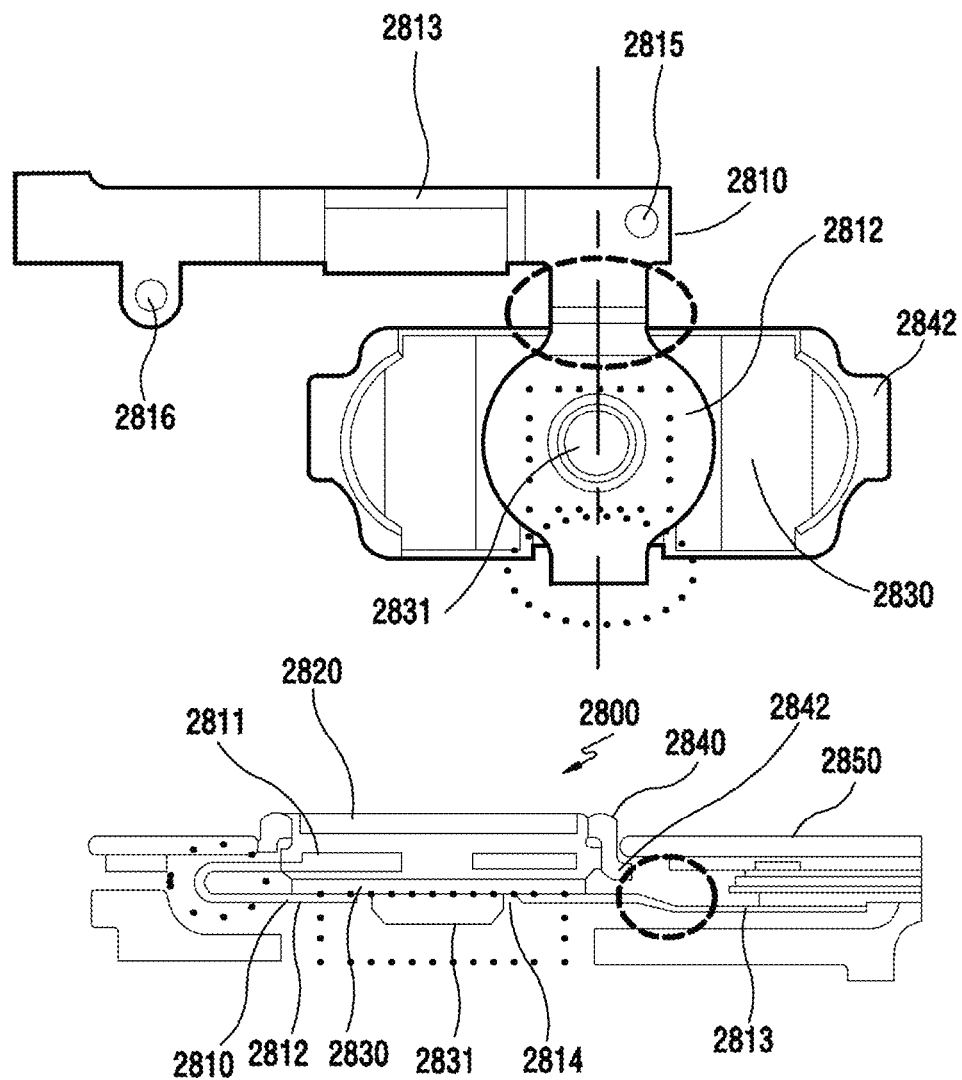
FIGS. 36A and 36B are views illustrating an installed home key button of an electronic device according to various embodiments of the present disclosure.

Referring to FIG. 35A, a home key button 2800 may include an FPCB 2810, a fingerprint recognition sensor 2820 that is arranged on the top of the FPCB 2810 to be electrically connected to the FPCB 2810, and a support plate 2830 that includes an actuator 2831 as illustrated in FIG. 36A. The actuator 2831 is arranged below the FPCB 2810 so that, when the home key button 2800 is pressed, the actuator 2831 presses a dome switch that is arranged below the actuator 2831. According to an embodiment of the present disclosure, the home key button 2800 may further include an ornamental member 2840 that is coupled to the support plate 2830 on which the FPCB 2810 is placed.

According to an embodiment of the present disclosure, the ornamental member 2840 may include a sensor exposure port 2841 in the central portion thereof, and may be coupled to the support plate 2830 such that the fingerprint recognition sensor 2820 is exposed. In addition, the ornamental member 2840 may be formed of a metal material. In addition, the ornamental member 2840 may be formed by plating chrome on a synthetic resin material. Further, when the ornamental member 2840 is mounted on the front face F of the electronic device 100 (see FIG. 1), at least a portion of the peripheral edge of the ornamental member 2840 is exposed to the outside so that the home key button 2800 is highlighted in the electronic device 100. Further, the ornamental member 2840 may also contribute to the configuration of the beautiful exterior of the electronic device 100. In addition, the ornamental member 2840 is engaged with the inner face of the housing of the electronic device 100 so that the ornamental member 2840 may serve to restrain the home key button 2800 from being fully released to the outside.

According to an embodiment of the present disclosure, the FPCB 2810 may include a sensor mounting portion 2811 that accommodates the fingerprint recognition sensor 2820 and is electrically connected to the fingerprint recognition sensor 2820, a diffraction portion 2812 that is formed to extend from the sensor mounting portion 2811, and bypasses a molding portion to be attached to the bottom face of the support plate 2830, the diffraction portion including a through-hole 2814, and a connecting portion 2813 that is formed to extend from the diffraction portion 2812 and is electrically connected to a PCB to avoid the display of the electronic device.

In addition, the connecting portion 2813 may further include a position fixing hole 2815 so that, when the home key button 2800 is applied to the electronic device 100, a protrusion formed on the housing (e.g., the bezel 3) of the electronic device 100 may be inserted into the position fixing hole 2815 to be fixed in position. According to an embodiment of the present disclosure, an end of the connecting portion 2813 may further include a connection terminal to be connected to a circuit board (e.g., the circuit board 7 in FIG. 6E).

According to an embodiment of the present disclosure, the support plate 2830 may be formed as a metal member. In addition, the support plate 2830 may be formed of STS, aluminum, or the like. In addition, the support plate 2830 may include, on its bottom face, an actuator 2831 that protrudes downward. Further, in the case where the home key button 2800 is mounted in the electronic device 100, the actuator 2831 may serve as a pressing portion that physically presses the dome switch that is disposed below the actuator 2831.

According to an embodiment of the present disclosure, it has been described that the fingerprint recognition sensor 2820 is arranged on the home key button 2800, but the present disclosure is not limited thereto. For example, various sensor modules (e.g., an HRM sensor) may be arranged in place of the fingerprint recognition sensor 2820 or together with the fingerprint recognition sensor 2820. According to an embodiment, various light emitting members, such as an LED indicator device, may be applied in place of the fingerprint recognition sensor.

Figure 35B:
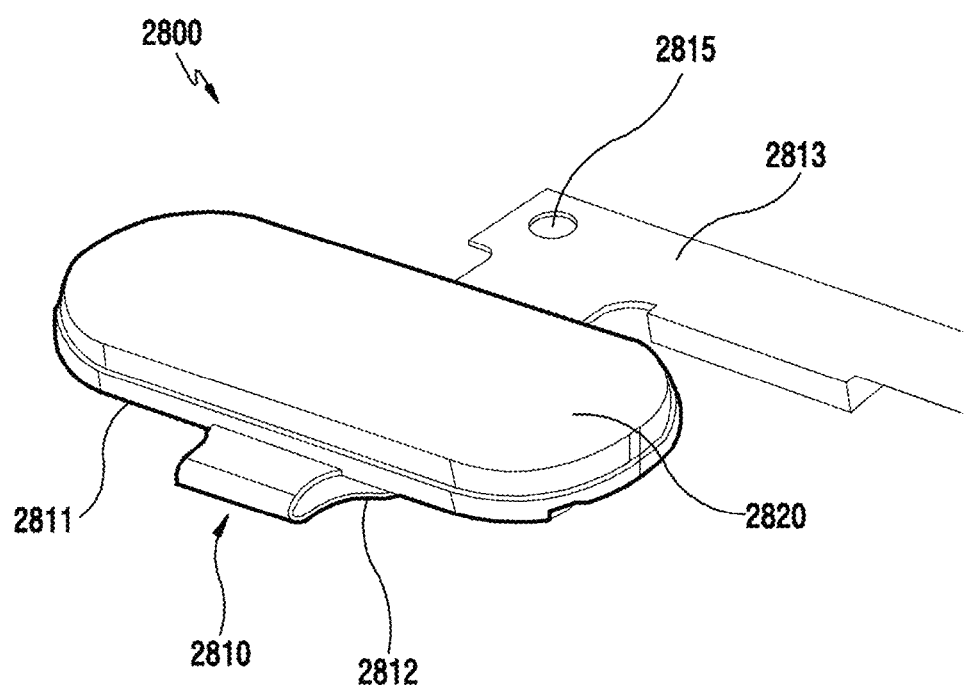
Figure 35C:
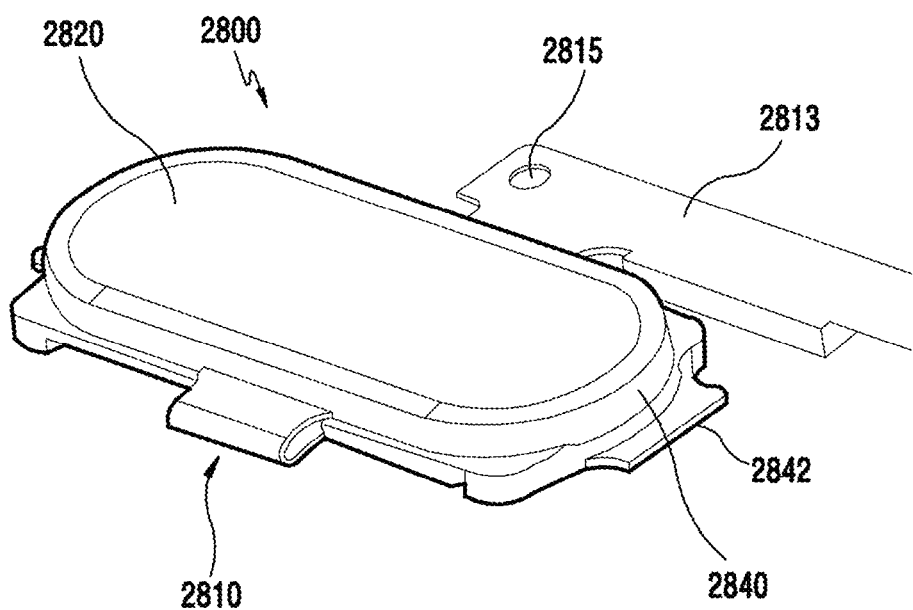

Referring to FIGS. 35B and 35C, the FPCB 2810 and the fingerprint recognition sensor 2820 may be fixed to each other by being molded with a synthetic resin, and may be electrically connected to each other. According to an embodiment of the present disclosure, only the FPCB 2810 may be formed by insert-molding by a synthetic resin material member, and the fingerprint recognition sensor 2820 may be arranged by being attached to the top of the FPCB 2810. In addition, the ornamental member 2840 may be further stacked on the top of the fingerprint recognition sensor 2820. In such a case, the ornamental member 2840 may be fixed to a molding that includes the FPCB 2810 by bonding or using a double-sided tape or the like. In addition, the top face of the fingerprint recognition sensor, which is exposed through the ornamental member 2840, may be formed through a UV molding process.

Figure 35D:
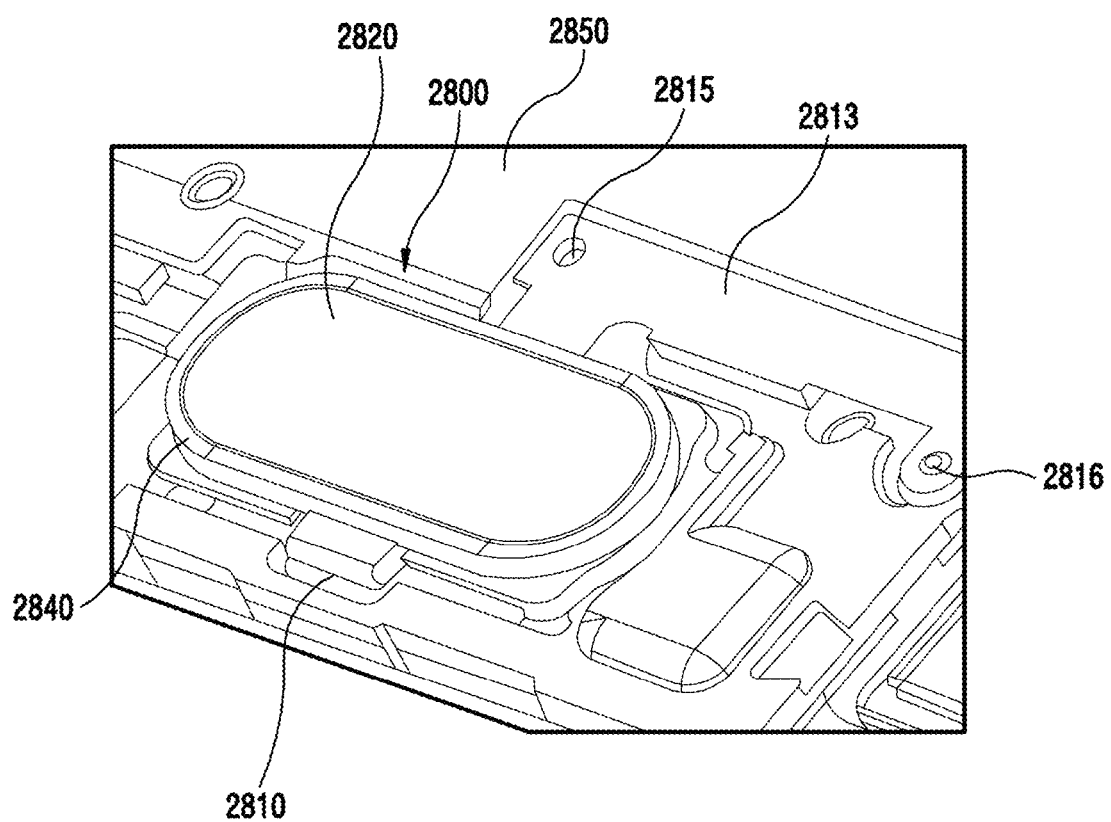

Referring to FIG. 35D, the home key button 2800 may be arranged in the housing 2850 of the electronic device 100. According to an embodiment of the present disclosure, the home key button 2800 may be arranged in such a manner that the fingerprint recognition sensor 2820 is exposed to the top of the home key button 2800 through the opening 2841 of the ornamental member 2840, and the diffraction portion 2812 of the FPCB 2810 may be bent to be disposed below the fingerprint recognition sensor 2820. This is to address various problems such as, when the FPCB 2810 is formed linearly, it may overlap with the display and when the FPCB 2810 is linearly fixed, the length of the portion of the FPCB 2810 to be fixed to the housing is reduced so that a click feeling may be degraded. In addition, a pair of position fixing holes 2815 and 2816 may be formed in the connecting portion 2813 of the FPCB 2810 so that the position fixing holes 2815 and 2816 are fitted on the protrusions, which are formed in the housing 2850, to be fixed in position.

Figure 36B:
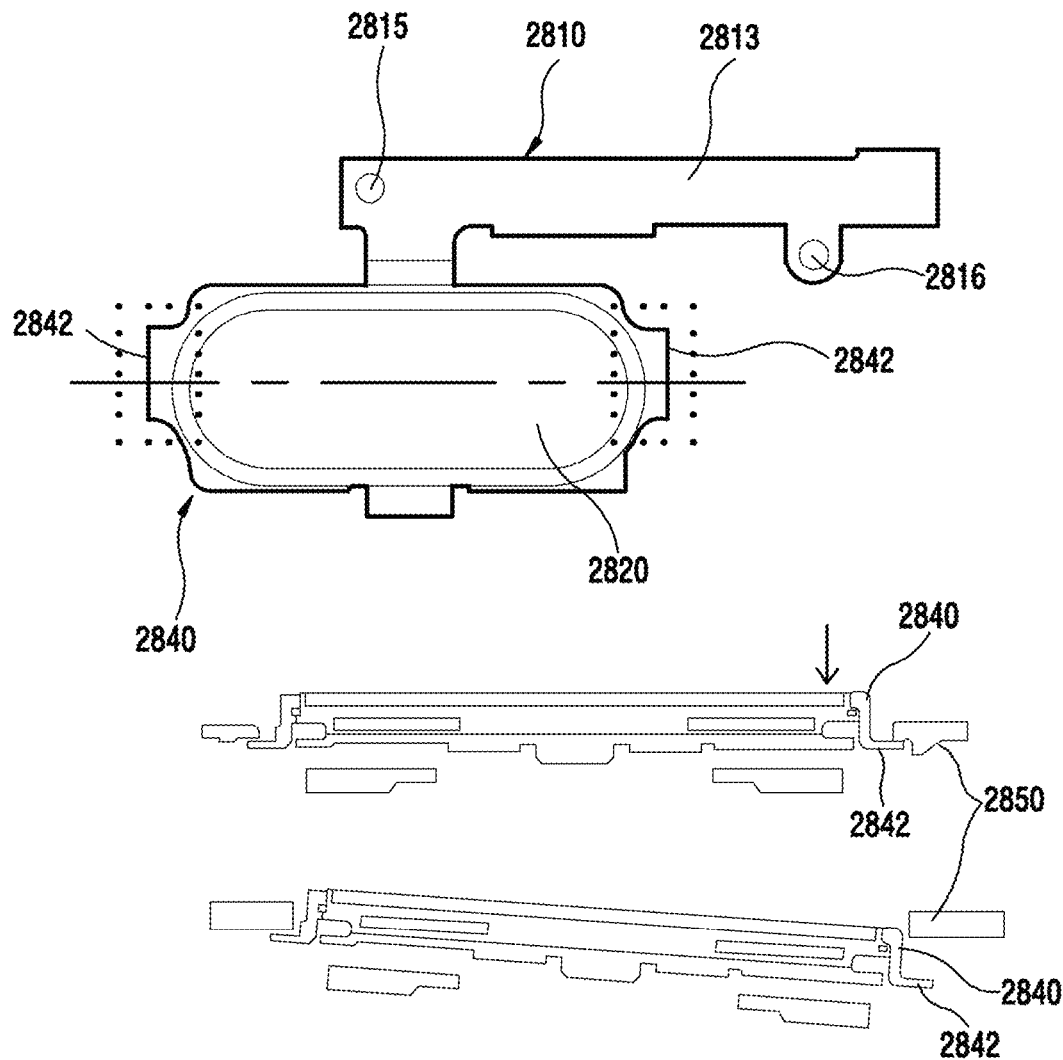

FIGS. 36A and 36B are views illustrating an installed home key button of an electronic device according to various embodiments of the present disclosure.

Referring to FIGS. 36A and 36B, the home key button 2800 may be installed such that the catch pieces 2842 of the ornamental member 2840 are caught and restrained by the housing 2850 of the electronic device 100. According to an embodiment of the present disclosure, the fingerprint recognition sensor 2820 may be arranged to be exposed to the top side of the ornamental member 2840, and the sensor mounting portion 2811 of the FPCB 2810, which is insert-molded to the molding portion, may arranged below the fingerprint recognition sensor 2820. In addition, the support plate 2830 may be arranged below the molding portion. In addition, the diffraction portion 2812 of the FPCB 2810, which is drawn out from the molding portion, may be arranged across the center of the bottom face of the support plate 2830. In such a case, the diffraction portion 2812 of the FPCB 2810 may be tightly attached to the bottom face of the support plate 2830 such that the actuator 2831 of the support plate 2830 passes through the through-hole 2814. In addition, the diffraction portion 2812 of the FPCB 2810 may be attached to the bottom face of the support plate 2830 by bonding or using a double-sided tape or the like.

According to an embodiment of the present disclosure, the home key button 2800 may be restrained from being fully released to the outside of the electronic device as the catch pieces 2842 formed to extend from the opposite ends of the ornamental member 2840 are caught by the housing 2850. In such a case, as the length of the catch pieces 2842 increases in the width direction of the home key button 2800, deviation in upward and downward click feelings of the home key button 2800 may be reduced.

Figure 37:
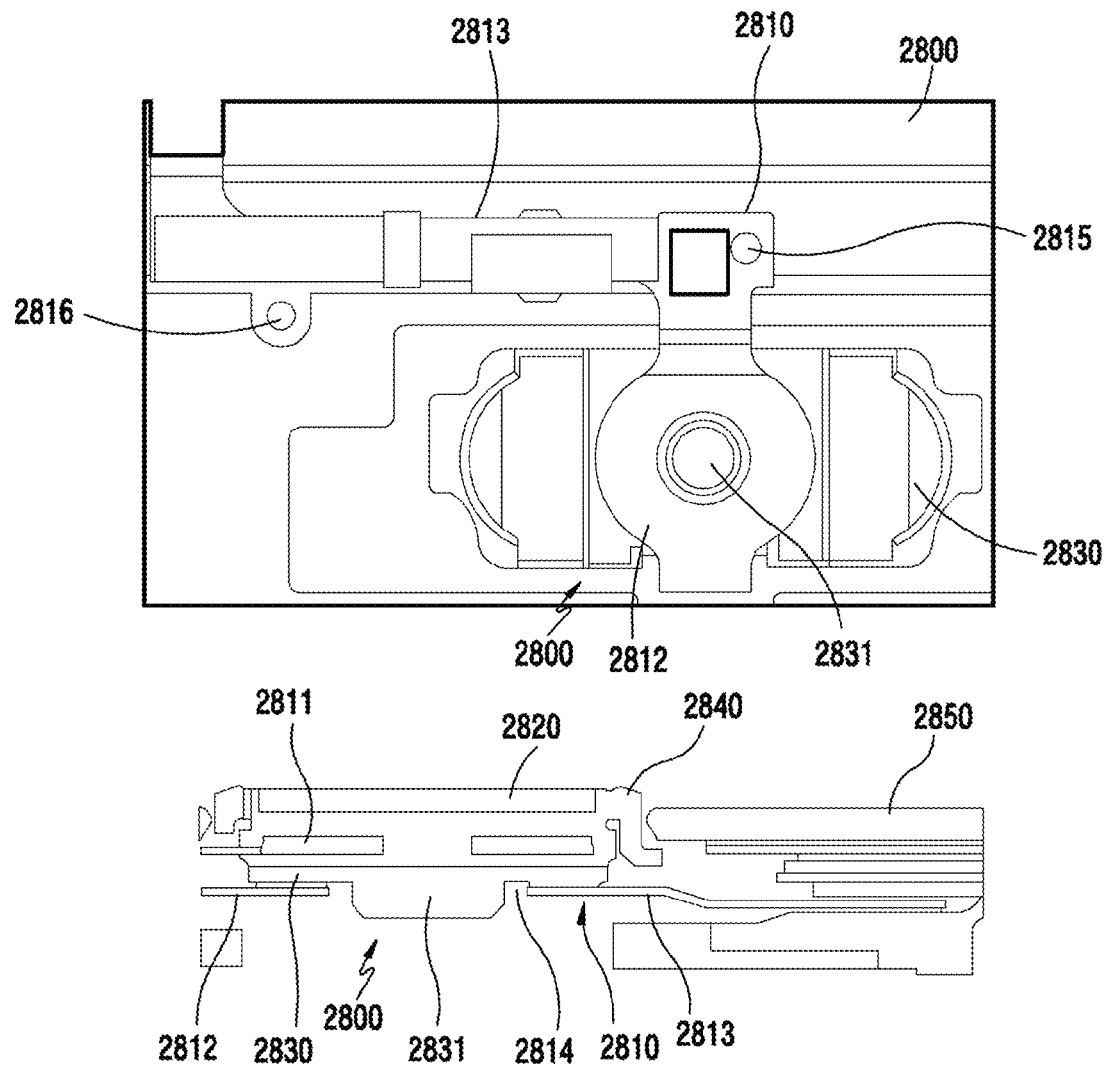
FIG. 37 is a view illustrating an FPCB that is provided in a home key button according to various embodiments of the present disclosure.

FIG. 37 is a view illustrating an FPCB that is provided in a home key button according to various embodiments of the present disclosure.

Referring to FIG. 37, a home key button 2800 may be arranged in a housing 2850 of an electronic device 100. According to an embodiment of the present disclosure, the FPCB 2810 may include a diffraction portion 2812 that bypasses the center of a support plate 2830 under the fingerprint recognition sensor 2820, and may also include a connecting portion 2813 that extends toward a display from the diffraction portion 2812 and then is bent again. In addition, the connecting portion 2813 may be arranged to be spaced apart from the display so as to prevent a white spot phenomenon of the LCD. In addition, the bent region, which includes a first fixing hole 2815 in the connecting portion 2813, may exclude an adhesion process (excluding a double-sided tape), thereby preventing degradation of the click feeling of the home key button 2800 in advance. In addition, a second position fixing hole 2816 may be arranged at a distance from the first position fixing hole 2815 along the bent portion in the connecting portion 2813. In addition, a hardware (H/W) component for the home key button 2800 may be mounted in a region of the connecting portion 2813 between the first position fixing hole 2815 and the second position fixing hole 2816.

Figure 38A:
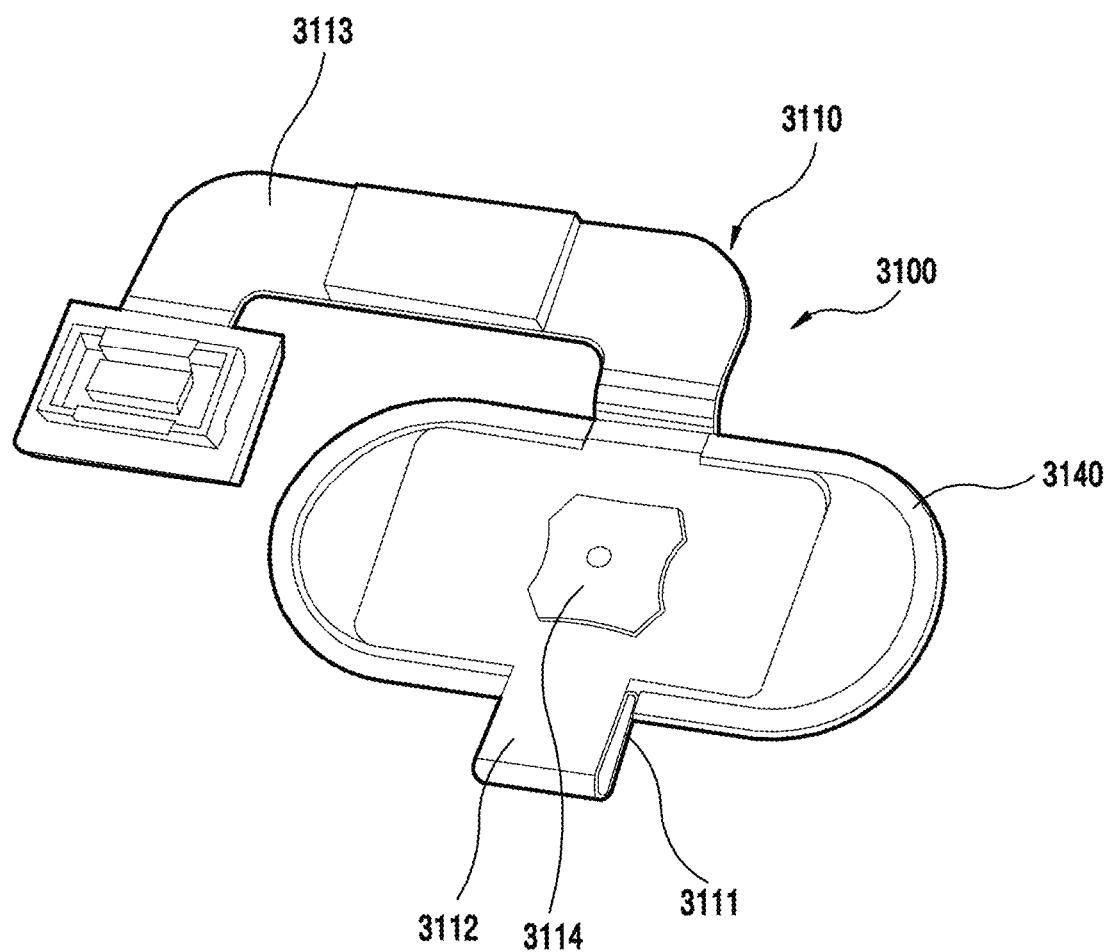
FIGS. 38A and 38B are views illustrating a home key button of an electronic device according to various embodiments of the present disclosure.
Figure 38B:
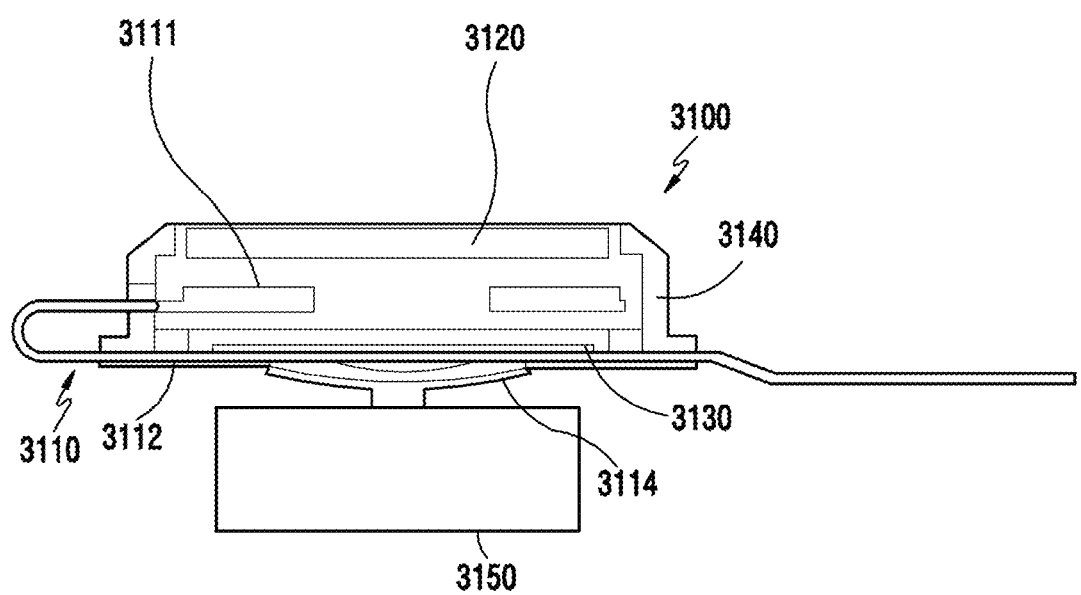

FIGS. 38A and 38B are views illustrating a home key button of an electronic device according to various embodiments of the present disclosure.

Referring to FIGS. 38A and 38B, a home key button 3100 is arranged such that a fingerprint recognition sensor 3120 may be exposed to the top of the ornamental member 3140, and an FPCB 3110 may be stacked below the fingerprint recognition sensor 3120. According to an embodiment of the present disclosure, the FPCB 3110 may include sensor mounting portion 3111 that is molded and mounted together with the ornamental member 3140, and a diffraction portion 3112 that is drawn out from the sensor mounting portion 3111 to bypass and extend to the bottom portion of the home key button 3100. In addition, the diffraction portion 3112 may be arranged in the center of the bottom face of a support plate 3130 that is installed below the home key button 3100. In addition, the FPCB 3110 may further include a connecting portion that is drawn out from the diffraction portion 3112 and is bent a plurality of times in order to avoid the display.

According to an embodiment of the present disclosure, a switching dome 3114 may be installed in the center of the diffraction portion 3112 of the FPCB 3110. In addition, the switching dome 3114 may be a metal dome. Accordingly, when the home key button 3100 is pressed after it is installed in the electronic device, the switching dome 3114 may perform a switching operation under the support of a corresponding mechanical product 3150 (e.g., the bracket 5) of the electronic device 100.

Figure 39A:
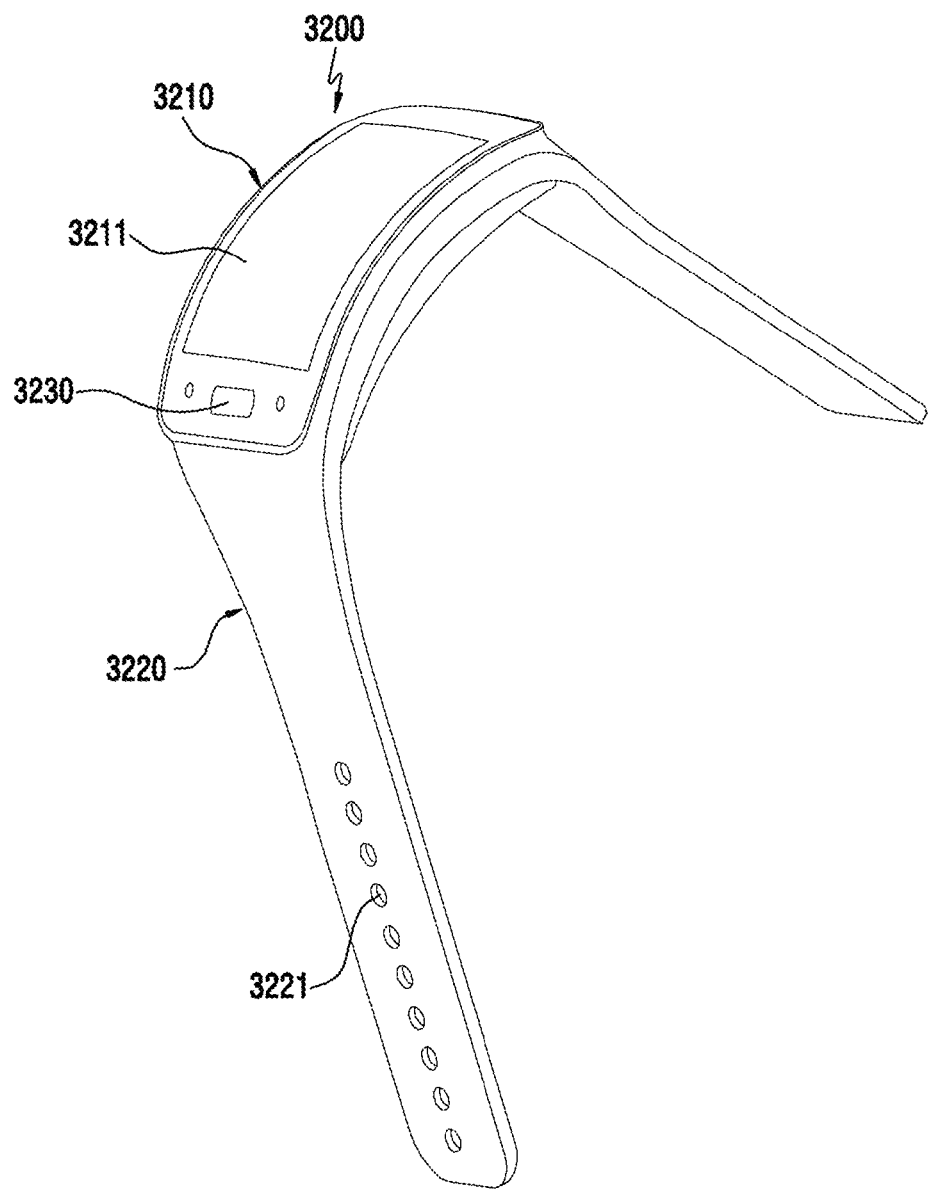
FIGS. 39A to 39C are views illustrating a configuration of a home key button that is installed in a wearable electronic device according to various embodiments of the present disclosure.
Figure 39B:
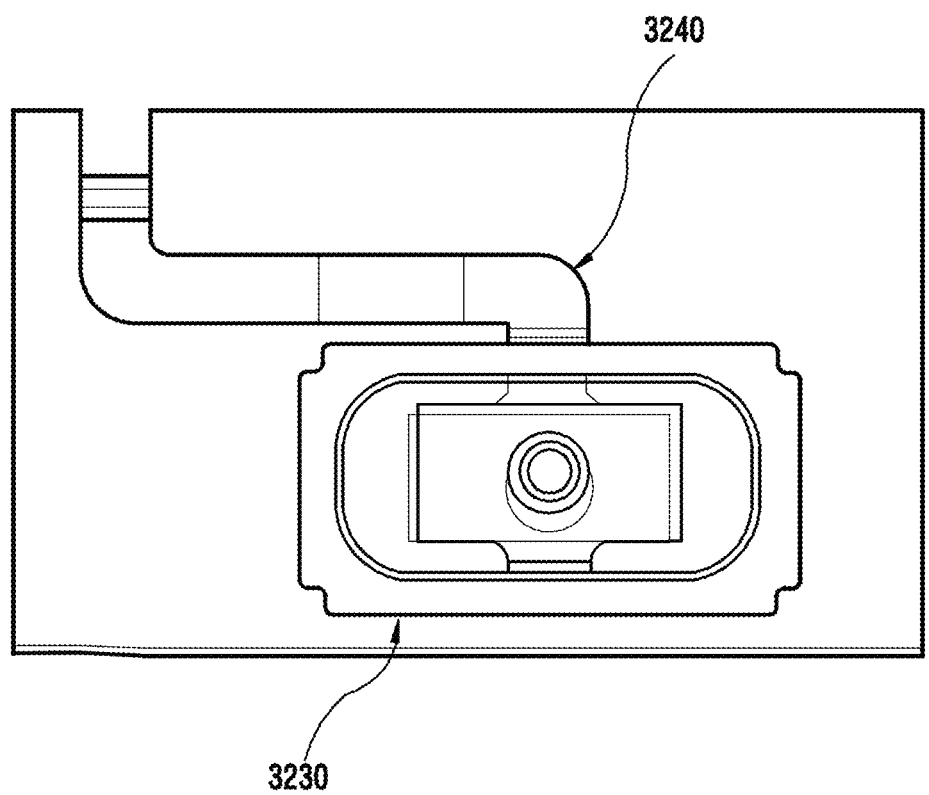
Figure 39C:
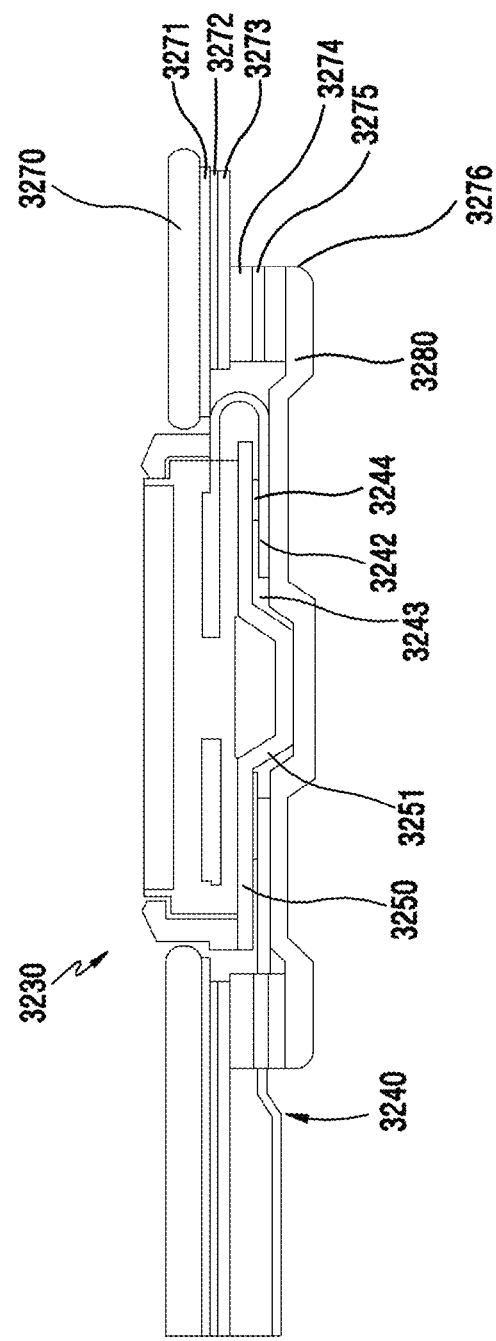

FIGS. 39A to 39C are views illustrating a configuration of a home key button that is installed in a wearable electronic device according to various embodiments of the present disclosure.

Referring to FIGS. 39A to 39C, a home key button according to an embodiment of the present disclosure may be applied to a wearable electronic device. According to an embodiment of the present disclosure, the wearable electronic device may be a wrist-wearable electronic device that may be worn on a user's wrist. According to an embodiment of the present disclosure, the home key button applied to the wearable electronic device may be implemented as a waterproofing structure.

Referring to FIG. 39A, the wearable electronic device 3200 may include a main body 3210, and one pair of straps 3220 that are installed to extend from the opposite ends of the main body 3210 to be worn on the user's wrist. According to an embodiment of the present disclosure, a display 3211 may be disposed on the main body 3210, and a home key button 3230 according to an embodiment of the present disclosure may be disposed below the display 3211. According to an embodiment of the present disclosure, the straps 3220 may have a plurality of length adjustment openings 3221 that are formed at predetermined intervals therein so as to guide the user to wear the main body to be suitable for the user's wrist.

Referring to FIGS. 39B and 39C, the basic configuration of the home key button 3230 applied to the wearable electronic device 3200 may include a left-right symmetric arrangement structure in which the FPCB 3240 passes through the center of the bottom face of the home key button 3230, as described above. According to an embodiment of the present disclosure, in the home key button 3230, the fingerprint recognition sensor may be disposed to be exposed to the top of the ornamental member to be exposed, and the FPCB 3240 may be stacked below the fingerprint recognition sensor.

According to an embodiment of the present disclosure, the FPCB 3240 may include a sensor mounting portion that is molded to the ornamental member and mounted together with the ornamental member, and a diffraction portion that is drawn out from the sensor mounting portion and bypasses and extends to the bottom side of the home key button. In addition, the diffraction portion may be disposed at the center of the bottom face of the support plate 3250 that is installed to the bottom of the home key button. In addition, the FPCB 3240 may further include a connecting portion that is drawn out from the diffraction portion 3242 and is bent a plurality of times so as to avoid the display. In addition, the diffraction portion 3242 may include a through-hole 3243 that allows the actuator 3251 of the support plate 3250 to pass therethrough. According to an embodiment, the diffraction portion 3242 may be fixed by being attached to the bottom face of the support plate 3250 by a tape 3244.

According to an embodiment of the present disclosure, the home key button 3230 may include a waterproof structure since it is disposed on the front face of the main body 3210 that includes the display of the wearable electronic device 3200. According to an embodiment of the present disclosure, on the bottom portion of a window around the home key button 3230, a print film 3271, an optical clear adhesive (OCA) 3272, and a TSP 3273 may be sequentially stacked to be used as a part of the display.

According to an embodiment of the present disclosure, a waterproof member 3280 formed of an elastic material may be disposed to completely enclose the support plate 3250 on the bottom portion of the home key button. According to an embodiment of the present disclosure, the waterproof member 3280 may be attached to the bottom face of the window 3270 by one or more waterproof tapes 3274 and 3276, and a PC sheet 3275. According to an embodiment of the present disclosure, the waterproof member 3280 may be formed of at least one of urethane, silicon, and rubber. Accordingly, even if the home key button 3230 is pressed, the elastic waterproof member 3280 may be pushed downwardly by the support plate 3250 while maintaining the waterproof function.

According to an embodiment of the present disclosure, the housing of the electronic device may be manufactured through dual injection molding of dissimilar materials. According to an embodiment, the housing may be formed by insert-molding a non-metal member to a metal member. According to an embodiment of the present disclosure, the non-metal member may be formed of a synthetic resin material.

According to an embodiment of the present disclosure, an electronic device that includes a housing including a metal portion in at least a portion thereof may require an electric connection structure between a PCB disposed in the inner space of the electronic device and an antenna radiator that is generally disposed on the outer face of the electronic device. Because the existing electric connection structures of an antenna carrier type, a laser direct structure (LDS) type, and an FPCB type include a flexible antenna radiator so that they can be vertically connected to a pattern face, and in the case of a direct print antenna (DPA) that is directly printed on the housing, an electric connection can be achieved by using a separate metallic press-in pin since the vertical connection to a radiation pattern is not enabled.

However, the structure using such a press-in pin will additionally require a process of applying a separate structure, and may cause deterioration of a radiation performance of the antenna as a deviation and an error occur according to the assembly. Further, there are problems in that manufacturing costs increase due to the added components, and the press-in pin cannot be applied to a complicated structure portion, such as a curved face, and a peripheral portion may be scratched or deformed in the press-in process.

Further, the FPCB of the related art and the antenna carrier type are flexible so that a pattern is movable from a radiation face of an antenna radiator to a PCB contact face. A problem may occur in securing a space that is absolutely necessary for pattern movement.

In addition, a bolt fastening structure of the related art may cause an electric shock problem. For example, an inner current may be transferred to an outer metal housing through a bolt so than the user may be exposed to electric shock. In order to prevent this, a capacitor may be disposed around the bolt as an electric safety device. However, this may increase the unit cost, and a separate mounting space may be needed by adopting additional components.

Various embodiments of the present disclosure may provide a housing that is capable of solving the above-mentioned problems only by a process of manufacturing the housing using a metal member and a non-metal member.

Various embodiments of the present disclosure may implement electric conduction and insulation effects at a desired position only by the processes of insert-molding and processing a non-metal member to a metal member.

Figure 40:
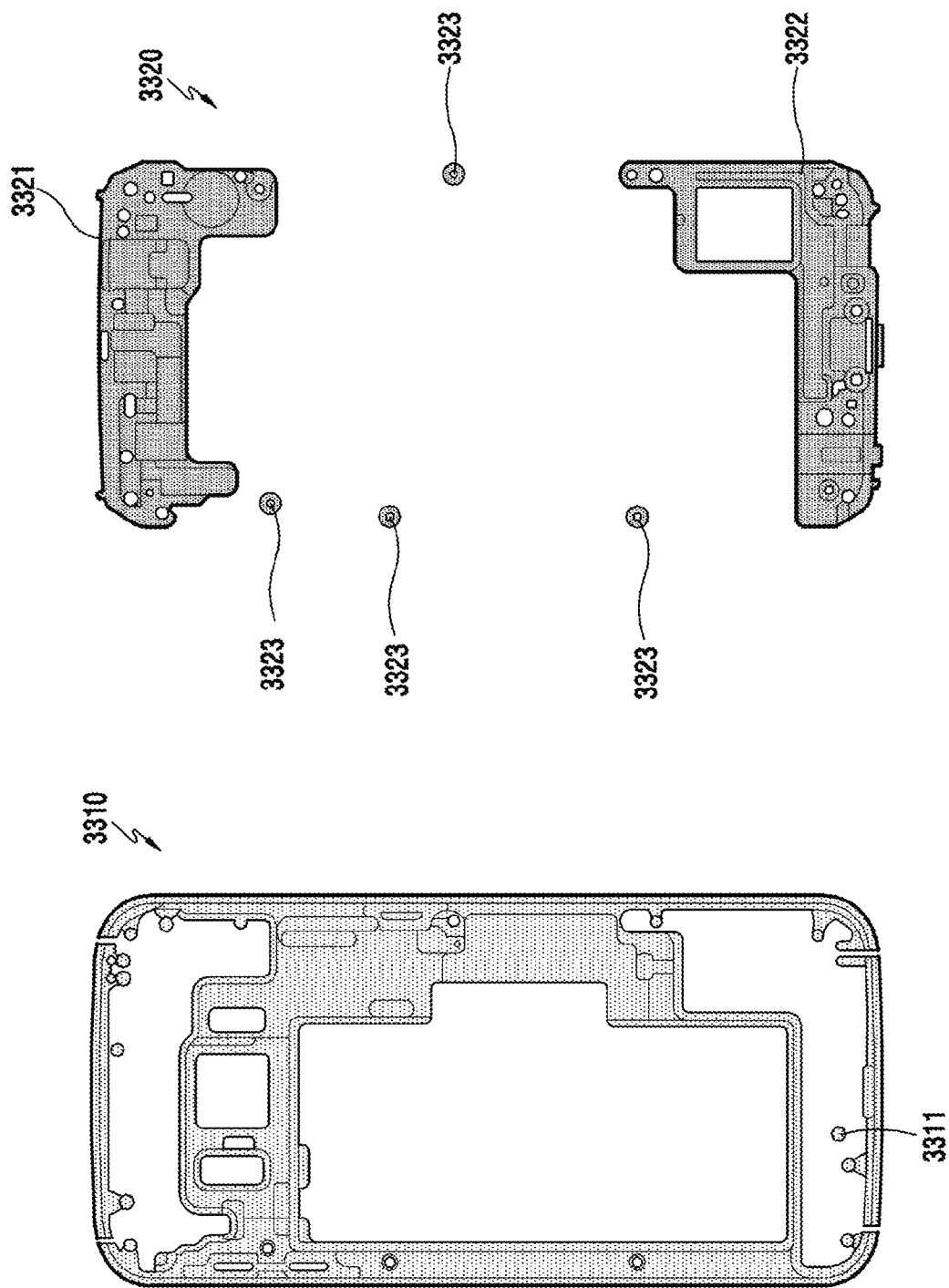
FIG. 40 is a view illustrating configurations of a metal member and a non-metal member that are applied to an electronic device according to various embodiments of the present disclosure.

FIG. 40 is a view illustrating a configuration of a metal member and a non-metal member, which are applied to a housing of an electronic device according to various embodiments of the present disclosure.

Referring to FIG. 40, the housing may include a metal member 3310 and a non-metal member 3320 that is insert-molded to the metal member 3310. According to an embodiment of the present disclosure, the metal member 3310 may include a metal bezel of the above-described housing. In addition, the metal member 3310 may include a metal structure that extends to at least a portion of the front face and/or the rear face of the electronic device from the metal bezel. According to an embodiment, the metal member 3310 may include a metal filler 3311 that is independently formed in a space separate from the metal bezel.

According to an embodiment of the present disclosure, the non-metal member 3320 may include an upper member 3321 and a lower member 3322. According to an embodiment of the present disclosure, the non-metal member 3320 may include a plurality of insulation members 3323 that are applied to the metal member 3310. In addition, the insulation members 3323 may contribute to the insulation between the metal member 3310 and the PCB when fixing the housing and the bracket or fixing the PCB through bolts.

Figure 41A:
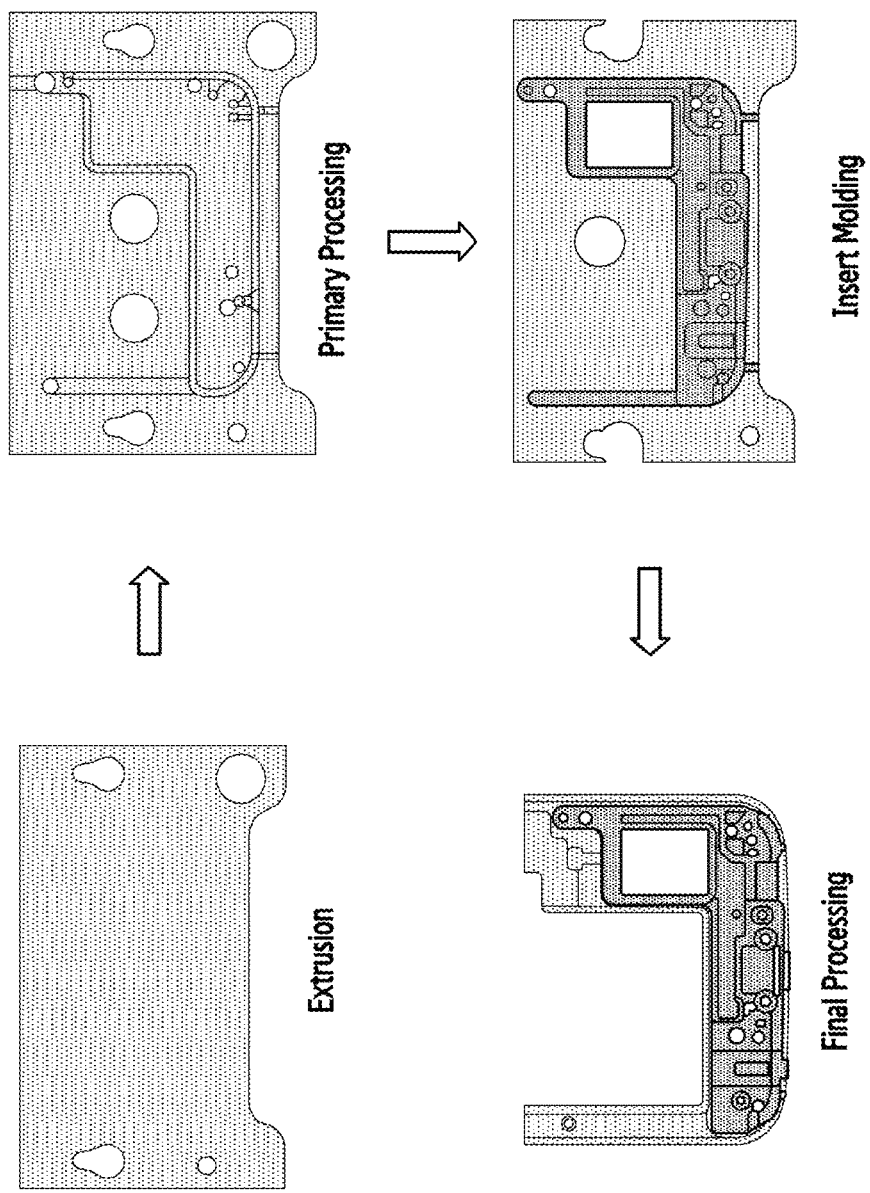
FIGS. 41A and 41B are views illustrating a manufacturing process of a housing of an electronic device according to various embodiments of the present disclosure.
Figure 41B:
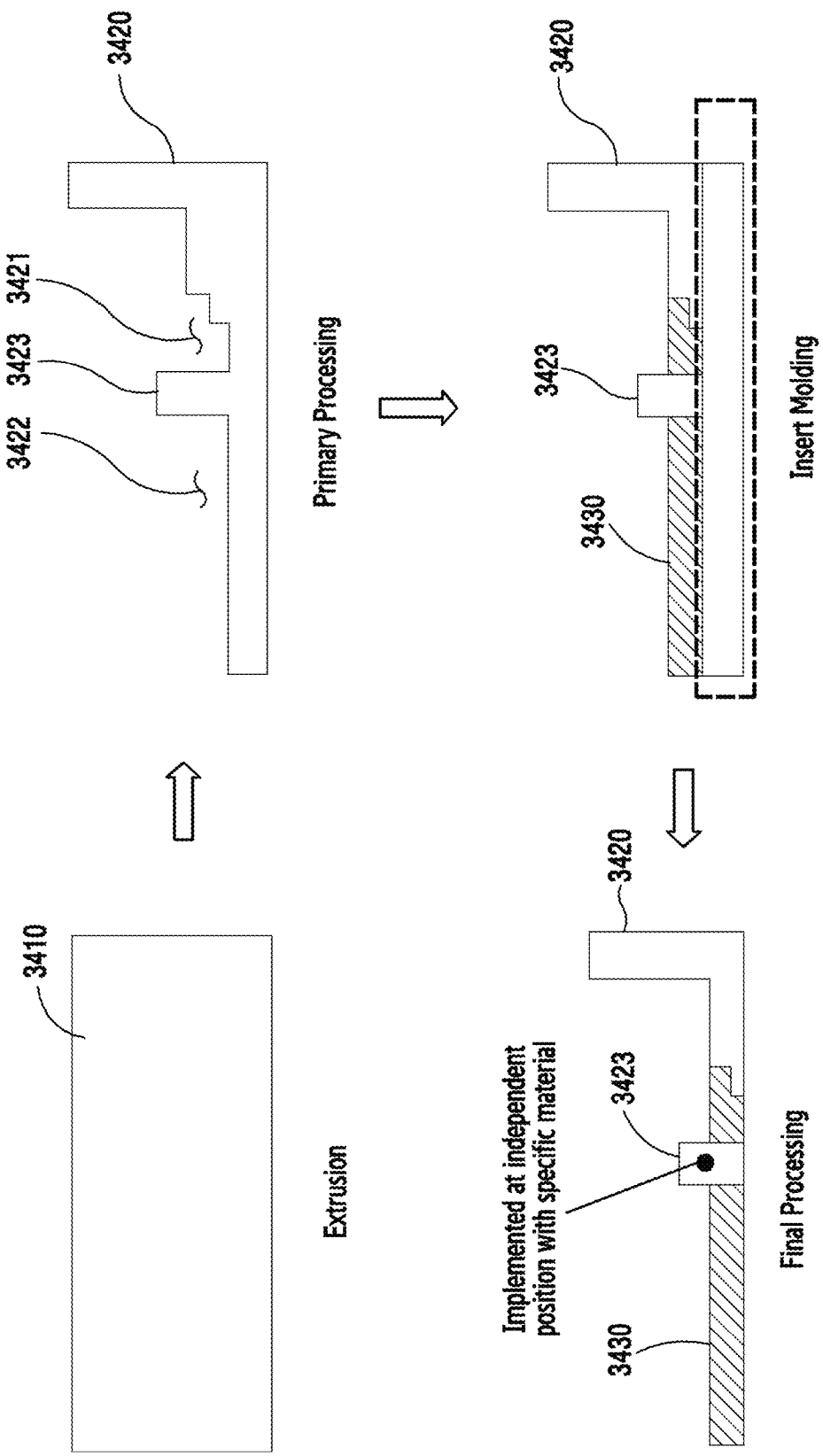
Figure 42A:
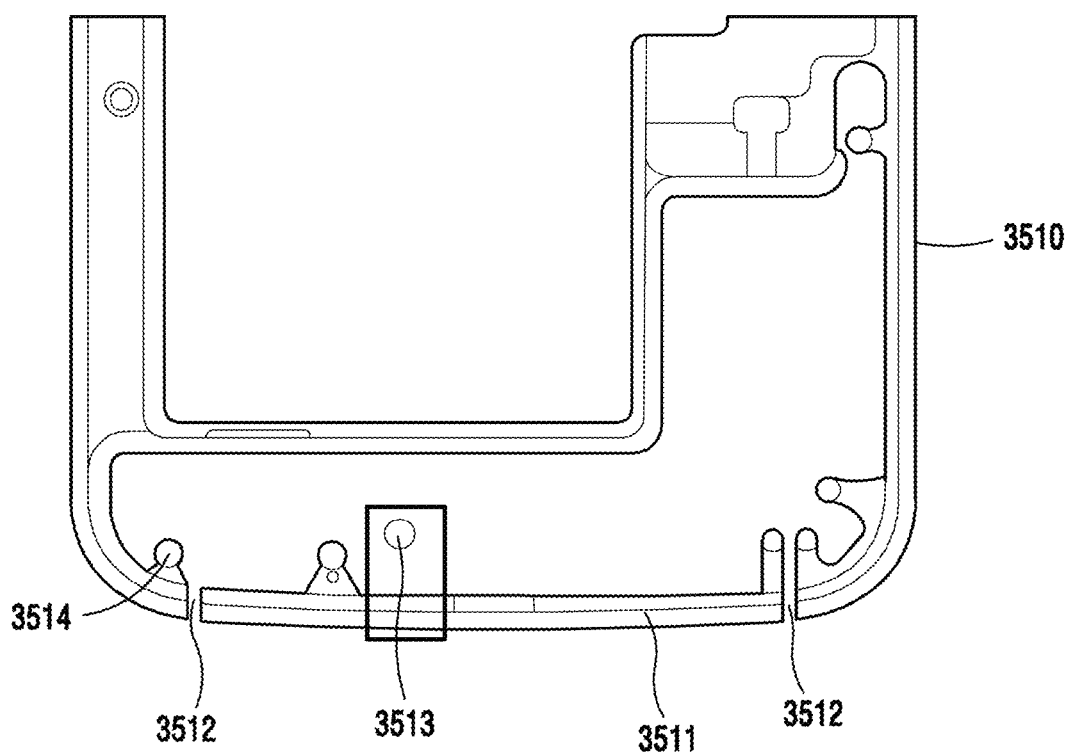
FIGS. 42A and 42B are views illustrating a configuration of a metal filler according to insert-molding of a non-metal member according to various embodiments of the present disclosure.
Figure 42B:
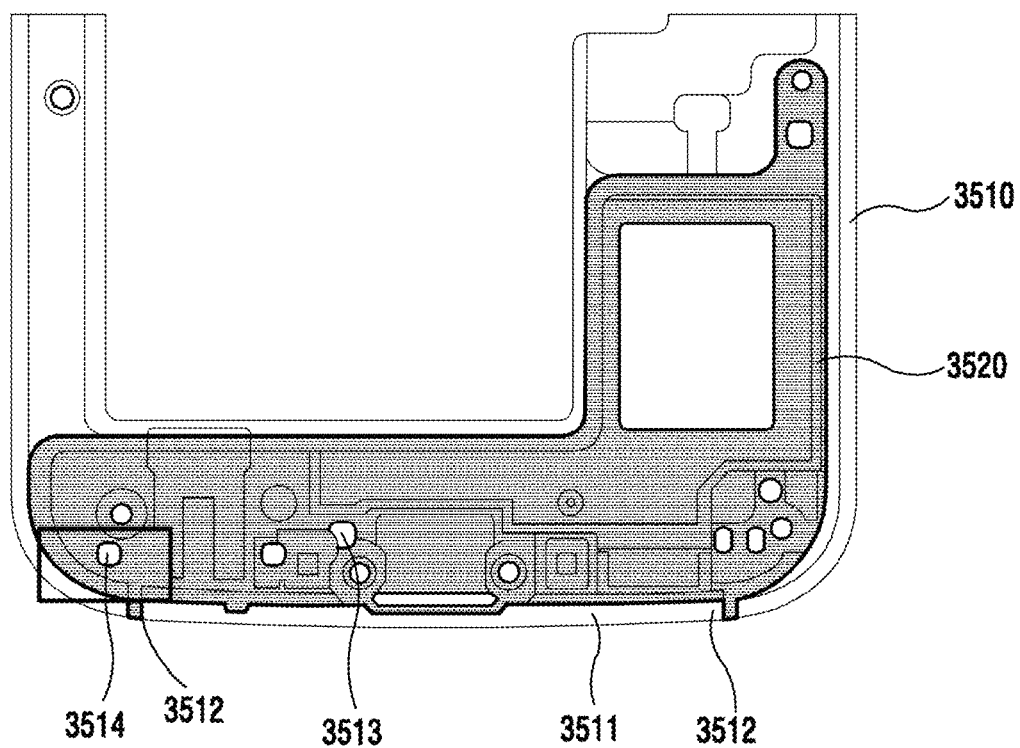

FIGS. 41A and 41B are views illustrating a process of manufacturing a housing of an electronic device according to various embodiments of the present disclosure. FIGS. 42A and 42B are views illustrating a configuration of a metal filler according to insert-molding of a non-metal member according to various embodiments of the present disclosure.

Referring to FIG. 41A, a primary processing may be performed by extruding a plate-type metal preform, and a non-metal member may be insert-molded to the primarily processed metal preform. According to an embodiment of the present disclosure, after the non-metal member is insert-molded to the metal member, a processing process may be finally performed.

Referring to FIG. 41B, a primarily processed preform 3420 may be obtained by extruding a plate-type metal preform 3410. According to an embodiment of the present disclosure, the primarily processed preform 3420 may include a protruding portion 3423 and a plurality of recessed portions 3421 and 3422 that are formed to be relatively lower that the protruding portion 3423. In addition, a non-metal member 3430 may be insert-molded to at least a portion of the plurality of recessed portions 3421 and 3422 and the protruding portion 3423 of the primarily processed metal preform 3420. According to an embodiment, when a portion indicated by a dotted line in the insert-molded preform is processed, the protruding portion 3423 may serve as a metal filler 3423 that is disposed independently from the primarily processed preform 3420.

FIGS. 42A and 42B are views illustrating a configuration of a metal filler according to an insert-molding of a non-metal member according to various embodiments of the present disclosure.

FIG. 42A is a view illustrating a state prior to a non-metal member is molded to a metal member 3510 that is used as a metal member. FIG. 42B is a view illustrating a state in which a non-metal member (e.g., PC) is insert-molded to a metal bezel. In particular, FIG. 42B illustrates a metal bezel and a unit bezel portion that is formed by a portion of the metal bezel and cut-off portions to serve as an antenna radiator.

Referring to FIGS. 42A and 42B, the metal bezel 3510 may be disposed to surround the outer periphery of the electronic device, and one pair of cut-off portions 3512 may be formed at a predetermined interval at the lower side of the metal bezel 3510. According to an embodiment of the present disclosure, the unit bezel portion 3511 may be formed independently from the metal bezel 3510 by insert-molding the non-metal member 3520 to the cut-off portions 3512. In addition, the unit bezel portion 3511 may serve as an antenna member. In addition, a portion of the unit bezel portion 3511 may form a contact portion 3514 that is drawn out to extend to the inside of the electronic device. In addition, by being formed independently from the metal bezel 3510 and the unit bezel portion 3511, the metal filler 3513 is operated as a metal island to be used as an electric connection member in the vertical direction between a DPA that is disposed in the housing, and a PCB that is disposed inside the electronic device.

Figure 43A:
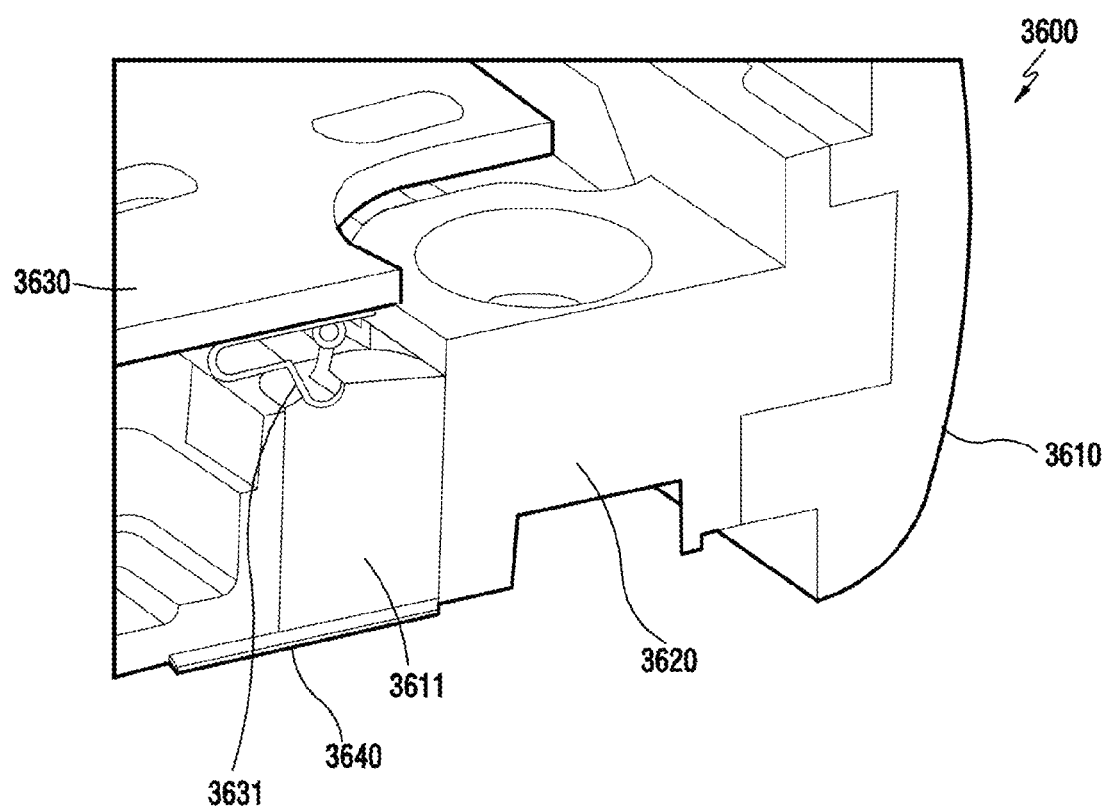
FIGS. 43A and 43B are views of a metal filler according to various embodiments of the present disclosure.
Figure 43B:
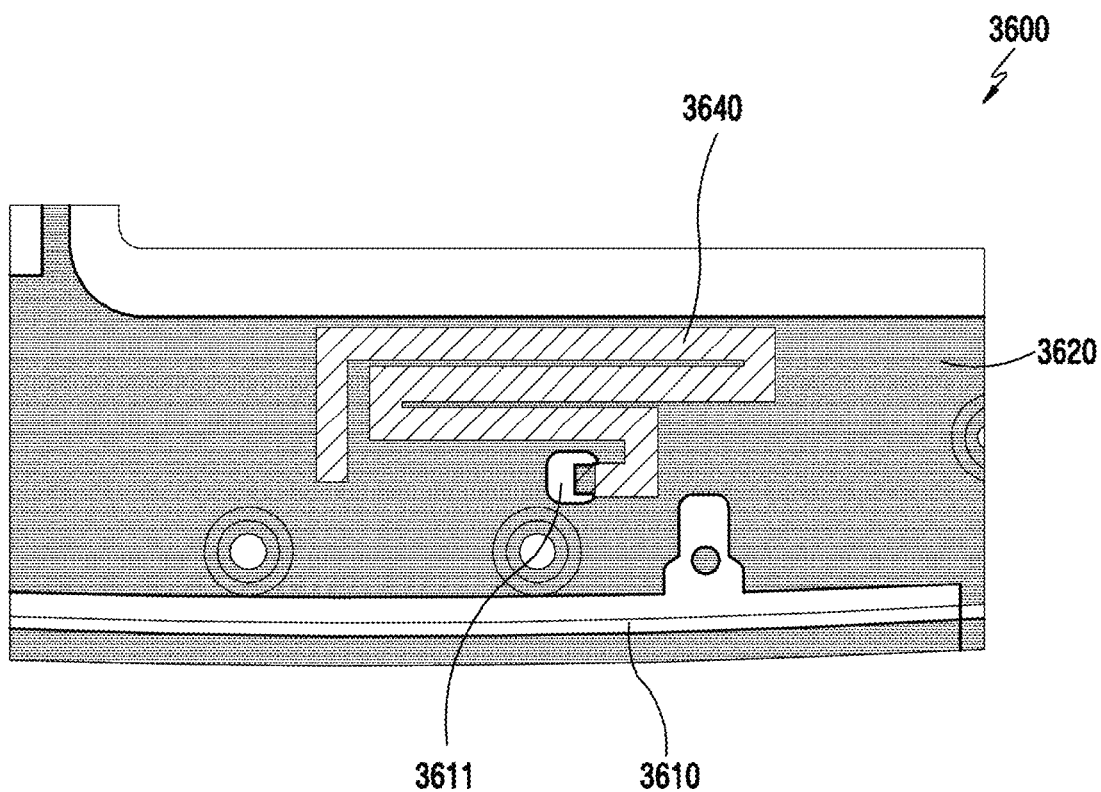

FIGS. 43A and 43B are views of a metal filler according to various embodiments of the present disclosure.

Referring to FIGS. 43A and 43B, the metal filler 3611 may be disposed to be isolated by a non-metal member 3620 that is insert-molded to a metal member 3610 that is used as the metal bezel. According to an embodiment of the present disclosure, the metal member 3610 and the non-metal member 3620 that is insert-molded to the metal member 3610 may serve as a portion of the housing 3600 of the electronic device. In addition, at least a portion of the metal filler 3611 may be disposed to be exposed to the outer face of the non-metal member 3620 of the housing 3600. Further, at least a portion of the metal filler 3610 may be disposed to be exposed to the inner face of the non-metal member 3620 of the housing 3600.

According to an embodiment of the present disclosure, an antenna radiator 3640 may be disposed on and attached to the outer face of the housing 3600. In addition, the antenna radiator 3640 may be physically in contact with the metal filler 3611 that is exposed to the outer face of the housing 3600. In addition, a PCB 3630 may be disposed within the electronic device, and an electric connection member 3631 may be interposed between the PCB 3630 and the metal filler 3611. According to an embodiment of the present disclosure, as the electric connection member 3631, various members, such as a C-clip, a thin wire cable, and a flexible printed circuit, may be used.

According to an embodiment of the present disclosure, the antenna radiator (DPA) 3640 attached to the outer face of the housing 3600 is electrically connected to the PCB 3630 through the metal filler 3611 and the electric connection member 3631, so that the antenna radiator 3640 may be used as an additional antenna radiator of the electronic device or an independent antenna radiator.

Figure 44:
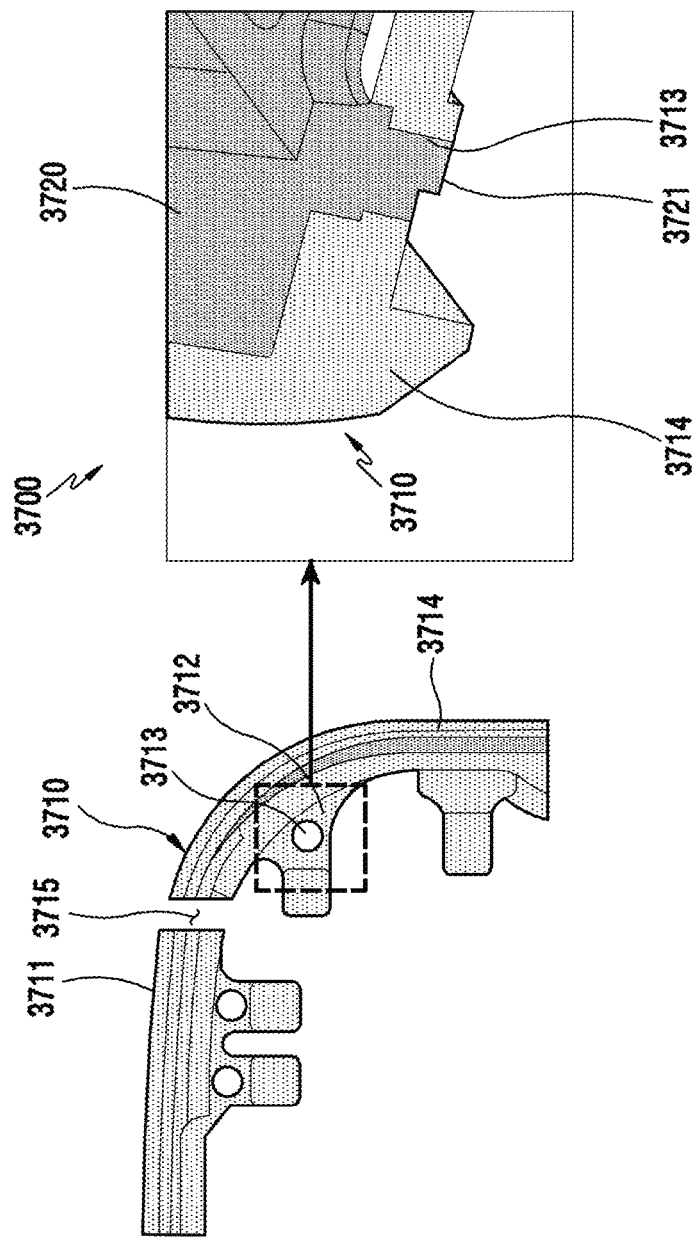
FIG. 44 is a view illustrating a non-metal member insert-molded to a metal member according to various embodiments of the present disclosure.

FIG. 44 is a view illustrating a non-metal member insert-molded to a metal member according to various embodiments of the present disclosure.

Referring to FIG. 44, in a housing 3700, a non-metal member 3720 may be formed on a metal member 3710 by insert-molding. According to an embodiment, since the metal member 3710 and the non-metal member 3720 are bonded to each other through bonding between dissimilar materials, the metal member 3710 and the non-metal member 3720 preferably have a separate and additional binding structure. According to an embodiment of the present disclosure, the metal member 3710 may include a metal bezel 3714 and a unit bezel 3711 that is separated from the metal bezel 3714 by cut-off portions 3715. In addition, the metal bezel 3714 may include a flange 3712 that is formed to extend inwardly, and at least one molding opening 3713 may be formed in the flange 3712. Accordingly, when the non-metal member 3720 is insert-molded to the metal member 3710, the non-metal member 3720 may be insert-molded to the molding opening 3713 of the metal member 3710 to serve as a non-metal filler 3721, which may support the binding force between the metal member 3710 and the non-metal member 3720, which are formed of dissimilar materials.

Figure 45A:
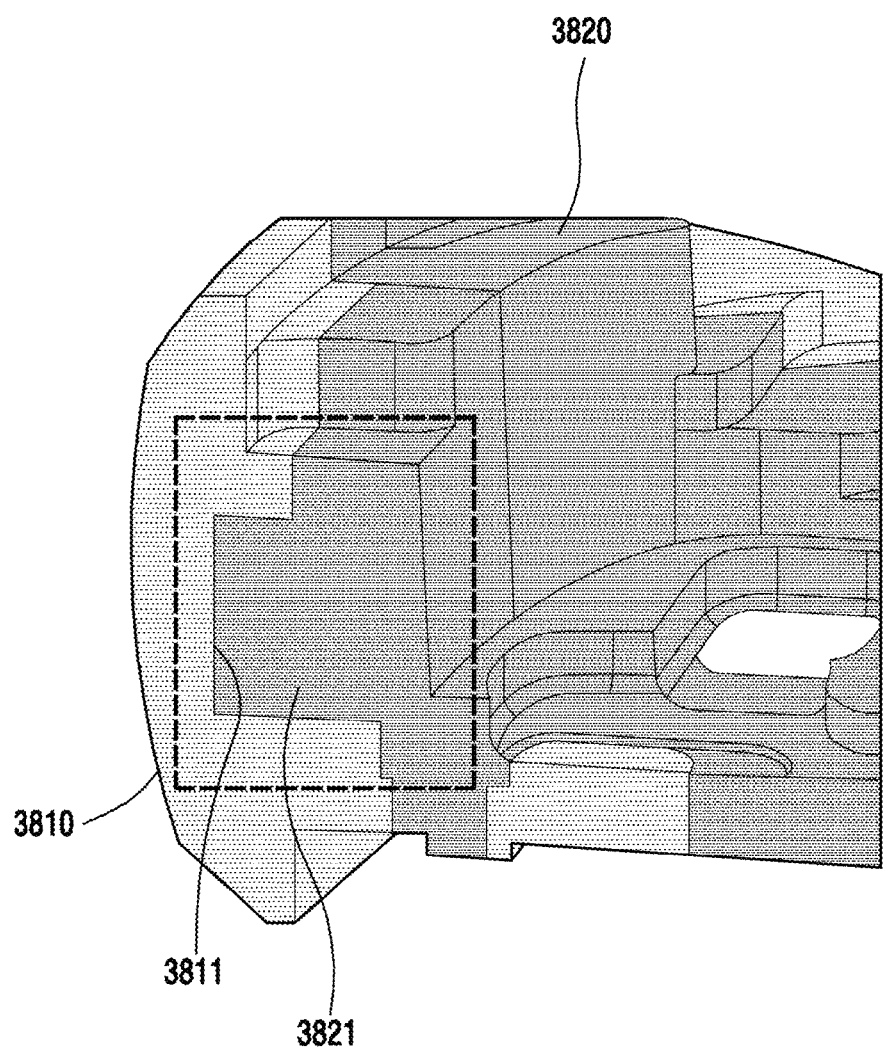
FIGS. 45A to 45C are views illustrating a non-metal member insert-molded to a metal member according to various embodiments of the present disclosure.
Figure 45B:
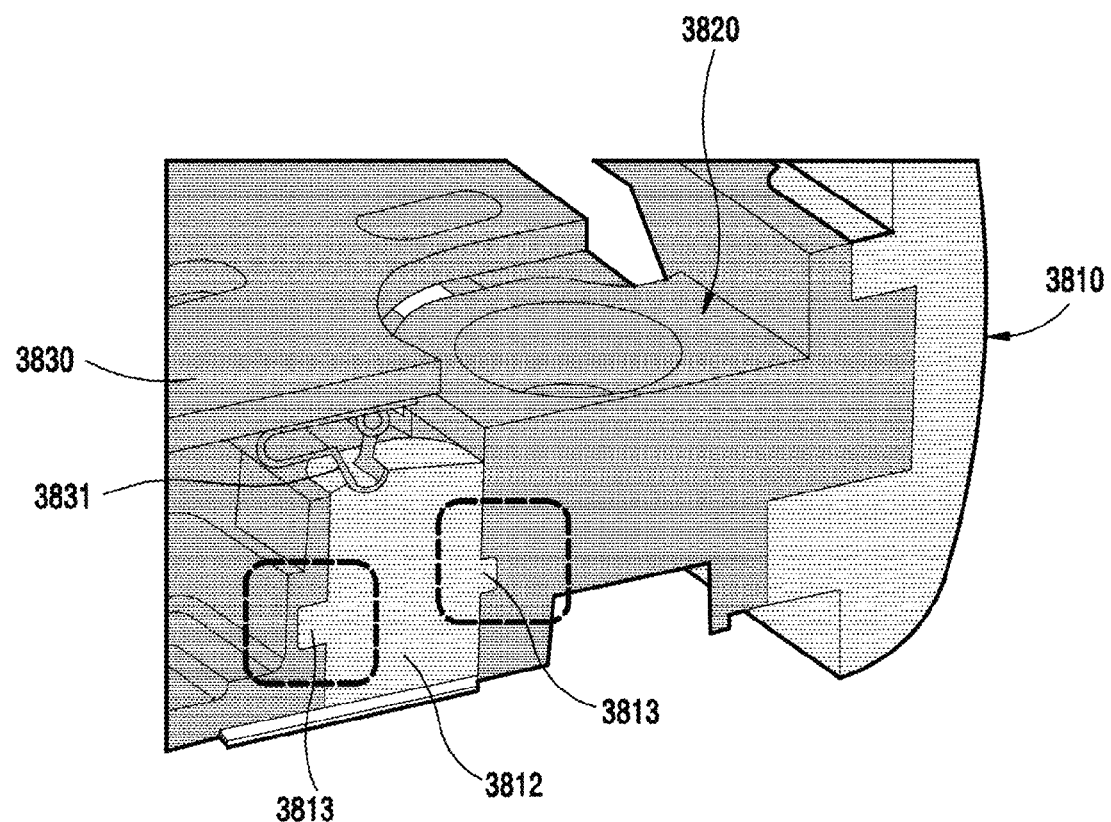
Figure 45C:
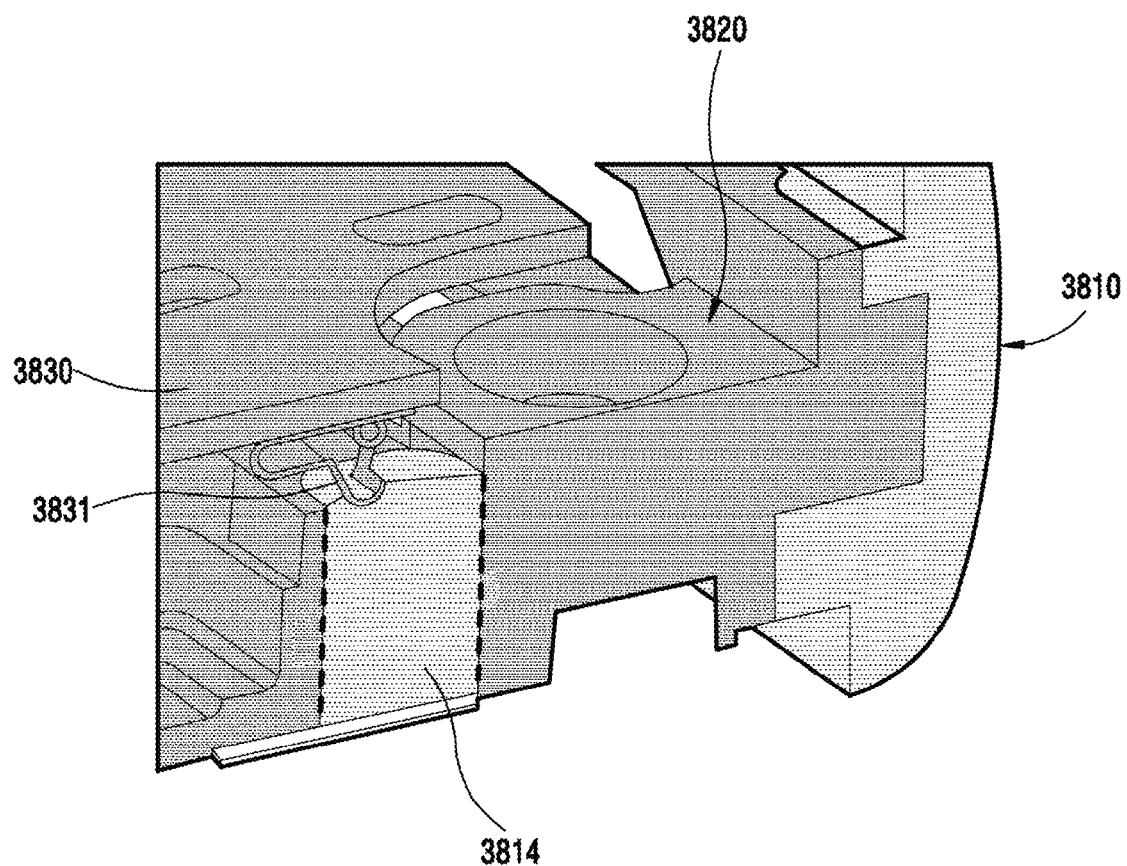

FIGS. 45A to 45C are views illustrating a non-metal member insert-molded to a metal member according to various embodiments of the present disclosure. FIGS. 45A to 45C illustrate a bonding structure for improving the bonding force between dissimilar materials (a metal material and a non-metal material) by the structure of the metal member itself.

Referring to FIGS. 45A to 45C, a bonding structure for improving the bonding force between dissimilar materials (a metal material and a non-metal material) by the structure of the metal member itself is illustrated. Referring to FIG. 45A, a recess 3811 is formed on the metal member 3810, and the non-metal member 3820 may be insert-molded to the recess 3811 to be formed as a protrusion 3821 so as to support the bonding force between dissimilar materials.

Referring to FIG. 45B, the metal member 3810 and the non-metal member 3820 are insert-molded, and a metal filler 3812, which is disposed to be spaced apart from the metal member 3810, causes a plurality of protrusions 3813 to protrude along the outer peripheral surface thereof to be molded as non-metal members in the process of extrusion. Accordingly, it is possible to prevent the metal filler 3812 from being separated or moved in the vertical direction by the force pressing an electric connection member 3831, which is installed on the PCB 3830 and has a certain elasticity.

Referring to FIG. 45C, the metal member 3810 and the non-metal member 3820 are insert-molded, and the metal filler 3814, which is disposed to be spaced apart from the metal member 3810, is also processed by performing a process, such as sanding or chemical etching, on the outer peripheral face of the metal filler 3814 during the extrusion process. Thus, the surface frictional force can be increased so that the bonding force of the metal filler 3814 with the non-metal 3820 can be increased. Accordingly, it is possible to prevent the metal filler 3821 from being separated or moved in the vertical direction by the force pressing the electric connection member 3831, which is installed on the PCB 3830 and has certain elasticity.

Figure 46A:
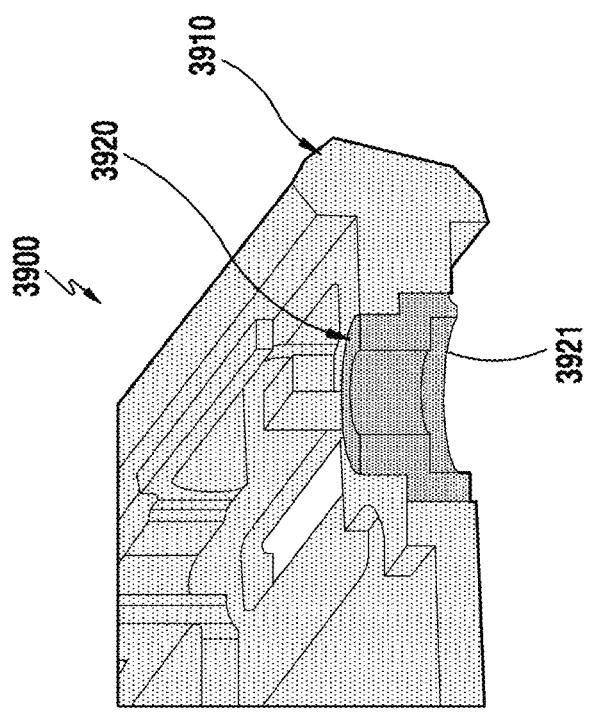
FIGS. 46A and 46B are views illustrating a non-metal member used as an insulation member when the non-metal member is insert-molded to a metal member according to various embodiments of the present disclosure.
Figure 46A:
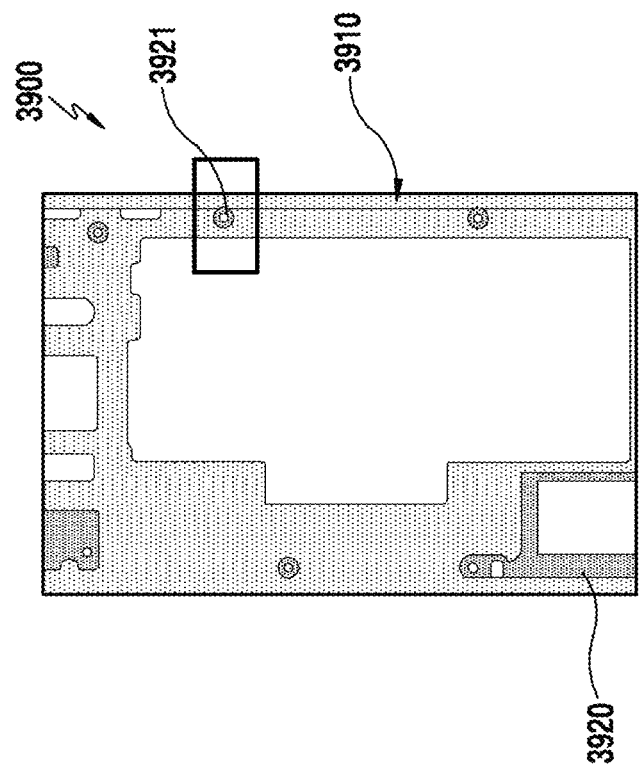
Figure 46B:
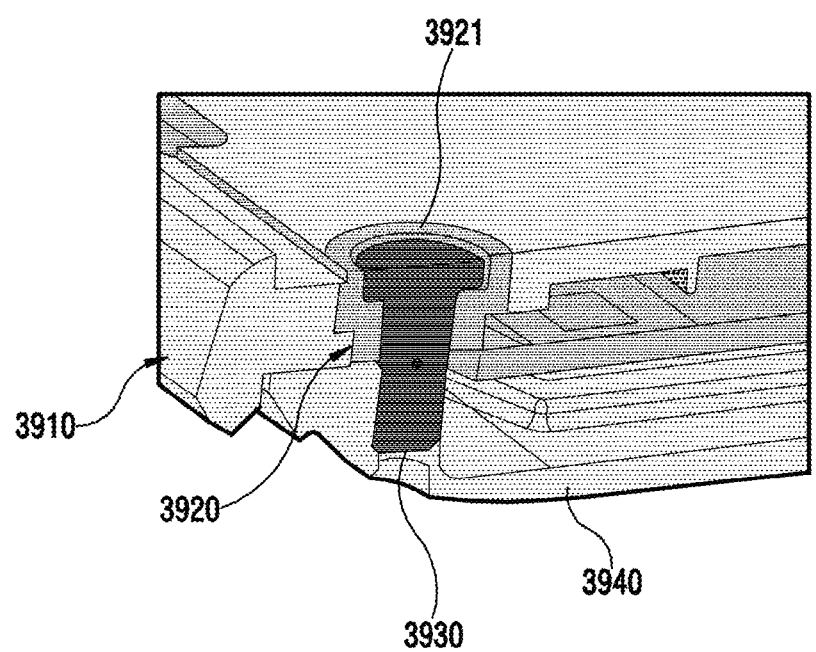

FIGS. 46A and 46B are views illustrating a non-metal member used as an insulation member when the non-metal member is insert-molded to a metal member according to various embodiments of the present disclosure.

Referring to FIGS. 46A and 46B, a housing 3900 may be formed by insert-molding a non-metal member 3920 to a metal member 3910. According to an embodiment of the present disclosure, one or more insulation members 3921 formed by the non-metal member 3920 may be disposed on the metal member 3910. According to an embodiment of the present disclosure, each insulation member 3921 may accommodate a bolt 3930, and may be configured to prevent in advance an electric shock accident that is caused by electric power applied to the metal member 3910 through another structure (e.g., a PCB) 3940 within the electronic device.

According to an embodiment of the present disclosure, the insulation member 3921, which is insert-molded in the metal member 3910, may be formed in a hollow shape to have a depth that is at least the same as the entire height of the metal member 3910. In addition, the bolt 3930, which is inserted into the insulation member 3921, may be fastened to the other structure 3940 of the electronic device. In addition, the other structure 3940 may be a PCB, a bracket, or the like. Accordingly, the metal member 3910 is maintained in the state in which it is completely insulated from a structure within the electronic device by the insulation member 3921, so that an electric shock accident can be prevented.

According to an embodiment of the present disclosure, there may be provided a portable electronic device. The electronic device may include: a front glass cover that forms a front face of the electronic device; a rear cover that forms a rear face of the electronic device; a bezel that surrounds a space formed by the front cover and the rear cover; a display device embedded in the space and including a screen region that is exposed through the front cover; a metal structure positioned within the space, and including a first face facing the front cover and a second face facing the rear cover; a non-metal structure positioned within the space to partially overlap with the metal structure, and including a first surface facing the front cover and a second surface facing the rear cover; and a metal filler extending from the first surface to the second surface of the non-metal structure through a portion of the non-metal structure.

The metal filler may be formed of a material that is equal to that of the metal structure, and may include a first end portion adjacent to the first surface and a second end portion adjacent to the second surface. The first end portion and/or the second end portion may be aligned to be coplanar with a portion of the first surface and/or a portion of the second surface, respectively.

According to an embodiment of the present disclosure, the first end portion may be aligned with the first surface to be coplanar with each other, and the second end portion may protrude from the second surface.

According to an embodiment of the present disclosure, the first end portion may protrude from the first surface, and the second end portion may be aligned to form the same plane with the second surface.

According to an embodiment of the present disclosure, the electronic device may further include an antenna pattern disposed adjacent to the first surface or the second surface, and the antenna pattern may be electrically connected with the metal filler.

According to an embodiment of the present disclosure, the electronic device may further include a communication circuit within the space, and the communication circuit may be electrically connected to the antenna pattern through the metal filler.

According to an embodiment of the present disclosure, the electronic device may further include a flexible conductive structure for forming an electrical connection at the first end portion or the second end portion.

According to an embodiment of the present disclosure, the electronic device may further include a printed circuit board (PCB) within the space, and the PCB may be disposed to be in electrical contact with the flexible conductive structure.

According to an embodiment of the present disclosure, the PCB may be positioned between the front cover and the non-metal structure, the flexible conductive structure may be positioned between the PCB and the first end portion of the metal filler, and the electronic device may further include an antenna pattern that is positioned between the rear cover and the non-metal structure and is in electrical contact with the second end portion of the metal filler.

According to an embodiment of the present disclosure, the bezel may be formed of a metal that is the same as the material of the metal structure, and may be integrally formed with at least a part of the metal structure.

According to an embodiment of the present disclosure, at least a portion of the bezel may form a portion of an antenna of the electronic device.

According to an embodiment of the present disclosure, there may be provided a portable electronic device. The electronic device may include a front glass cover that forms a front face of the electronic device, a rear cover that forms a rear face of the electronic device, a bezel that surrounds a space formed by the front cover and the rear cover, a display device embedded in the space and including a screen region that is exposed through the front cover, a metal structure positioned within the space, and including a first face facing the front cover and a second face facing the rear cover, a non-metal structure positioned within the space to partially overlap with the metal structure, and including a first surface facing the front cover and a second surface facing the rear cover, and a non-metal filler extending from the first face to the second face of the metal structure through a portion of the metal structure.

The non-metal filler may be formed of a material that is equal to that of the non-metal structure, and may include a first end portion adjacent to the first face of the metal structure and a second end portion adjacent to the second face of the metal structure. The first end portion and/or the second end portion may be aligned with a portion of the first face of the metal structure and/or a portion of the second face of the metal structure to form the same planes, respectively.

According to an embodiment of the present disclosure, the non-metal filler may further include a through-hole, and a fastener inserted into the through-hole.

According to an embodiment of the present disclosure, there may be provided a method of manufacturing a portable electronic device. The method may include: an operation of manufacturing a structure that includes a bezel that forms at least a portion of a side face of the electronic device to surround a space that is formed by a front cover and a rear cover of the electronic device, a metal structure connected to the bezel, and a non-metal structure.

The operation of manufacturing the structure may include: an operation of extruding a metal plate; an operation of forming at least a portion of the metal structure on the extruded metal plate, the metal structure including at least one protrusion; an operation of forming at least a portion of the non-metal structure by insert-molding the metal plate, the non-metal structure surrounding at least a portion of the protrusion; and an operation of concurrently cutting at least a portion of the metal structure and at least a portion of the non-metal structure to align the metal structure and the non-metal structure such that a face of the protrusion and a portion of a surface of the non-metal structure are coplanar with each other.

According to an embodiment of the present disclosure, the method may further include an operation of installing a rear cover that forms a rear face of the electronic device.

According to an embodiment of the present disclosure, the method may further include an operation of installing a front glass cover that forms a front face of the electronic device.

Figure 47:
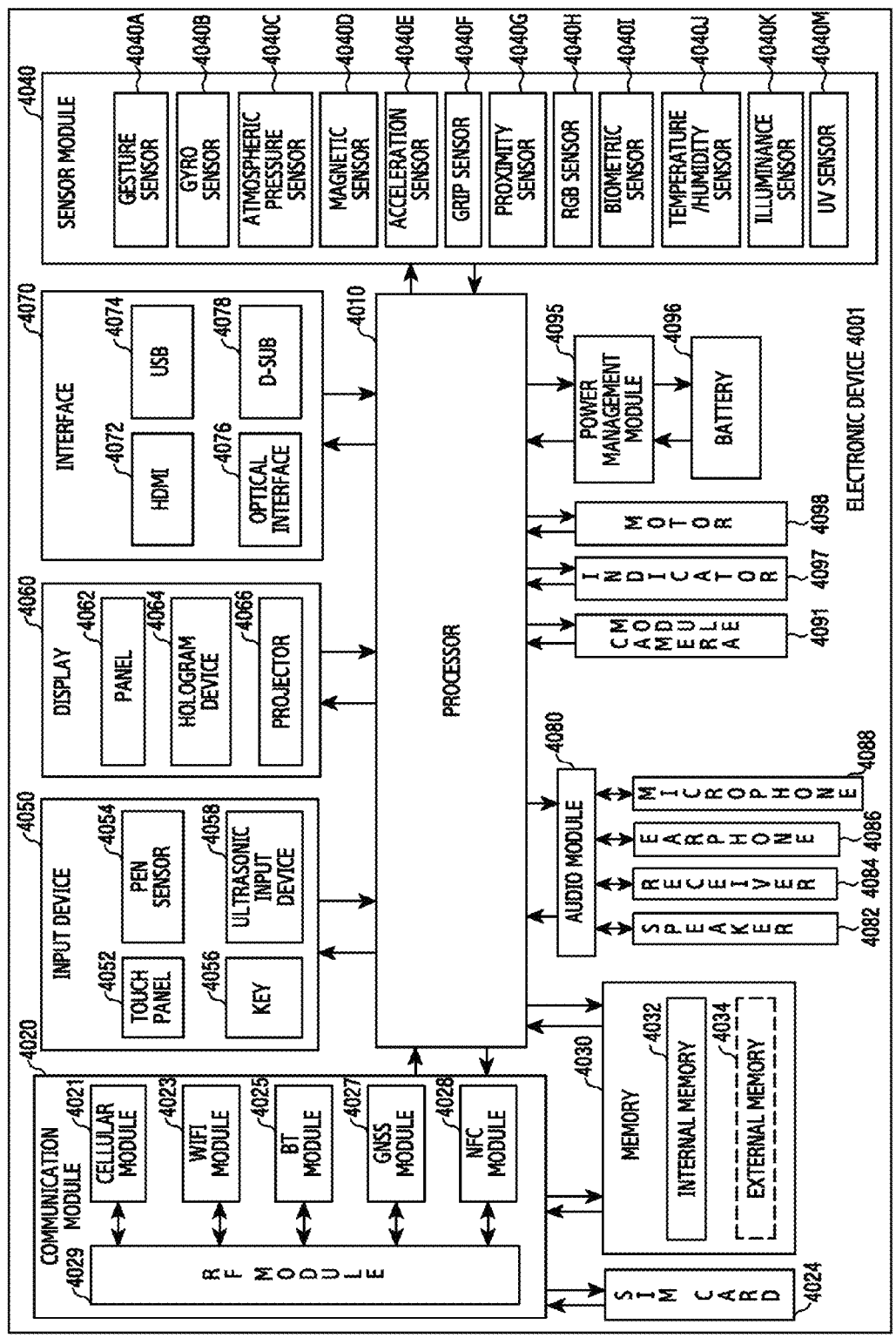
FIG. 47 is a block diagram of an electronic device according to various embodiments.

FIG. 47 is a block diagram of an electronic device according to various embodiments.

Referring to FIG. 47, an electronic device 4001 may include a front glass cover (e.g., the front glass cover 1 in FIG. 1) that forms a front face (e.g., the front face F in FIG. 1), a rear glass cover (e.g., the rear glass cover 2 in FIG. 1) that forms a rear face (the rear face B in FIG. 1) of the electronic device 4001, and a metal bezel (e.g., the metal bezel 3 in FIG. 1) that surrounds a space formed by the front glass cover 1 and the rear glass cover 2. In addition, the electronic device 4001 may include one or more processors 4010 (e.g., AP), a communication module 4020, a subscriber identification module 4024, a memory 4030, a sensor module 4040, an input device 4050, a display 4060 (e.g., the display device 4 in FIG. 3), an interface 4070, an audio module 4080, a camera module 4091 (e.g., the camera module 1200 in FIG. 12), a power management module 4095, a battery 4096 (the battery 9 in FIG. 3), an indicator 4097, or a motor 4098, which are embedded in the above-described space.

According to various embodiments of the present disclosure, at least one glass cover of the front glass cover 1 and the rear glass cover 2 may include a surface that includes a first edge (e.g., the first edge 1E1 in FIG. 1), a second edge 1E2 that extends at the opposite side to the first edge 1E1, a third edge 1E3 that interconnects a first end of the first edge 1E1 and a first end of the second edge 1E2, and a fourth edge 1E4 that interconnects a second end of the first edge 1E1 and a second end of the second edge 1E2. When viewed from a cross section, the at least one glass cover may include a first region (the first region 1A1 in FIG. 1) that has a thickness that decreases at a first gradient toward the first edge 1E1 and is positioned adjacent to the first edge 1E1. The at least one glass cover may include a second region (the second region 1A2 in FIG. 1) that has a thickness that decreases at the first gradient toward the second edge 1E2, and is positioned adjacent to the second edge 1E2. The at least one glass cover may include a third region (the third region 1A3 in FIG. 1) that has a thickness that decrees at a second gradient, which is different from the first gradient, and is positioned adjacent to the third edge 1E3. In addition, the at least one glass cover may include a fourth region (the fourth region 1A4 in FIG. 4) that has a thickness that decreases at the second gradient toward the fourth edge 1E4, and is positioned adjacent to the fourth edge 1E4.

According to an embodiment of the present disclosure, the one or more processors 4010 (e.g., an AP), the communication module 4020, the subscriber identification module 4024, the memory 4030, the sensor module 4040, the input device 4050, the display 4060 (e.g. the display device 4 in FIG. 3), the interface 4070, the audio module 4080, the camera module 4091 (e.g., the camera module 1200 in FIG. 12), the power management module 4095, the indicator 4097, or the motor 4098 may be mounted on a circuit board (e.g., the circuit board 7 in FIG. 3).

According to an embodiment of the present disclosure, the processor 4010 may control a plurality of hardware or software components connected to the processor 4010 and perform processing of various pieces of data and calculations by driving an operating system or application programs. The processor 4010 may be implemented by, for example, a system on chip (SoC). According to an embodiment of the present disclosure, the processor 4010 may further include a graphic processing unit (GPU) and/or an image signal processor (ISP). The processor 4010 may include at least some (e.g., a cellular module 4021) of the elements illustrated in FIG. 47. The processor 4010 may load, into a volatile memory, instructions or data received from at least one (e.g., a non-volatile memory) of the other elements and may process the loaded instructions or data, and may store various data in a non-volatile memory.

According to an embodiment of the present disclosure, the communication module 4020 may include, for example, a cellular module 4021, a wireless fidelity (Wi-Fi) module 4023, a Bluetooth (BT) module 4025, a global navigation satellite system (GNSS) module 4027 (for example, a GPS module, a Glonass module, a Beidou module, or a Galileo module), an NFC module 4028, and a radio frequency (RF) module 4029.

According to an embodiment of the present disclosure, the cellular module 4021 may provide a voice call, image call, a text message service, or an Internet service through, for example, a communication network. According to an embodiment, the cellular module 4021 may distinguish between and authenticate electronic devices within a communication network using a subscriber identification module (for example, the SIM card 4024). According to an embodiment of the present disclosure, the cellular module 4021 may perform at least some of the functions that the AP 4010 may provide. According to an embodiment of the present disclosure, the cellular module 4021 may include a communication processor (CP).

According to an embodiment of the present disclosure, each of the Wi-Fi module 4023, the BT module 4025, the GNSS module 4027, and the NFC module 4028 may include, for example, a processor for processing data transmitted and received through the relevant module. According to various embodiments, at least some (for example, two or more) of the cellular module 4021, the Wi-Fi module 4023, the BT module 4025, the GNSS module 4027, and the NFC module 4028 may be included in one integrated chip (IC) or IC package.

According to an embodiment of the present disclosure, an RF module 4029 may, for example, transmit and receive a communication signal (e.g., RF signal). The RF module 4029 may include, for example, a transceiver, a power amplifier module (PAM), a frequency filter, a low noise amplifier (LNA), or an antenna. According to another embodiment of the present disclosure, at least one of the cellular module 4021, the Wi-Fi module 4023, the BT module 4025, the GPS module 4027, and the NFC module 4028 may transmit/receive an RF signal through a separate RF module.

According to an embodiment of the present disclosure, the subscriber identification module 4024 may include, for example, a card including a subscriber identity module and/or an embedded SIM, and may contain unique identification information (e.g., an integrated circuit card identifier (ICCID)) or subscriber information (e.g., an international mobile subscriber identity (IMSI)).

According to an embodiment of the present disclosure, the memory 4030 may include an internal memory 4032 or an external memory 4034. The internal memory 4032 may include at least one of a volatile memory (for example, a dynamic random access memory (DRAM), a static RAM (SRAM), a synchronous dynamic RAM (SDRAM), and the like) and a non-volatile memory (for example, a one time programmable read only memory (OTPROM), a programmable ROM (PROM), an erasable and programmable ROM (EPROM), an electrically erasable and programmable ROM (EEPROM), a mask ROM, a flash ROM, a flash memory (for example, a not and (NAND) flash memory or a not or (NOR) flash memory), a hard disc drive, a solid state drive (SSD), and the like).

According to an embodiment of the present disclosure, an external memory 4034 may further include a flash drive, for example, a compact flash (CF), a secure digital (SD), a micro-SD, a mini-SD, an extreme digital (xD), a memory stick, or the like. The external memory 4034 may be functionally and/or physically connected to the electronic device 4001 through various interfaces.

According to an embodiment of the present disclosure, the sensor module 4040 may measure, for example, a physical quantity or detect an operation state of the electronic device 4001, and may convert the measured or detected information to an electrical signal. The sensor module 4040 may include, for example, at least one of a gesture sensor 4040A, a gyro sensor 4040B, an atmospheric pressure sensor 4040C, a magnetic sensor 4040D, an acceleration sensor 4040E, a grip sensor 4040F, a proximity sensor 4040G, a color sensor 4040H (for example, a red, green, blue (RGB) sensor), a biometric sensor 4040I, a temperature/humidity sensor 4040J, a light sensor 4040K, and a UV sensor 4040M. Additionally or alternatively, the sensor module 4040 may include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 4040 may further include a control circuit for controlling one or more sensors included therein. In various embodiments of the present disclosure, an electronic device 4001 may further include a processor configured to control the sensor module 4040 as a part of or separately from the processor 4010, and may control the sensor module 4040 while the processor 4010 is in a sleep state.

According to various embodiments of the present disclosure, the sensor module 4040 may be arranged adjacent to the front glass cover 1 or the rear glass cover 2. For example, the front glass cover 1 may include one or more transparent regions (e.g., the transparent regions 1T1 and 1T2 in FIG. 1) for supporting an optical related sensor (e.g., the illuminance sensor 4040K or a proximity sensor 4040G). External light may be introduced into the optical related sensor through the transparent regions 1T1 and 1T2. In addition, light from the optical related sensor may be projected to the outside through the transparent regions 1T1 and 1T2. Here, the external light may be introduced to the optical related sensor through a central region (e.g., the central region 1A or 2A in FIG. 1) that is surrounded by the first to fourth regions 1A1 to 1A4 of the front glass cover 1 or the rear glass cover 2. Alternatively, the light projected from the optical related sensor may be projected to the outside through the central region (e.g., the central region 1A or 2A in FIG. 1) that is surrounded by the first to fourth regions 1A1 to 1A4 of the front glass cover 1 or the rear glass cover 2.

According to an embodiment of the present disclosure, the input device 4050 may include, for example, a touch panel 4052, a (digital) pen sensor 4054, a key 4056, or an ultrasonic input device 4058. The touch panel 4052 may use at least one of, for example, a capacitive type, a resistive type, an IR type, and an ultrasonic type. Also, the touch panel 4052 may further include a control circuit. The touch panel 4052 may further include a tactile layer to provide a tactile reaction to a user.

According to an embodiment of the present disclosure, the touch panel 4052 may be arranged between the display 4060 and the front glass cover 1. According to another embodiment, the touch panel 4052 may be additionally coupled to the rear glass cover 2.

The (digital) pen sensor 4054 may include, for example, a recognition sheet which is a part of the touch panel or is separated from the touch panel. The key 4056 may include, for example, a physical button, an optical key or a keypad. The ultrasonic input device 4058 may detect ultrasonic wavers generated by an input tool through a microphone (for example, a microphone 4088) and identify data corresponding to the detected ultrasonic waves.

According to an embodiment of the present disclosure, a pen sensor 4054 may be coupled to the display 4060, and may be arranged between the display 4060 and the rear glass cover 2.

According to another embodiment, the pen sensor 4054 may be additionally coupled to the rear glass cover 2.

According to an embodiment of the present disclosure, the display 4060 may include a panel 4062, a hologram unit 4064, or a projector 4066. The panel 4062 may be implemented to be, for example, flexible, transparent, or wearable. The panel 4062 and the touch panel 4052 may be implemented as one module. The hologram 4064 may show a three dimensional image in the air by using an interference of light. The projector 4066 may display an image by projecting light onto a screen. The screen may be located, for example, inside or outside the electronic device 4001. According to an embodiment, the display 4060 may further include a control circuit for controlling the panel 4062, the hologram device 4064, or the projector 4066.

According to an embodiment of the present disclosure, the display 4060 may include a screen region that is exposed through the front glass cover 1. The first region 1A1, the second region 1A2, the third region 1A3, or the fourth region 1A4 of the front glass cover 1 may not overlap with the screen region.

According to an embodiment of the present disclosure, the display 4060 may be coupled to the rear glass cover 2. Here, the rear glass cover 2 may include a transparent region that corresponds to the screen region of the display 4060.

According to an embodiment of the present disclosure, the interface 4070 may include, for example, a high-definition multimedia interface (HDMI) 4072, a USB 4074, an optical interface 4076, or a D-subminiature (D-sub) 4078. Additionally or alternatively, the interface 4070 may include, for example, a mobile high-definition link (MHL) interface, a SD card/multi-media card (MMC) interface, or an infrared data association (IrDA) standard interface.

According to an embodiment of the present disclosure, the audio module 4080 may bilaterally convert a sound and an electrical signal. The audio module 4080 may process sound information which is input or output through, for example, a speaker 4082, a receiver 4084, earphones 4086, the microphone 4088 or the like.

According to an embodiment of the present disclosure, the camera module 4091 is a device which may photograph a still image and a dynamic image. According to an embodiment, the camera module 4091 may include one or more image sensors (for example, a front sensor or a back sensor), a lens, an ISP or a flash (for example, LED or xenon lamp).

According to various embodiments of the present disclosure, the angle of view of the camera module 4091 may not include a first region 1A1 to a fourth region 1A4.

According to an embodiment of the present disclosure, the power management module 4095 may, for example, control power of the electronic device 4001. According to an embodiment of the present disclosure, the power management module 4095 may include a power management integrated circuit (PMIC), a charger IC, or a battery or fuel gauge. The PMIC may use a wired and/or wireless charging method. Examples of the wireless charging method may include, for example, a magnetic resonance method, a magnetic induction method, an electromagnetic method, and the like. Additional circuits (e.g., a coil loop, a resonance circuit, a rectifier, etc.) for wireless charging may be further included. The battery gauge may measure, for example, a residual quantity of the battery 4096, and a voltage, a current, or a temperature during the charging. The battery 4096 may include, for example, a rechargeable battery or a solar battery.

According to an embodiment of the present disclosure, the indicator 4097 may display a particular state (e.g., a booting state, a message state, a charging state, or the like) of the electronic apparatus 4001 or a part (e.g., the processor 4010) of the electronic apparatus 4001. The motor 4098 may convert an electrical signal into mechanical vibration, and may generate vibration, a haptic effect, or the like. Although not illustrated, the electronic apparatus 4001 may include a processing unit (e.g., a GPU) for supporting a mobile TV. The processing unit for supporting mobile TV may, for example, process media data according to a certain standard such as digital multimedia broadcasting (DMB), digital video broadcasting (DVB), or mediaFLO™.

Each of the above-described component elements of hardware according to the present disclosure may be configured with one or more components, and the names of the corresponding component elements may vary based on the type of electronic device. In various embodiments, the electronic device may include at least one of the above-described elements. Some of the above-described elements may be omitted from the electronic device, or the electronic device may further include additional elements. Also, some of the hardware components according to various embodiments may be combined into one entity, which may perform functions identical to those of the relevant components before the combination.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A portable electronic device comprising:
   a front glass cover forming a front face of the electronic device;
   a rear glass cover forming a rear face of the electronic device;
   a metal bezel encapsulating a space formed by the front glass cover and the rear glass cover; and
   a display device disposed in the space and that includes a screen region exposed through the front glass cover,
   wherein at least one glass cover of the front glass cover and the rear glass cover includes a surface comprising:
      a first edge;
      a second edge extending at an opposite side to the first edge;
      a third edge interconnecting a first end of the first edge and a first end of the second edge; and
      a fourth edge interconnecting a second end of the first edge and a second end of the second edge, and
   wherein when viewed from a cross-section, the at least one glass cover includes:
      a first region having a thickness that decreases at a first gradient toward the first edge, and positioned adjacent to the first edge;
      a second region having a thickness that decreases at the first gradient toward the second edge, and positioned adjacent to the second edge;
      a third region having a thickness that decreases at a second gradient, which is different from the first gradient, toward the third edge, and positioned adjacent to the third edge; and a fourth region having a thickness that decreases at the second gradient toward the fourth edge, and positioned adjacent to the fourth edge.

2. The portable electronic device of claim 1, wherein at least one of the first to fourth regions includes a curved face.

3. The portable electronic device of claim 1, wherein the at least one glass cover includes an external face exposed to an outside and an internal face facing to an inside of the electronic device, and the internal face is a substantially flat face.

4. The portable electronic device of claim 1, wherein the first region and the second region are symmetrical to each other, and the third region and the fourth region are symmetrical to each other.

5. The portable electronic device of claim 1, wherein the screen region has a rectangular shape having a first short side adjacent to the first edge, a second short side adjacent to the second edge, a first long side adjacent to the third edge, and a second long side adjacent to the fourth edge.

6. The portable electronic device of claim 5, wherein the second gradient is smaller than the first gradient.

7. The portable electronic device of claim 1,
wherein the at least one glass cover is the rear glass cover,
wherein the metal bezel comprises:
a first corner portion adjacent to a location where the first edge and the third edge are connected to each other;
a second corner portion adjacent to a location where the first edge and the fourth edge are connected to each other; and
a first connecting portion between the first corner portion and the second corner portion, and
wherein, in a direction from the front face to the rear face of the electronic device when viewed from the cross-section, the first corner portion and the second corner portion have a first thickness, and the first connecting portion has a second thickness that is smaller than the first thickness.

8. The portable electronic device of claim 7,
wherein the metal bezel comprises:
a third corner portion adjacent to a location where the second edge and the third edge are connected to each other;
a fourth corner portion adjacent to a location where the second edge and the fourth edge are connected to each other; and
a second connecting portion between the third corner portion and the fourth corner portion, and
wherein, in the direction from the front face to the rear face of the electronic device when viewed from the cross section, the third corner portion and the fourth corner portion have the first thickness, and the second connecting portion has the second thickness.

9. The portable electronic device of claim 8,
wherein the metal bezel comprises:
a third connecting portion between the first corner portion and the third corner portion; and
a fourth connecting portion between the second corner portion and the fourth corner portion,
wherein, in the direction from the front face to the rear face of the electronic device when viewed from the cross-section, the third connecting portion and the fourth connecting portion have a third thickness that is smaller than the first thickness.

10. The portable electronic device of claim 9,
wherein the rear glass cover includes a central region that is surrounded by the first to fourth regions, wherein the first corner portion includes a first corner face that forms a surface parallel to the rear face,
wherein the second corner portion includes a second corner face that forms a surface parallel to the rear face,
wherein the first connecting portion includes a first connecting face that forms a surface parallel to the rear face, and
wherein the first corner face and the second corner face protrude more than the central region in the direction from the front face to the rear face of the electronic device when viewed from the cross-section.

11. The portable electronic device of claim 10, wherein the first connecting face protrudes less than the central region in the direction from the front face to the rear face of the electronic device when viewed from the cross-section.

12. The portable electronic device of claim 10,
wherein the third connecting portion includes a third connecting face that forms a surface parallel to the rear face, and
wherein the third connecting face protrudes less than the central region and the third region in the direction from the front face to the rear face of the electronic device when viewed from the cross-section.

13. The portable electronic device of claim 1, wherein the at least one glass cover is the front glass cover, and the first region and the second region do not overlap with the screen region.

14. The portable electronic device of claim 1,
wherein the at least one glass cover is the front glass cover,
wherein the metal bezel comprises:
a first corner portion adjacent to a location where the first edge and the third edge are connected to each other;
a second corner portion adjacent to a location where the first edge and the fourth edge are connected to each other; and
a first connecting portion between the first corner portion and the second corner portion, and
wherein, in a direction from the rear face to the front face of the electronic device when viewed from the cross-section, the first corner portion and the second corner portion have a first thickness, and the first connecting portion has a second thickness that is smaller than the first thickness.

15. The portable electronic device of claim 14,
wherein the metal bezel comprises:
a third corner portion adjacent to a location where the second edge and the third edge are connected to each other;
a fourth corner portion adjacent to a location where the second edge and the fourth edge; and
a second connecting portion between the first corner portion and the second corner portion,
wherein, in a direction from the rear face to the front face of the electronic device when viewed from the cross section, the third corner portion and the fourth corner portion have the first thickness, and the second connecting portion has the second thickness.

16. The portable electronic device of claim 15,
wherein the metal bezel comprises:
a third connecting portion between the first corner portion and the third corner portion; and
a fourth connecting portion between the second corner portion and the fourth corner portion, and
wherein, in the direction from the rear face to the front face of the electronic device when viewed from the cross section, the third connecting portion and the fourth connecting portion have a third thickness that is smaller than the first thickness.

17. The portable electronic device of claim 16, wherein the front glass cover includes a central region surrounded by the first to fourth regions,
the first corner portion includes a first corner face that forms a surface parallel to the front face,
the second corner portion includes a second corner face that forms a surface parallel to the front face,
the first connecting portion includes a first connecting face that forms a surface parallel to the front face, and
wherein the first corner face and the second corner face protrudes more than the central region in the direction from the rear face to the front face of the electronic device when viewed from the cross section.

18. The portable electronic device of claim 17, wherein the first connecting face protrudes less than the central region in the direction from the rear face to the front face of the electronic device when viewed from the cross section.

19. The portable electronic device of claim 17, wherein the third connecting portion includes a third connecting face that forms a surface parallel to the front face, and
wherein the third connecting face protrudes less than the central region in the direction from the rear face to the front face of the electronic device when viewed from the cross section.

20. The portable electronic device of claim 1, further comprising:
a camera embedded in the space formed by the front glass cover and the rear glass cover, the camera receiving external light introduced through the front glass cover,
wherein the first to fourth regions are not included in a range of an view of angle of the camera.

* * * * *